United States Patent [19]

Loshbough et al.

[11] 4,204,197
[45] May 20, 1980

[54] DIGITAL SCALE

[75] Inventors: Richard C. Loshbough; Edward G. Pryor, both of Westerville, Ohio

[73] Assignee: Reliance Electric Company, Cleveland, Ohio

[21] Appl. No.: 824,858

[22] Filed: Aug. 15, 1977

[51] Int. Cl.² .................. H03K 13/20; G01G 19/413
[52] U.S. Cl. ..................... 340/347 NT; 340/347 AD; 364/466
[58] Field of Search ................. 340/347 AD, 347 NT; 364/567, 466; 177/25, 3; 235/92 PE, 92 NT

[56] References Cited

U.S. PATENT DOCUMENTS

| Re. 28706 | 2/1976 | Dorey | 340/347 NT |
|---|---|---|---|
| 3,622,769 | 11/1971 | Lajoie et al. | 235/92 NT |
| 3,733,471 | 5/1973 | Gilberg | 235/92 PE |
| 3,765,012 | 10/1973 | Grutzediek et al. | 340/347 NT |
| 3,772,683 | 11/1973 | Dorey | 340/347 NT |
| 3,789,195 | 1/1974 | Meier et al. | 235/92 PE |
| 3,826,983 | 7/1974 | Garratt et al. | 340/347 NT |
| 3,876,869 | 4/1975 | Houpt | 235/92 PE |
| 3,895,376 | 7/1975 | Uchida | 340/347 NT |
| 3,943,506 | 3/1976 | Peattie | 340/347 NT |
| 3,975,727 | 8/1976 | Mader et al. | 340/347 NT |
| 4,044,846 | 8/1977 | Matilainen | 364/567 |
| 4,050,065 | 9/1977 | Mosley et al. | 340/347 NT |
| 4,071,102 | 1/1978 | Van Ostenbridge et al. | 364/567 |
| 4,084,082 | 4/1978 | Alfke | 235/92 PE |

Primary Examiner—Felix D. Gruber
Attorney, Agent, or Firm—Roy F. Hollander; William F. Simpson

[57] ABSTRACT

The invention relates to a scale system which employs a microcomputer forming an integral part of the analog to digital conversion means in which the microcomputer controls the sequence of operations for performing the conversion, accumulates and stores digital data derived during the conversion of the analog signal and combines and processes that data to provide the digital output data resulting from the conversion, all in addition to performing other scale functions. The invention relates to an improved multicapacity weighing and computing digital scale having a triple slope analog-to-digital conversion means. The analog weight signal is integrated for a time interval which is fixed for a given scale capacity range which would generate substantially the same integrator output level in response to a full capacity weight signal for the selected scale capacity as would be generated by a full capacity weight for all other scale capacities. In accordance with the invention, the time interval during which the first reference DC source is integrated is extended beyond the detection of the crossover of the integrator output with its reference level. The invention also provides an improved weight filtering arrangement which enables the full advantage of the improved converter to be obtained. The invention further provides for the tracking of the net zero indication by modification of the stored tare weight data by a predetermined amount to decrease the absolute value of the net weight in response to the net weight being within a preselected weight range.

17 Claims, 37 Drawing Figures

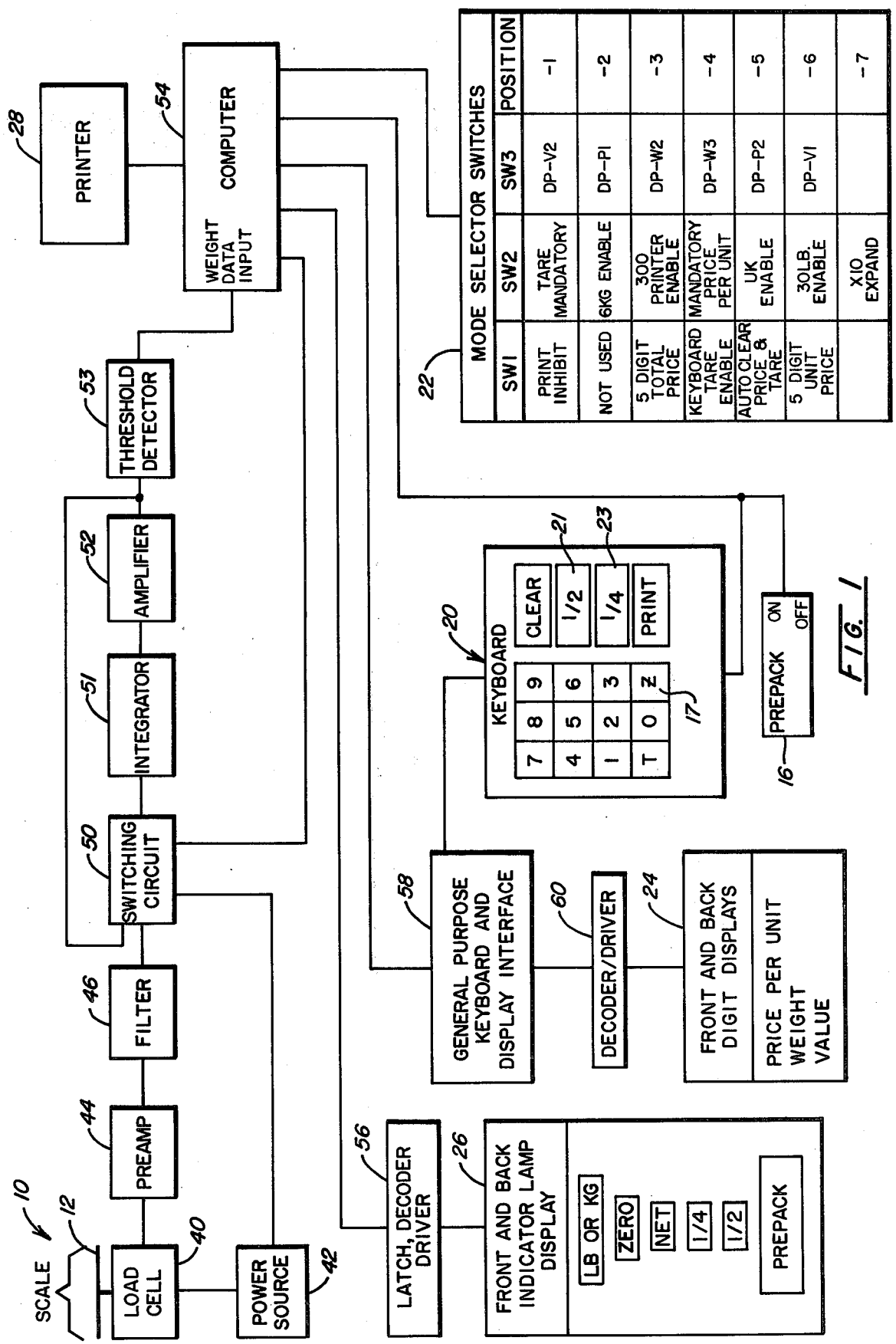

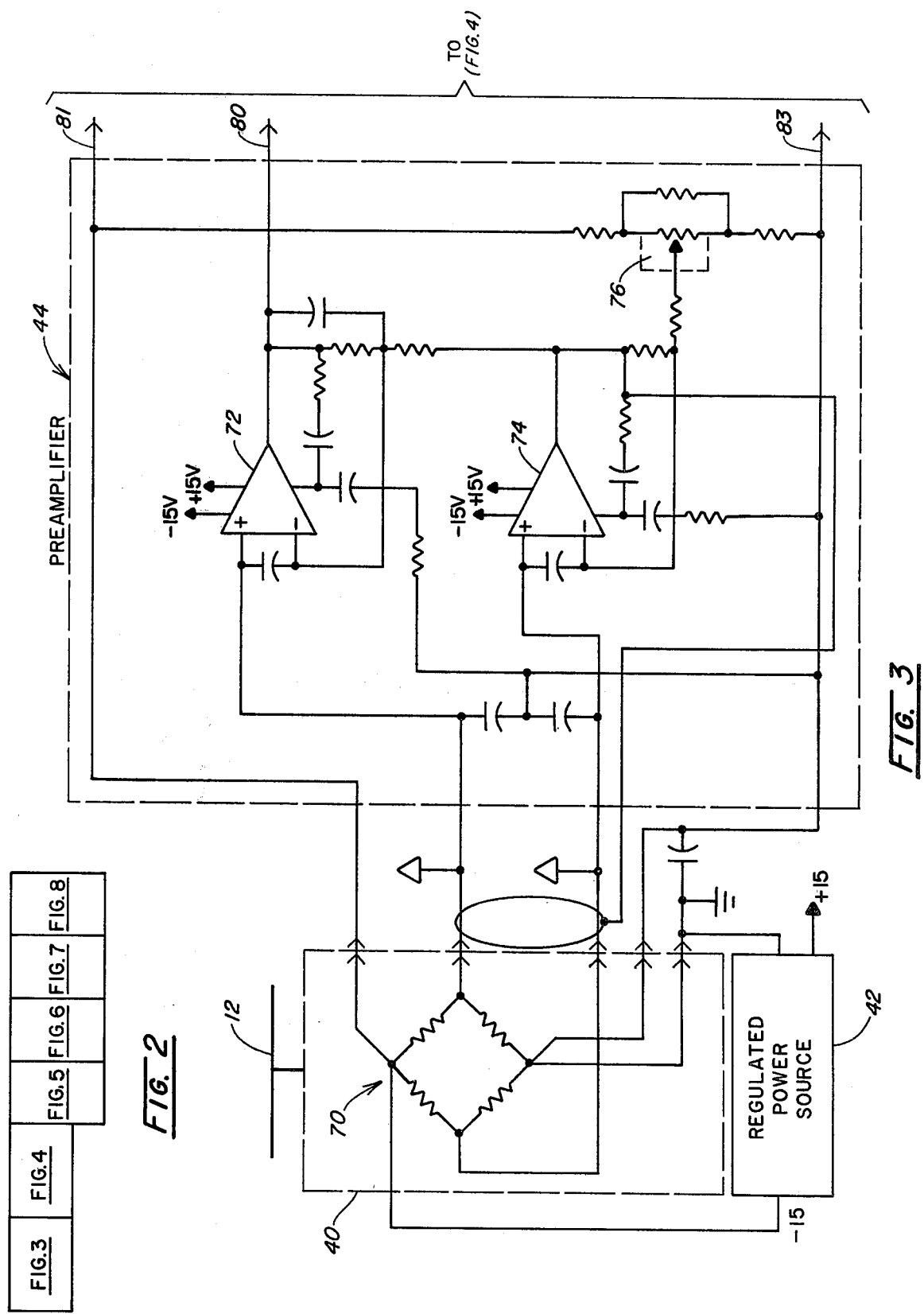

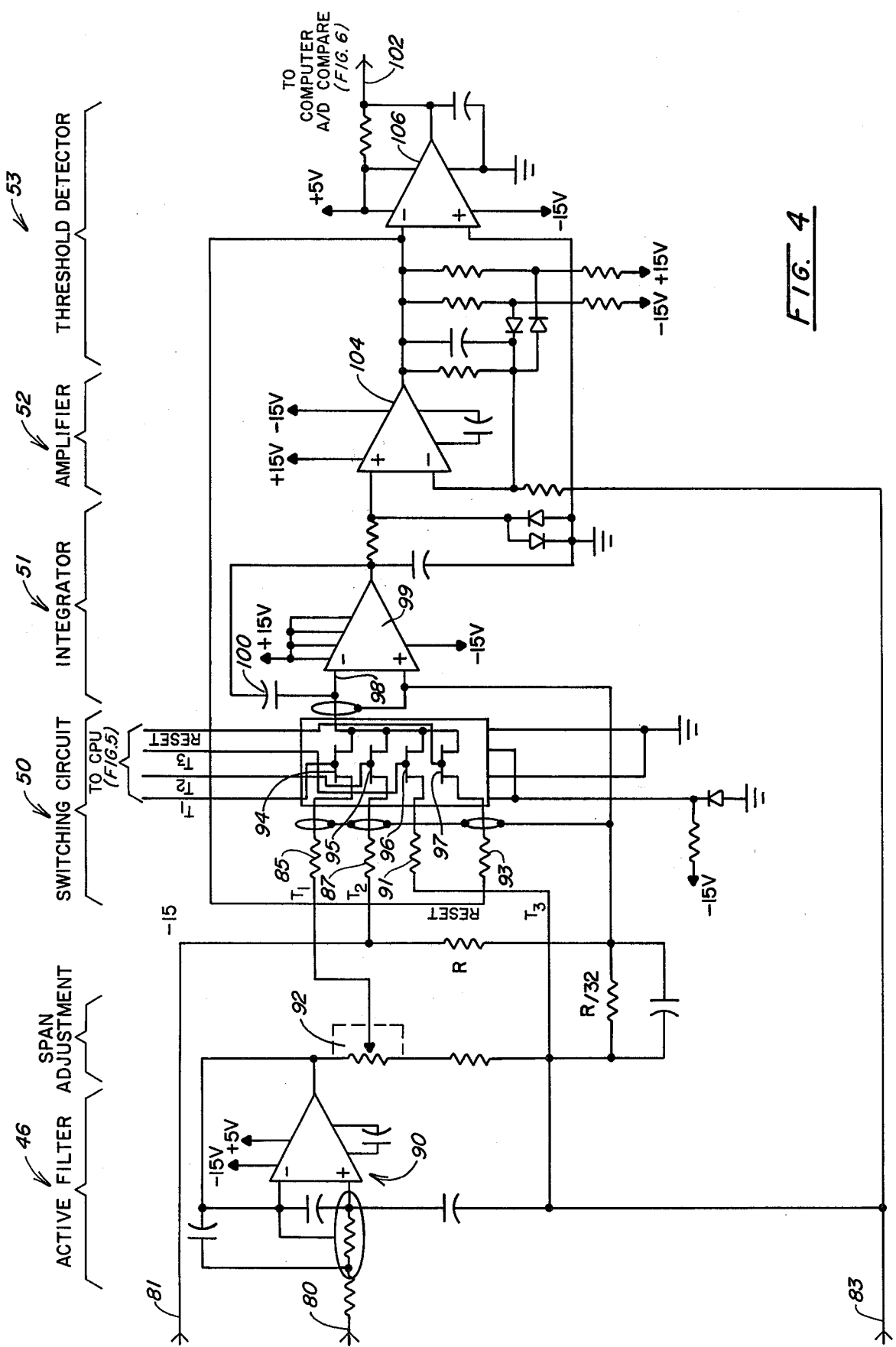

RAM ASSIGNMENTS

| | 00 | | 01 | | 02 | | 03 | |
|---|---|---|---|---|---|---|---|---|
| 0 | MOTION FLAG | -000 | FILTER COUNTER | -010 | LB/KG LAMP | -020 | Z̄ KEY TIMER | -030 |
| 1 | ZERO INCREMENT FLAG | -001 | ZERO LAMP FLAG | -011 | ZERO LAMP | -021 | ZERO DONE FLAG | -031 |
| 2 | TARE DONE FLAG | -002 | NET FLAG | -012 | NET LAMP | -022 | | |
| 3 | MANUAL TARE FLAG | -003 | FACTOR FLAG | -013 | 1/2 LAMP | -023 | AUTO CLEAR FLAG | -033 |
| 4 | DIGIT TIMER | -004 | | | 1/4 LAMP | -024 | 2 PREVIOUS LSD | -034 |
| 5 | | -005 | | | PRE-PACK HALF PENCE | -025 | 1 PREVIOUS LSD | -035 |
| 6 | | | | | PRE-PACK HALF PENCE | -026 | | |
| 7 | | | | | PRINT COMMAND | -027 | | |
| 8 | | | VERIFY TEST FLAG | -018 | | | | |
| 9 | | -009 | SIGN | -019 | SIGN | -029 | SIGN | -039 |
| A | RESULT | -00A | | -01A | | -02A | | -03A |
| B | | | ARI ARITHMETIC SCRATCH PAD RESGISTER | | WEIGHT | | FILTERED WEIGHT | |
| C | | | | | | | | |
| D | | | | | | | | |
| E | | | | | | | | |
| F | | -00F | | -01F | | -02F | | -03F |

| | 04 | | 05 | | 06 | | 07 | |
|---|---|---|---|---|---|---|---|---|
| 0 | 300 PRINTER ENABLE | -040 | 5 DIGIT TOTAL PRICE ENABLE | -050 | | -060 | | -070 |
| 1 | MANDATCRY PRICE/UNIT EN. | -041 | 5 DIGIT PRICE ENABLE | -051 | TOTAL PRICE | | | |
| 2 | TARE MANDATCRY EN. | -042 | | | | | | |
| 3 | 30 LB EN. | -043 | AUTO CLEAR EN. | -053 | | | WORK AREA AND DISPLAY OUTPUT REGISTERS | |
| 4 | 6 KG EN. | -044 | 20 INCREMENT PRINT DISABLE | -054 | | -064 | | |
| 5 | UK EN. | -045 | KEYBOARD TARE EN. | -055 | | -065 | | |
| 6 | KEYBOARD RETURN | -046 | | | | | | |
| 7 | KEYBOARD STROBE | -047 | RECOMPUTE FLAG | -057 | PRICE | | | |
| 8 | X ZERO BY PER. 10 KEY | -048 | VERIFY MODE FLAG | -058 | | | | |
| 9 | SIGN | -049 | SIGN | -059 | | -069 | | -079 |
| A | | -04A | | -05A | | -06A | | |
| B | | | | | OUTPUT WEIGHT | | TEMPORARY SCRATCH PAD REGISTERS | |
| C | AUTO ZERO | | TARE | | | | | |
| D | | | | | | -06D | | |
| E | | | | | SIGN | -06E | | |
| F | | -04F | | -05F | | -06F | | -07F |

*FIG. 13*

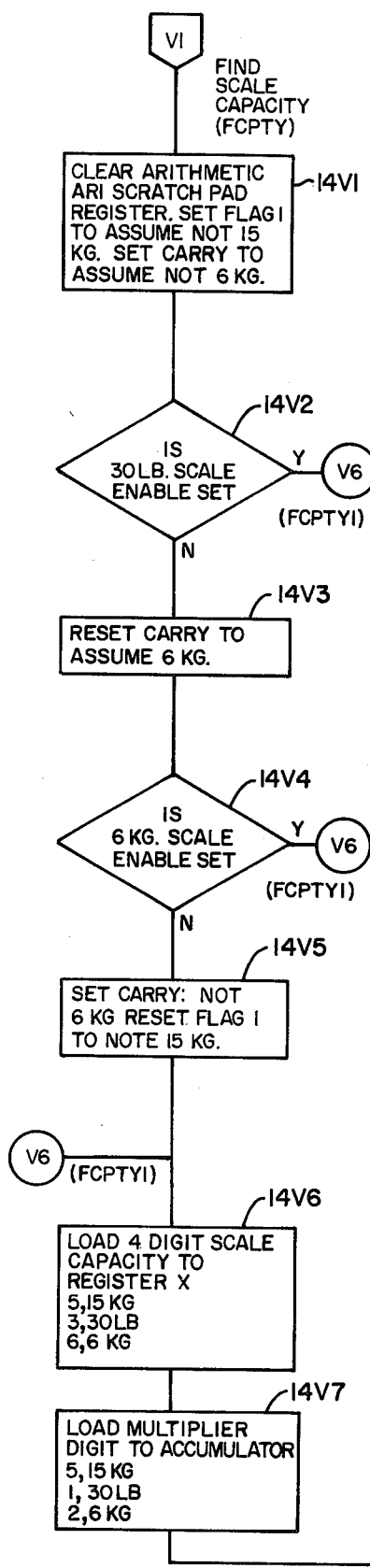
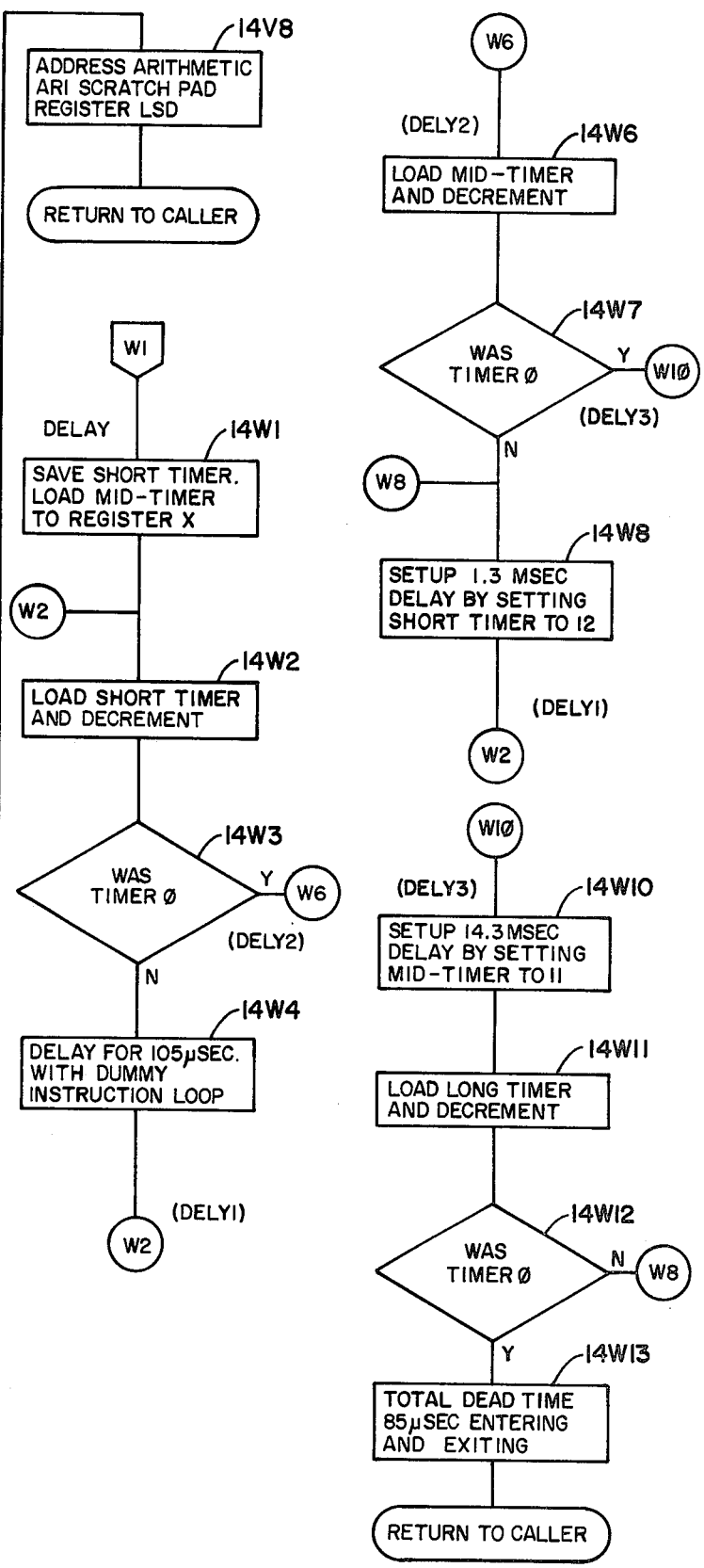
FIG. 14V
FIG. 14W

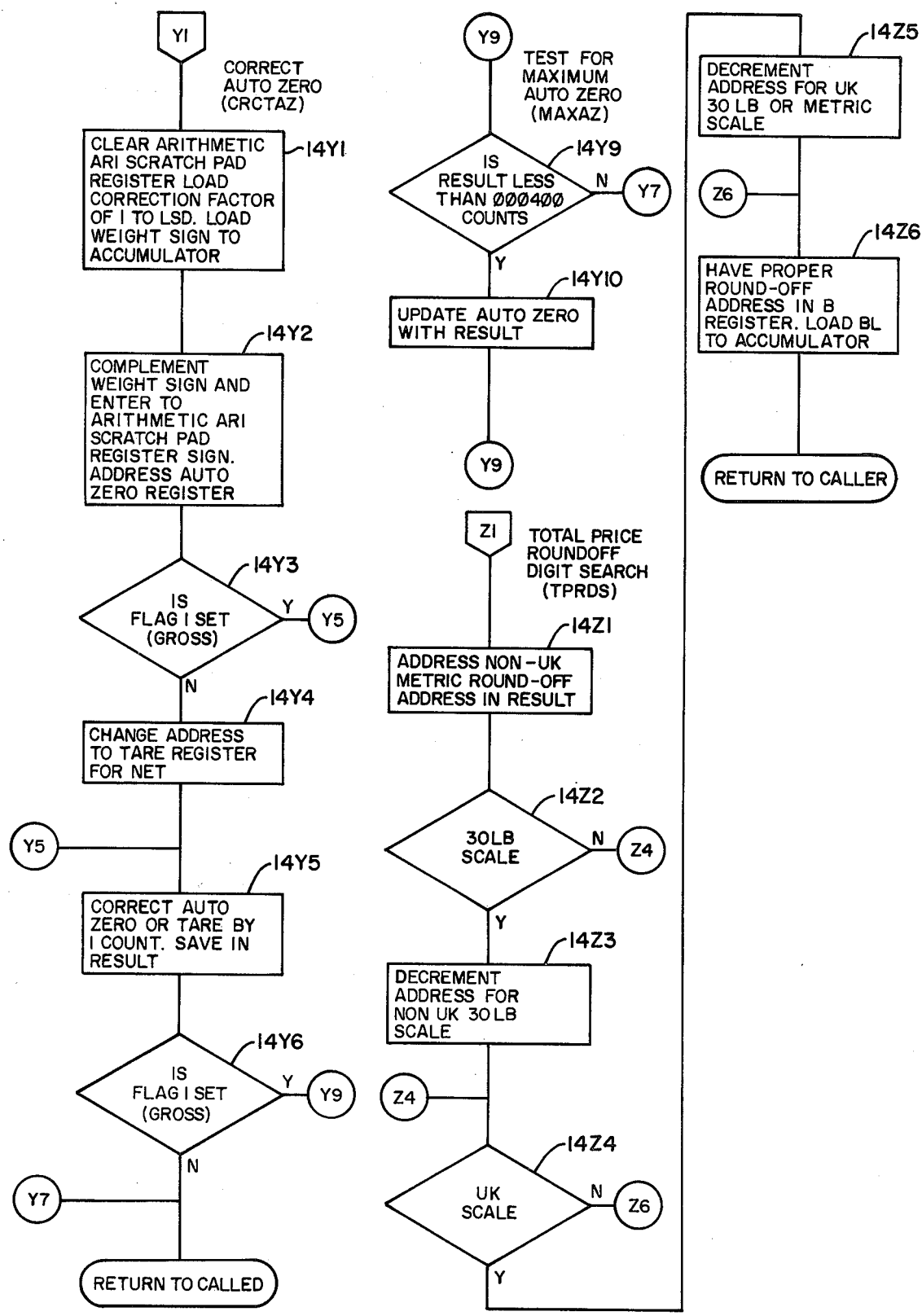

DIGITAL SCALE

BACKGROUND OF THE INVENTION

1. Field of the Invention

This invention concerns weight measuring apparatus. More particularly, the invention is concerned with a weighing scale system having an improved analog-to-digital conversion means including a microcomputer which forms an integral part thereof and to the automatic tracking of the net zero indication of such an apparatus.

2. Description of the Prior Art

Weighing and computing scales must meet several stringent requirements for performance and cost. The scales must be accurate enough to satisfy public weights and measures authorities, yet be available at a reasonably affordable price and perform their operations within a period of time which is convenient for sales transactions.

One of the important factors in digital scales upon which cost, accuracy and operation time depends, is the conversion of the unknown analog weight signal corresponding to an article weight to digital data representative of the article weight.

In the past, digital weighing and computing scales have typically performed the analog-to-digital conversion with a separate distinct and independently controlled analog-to-digital converter circuit which may provide its digital output to a data processing means. Typical examples are Williams, Jr. et al, U.S. Pat. No. 3,709,309 and Loshbough et al., U.S. Pat. No. 3,962,569. This prior art circuitry conventionally uses the dual slope method of analog-to-digital conversion, which method is illustrated in Gilbert, U.S. Pat. No. 3,051,939 and Ammann, U.S. Pat. No. 3,316,547. Triple slope analog-to-digital converters are shown in U.S. Pat. Nos. 3,577,140 Aasnacs; 3,582,947 Harrison; 3,678,506 Wheable; and Re 28706 Dorey. Reference is also made to U.S. Pat. No. 3,937,287 granted to E. G. Pryor and R. C. Loshbough on Feb. 10, 1976 relating to data filtering. The exemplary embodiment of the invention described herein describes features shown in U.S. Pat. Nos. 3,962,569 Loshbough et al; 3,962,570 Loshbough et al; 3,986,012, Loshbough et al; 4,004,139, Hall et al; and application Ser. No. 729,911, Hall et al now U.S. Pat. No. 4,159,521.

Prior art weight measuring apparatus has generally required circuitry separate from the data processing means for performing the integrating, counting, and control functions normally associated with an integrating type analog-to-digital conversion. Attendant with the requirement for separate circuitry is its cost and the relative inflexibility due to the limited number of functions performed by hardwired circuitry.

SUMMARY OF THE INVENTION

There is, therefore, a need for a weighting scale having a relatively simple design which is capable of more effectively utilizing the data processing means to reduce the number of components required to implement the analog-to-digital conversion and thereby reduce the cost of the weighing scale and allow the analog-to-digital conversion to avail itself of the flexibility afforded by the data processing means.

The present invention achieves the foregoing needs by providing a weighing scale system which employs a microcomputer data processing means which is integral to an analog-to-digital conversion and which is used for controlling the sequence of operations and computing the required data for the scale system. The requirement for separate control and counting circuitry associated solely with the analog-to-digital conversion is thereby eliminated, with the additional advantage of allowing the analog-to-digital conversion to be modified via a modification of the instructions of the microcomputer.

In a conventional triple slope analog-to-digital conversion, an analog signal is applied through a switching circuit to an integrator circuit for a first fixed time interval in order to drive its output from an initial level to a level which is proportional to the amplitude of the analog signal. Then a second integrating interval is begun in which a clock-driven digital timing counter begins counting time intervals and simultaneously a first reference DC source is applied through the switching circuit to the integrator to drive its output past a reference level. This level is detected by a threshold detector circuit. In accordance with the present invention, the second time interval is extended an additional time interval beyond the crossover of the reference level. Then during the third integrating interval, the elapse of time is counted. The slower rate permits the crossover to be more precisely detected. Upon detection of such crossover by the threshold detector, the counting of the elapsed time is halted.

In the prior art a separate single digital counter is used to count the clock pulses to accumulate a count of elapsed time for both the second and third integrating intervals. Its most significant digits are used to accumulate the elapsed time count during the second interval and its least significant digits are used to accumulate the elapsed time count during the third interval.

A unique feature of the present invention is that the control of the switching circuit is performed by a microcomputer and the output of the threshold detector is applied directly to the microcomputer so that all counting and arithmetic operations are performed by the microcomputer.

The analog to digital conversion system also affects other characteristics of a weighing and computing scale. For example, an improved digital input weight filtering arrangement is provided which permits the improved accuracy to be obtained by reducing the filter delay and at the same time reducing the effects of vibration or jitter.

In order for a weighing scale to be able to provide a choice of full scale capacities, it is necessary that the weight signal or data be modified in either its analog form or its digital form in a manner which is dependent upon the particular scale capacity and units of weight which are selected.

The weight can be detected according to a single one of several possible scale capacities and weight units and then multiplied by an appropriate conversion factor when another scale capacity is selected. This, however, requires that a computer of such a weighing scale have a more complex sequence of operations because for each selected scale capacity it must deal with substantially different numbers in performing all of its various checks and control functions.

Alternatively, the analog weight signal may be amplified by an amplification factor which is unique for each scale capacity. This selective modification of the analog gain has the disadvantage that it requires the use of either adjustable or multiple circuit elements, such as resistors, in the analog circuitry, one of which must be manually switched into the circuit for each selected amplification factor corresponding to each selected scale capacity. The use of such alternatively selectable circuit elements requires a substantial additional expense and creates problems in calibration.

These problems can be reduced by causing the full capacity analog weight signal for each scale capacity to produce the same digital number at the output of the analog-to-digital converter. This also permits a single span control to set the full capacity output for all selectable scale capacities. For example, in the exemplary embodiment of the present invention, a full scale weight for each scale capacity will produce a digital output of 30,000 net effective weight increments which are termed raw weight increments. The number of raw weight increments is then multiplied by a factor, depending upon the scale capacity to obtain the proper weight units.

It is a unique feature of the present invention that it provides substantially the same digital data with a full capacity weight for all selected scale capacities without requiring multiple circuit elements and without requiring modification of the analog circuit gain. This unique aspect of the present invention is provided by the microcomputer implementation of the analog-to-digital conversion.

Another unique feature of the present invention relates to the computing and displaying of a net weight. The prior art includes weighing and computing scales upon which a food container or other tare weight may be placed, weighed and have the tare weight entered into memory. This stored tare weight is available for later subtraction from the gross weight of the filled container to compute and display the net weight of the contents.

Whenever such a tare weight container is placed on the platter of a scale operating in such a net mode, the digital display should indicate a zero weight. However, drift and hysteresis effects may cause the digital data representing the subsequent measurement of the weight of the container to be different from the previously measured weight data which was stored as the tare weight. Consequently, a subtraction of the earlier stored tare weight from the currently measured weight may cause an erroneous non-zero numer to be displayed.

It is a unique feature of the present invention that such drift or wandering in the digital tare weight data is automatically tracked and the stored tare weight is automatically updated so that an accurate net zero indication is maintained.

The objects and features of the invention will be apparent from the specification and claims when considered in connection with the accompanying drawings illustrating the exemplary embodiment of the invention.

The means, apparatus, and structure, by which the above novel improvements, in accordance with the present invention, are achieved in the exemplary embodiment described herein, comprises various registers, counters, timers, flags, storage spaces, together with specific routines and routine loops for the control of the respective apparatus or means by the central controlled unit. In addition, numerous switches, lamps and display devices cooperate with the central control unit and the various storage spaces, counters, timers, etc., which apparatus comprises input and output means for the system.

DESCRIPTION OF THE DRAWINGS

FIG. 1 is a block diagram illustrating the apparatus of the exemplary embodiment of the invention.

FIG. 2 is a diagram illustrating the layout and relative interrelationship of the circuit diagrams of FIGS. 3 through 8 and is shown on the same sheet as FIG. 10.

FIGS. 3 through 8 show the detailed circuitry of an exemplary embodiment of the invention.

FIG. 13 is a random access memory assignment table illustrating the assignments for the memory of the exemplary embodiment of the invention.

Figure 5:
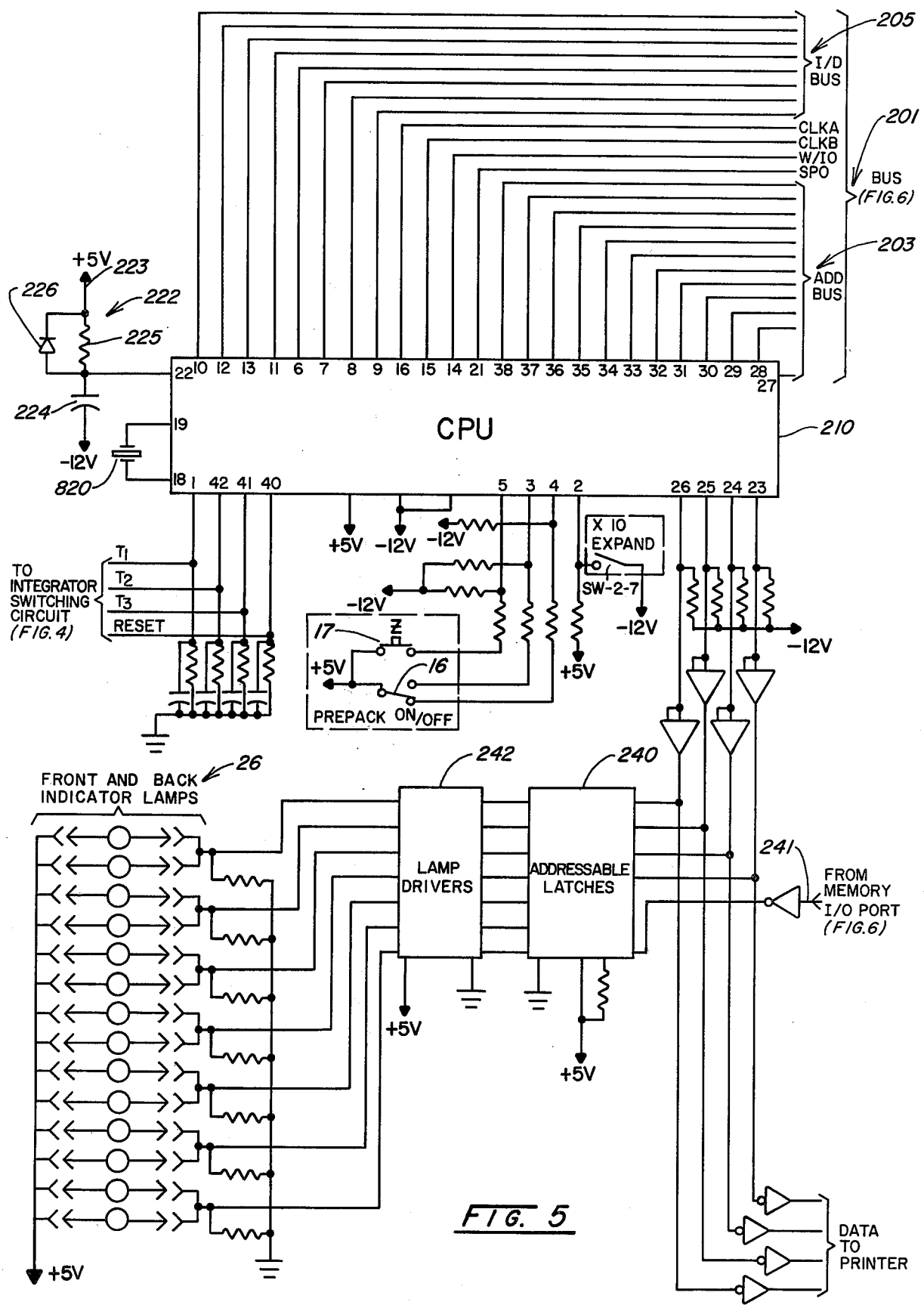

In describing the preferred embodiment of the invention illustrated in the drawings, specific terminology will be resorted to for the sake of clarity. However, it is not intended to be limited to the specific terms so selected, and it is to be understood that each specific term includes all technical equivalents which operate in a similar manner to accomplish a similar purpose. For example, the term connection is not necessarily limited to direct connection but also includes connection through other circuit elements.

GENERAL DESCRIPTION

The exemplary embodiment of the invention is illustrated in the block diagram of FIG. 1. A load cell 40 mechanically supports a platter 12 and is supplied with electrical energy by a power source 42. The load cell applies an analog weight signal through a preamplifier 44 and filter 46 to a switching circuit 50. The analog weight signal has an amplitude which is dependent upon the weight supported by the load cell 40.

The switching circuit 50 is also connected to the power supply so that not only the analog signal but also two reference DC sources can be sequentially applied to the integrator 51 during the performance of a triple slope A/D conversion. The output of the integrator is amplified by an amplifier 52 and applied to a threshold detector so that the crossover of the integrator output with its reference output level is detected by the threshold detector 53. The output of the amplifier is also connected to the switching means 50 for use in resetting the integrator 51. The output of the threshold detector 53 is applied to a microcomputer 54 which is also connected to the switching circuit 50 for controlling its switching functions.

The microcomputer 54 is connected to a printer 28 and through latch decoder and driver circuitry 56 to indicator lamp displays 26. Operational mode selector switches 22 are also connected to data input terminals of the microcomputer 54.

The microcomputer is further connected to a general purpose keyboard and display interface 58 for receiving data from a keyboard 20 and transmitting data through a decoder/driver 60 to digit displays 24. The "PRE-PACK ON/OFF" switch 16 and the "Z" key 17 are individually connected to discrete inputs to the microcomputer 54.

In this exemplary embodiment, the analog-to-digital conversion is performed by the combination of the switching circuit 50, the reference DC sources derived from the power source 42, the integrator 51, the threshold detector 53 and the microcomputer 54. The amplifier 52 is provided to amplify the integrator output so that the threshold detector will more accurately determine when the integrator output crosses the threshold voltage.

The microcomputer 54 includes storage registers in which the elapsed time counts, which are derived from a microcomputer program or instruction loop, are accumulated. It also includes stored data for each scale capacity. The microcomputer 54 includes a central processor, associated memory and stored data for controlling the switching circuit 50 to appropriately apply the inputs to the integrator 51 in the proper sequence and at the proper time, for interrogating the output of the threshold detector 53, and for arithmetically processing the accumulated elapsed time intervals or counts.

Figure 12:
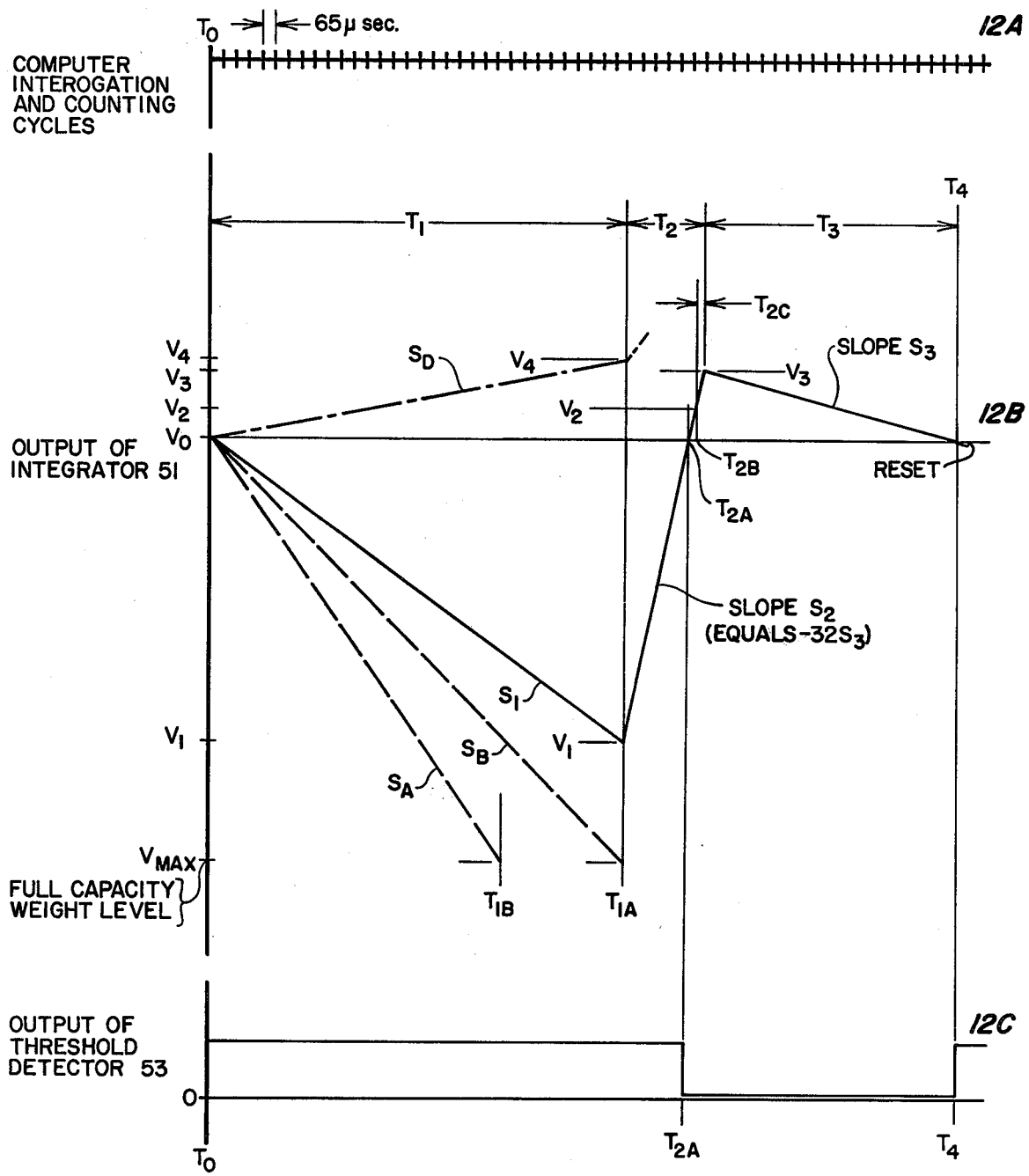
FIG. 12 is a diagram illustrating the operation of the exemplary embodiment of the invention.

FIG. 12 illustrates, in simplified form, the signal relationships which are most significant in describing the invention. The vertical axes represent amplitudes which are not drawn to scale in order that the principles of operation may be more clearly illustrated. The horizontal axis represents time.

The top most graph 12A depicts the computer interrogation and counting cycles and in the exemplary embodiment have a 65 microsecond period. These are not drawn to scale because several thousand such cycles would be needed. Each cycle represents the length of time required for the microcomputer to loop through its interrogation and indexing sequence of operations.

Below that is a graph 12B illustrating in a solid line the output of the integrator 51 and also illustrating, with broken lines, portions of alternative outputs from the integrator 51.

Finally, the lowest graph 12C illustrates the output state of the threshold detector 53. Its threshold level is set to correspond to the initial level $V_0$ at the output of the integrator 51 and its output is high when the output of the integrator is negative and is low when the output of the integrator is positive.

Referring to FIGS. 1 and 12, at time $T_0$ the microcomputer 54 switches the switching circuit 50 to apply the analog signal, which was derived from the load cell, to the input of the integrator 51. This analog signal continues to be applied and is integrated for the entire time interval $T_1$. This input causes the output of the integrator to be driven from its initial level $V_0$ along slope $S_1$ to level $V_1$. The magnitude of $V_1-V_0$ is directly proportional function of the amplitude of the analog signal and is also a function of its integration time $T_1$.

The time interval $T_1$ is a different but fixed and constant time for each different scale capacity and is controlled by the microcomputer 54 and is obtained by reading permanently stored timing data from the computer memory, loading it into suitable registers and sequentially setting the registers in accordance with selected timing loop instructions.

One unique feature of the present invention is that this first integrating interval $T_1$, during which the analog signal is integrated, is different for each scale capacity and therefore different data is stored in memory and loaded into the time delay registers for each scale capacity.

A particular $T_1$ time is chosen for each scale capacity so that whatever scale capacity is selected, a full scale weight on the platter for that scale capacity will always drive the integrator output to substantially the same level. Assume for example that the above described integration along integrator output slope $S_1$ represents a 20 pound weight on the platter 12 with a 30 pound scale capacity selected, then a 30 pound weight on the platter 12 would integrate along slope $S_B$ to arrive at $V_{MAX}$ at the time $T_{1A}$ after time interval $T_1$. If, for example, a 15 kg scale capacity were then selected, a shorter analog signal integrating time would be provided by the microcomputer 54 so that a 15 kg weight on the scale platter would drive the integrator output along the slope $S_C$ to reach $V_{MAX}$ at a time $T_{1B}$. In the examplary embodiment, the following analog signal time intervals are used:

6 kg×2 g—239.660 milliseconds
15 kg×5 g—95.790 milliseconds
30 lb×0.01 lb—105.625 milliseconds At time $T_{1A}$ which is the end of the first integrating time interval $T_1$, the microcomputer 54 switches the switching circuit 50 to begin the second integrating time interval $T_2$ by applying a first reference DC source $I_1$ to the input of the integrator 51. This first reference DC source $I_1$ is then integrated to drive the integrator output level, which represents the sum of the integral obtained during $T_1$ and the integral being performed during $T_2$, along slope $S_2$ back towards and past the initial integrator output level $V_0$.

After initiating this second integrating interval $T_2$, the microcomputer begins periodically interrogating the output of the threshold detector 53 looking for the transition which indicates the crossover of the integrator output level with its initial level $V_0$.

Each time the microcomputer interrogates the output of the threshold detector 53 and finds that crossover has not occurred, it increments a memory register referred to as the $T_2$ register or $T_2$ counter which is assigned to accumulate such interrogation counts. Each such interrogation and counting cycle or instruction loop requires the identical time to perform which in the exemplary embodiment, is 65 m sec.

Eventually, at a time labelled $T_{2A}$ in FIG. 12B, the output of the integrator 51 crosses over its initial level $V_0$ causing the output of the threshold detector to switch from a high state to a low state. This transition may occur anywhere within an interrogation and indexing cycle or the end or beginning of such a cycle. However, because of the digital ambiguity the microcomputer 54 will not detect this transition until it interrogates the output of the threshold detector 53 at time $T_{2B}$.

When the switching of the output of the threshold detector 53 is detected at $T_{2B}$ by the microcomputer 54, no more interrogation and indexing cycle counts are accumulated in the memory register. Therefore, the digital count accumulated in the first memory register at time $T_{2B}$ represents the sum of the amplitude $(V_1-V_0)$ plus any overshoot $V_2-V_0$ of slope $S_2$, beyond level $V_0$.

On occasion, the coincidence of the integrator output with the threshold level $V_0$ will occur relatively near the end of a counting cycle. The possibility then exists that circuit switching, which occurs at the end of the computer interrogating cycles, may cause transients which might cause erroneous operation. For example, if the crossover occurs just before an interrogation of the output of the threshold detector 53 by the microcomputer 54 so that very little overshoot occurs, then the output level of the integrator will be close to the level $V_0$. If the next integrating interval $T_3$ were then begun, a computer clock pulse may cause the threshold detector 53 to switch states prematurely.

A unique feature of the present invention is that these crosstalk problems can be eliminated by providing an extra delay at the end of the $T_2$ interval after the microcomputer 54 has detected the $V_0$ crossover. Conveniently, this delay interval, labelled $T_{2C}$, can be made equal to one interrogation cycle and will cause the integrator output to be driven further along $S_2$ from $V_2$ and $V_3$. However, the count accumulating memory is not incremented so that no count is added to the memory register for that extra cycle.

After delay time $T_{2C}$, the computer 54 switches the switching circuit 50 to apply a second reference DC source $I_2$ to the integrator 51. This second reference DC source $I_2$ is substantially less than the first reference DC source $I_1$ which was integrated during interval $T_2$ because it is desired to integrate at a reduced slope $S_2$ in order to obtain more precisely the time of the coincidence of the integrator output with its initial level $V_0$. In the exemplary embodiment of the invention, the reference source which is integrated during the $T_2$ interval is 32 times greater than the reference source which is integrated during the $T_3$ interval. Therefore, the magnitude of the slope $S_2$ of the integrator output during interval $T_2$ is 32 times greater than the magnitude of the slope $S_3$ during interval $T_3$.

Upon the beginning of interval $T_3$, the microcomputer 54 again goes through interrogating and counting cycles just as it did during interval $T_2$. However, during interval $T_3$, the interrogating and counting cycles are counted by incrementing a memory register referred to as the $T_3$ counter or $T_3$ register. Then, as during interval $T_2$, counts continue to be accumulated in the second memory register until the first interrogation of the threshold detector 53 by the computer 54 which occurs after coincidence of the integrator output with the threshold level $V_0$. When the computer detects the resultant output level change of the threshold detector 53 at time $T_4$, the $T_3$ integrating interval and the count accumulation is stopped by the microcomputer 54.

At time $T_4$, the count accumulated in the second register during interval $T_3$, is directly proportional to and represents the difference between the integrator output level $V_3$ at $T_{2C}$ which is at the beginning of interval $T_3$ and the integrator output level at $T_4$ at the end of interval $T_3$. For computational purposes, the integrator output level at the end of $T_3$ is assumed to be $V_0$. Since this is a digital ambiguity within one of the counting cycles for the integration along the lesser slope $S_3$, it will be apparent from the following discussion that the error is less than one part in 30,000 at full scale capacity in the exemplary embodiment.

Nonetheless the time $T_4$, when the microcomputer detects the crossover, there will again be some overshoot past the initial level $V_0$ if the crossover occurs between periodic interrogations of the output of the threshold detector 53.

In order to remove the affect of this overshoot and accurately reset the integrator precisely to the identical $V_0$ prior to each integration, the microcomputer 54 switches the switching circuit 50 to effectively connect the integrator output to its input. This negative feedback drives the integrator output to $V_0$ following $T_4$ by effectively discharging the capacitor of the integrator 51. This is desirable because the current may drift prior to the next integrating cycle and because the overshoot and the end of the interval $T_3$ may produce an error in the time of crossover during the $T_2$ interval in which the integration is done along the steeper slope $S_2$.

The integration functions of the triple slope A/D conversion are completed with the accumulation in each of two memory registers of the digital count data taken along slopes $S_2$ and $S_3$. The microcomputer must now take this data and derive a digital number which is proportional to $V_1 - V_0$ and which therefore is proportional to the amplitude of the analog input signal which was integrated during time interval $T_1$.

The counts in the $T_2$ register are proportional to $V_1 - V_2$. The counts accumulated in the $T_3$ register are proportional to $V_3 - V_0$. However, these counts were derived from the integration of two different reference DC sources of substantially different amplitudes. Therefore each $T_2$ count represents a different and greater quantity of integrator output amplitude and thus a greater weight increment than is represented by each $T_3$ count. In the exemplary embodiment, the first reference DC source $I_1$ is 32 times greater than the second reference DC source $I_2$ and therefore each $T_2$ count represents 32 times as much amplitude (32 raw weight increments) as does each $T_3$ count.

In order to equalize the value of each count in the $T_2$ and $T_3$ counters, the microcomputer 54 first multiplies the $T_2$ count by the ratio of $I_1/I_2$ which in the exemplary embodiment is 32. There upon the result represents the raw weight increments.

By way of example, 600 interrogating and counting cycle counts may have been accumulated in the $T_2$ register in driving the integrator output from $V_1$ to $V_2$ and 45 interrogating and counting cycle counts may have been accumulated in the $T_3$ counter in driving the integrator output from $V_3$ to $V_0$ during interval $T_3$. Consequently, in accordance with the invention, the microcomputer will multiply 600 by 32 to obtain a product of 19,200 raw weight increments represented by $V_1 - V_2$.

The microcomputer then processes the $T_3$ count to convert it from a number representing $V_3 - V_0$ to a number representing $V_2 - V_0$. This is done by subtracting from the $T_3$ count a number of counts representing $V_3 - V_2$. Since the integration along slope $S_2$ from $V_2$ to $V_3$ required one interrogating and counting cycle during time $T_2$, that interval $T_{2C}$ represents the same amplitude as is represented by a number of $T_3$ counts which is equal to the ratio of the first reference DC source $I_1$ to the second constant DC source $I_2$. Consequently, the microscomputer subtracts that ratio $I_1/I_2$ from the accumulated $T_3$ count.

In the above example for the exemplary embodiment, the number 32 is the ratio which is subtracted from the $T_3$ count of 45 yield a difference of 13 counts. These 13 counts represent 13 raw weight increments represented by $V_2 - V_0$.

Therefore, the microcomputer can now arithmetically derive the number of raw weight increments represented by $V_1 - V_0$ by subtracting this difference of $T_3$ counts which represents $V_2 - V_0$ from 32 times the number of $T_2$ counts. In the example, the microcomputer subtracts 13 from 19,200 to yield 19,187 raw weight increments.

This digital number is proportional to the amplitude of the analog weight signal which was integrated during $T_1$. In the exemplary embodiment this digital represents weight increments which are referred to as raw weight increments herein.

Each weight indication is then filtered by an improved digital filter. Each weight, when obtained, is subtracted from the filtered weight and the difference divided by two. A one is then added or subtracted from the result to make the result approach the last weight and the last weight corrected by the final result.

This digital number of raw weight units is multiplied by the computer at a later time by the computer by a factor, depending upon the scale capacity to obtain the weight in the proper units for display.

The present invention maintains an accurate zero indication when the scale is not operating in the net mode and also maintains an accurate net zero indication in addition by updating the data stored in a tare weight register.

Tare weight data may be entered into a tare memory register by either of two methods. The digits of a tare weight may be keyed in through the keyboard 20 and this is referred to as a keyboard tare. The tare weight data may also be entered into memory by placing an empty container or other tare weight on the platter and depressing the "T" key. This is referred to as manual tare and causes the scale to read the tare weight and store it in the tare memory.

After a tare weight is properly entered by either of these operations, the computing and weighing scale displays the net weight, which is the difference between the weight of an object on the platter and the weight data stored in the tare register. Consequently, an object weighing the same as the tare weight, for example, the same empty container, should cause a zero net weight to be displayed. A lessor weight on the platter will generate the display of a negative weight.

Unfortunately, creep, hysteresis effects and drift may cause an object on the platter to generate slightly different tare weight data at different times. Similar difficulties have been observed in the maintenance of a gross zero indication as described in Loshbough et al, U.S. Pat. No. 3,986,012. In that situation, a separate auto zero register is used to store a correction factor for automatically correcting the gross zero indication. However, it has been discovered that the same auto zero register cannot be used for net zero tracking because whenever the scale reverts from a net mode of operation back to its gross mode, the auto zero register would still contain net zero tracking data and be erroneous for gross auto zero correction purposes.

The invention involves the periodic updating of the tare weight data to track such wander in order to maintain the display of a zero net weight under the conditions for which a zero net weight should be displayed and in order to use the most recently detected and most accurate tare weight data as a reference which is subtracted from total gross weight to compute net weight.

Each time the microcomputer 54 computes a net weight, it examines that weight data to determine whether the tare weight data should be modified. If the net weight is found to be exactly zero, then no drift has occurred and no tracking is necessary. Since a zero indication already exists, the microcomputer skips the remaining net zero tracking sequence of operations.

However, if the computed net weight is not exactly zero, it is then examined to determine whether it is close enough to a net weight of zero that its departure from zero can be attributed to creep, drift or hysteresis effects rather than to a change in the weight placed on the platter.

This decision, whether the net zero tracking should actually be performed, is made by determining whether the net weight is within a preselected, narrow, weight range or band centered about a net weight indication of zero. Therefore if the computed but non-zero net weight is outside this range, the remainder of the net zero tracking sequence of operations is skipped. However, if it is within the range, net zero tracking is performed by modifying the previously stored tare weight data to compensate for the shift or wander of the net zero.

Data representing the preselected range within which net zero tracking is performed is permanently stored in the memory of the microcomputer 54. In the exemplary embodiment of the invention this range is a predetermined number of increments which represent different weights for each scale capacity so the net zero tracking sequence of operations is done with data which has already been multiplied by a scale conversion factor to represent output increments of weight rather than units of raw weight increments.

For example, in the exemplary embodiment, for the following scale capacities, the net weight must be within the following ranges in order for the tare weight data to be modified to track the net zero:

| Scale Capacity | Range |
| --- | --- |
| 6kg × 0.002kg | ±0.0008kg |
| 15kg × 0.005Kg | ±00.0002kg |
| 30 lb × 0.01 lb | ±00.004 lb |

If the net weight is within the preselected range for the selected scale capacity, then the microcomputer modifies the tare weight register in a direction which will reduce the next computed net weight by one increment of its least significant digit.

If the net weight is within the preselected range for the selected scale capacity, then the microcomputer modifies the tare weight register in a direction which will reduce the next computed net weight by one increment of its least significant digit.

This is done by algebraically adding to the tare weight data a one having the same sign as the previously computed net weight.

For example, for the 30 lb×0.01 lb capacity, a computed net weight of +00.002 pounds will cause a +1 to be added to the least significant digit of the tare weight data, any carry being appropriately propagated. If the stored tare weight was 00.192 pounds it will become 00.193 pounds. Therefore, the next time a net weight is computed for the identical gross weight data, the net weight will be +00.001 pounds.

If the gross weight data does not change, continued repetition of the above sequence of operations will continue to increment the stored tare weight data ultimately to cause a net weight indication of 00.000 pounds. Thus, in the exemplary embodiment 00.00 will be displayed when only the 4 most significant digits are displayed. The repetition of these net weight tracking operations occur approximately five times per second in the exemplary embodiment.

The exemplary embodiment of the invention incorporates and cooperates with many features shown in U.S.

Pat. Nos. 3,962,569; 3,962,570; and 3,986,012; and in U.S. applications Ser. Nos. 573,162 and 729,911 which are incorporated herein.

However, these features are briefly described to the extent which is helpful to enable those skilled in the art to construct an embodiment of the invention and to practice the invention.

The exemplary embodiment comprises a digital weighing and computing scale to determine the weight of merchandise, to compute the total price or value of the merchandise and to display, and optionally to print, the price per unit weight, the weight of the merchandise and the total value or total price of the merchandise.

FIG. 1 is a block diagram of the exemplary embodiment of the invention and was broadly described above. The exemplary embodiment has input and output structures which may be explained in more detail.

The first input device is the load cell 40 linked to a platter 12 upon which merchandise is supported. The load cell 40 provides the analog output signal which is related to the weight of the merchandise.

The second group of inputs comprises operator accessible switches 20 including a "PREPACK on/off" switch 16 for selecting a prepack mode of operation and a keyboard 20 having keys labelled and physically arranged as illustrated in FIG. 1. The "PREPACK on/off" switch is not provided for UK modes of operation when Half Pence pricing is used. While the "PREPACK on/off" switch 16 is not electrically a part of the keyboard, it is conveniently positioned adjacent the keyboard for ease of access by the operator.

The third group of inputs comprises a plurality of programmable mode selector switches 22 which are selectively switched at the factory or by a service technician in the field and are inaccessible to the operator. These mode selector switches 22 are labelled as indicated in FIG. 1 and are switched to those operational modes which are appropriate for the weight and currency units, legal standards and requirements and to the merchandising and pricing methods of the particular store in which the weighing and computing scale will be used.

The weighing and computing scale embodying the present invention also has three groups of output devices. The first group consists of two identical sets of three numerical display devices 24. One set is mounted so that it is visible to the scale operator and a duplicate set is mounted to be visible to the customer or purchaser of the merchandise.

Each display device contains five, cold cathode, gas discharge display digits with three lower commas, each digit having seven segments to display any number from zero through nine. The three displays of each duplicate set ordinarily display price per unit, net or gross weight and total value.

The second output group comprises a pair of duplicate front and back indicator lamp displays, one facing the operator and one facing the purchasing customer. Each indicator lamp display has six translucent windows upon which labels are printed and which are at times backlighted by suitable lamps for making the labels visible. As illustrated in FIG. 1, the labels include "Zero", "NET", "PREPACK", "¼", "½" and a sixth legend which is alternatively labelled at the factory either "LB" or "KG".

The third output is a printer 28 which is optional.

The "Z" key 17 is operated to zero or null the scale. After power is first applied to the weighing and computing scale embodying the present invention or after a power interruption, no unit price data or tare weight data will be accepted and no total price or value will be displayed until the exemplary embodiment has been so zeroed. The scale may also be zeroed at other times using the "Z" key.

The scale is zeroed in response to depression of the "Z" key 17 when no substantial weight is on the scale by loading the presently detected weight into a memory register for subsequent use as a correction factor. In subsequent weight measurements this correction factor is subtracted from the detected weight to provide a corrected weight. Consequently a zero weight indication will be displayed when there is no weight on the scale.

In order for the exemplary embodiment to perform the zero operation in response to depression of the "Z" pushbutton 17, all of the following four conditions must exist. These interlocks prevent the customer from being defrauded by intentional or accidental creation of an erroneous zero. First, the "Z" pushbutton 17 must be depressed continuously for at least 1.5 seconds. Second, the platform of the scale must have been motionless for a predetermined interval of time. Third, there must be no tare weight data stored in the memory registers of the exemplary embodiment. Fourth, there must be no significant weight on the platter.

Shortly after the exemplary embodiment has been zeroed in this manner the lamp behind the "ZERO" legend of the indicator lamp display 26 will be illuminated.

The keyboard 20 is a 4×5 matrix in which 15 of its key positions are used. The 10 keys labelled "0" through "9" are used to key in price per unit information and, under conditions subsequently described, may be used to key in a tare weight.

Tare weight data may be entered into memory registers in one of two ways. First, a known tare weight may be keyed in by using the keys labelled "0" through "9" of the keyboard 20 and then subsequently depressing the "T" key within two seconds after entry of the last tare weight digit. Such a keyboard entry of tare weight data is accepted only if the corresponding mode of operation is selected by the appropriate mode selector switches 22. Second, an empty container or other object of unknown tare weight may be positioned on the platter 12 and the "T" key then depressed to cause the exemplary embodiment of the invention to automatically store in memory the weight of that object as the tare weight. This is termed a manual tare operation. A tare weight will be accepted and entered into memory only when certain conditions exist which are described in connection with FIGS. 14A–14Z in the detailed description of the operation of the exemplary embodiment.

If an operator discovers that erroneous tare weight data has been entered, the tare data may be cleared by pressing the key with the numeral "0" and then pressing the "T" key within 2 seconds of the operation of the "0" key. However, such a clearing of the tare data will only be accepted and the tare data will be cleared only if the net weight on the scale is less than 10 scale increments. This prevents the defrauding of a customer by the erroneous clearing or changing of the tare data while an object is on the platter.

After the entry and acceptance of tare weight data, the "NET" legends of the indicator lamp displays will be backlighted to signify that the exemplary embodiment is in a net mode of operation and therefore that its displayed data is a net weight.

If tare weight data has been entered by a manual tare, then the removal of the container will cause the exemplary embodiment to display the tare weight preceded by a negative sign.

The ten digit keys 0 through 9 are used to enter the price per unit weight either after tare data has been entered into memory or, under no tare conditions, by keying in the price per unit and failing to depress the "T" key.

The fraction keys 21 and 23 bear, respectively, the legends "½" and "¼". These fraction keys are depressed to input the information that the pricing is per ½ unit or ¼ unit of weight. Depression of a fraction key 21 or 23 at the appropriate time will cause the corresponding fractional legend on the indicator lamp displays 26 to be illuminated.

The "CLEAR" key of the keyboard 20 may perform two different functions. First, any price data which has been entered may be cleared by depressing the "CLEAR" key. Second, when the "CLEAR" key is pressed and held in a depressed position, all output displays will be blanked or held off. If the pushbutton is released and subsequently again held in a depressed state, all display segments and all display indicating lamps will be turned on.

These two modes permit the displays to be checked to make certain that there are no short circuits which are erroneously turning on display segments and no open circuits which are preventing display sigements from being turned on.

When the weighing and computing scale embodying the present invention is used with a printer 28, the operator may depress the "PRINT" key to initiate the printing of an appropriate label bearing the price per unit, the total weight and the total value.

The manually programmable mode selector switches 22 comprise a plurality of individually operable, single pole, single throw switches. Their functions are enabled, that is their labelled conditions exist, when the switches are on or made.

The exemplary embodiment of the present invention has three selectable scale capacities, these are: 15.000 kg×0.005 kg., 30.00 lbs.×0.01 lbs. and 6.000 kg×0.002 kg. For selecting the particular scale capacity which is desired, two capacity-enabled mode selector switches are provided, a first switch 1 for selecting the 6 kg scale and a second switch 2 for selecting the 30 lb capacity. If both of these mode selector switches are off, then 15 kg scale capacity is chosen.

Under most conditions, the price per unit and the total price will be four digit numbers from 0 to 99.99. However, mode selector switches are provided to permit either or both of the price per unit and the total price to be displayed as a five digit number. Selection of these modes is accomplished by switching to the on position the mode selector switch 3 labelled "5 digit unit price" and/or the mode selector switch 4 labelled "5 digit total price."

A mode selector switch 5 labelled "x10 EXPAND" provides a mode which increases displayed resolution by causing the display of the raw weight increment data. This mode may be used when calibrating, servicing or testing the exemplary embodiment.

A mode selector switch 6 labelled "PRINT INHIBIT", when switched to its on position, will cause printing to be inhibited for weights less than 20 scale increments. A mode selector switch 7 labelled "KEYBOARD TARE ENABLE" is switched on to permit tare weights to be entered on the keyboard as described above.

The mode selector switch 8 labelled "AUTO-CLEAR PRICE AND TARE" may be switched to its on position so that whenever the scale weight goes above ten scale increments and remains above ten increments for one second or longer and then returns below ten scale increments, the price per unit data and the tare weight data will be automatically cleared. This avoids the necessity of requiring the operator to manually clear the price per unit data and tare weight data each time merchandise is weighed.

A "TARE MANDATORY" mode selector switch 9 may be switched to its on position to require the input of a tare weight before the exemplary embodiment will compute and display the total price.

The mode selector switch 10, labelled "300 PRINTER ENABLE" is provided for use with the model Toledo/300 Automatic label printer manufactured by the Toledo Scale Division of Reliance Electric Company. When switched to its on position, it limits the printing of price per unit, weight and total value to four digits each.

Mode selector switch 12 labelled "UK" enables half penny pricing for the United Kingdom.

The mode selector switch 13, labelled "PRICE PER UNIT", is switched to its on position whenever it is desired to permit factor pricing (e.g., price per ¼ and ½ pound), to be entered on the keyboard and yet have the price per pound displayed.

In some areas a "price by count" mode of operation is desired. To allow this mode to be elected, the "PREPACK on/off" switch 16 may be provided in an alternate embodiment with a third position labelled "price by count".

When the "PREPACK" switch 16 is switched to its on position, the previously entered price per unit data and tare weight data will not be automatically cleared regardless of the position of the mode selector switch 8. The "PREPACK" switch 16 causes the "PREPACK" legend to be backlighted and overrides the mode selector switch 8 so that re-entry of the identical price per unit and tare weight after each weighing operation will not be necessary.

In addition to the operational modes and functions already described above, the exemplary embodiment of the present invention automatically performs several other operations regardless of the selected mode.

Automatic gross zero compensation or auto zero tracking compensates the scale for minor off-sets from a zero weight after correction. Whenever the presently detected and corrected weight is within 4 raw weight increments of zero, the correction factor is modified to automatically bring the corrected weight to within one raw weight increment of zero. This automatic gross zero compensation will occur for variations in zero which occur at a rate of 5 raw weight increments per second or slower so long as the total compensation, that is the total correction factor, is within ±400 raw weight increments. The exemplary embodiment of the invention also provides net zero tracking as previously described.

It might be noted by way of further explanation, that the "Z" key 17 causes the capture range of the automatic gross zero tracking system to be extended from ±4 raw weight increments as described above to ±400 raw weight increments.

The exemplary embodiment of the invention is also provided with a motion detection system which detects weight changes greater than ±0.5 displayed increment per 1/5 second. The detection of such platter motion causes the display lamps behind the legend "LB" or "KG" to be turned off and signals to the remainder of the circuitry of the exemplary embodiment that a motion condition exists.

A gross weight exceeding the scale capacity by more than 5 scale increments causes the weight display and the total value or total price display to be blanked.

A total price calculation in excess of the digit nine in all four character positions of the total price register (or alternatively all five if the five digit total price mode is selected) will cause the total price display to be blanked.

The circuitry of the weighing and computing scale illustrated in FIG. 1 is shown in detail in the schematic diagrams of FIGS. 3 through 11. FIG. 2 shows how FIGS. 3 through 8 are associated to illustrate the complete circuit. The random access memory assignments are illustrated in in FIG. 13 and are discussed in connection with the subsequent description of the detailed operation of the exemplary embodiment.

FIG. 3 illustrates a load cell 40 which is mechanically linked to the platter 12 and includes four resistive strain gage elements which are connected in a Wheatstone bridge arrangement 70. Typical scale mechanisms suitable for cooperating in the embodiment of the invention described herein are shown in U.S. Pat. No. 3,847,238 granted to D. L. Hall, et al., on Nov. 12, 1974 and in U.S. Pat. No. 3,074,496 granted to L. S. Williams on Jan. 22, 1963.

Electrical power from the regulated power supply 42 is applied across one pair of opposite terminals of the bridge 70. The other pair of opposite terminals of the strain gage bridge 70 forms the output of the strain gage bridge and is connected to the input of the preamplifier 44. With no strain, the bridge 70 would be balanced and the output would be zero volts. In this state each output terminal of the strain gage bridge is at the same potential intermediate the potentials of the terminals of the regulated power source 42. However, in practical application the strain gage bridge 70 will be under the stress of the platter and other mechanical linkages.

Any weight positioned on the platter 12 will further deform the resistive element of the bridge 70 causing a variation in their resistance and unbalancing of the bridge. In this manner an output analog voltage is obtained from the strain gage bridge 70 which is related to the weight of the object on the platter 12 and is applied and amplified by the preamplifier 44.

The preamplifier 44 has two differential operational amplifiers 72 and 74 which are connected to form a differential amplifier presenting a very high input impedance to the output of the strain gage bridge 70 so that there is substantially no current drain from the bridge 70 while still providing a preamplifier which is a true differential amplifier rejecting all common mode voltages such as drift or changes in the bridge excitation voltage.

The non-inverting input of the OP-AMP 72 is connected to one of the output terminals of the strain gage bridge 70. The other output terminal of the bridge 70 is connected to the non-inverting input of OP-AMP 74. The OP-AMP 74 provides a substantially unity gain amplifier with its output fed across to the inverting input of the OP-AMP 72. In addition, the inverting input of the OP-AMP 74 is connected to the wiper of a potentiometer 76 which is used to shift the output level of OP-AMP 72. The potentiometer 76 is manually adjusted to compensate for small differences in the mechanical and electrical parameters of production parts and circuits to provide a total effective analog signal component resulting primarily from loading of the strain gages 70 when the platter has no object placed thereon. Thus known analog signal component or analog offset is subsequently removed by a subtraction in the digital data processing circuitry.

Referring now to FIG. 4, the output 80 of the preamplifier 44 provides a voltage having an amplitude proportional to the sum of the analog offset and the signal change resulting from an object being placed on the platter 12 and is applied to an active filter circuit 46. This active filter circuit 46 is a low pass filter designed to filter out scale platform or platter vibration. The output circuit of the active filter 46 includes a span adjustment potentiometer 92 which is connected as a simple voltage divider for adjustably selecting the desired proportion of the filtered analog weight voltage to be applied through the switching circuit 50 to the integrator 52 at the appropriate time. This potentiometer adjusts the analog circuit gain to a value suitable for the various scale capacities.

The switching circuit 50 under the control of the microcomputer 54 (see FIG. 1) may be used to selectively gate one of four possible inputs through four field effect transistors to the input 98 of the integrator 51. The four alternatively selectable inputs are: (1) the analog weight signal from the wiper of the potentiometer 92 which is applied through a resistor 85 and FET 94; (2) a reference DC source applied through resistor 87 and FET 95; (3) a second reference DC source which is applied through resistor 91 and FET 96; and (4) a reset signal applied through resistor 93 and FET 97. In the exemplary embodiment, resistors 85, 87, and 91 are all 500 K ohms.

Figure 9:
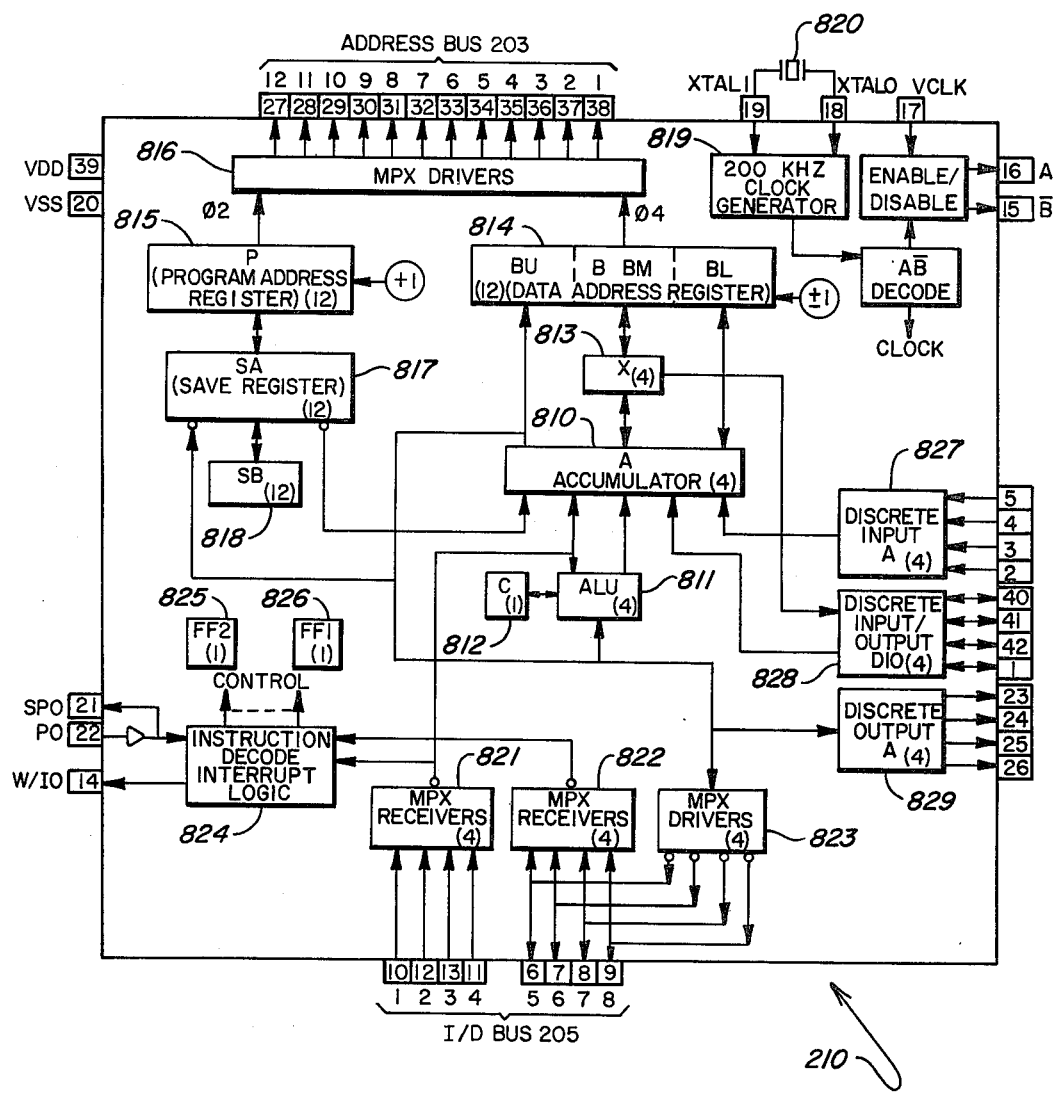
FIGS. 9 through 11 are block diagrams of the integrated circuits forming the central processor, memory and general purpose keyboard and display interface devices used in combination with the circuitry of the exemplary embodiment of the invention.

The gates of four FETS 94, 95, 96, and 97 are connected to four discrete input-output terminals, 1, 42, 41, and 40 of the CPU as illustrated in FIGS. 5 and 9 so that the CPU can control these gates.

As previously described in the exemplary embodiment, the amplitude of the first reference DC source, which is integrated during the second integration interval $T_2$ of the triple slope A/D conversion, is 32 times greater than the second reference DC source which is integrated during the third integration time interval $T_3$.

This is accomplished in the exemplary embodiment by referencing the input to the integrator 51 to a particular non-zero potential rather than to ground. In particular, series resistors R and R/32 shown in FIG. 4 form a voltage divider between the power supply potential of −15 volts and ground. Resistor R is 32 K ohms and resistor R/32 is 1 K ohm. Therefore, the reference potential which is always applied to the noninverting input of OP-AMP 99 of the integrator 51 has an amplitude equal to 1/33 of the power supply potential and has the same polarity. In the exemplary embodiment this reference potential fixed is at −(15/33) volts relative to ground potential by resistors R and R/32.

During the first integrating interval $T_1$ of the triple slope conversion, a positive analog weight signal is normally applied to the integrator 51. Then, during the second interval $T_2$, the −15 volt power supply provides the first reference DC source having a polarity opposite to the polarity of the analog weight signal and having an amplitude of $-(32/33)\times 15$ volts relative to the reference potential at the noninverting input of the OP-AMP 99.

During the third integrating interval $T_3$, FET 96 is switched on to apply a second reference DC source to the integrator which is derived through resistor 91 from ground potential. Since ground potential is positive with respect to the reference voltage at the noninverting input of OP-AMP 99 and has an amplitude of 15/33 volts, the connection of the integrator input 98 to ground through resistor 91 effectively provides a second reference DC source during interval $T_3$ which is both opposite in polarity to and 1/32 the amplitude of the reference DC source applied during interval $T_2$.

Except for this manner of referencing the integrator 51, it is a conventional integrator circuit including an integrating capacitor 100.

The output of the integrator 51 is applied to the amplifier 52 and through it to the threshold detector 53. The amplifier 52 comprises an OP-AMP 104 and is provided to amplify the output of the integrator 51 to make the slope of the output of integrator 51 steeper so that the time of its crossover with its initial level can be more accurately determined.

The threshold detector circuit 53 includes an OP-AMP 106. It is simply a high gain amplifier which is driven from one saturation to the other when its input voltage crosses zero.

FIGS. 5–8 show the details of the input and output devices and circuitry and the digital data processing and control circuitry.

In accordance with the present invention the microcomputer 54 of FIG. 1 may be any of several suitable types of commercially available microcomputers or other similar control circuitry including wired components of types well known in the computer and electronics arts.

In the exemplary embodiment of the invention, the microcomputer 54 is essentially a PPS-4 parallel processing, microcomputer system developed by and using devices manufactured by Rockwell International Corporation. The microcomputer 54 is comprised essentially of a central processing unit or CPU which in the exemplary embodiment described herein is a Rockwell PPS-4/2 unit and a memory unit having both read only memory or ROM for storage of program and fixed constants and also random access memory or RAM for storage of data for use in processing. The preferred memory used with the exemplary embodiment of the invention is a Rockwell P/N A17XX device.

In addition to its connection to the output of the Threshold detector 53, the microcomputer 54 is also directly connected to the mode selector switches 22, the printer 28, the "Z" key 17, and the "PREPACK ON/OFF" switch 16. The microcomputer 54 is also connected to the front and back indicator lamp displays 26 through suitable interfacing latching, decoding and driving circuitry 56.

Finally, the microcomputer 54 is also connected to a general purpose keyboard and display interfacing device 58 for interfacing the keyboard 20 and the front and back digit displays 24 with the microcomputer 54. A general purpose keyboard and display interface or GPKD interface 58 is employed which is the exemplary embodiment described herein comprises a device manufactured by Rockwell International Corporation and designated P/N 10788. This unit, under the control of the microcomputer 54, receives and temporarily holds data keyed in on the keyboard 20 for subsequent transmission to the microcomputer 54. The GPKD interface unit 58 also receives data from the microcomputer 54 which is applied through decoder/drive logic 60 to the front and back digit displays 24 under control of the microcomputer 54. The Rockwell PPS 4 microcomputer system uses four bit data words, eight bit instruction words and in the exemplary embodiment of the present invention twelve bit address words all of which are parallel transferred within the system.

Figure 6:
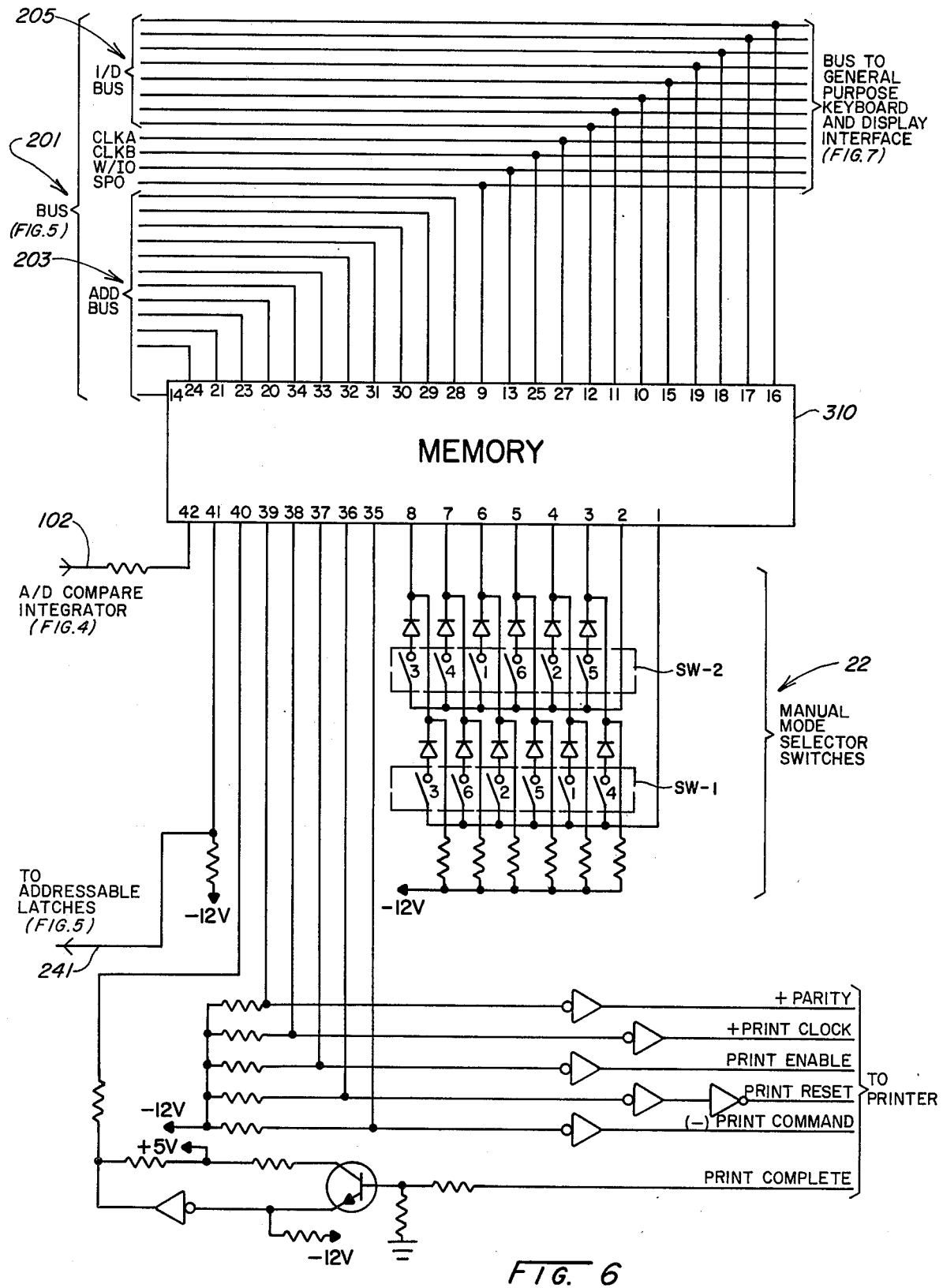
Figure 7:
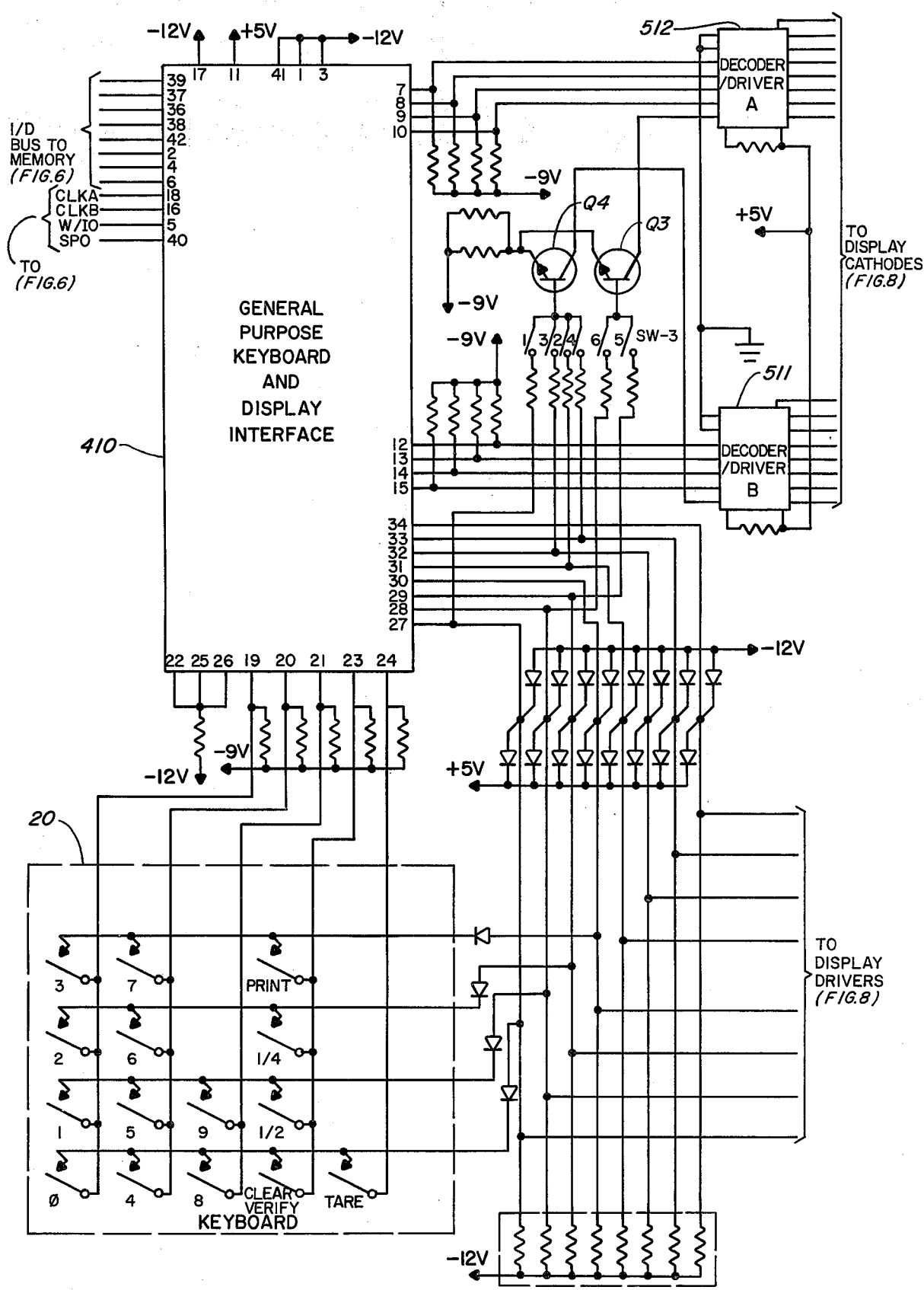

Referring now to FIGS. 5–8, at the top of FIG. 5 is shown the bus system 201 interconnecting the CPU 210 of FIG. 5, the memory 310 of FIG. 6 and the GPKD 410 of FIG. 7. The bus system 201 includes a twelve line address bus 203 which is connected only to the memory 310 for addressing the RAM and ROM memory. The bus 201 further includes an eight line instruction/data bus 205 which transfers, at different times, either eight bit instruction words or two four bit data words bidirectionally. The bus 201 further includes two clock lines, CLKA and CLKB, a write command line and an input/output enable line W/I0 for use during one clock phase time for instructing the RAM memory to write and for use during another clock phase time for disabling the RAM memory and enabling the input/output devices for the performance of an input/output instruction. The bus system also includes a "synchronized power on" CPU output line labelled SPO for use in initializing other devices in the circuit.

The CPU 210, which is shown as a single block in FIG. 5, is illustrated in greater detail in FIG. 9. FIG. 9 is a block diagram available with technical information from Rockwell International, Inc.

The CPU 210 as shown in FIG. 9 has an accumulator 810 which is the basic work register of the CPU. It also has an arithmetic logic unit 811 with a carry register 812 and an X register 813 all connected to the accumulator 810. The CPU 210 further has a data address register 814 and a program address register 815 which may be selectively interconnected with the address bus 203 output pins 27 through 38 through the multiplex driver circuits 816. The CPU 210 has two program address save registers 817 and 818 to provide two levels of subroutine stacking. The Rockwell CPU PPS 4/2 is provided with internal clock 819 when a suitable crystal 820 is connected to its pins 18 and 19. The instruction/data bus 205 is connected to pins 6 through 13 which in turn are connected to multiplex receivers 821 and 822 and the multiplex driver 823. Incoming instructions are decoded by the CPU in its instruction decode logic 824 and two separate flip-flops 825 and 826 are provided for program use.

In addition to the bus input/output capabilities, the CPU 210 is provided with 12 discrete input/output pins, four from each of the three registers 827, 828, and 829. These are connected as illustrated to pins 1–5, 23–26, and 40–42.

Referring back to FIG. 5, the discrete input/output register 828 of the CPU as shown in FIG. 9 is connected as shown in FIG. 5 to the four control lines labelled $T_1$, $T_2$, $T_3$, and "Reset" which extend to the switching circuit 50 in order to control the integrations of the triple slope A/D conversion. The crystal 820, shown in FIG. 5, controls the frequency of its internal clock generator which is preferably 0.20 MHZ.

A time delay circuit 222 FIG. 5 is provided for delaying the CPU 210 and in particular its program counter (which must be returned to 0000) after power is first applied or after a brief power interruption or momentary power failure.

The "PREPACK ON/OFF" switch 16, the "Z" pushbutton 17 and the "x10 EXPAND" mode selector switch 5 are connected to the discrete input 827 (see FIG. 9) at pins 2, 3, 4, and 5 of the CPU 210 as shown in FIG. 5.

The front and back indicator lamps 26 are connected through lamp drivers 242 to addressable latches 240. The addressable latches 240 respond to the incoming data and apply the data to the appropriate indicator lamps 26. More specifically, the latches are addressed from output pins 23, 24, and 25 of the CPU 210. With three such address lines, any of the seven indicator lamps 26 may be selected or addressed. The addressable latches are enabled by the output of terminal 26 of the CPU 210 and enabled latch is then controlled by data transmitted over line 241 from the memory input/output port terminals 41 shown in FIGS. 6 and 10.

As illustrated in FIG. 5, output terminals 23-26 of the CPU 210 also provide four bit data to the printer.

Figure 10:
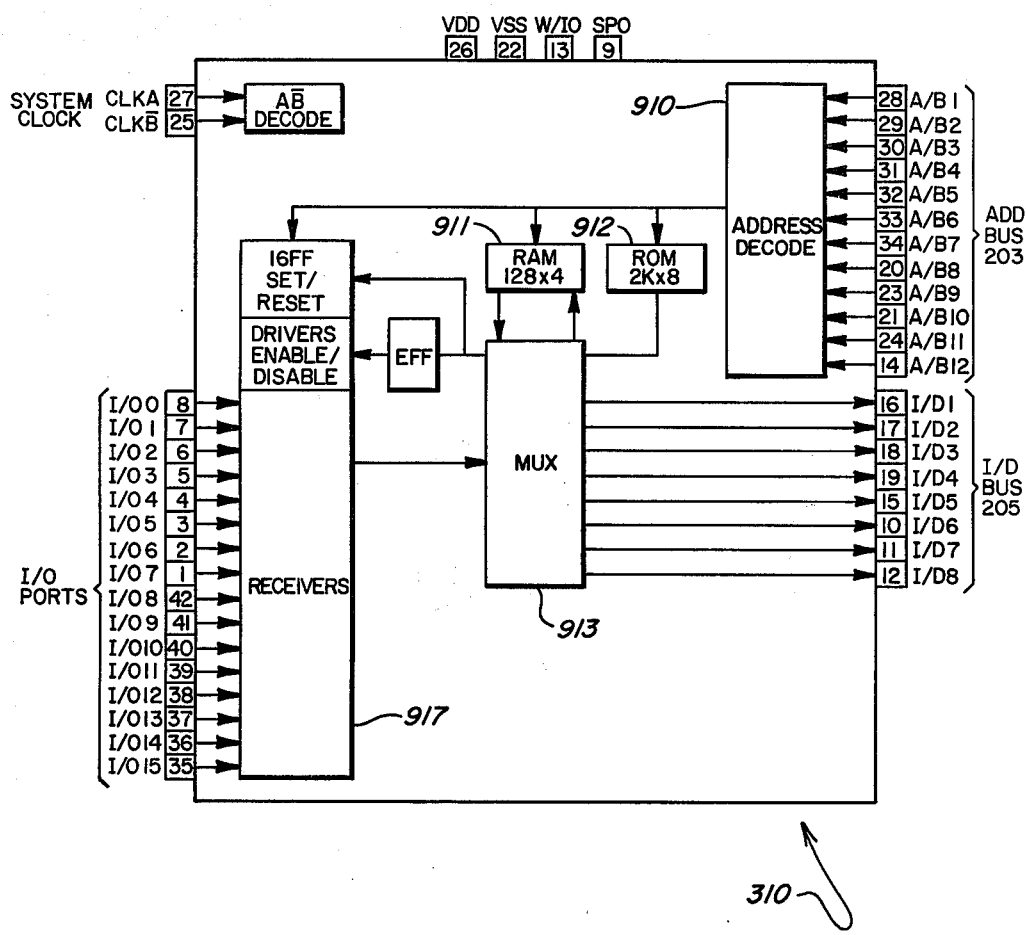

FIG. 6 illustrates, in block form, the memory 310 which is illustrated in greater detail in FIG. 10. Referring to FIG. 10, the memory includes both RAM memory 911 and ROM memory 912. These are connected to the instruction/data or I/D bus 205 through a multiplexer 913 which is connected to pins 10-12 and 15-19. An address decoder 910 is connected to the address bus 203 through pins 14, 20, 21, 23, 24, and 28-34. The memory 310 further has sixteen discrete input/output ports connected at pins 1-8 and 35-42 through receiver buffers 917 to the multiplexer 913.

The read-only memory 912 has a storage capacity of 2k eight bit words, any of which may be addressed over the address bus 203 and its stored eight bit word returned to the CPU over the instruction/data bus 205.

The random access memory 911 has 128 four bit storage registers for storing four bit words. Dependent upon the clock phase and the state of the W/I0 line connected from terminal 14 of the CPU to terminal 13 of the memory, the addressed memory register will read its four bit contents out onto the instruction/data bus 205 and will write, if so instructed, a new four bit word from the CPU into the addressed register through the multiplexer 913.

Returning to FIG. 6, the output 102 from the threshold detector 53 illustrated in FIG. 4 is applied to one of the discrete input/output ports at pin 42 of the memory 310.

Eight other discrete input/output ports connected to pins 1-8 of the memory 310 are connected to the twelve manual mode selection switches 22 illustrated in FIG. 6. Half of the twelve switches, labelled SW-1, are connected between pin 2 and through diodes to pins 3-8 of the memory 310. The other half of the twelve switches, labelled SW-2, are connected between pin 1 and pins 3-8. Each of the individual switches of both switches SW-1 and SW-2 are individually and independently actuable and each is labelled with a number which corresponds to the function listed in block 22 on FIG. 1. Consequently, the microcomputer 54 can interrogate the condition of switches SW-1 by strobing pin 2 and examining the data of lines 3-8 and can interrogate switches SW-2 by strobing pin 1 and examining the data of pins 3-8. It is to be understood that any particular one of these switches may be assigned any particular operational mode function.

Printer control signals are applied to the printer from the five discrete input/output memory ports 35-39 of the memory 310 illustrated in FIG. 6. The "print complete" signal when received from the printer is applied to the discrete input/output port 40 of the memory 310.

Figure 8:
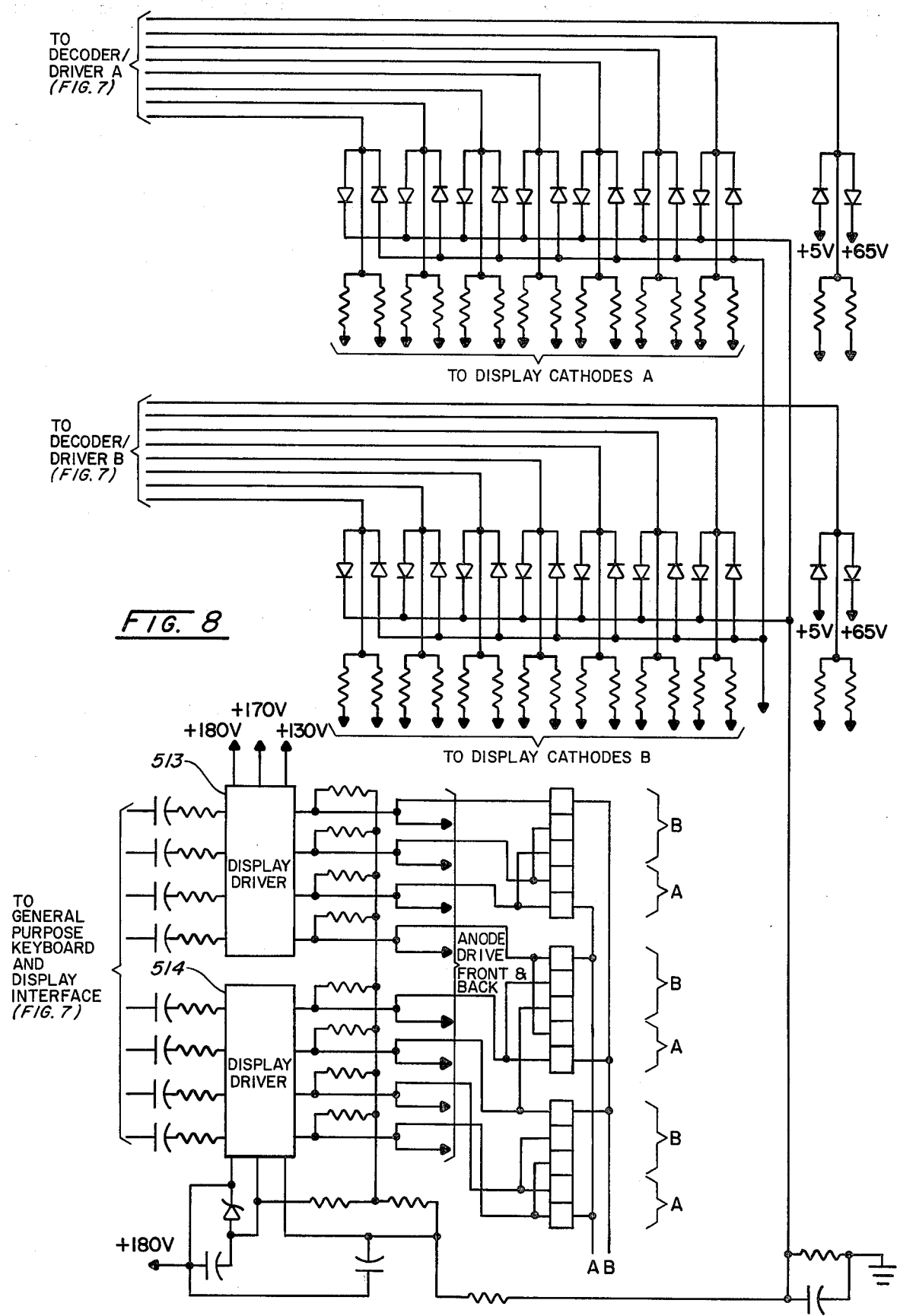

FIG. 7 includes, in block diagram form, the general purpose keyboard and display interface 410. FIGS. 7 and 8 illustrate the keyboard 20 and display drivers connected thereto.

The GPKD interface 410 used in the exemplary embodiment is a device manufactured by Rockwell International Corporation and given their type number P/N 10788. It is interconnected with the memory 310 and the CPU 210 through the data bus 205 as well as the clock A, clock B, synchronized power on and write/input-output lines of the bus 201.

Figure 11:
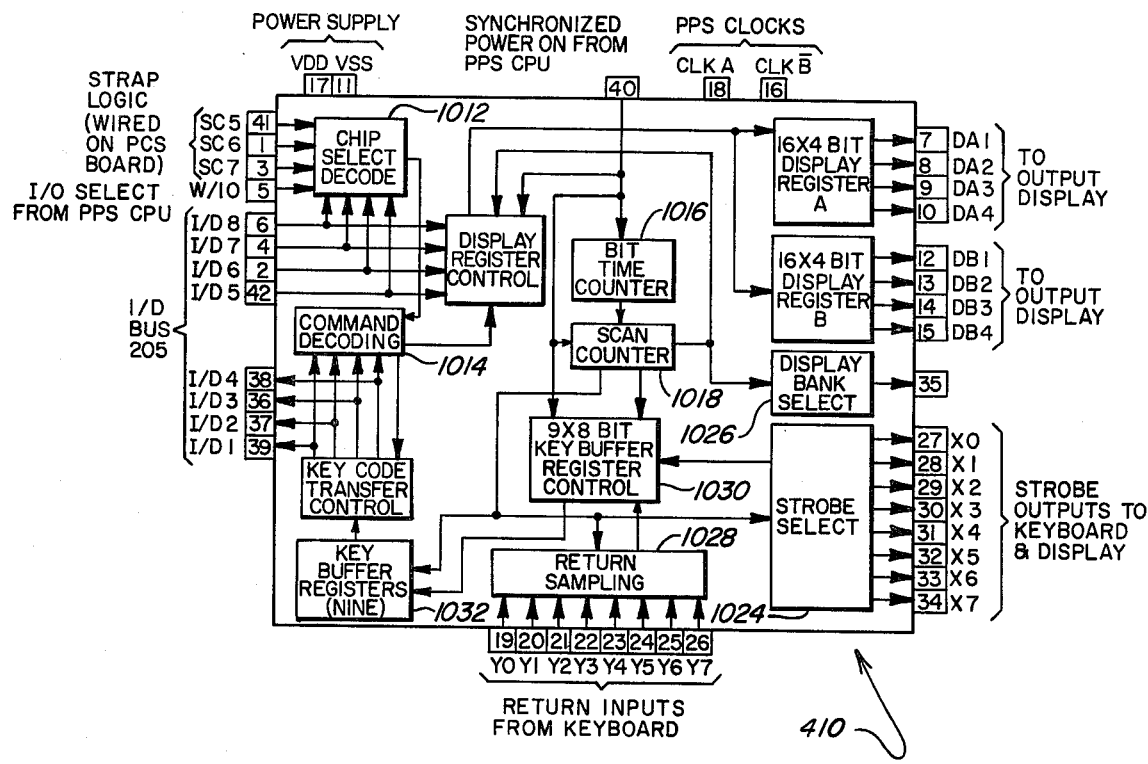

A block diagram of the circuit of the GPKD interface 410 is illustrated in FIG. 11. Referring to FIG. 11, chip select decode circuit 1012 compares the chip address data applied by the CPU 210 to pins 2, 4, and 42 of the GPKD over the instruction/data bus to the data on the chip select straps at pins 1, 3, and 41. If the strapped address is identical to the address on the instruction/data bus, if the instruction/data line connected to pin 6 is true and if the write/input-output mode has been selected by the CPU so that the CPU has trued the W/I0 input pin 5, then the GPKD is selected to execute the command.

The command is applied to the GPKD from the CPU 210 over that half of the instruction/data bus which is connected to pins 36 through 39. The command is decoded by the command decoding logic circuitry 1014. A bit time counter 1016 is provided to divide the clock frequency from the PPS clock and apply its output to a scan counter 1018. The scan counter 1018 provides timing signals for the display register control display bank select 1026, return sampling 1028, key buffer register 1032, and control 1030 and strobe select circuit 1024.

The GPKD of FIG. 11 includes two display registers A and B, which store display data. These display registers store data from the instruction/data bus and, upon command, output the data to their associated displays.

The strobe select circuit 1024, with its eight output pins, 27 through 34, sequentially outputs eight strobe signals to its eight output pins. These outputs may be used to strobe an 8×8 keyboard matrix or for multiplexing display characters.

The return sampling circuit 1028 receives data from the strobed keyboard indicating the states of the key matrix return lines from the keyboard. When a key closure is detected at the return sampling circuit 1028, the key buffer register control circuit 1030 loads the key code for that key into the buffer register 1032. Subsequent key closures which are detected may also be stored in the key buffer registers 1032 until they are called for by and transferred to the CPU on a first in, first out basis.

Returning to FIG. 7, the eight strobe select output pins 27 through 34 are applied four to the display driver 513 of FIG. 8 and four to the display driver 514 of FIG. 8. The outputs of the display drivers 513 and 514 are applied to the anode drive terminals of the front and back displays.

Referring to FIG. 7, since various decimal point locations are required by the various countries, a switch labelled SW-3 consisting of six individually operated single pole, single throw switches is associated with transistors Q3 and Q4 selectively enabling those digit positions in which decimals may be displayed.

Four of the strobe select lines at pins 27 through 30 of the GPKD 410 are additionally applied to the four input strobe lines of the keyboard matrix of the keyboard 20. The keyboard return lines are connected to pins 19 through 21, 23 and 24 of the return sampling inputs of the GPKD 410. These permit interrogation of the keyboard for key depressions.

OPERATION OF THE SYSTEM

Figure 14A:
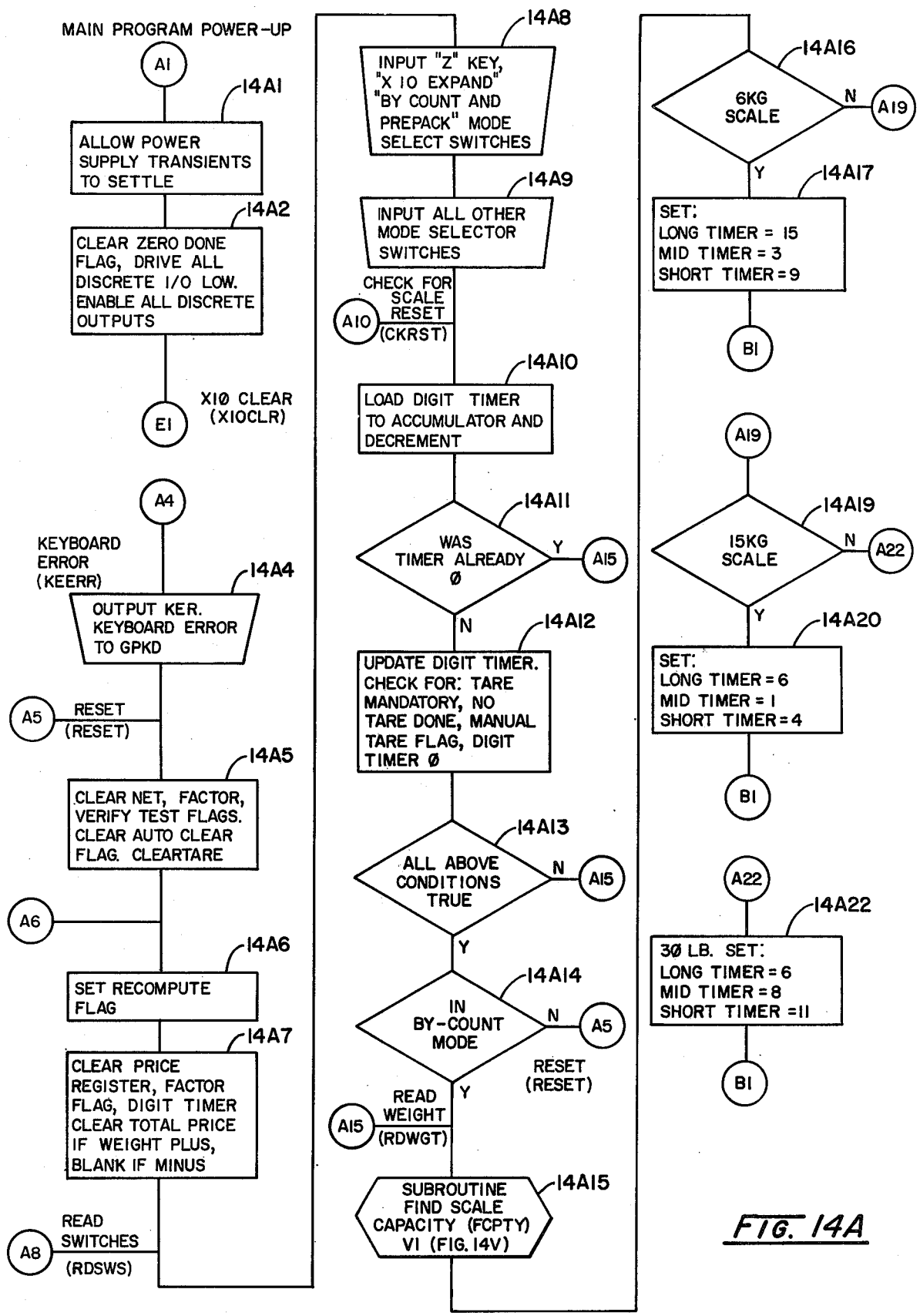
FIGS. 14A through 14Z are flow diagrams illustrating the operation of the preferred embodiment of the invention (FIG. numbers 14Q and 14U are not used for clarity).

The operation of the system can be most conveniently described in conjunction with FIGS. 14A through 14Z of the drawings (FIG. numbers 14Q and 14U are not used for clarity). The flow diagrams of FIGS. 14A through 14Z graphically describe the operation of the scale system utilizing the operating sequence represented by the program listing included herewith as an appendix in combination with the Rockwell PPS-4/2 microcomputer described above. However, it should be appreciated that the operating sequence of the system utilizing this operating sequence may be implemented on other types of commercially available computers in accordance with the principles described herein.

The present invention, as incorporated in the exemplary embodiment described herein is arranged to cooperate with many features and operations which are described and claimed in U.S. Pat. Nos. 3,984,667 to Loshbough, U.S. Pat. No. 3,869,005 to Williams, Jr., and U.S. Pat. No. 3,861,479 to Pryor, which patents are specifically incorporated by reference herein; and U.S. patent application Ser. No. 729,911 of Donivan L. Hall and Edward G. Pryor entitled "Digital Scale With Antifraud Features":, which patent application is also incorporated by reference herein. In order to more clearly set forth the precise invention for which this patent is solicited, in such a manner as to distinguish it from other inventions and from what is old, those operations which are disclosed in the incorporated references will only be generally described, with the primary emphasis being given those operations forming a part of the instant invention.

Many of the operations of the scale system utilizing the operating sequence are performed only partially by single pass through the operating sequence (hereinafter referred to as an operating sequence cycle), so that a plurality of passes or cycles through the operating sequence may be required in order to complete a particular operation. Such operations are clearly disclosed in the incorporated references and will be referred to in the instant disclosure only where necessary to clearly set forth the instant invention. The details of the operations are completely disclosed in the accompanying program listing in the appendix and in the flow diagrams FIGS. 14A through 14Z.

The flow diagrams of FIGS. 14A through 14Z disclose in graphical form an exemplary operating sequence of the scale system, including the operations required for implementing the analog-to-digital conversion and the net zero tracking described herein. The flow diagrams consist of a series of geometrical shapes, each of which corresponds to a particular type of operation. Each rectangular block represents the performance of a function which is generally indicated by the notation found within the rectangular block. Each diamond shaped geometrical figure represents a decision making operation where one of two alternatives is determined. The hexagons represent that a subroutine is performed at that particular point in the operating sequence, with the subroutine being performed indicated by the notation within the hexagon. The oval-shaped geometrical figures represent a branch back operation and are used in conjunction with a subroutine to indicate that the operating sequence continues at that point in the main operating sequence where the subroutine was entered. A rhomboid geometrical figure represents either an input or an output operation. The numbers placed in circles to the top and left of the geometrical figures represent input locations to those particular operations. The numbers in the circles to the right and below the blocks in the flow diagrams represent an output connected to a different location in the flow diagrams indicating a transfer in the operating sequence. The mneumonic designations found in parenthesis adjacent to the circles containing numbers, indicate labels which have been given to a particular group of operations. These mneumonics may be utilized in referring back to the detailed operating sequence disclosed in the appendix by referring to the symbol table found at the end of the appendix. The symbol table found in the appendix lists, in alphabetical order, the mneumonic labels and the corresponding location in the detailed program listing of the operating sequence where the particular operations represented by the mneumonic label may be found. Also a table is included showing the operations represented by the mneumonic labels.

In order to accomplish the operations illustrated in FIGS. 14A-14Z, data is assigned to and stored in various registers or memory cells in the random access memory or RAM 911 as illustrated in FIG. 13. Therefore, it is useful to define and explain the various flags, counters, timers and data registers which are used in the exemplary embodiment of the invention and which are referred to in the flow chart diagrams of FIGS. 14A-14Z.

The memory unit 310 which is shown in FIG. 6 and illustrated in more detail in FIG. 10, includes a random access memory or RAM with a capacity of 128 four-bit words and arranged as shown in FIG. 13. Each of the 128 four-bit words may contain any one of sixteen states. These states can represent numerical values of data or a status or condition.

In FIG. 13, the register addresses are referred to by the hexidecimal equivalents of their binary address. The two most significant hexidecimal digits of the address within the RAM define a particular column or grouping of four bit words and the least significant hexidecimal digit defines a row or particular four bit word within the RAM. The hexidecimal address designations are also used as reference numerals below. A tare done flag at address 002 is set to its binary eight state after a tare operation has been completed by the entry of tare weight data into the appropriate storage registers and otherwise is reset or cleared to a "zero" state when such a tare has not been completed.

A digit timer is provided at register 004. The digit timer is set to its binary "eleven" state upon the depression of a digit key on the keyboard. Thereafter it begins a timing cycle by decrementing one count each pass through an operating sequence cycle. The depression of any other digit key before the digit timer counts to zero will again set the digit timer to binary "eleven" state to reinitiate the counting cycle. If the digit timer counts down its "zero" state before all price digits are entered or the tare key is depressed, all previously entered keyboard digits will be cleared upon entry of any new digit. This feature requires that all digits be entered within a few seconds of each other and consequently avoids the retention by the apparatus of accidently entered data or of data entered a considerable time earlier and forgotten by the operator.

A manual tare flag having two states is provided at register 003. Whenever the "T" key is pressed, there is no motion of the platter and the digit timer of register 004 is at its "zero" state (i.e., is not running), the manual tare flag is set to its "eight" state. It is reset or cleared to its "zero" state after its condition has been sensed in subsequent operations.

The addresses of registers 005 through OOF are labelled as a result register and are used as a scratch pad.

A filter counter is provided at address 010 and is used to provide four states, "zero" through "three". Whenever, during the sequence of operations, no difference is found to exist between a most recently generated, fully processed weight and the weight currently being displayed, the filter counter is reset or cleared to its "zero" state. However, each time a difference is found to exist between the most recently generated fully processed weight and the weight being displayed, the filter counter counts up one count. If such a difference is found three times in succession, the filter counter counts one count at a time, to its "three" state to signal that the displayed weight should be updated with the most recently generated fully processed weight. This avoids a display blink from an unnecessary updating of the displayed weight with weight data which is identical to that which is currently being displayed.

A zero lamp flag is provided at address 011 and is used to provide three states "zero" through "two". Whenever a weight is detected which is not within a small range of the previously established scale zero, which range is different for different scale capacities, the zero lamp flag is set to its "two" state for purposes of causing the zero lamp to be turned off to indicate that the scale is not zeroed. However, each time a weight within this range is detected, the zero lamp flag is decremented. Consequently, if the scale is found to be within this range for two such detections in succession, the zero lamp flag gets decremented to its "zero" state so that the zero lamp is turned on to indicate that the scale is zeroed.

A net flag is provided at register 012 and is set to its "eight" state when the weighing scale is in its net mode of operation, that is, when a positive weight is stored in the tare memory register. Otherwise, the net flag is in its clear or reset state of "zero".

A factor flag is provided in register 013 which is reset or cleared to its "zero" state when there is no price factor, set to its "two" state when pricing is per ½ unit of weight and is set to its "four" state when pricing is per ¼ unit of weight.

A verify test flag is provided in register 018. This flag is set to its "eight" state in response to depression of the "clear" key to signify that a verification test is in progress. The verify test flag is reset or cleared to its "zero" state when the sequence of operations pass through the reset operation III beginning on FIG. 14A.

Registers 01A through 01F provide six, binary coded decimal digits of temporary scratch pad data storage for use in carrying out the sequences of operations of the exemplary embodiment of the invention. The sign of that six digit number is stored as a fifteen or zero in register 019.

Registers 020 through 026 store, as an "eight" or "zero", on the "on" or "off" state of the indicator lamps labelled at those addresses in FIG. 13.

The presence or absence of a print command is stored as an "eight" or "zero" at register 027.

Registers 02A through 02F store the six binary coded decimal digits which represent a detected weight while register 029 stores the sign of that weight.

In order to require that the "Z" be depressed for a sufficient length of time before such depression is accepted and to thereby prevent accidental erroneous or fraudulent zeroing of the weighing scale, a zero key timer is provided at register 030. The zero key timer has even states "zero" through "fourteen". An initial depression of the "Z" key causes the zero key timer to switch to its "two" state. Thereafter, on each pass through the operating sequence cycles, the zero key timer is incremented to its next higher even state so long as the "Z" key remains depressed. If the "Z" key is depressed sufficiently long that the zero key timer counts through all its even states and returns to "zero", the depression of the "Z" key is then accepted, the scale is zeroed and the zero done flag at register 031 is set to its "fifteen" state to indicate that the scale has been zeroed. The zero done flag is reset or cleared to its "zero" state in the initial, main program power-up operation I beginning on FIG. 14A.

An auto clear flag is provided at register 033 to help in the automatic clearing of a previously entered tare weight and price each time a weighing operation is completed. The auto clear flag is a seven state counter which is reset to its "zero" state whenever the detected weight is greater than a weight corresponding to one hundred raw weight increments. Whenever the scale weight exceeds this 100 increment band, the auto clear flag begins counting towards its "six" state. This auto clear flag counter is incremented each pass through the sequence of operations. If the detected weight falls within the 100 increment band before the auto clear flag counter reaches its "six" state, the auto clear counter is reset to its "zero" state and the tare data is not automatically cleared. However, if the scale weight is above the 100 increment band long enough for the auto clear flag to reach its "six" state, it will remain in its six state to enable the auto clear function. After the scale weight returns to within the 100 increment band, the tare weight and price will then be cleared.

Registers 034 and 035 are provided to store the least significant binary coded decimal digits of a first previously detected and a second previously detected weight. These are utilized as described below in the filtering operation of the preferred embodiment of the invention.

Registers 039 through 03F are used for the sign and the six binary coded decimal digits of a partially processed weight which represents a previously detected weight.

Registers 040 through 045, 050, 051, and 053 through 055 are two-state registers which store each mode selector switch status as an "eight" state or a "zero" state. Registers 046 and 047 store data which represent a keyboard key which has been depressed and detected. Register 048 stores in its four bits the status of the switches or keys labelled in those positions in FIG. 13.

Registers 049 through 04F form the auto zero register in which the zero correction factor is stored.

Registers 050 through 055 are used to store data as indicated.

A recompute flag is provided at register 057. It is set to a non-zero value whenever there is a change in a price digit or output weight in order to signify, during the next pass through an operating sequence cycle, that a new total price should be computed. However, if no such change is detected, the recompute flag remains in its "zero" state so that no new total price is computed. The recompute flag is cleared immediately prior to the compute total price operation XX.

A verify mode flag is provided at register 058. This flag has two states and is switched from its "zero" state to its 15 state upon the first depression of the CLEAR key and is returned to its "zero" state upon depression of any other key.

Registers 059 through 05F store the tare weight. Registers 060 through 06E store the total price, price and output weight as indicated. Registers 070 through 07F are used as a work area and temporary scratch pad during the display and other routines.

The various means and apparatus for performing the functions and improvements in accordance with the exemplary embodiment of the invention comprise the scale mechanism, keys, switches, flags, registers, counters, timers, and storage spaces together with program sequences or routines and routine loops in combination with the computer, and the output or display apparatus and the control thereof.

Thus the means for controlling the time the integrator means is connected to the scale means comprises gate 94 and the control thereof including program sequences of blocks 14A17, 14A20, or 14A22 and the program loops or sequences of FIG. 14W in combination with the computer.

Figure 14B:
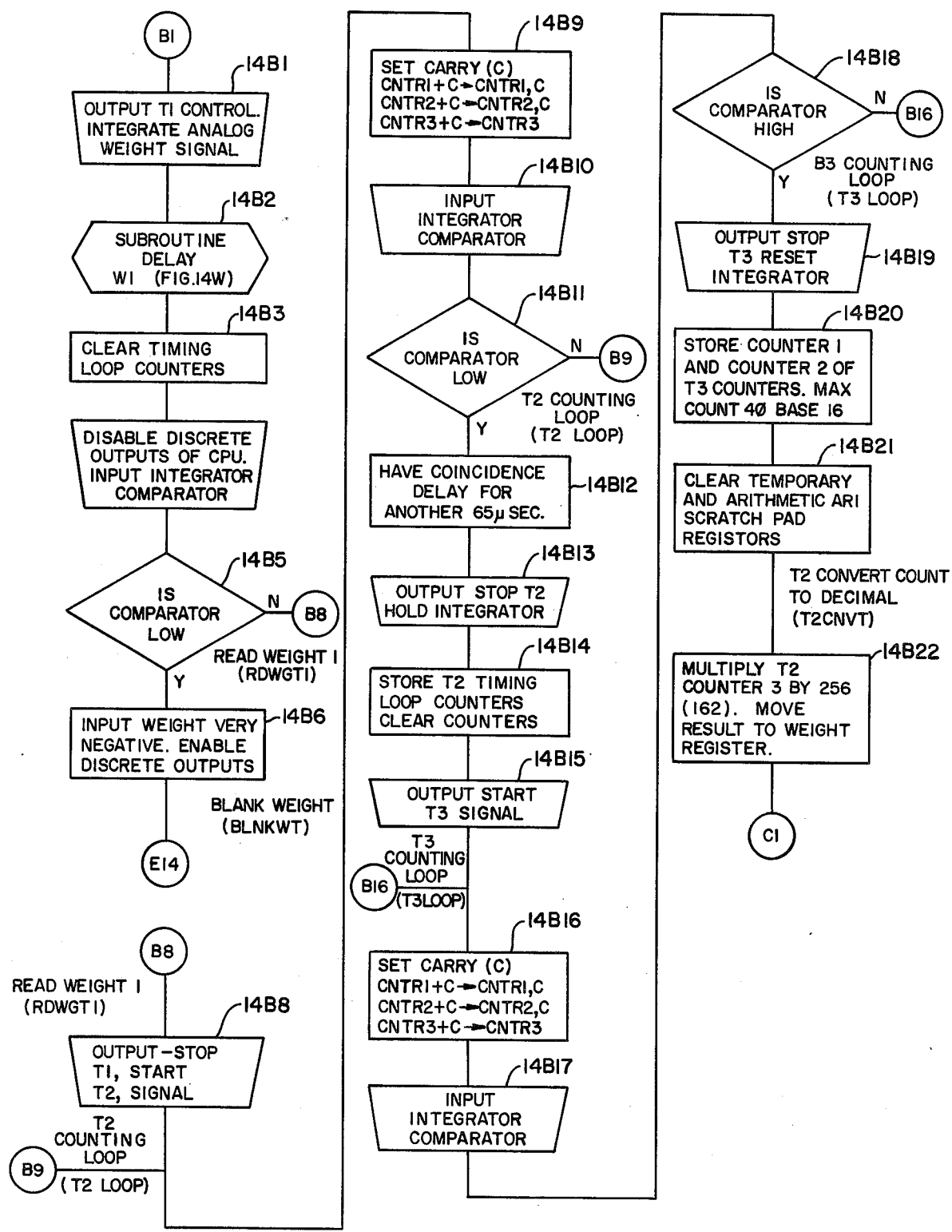

The means for reading the weight includes the flow diagrams beginning at B8 of FIG. 14B of the drawing.

The structure of the timing and counting arrangements operative during the T2 and T3 intervals comprise counter 1, counter 2, and counter 3 together with the program sequences and loops beginning at B9 of FIG. 14B which sequences and loops comprise the structure of the corresponding sections of the ROM storage. These sequences and loops together with the computer determine the T2 and T3 times.

Figure 14C:
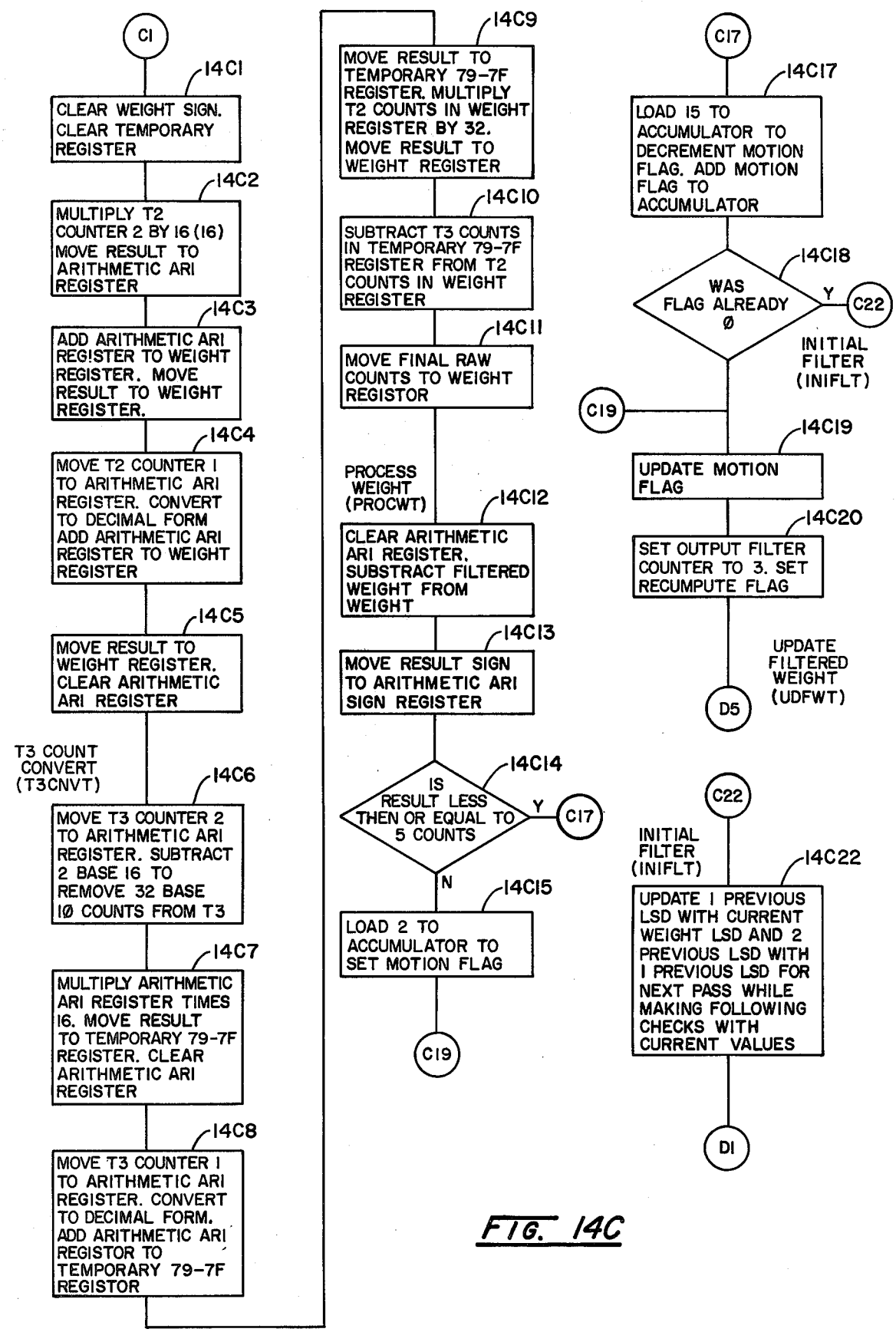

The program sequences employed to derive the raw weight from the T2 and T3 times are shown in the drawing beginning with block 14B22 of FIG. 14B and extend through block 14C11 of FIG. 14C.

The operation of the exemplary embodiment of the invention is now described with reference to the flow chart diagrams of FIGS. 14A–14Z. The first two digits of the alphanumeric reference numerals for the individual steps of the operation are the Figure numbers on which the particular steps are illustrated. The latter alphanumeric digits refer to the particular step in that Figure. The labels which are shown in parentheses on the drawings are the labels used in the program and therefore provide cross references to the appended program listing.

MAIN PROGRAM POWER-UP

The power-up sequence is an initialization sequence which is performed when power is first applied to the central processor or there is an interruption of power to the central processor.

During step 14A2 various registers within the computer are cleared to an initial state to provide a known starting state for the operating sequence.

After the main program power-up sequence the operating sequence then proceeds to the X10 CLEAR sequence beginning at step 14E1 which causes a clearing operation to take place with respect to the tare and auto-zero. The operating sequence then proceeds to the output sequence beginning at 14M19.

Figure 14D:
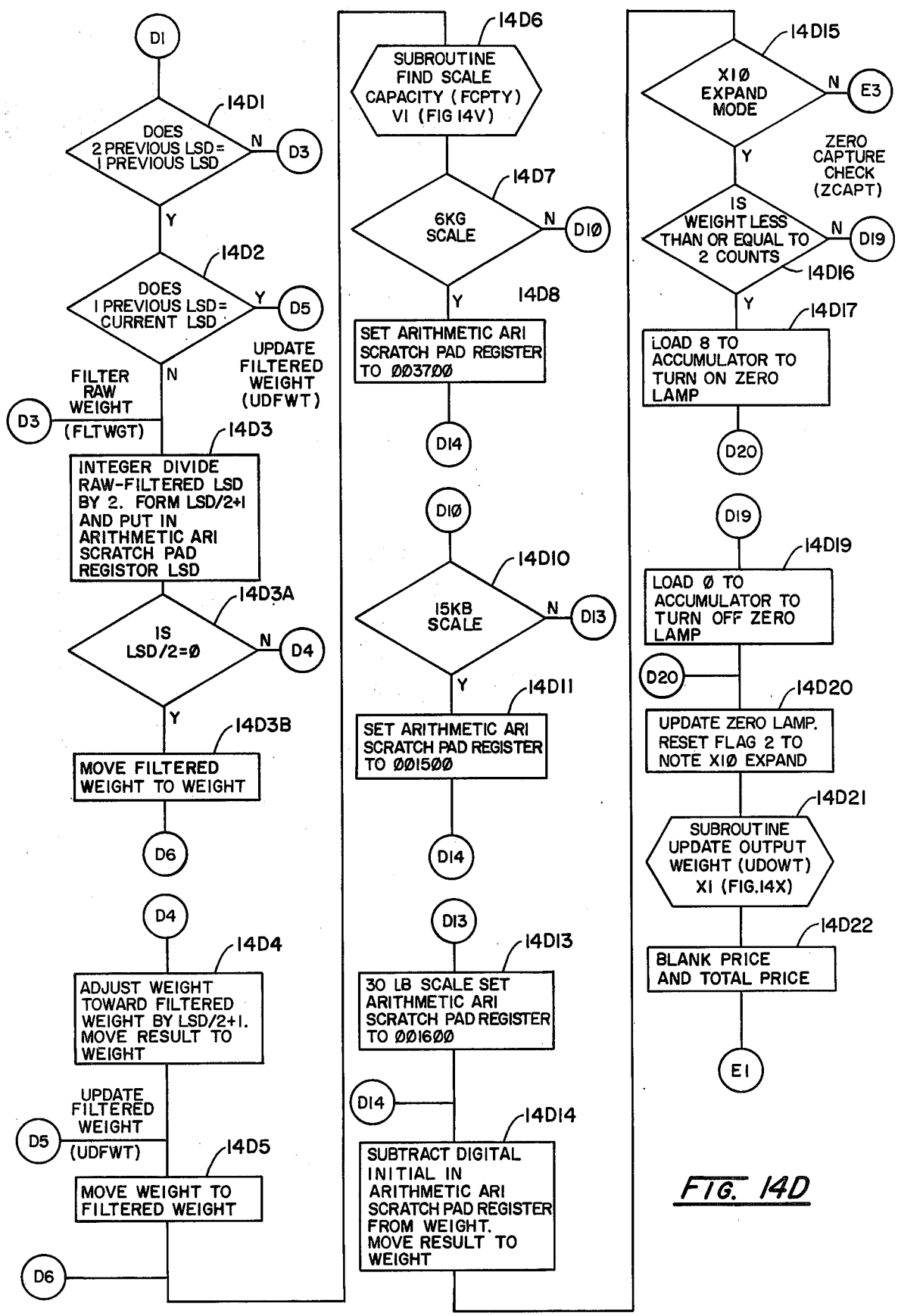
Figure 14E:
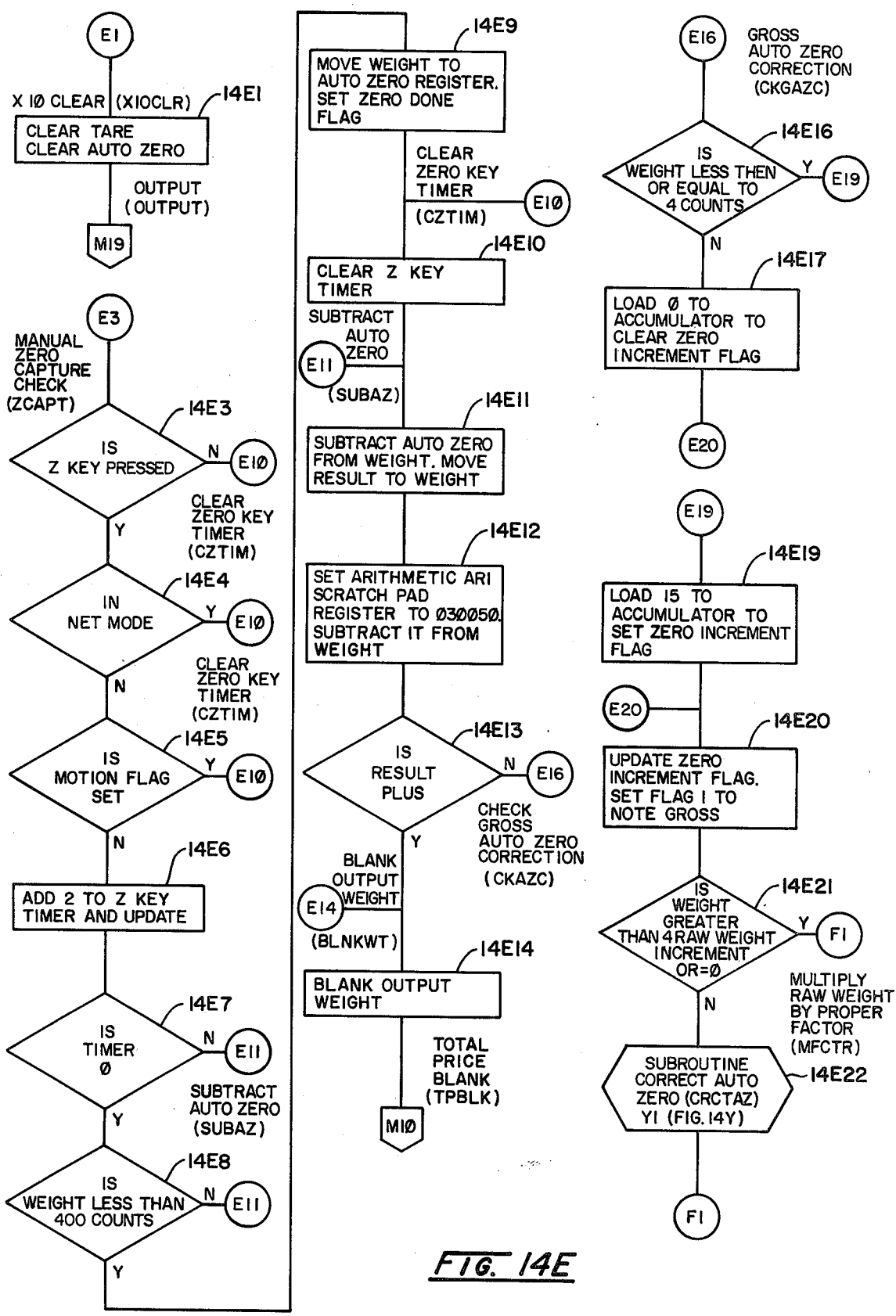
Figure 14F:
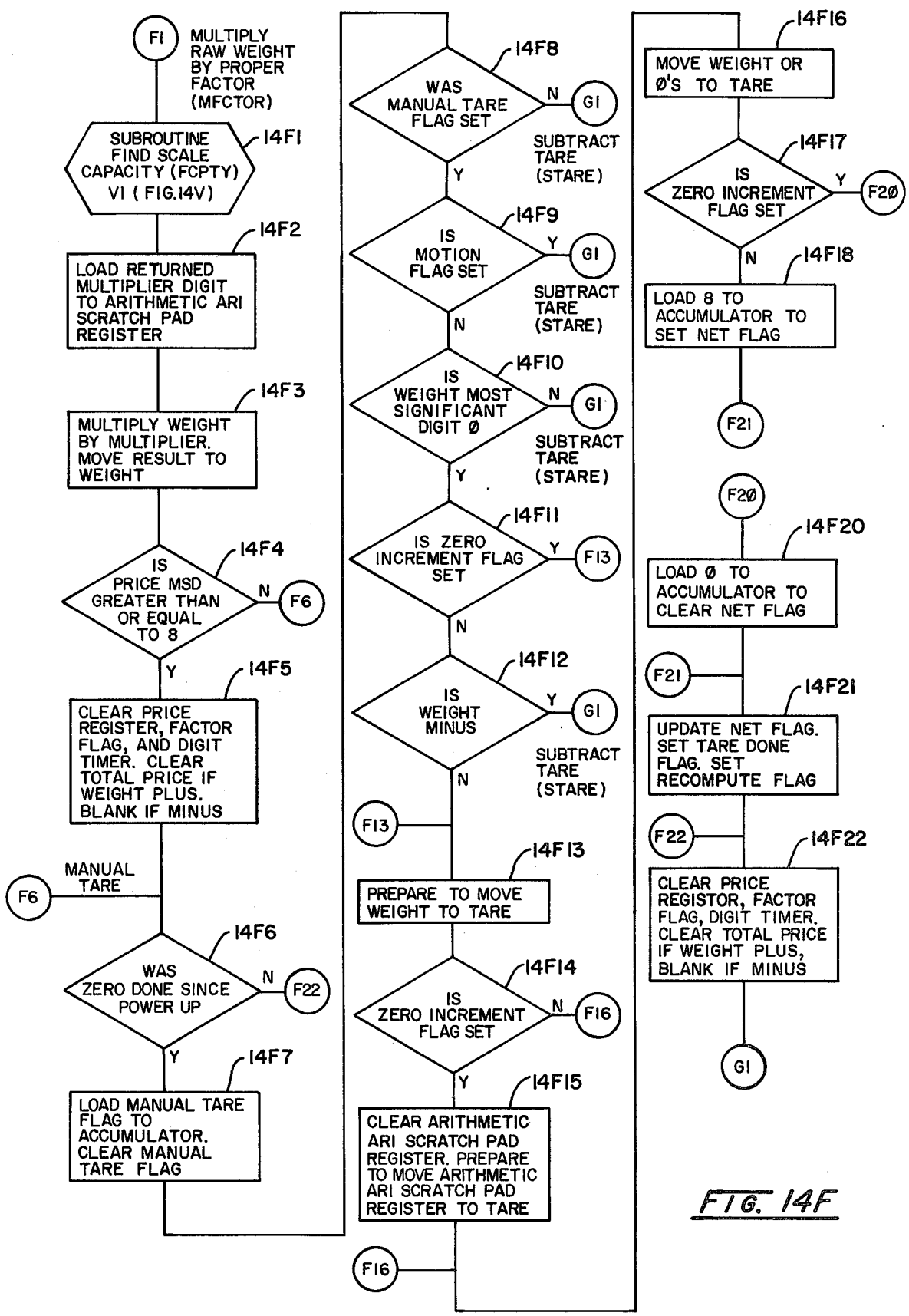
Figure 14G:
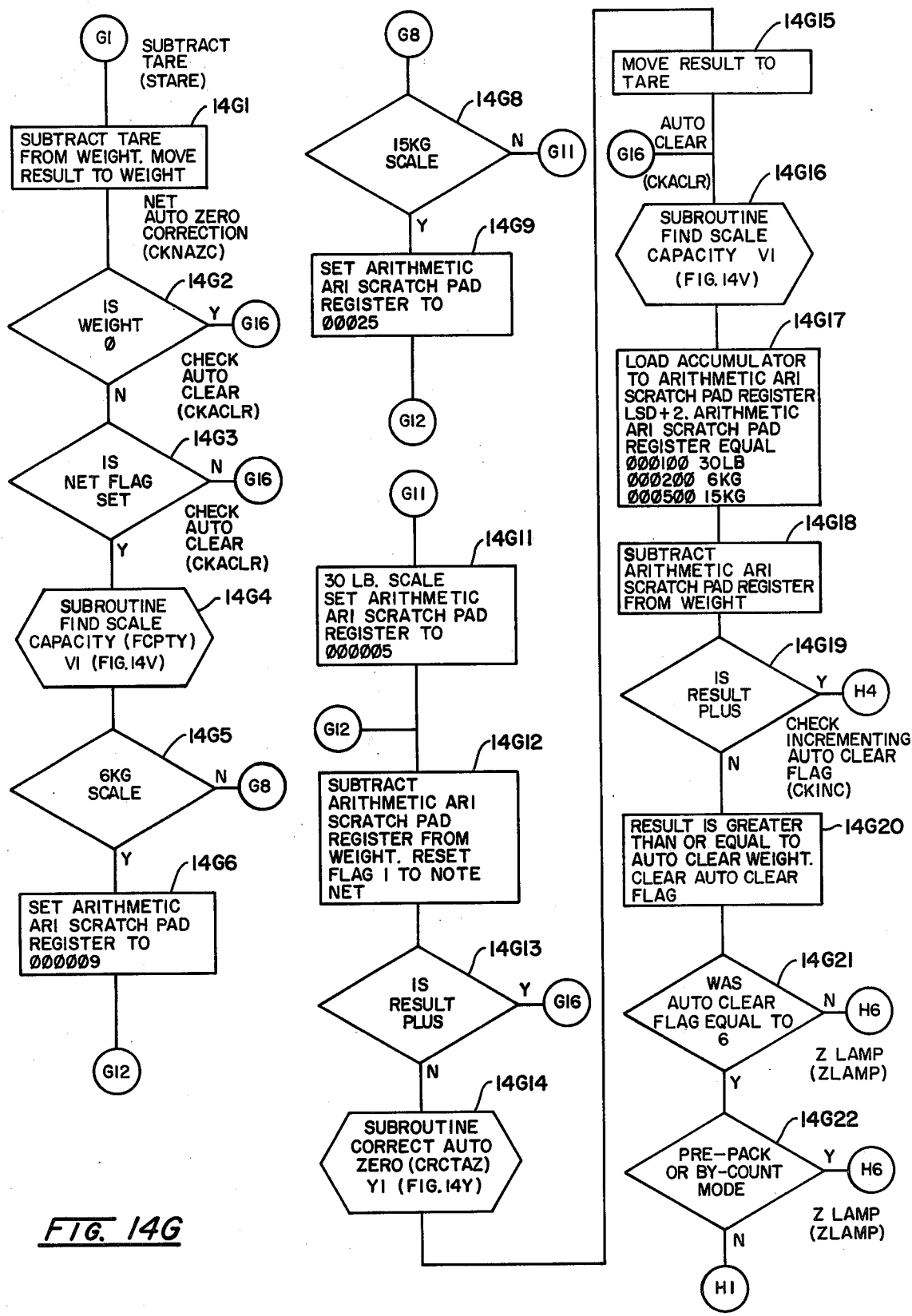
Figure 14H:
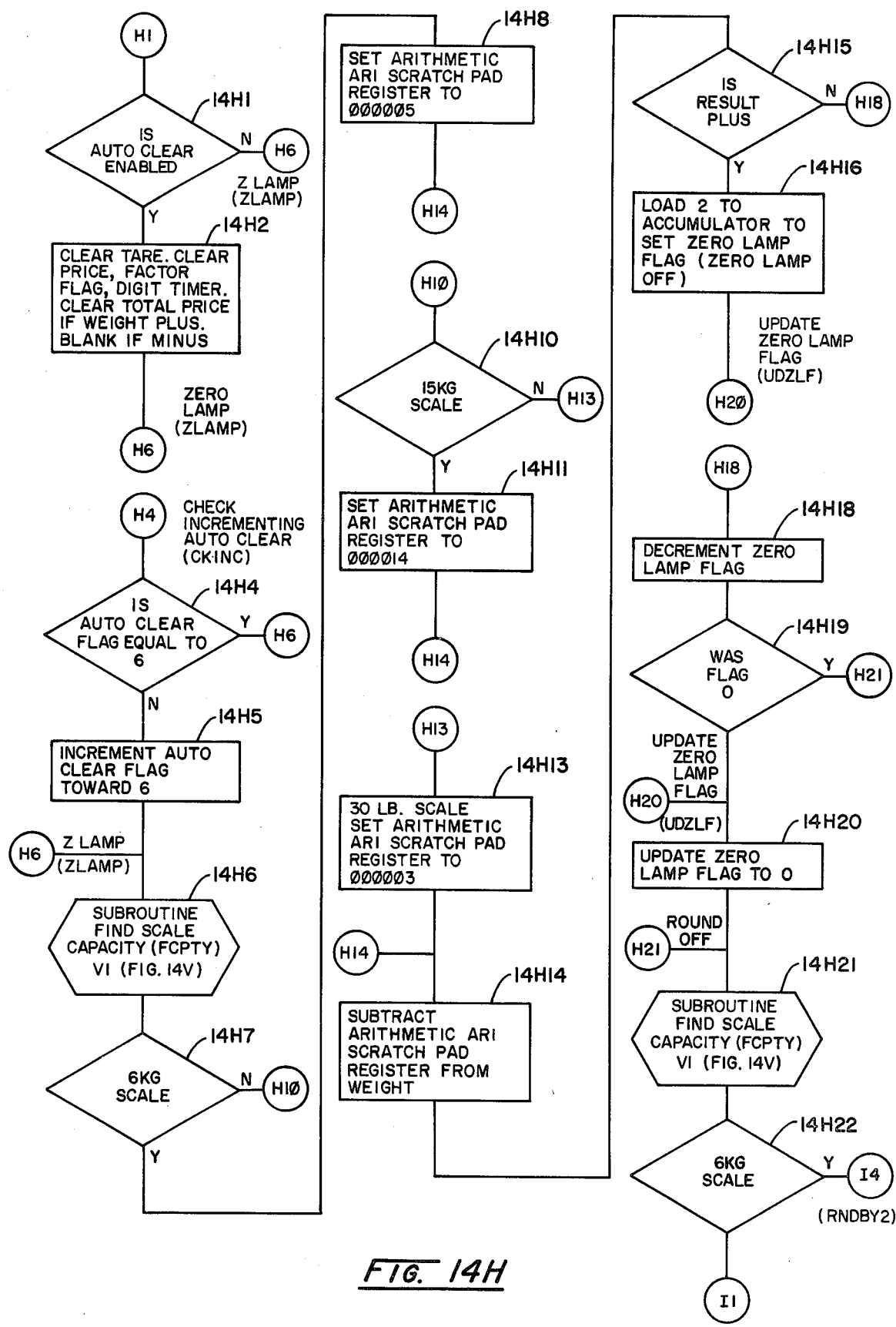
Figure 14I:
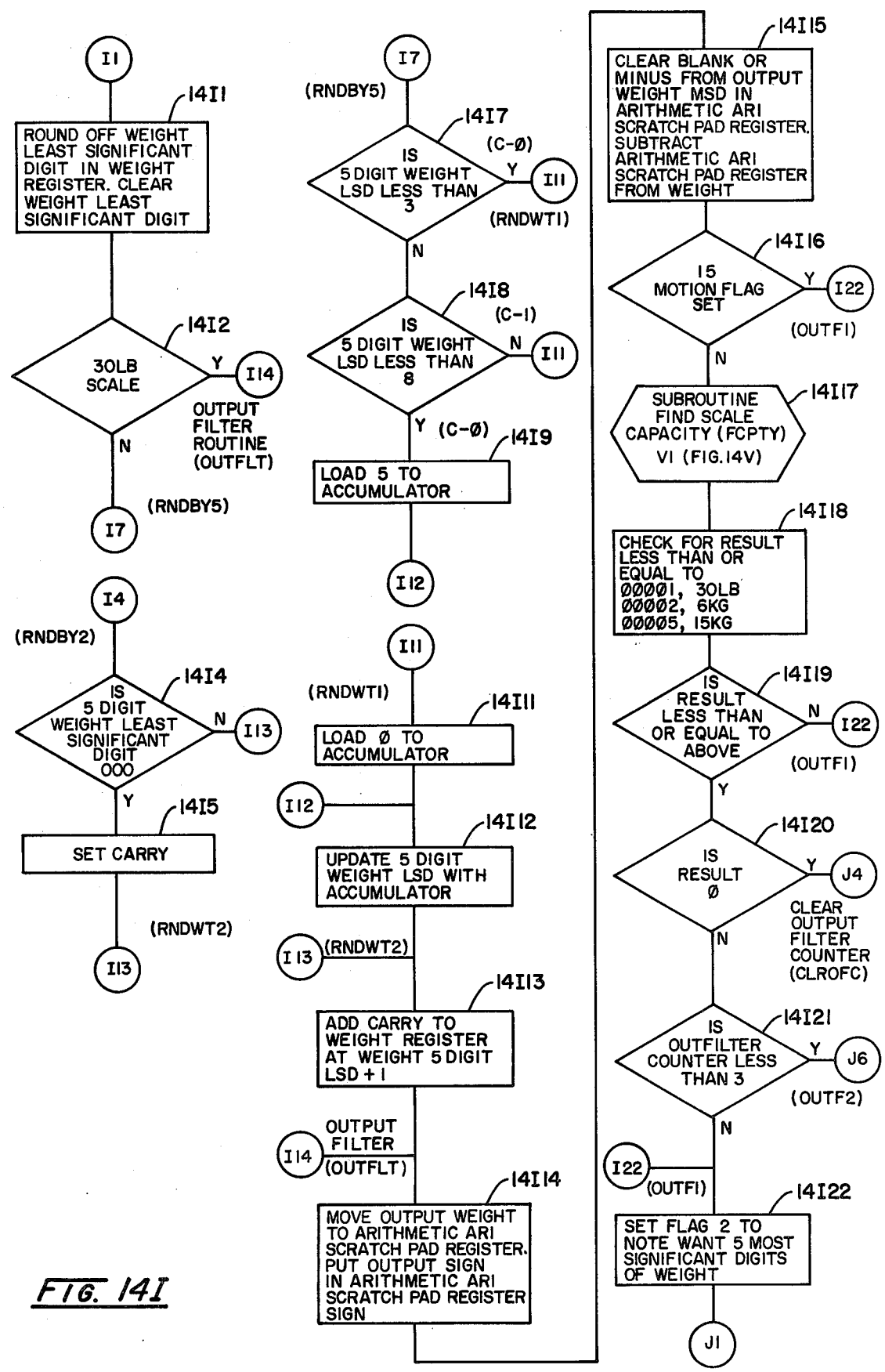
Figure 14J:
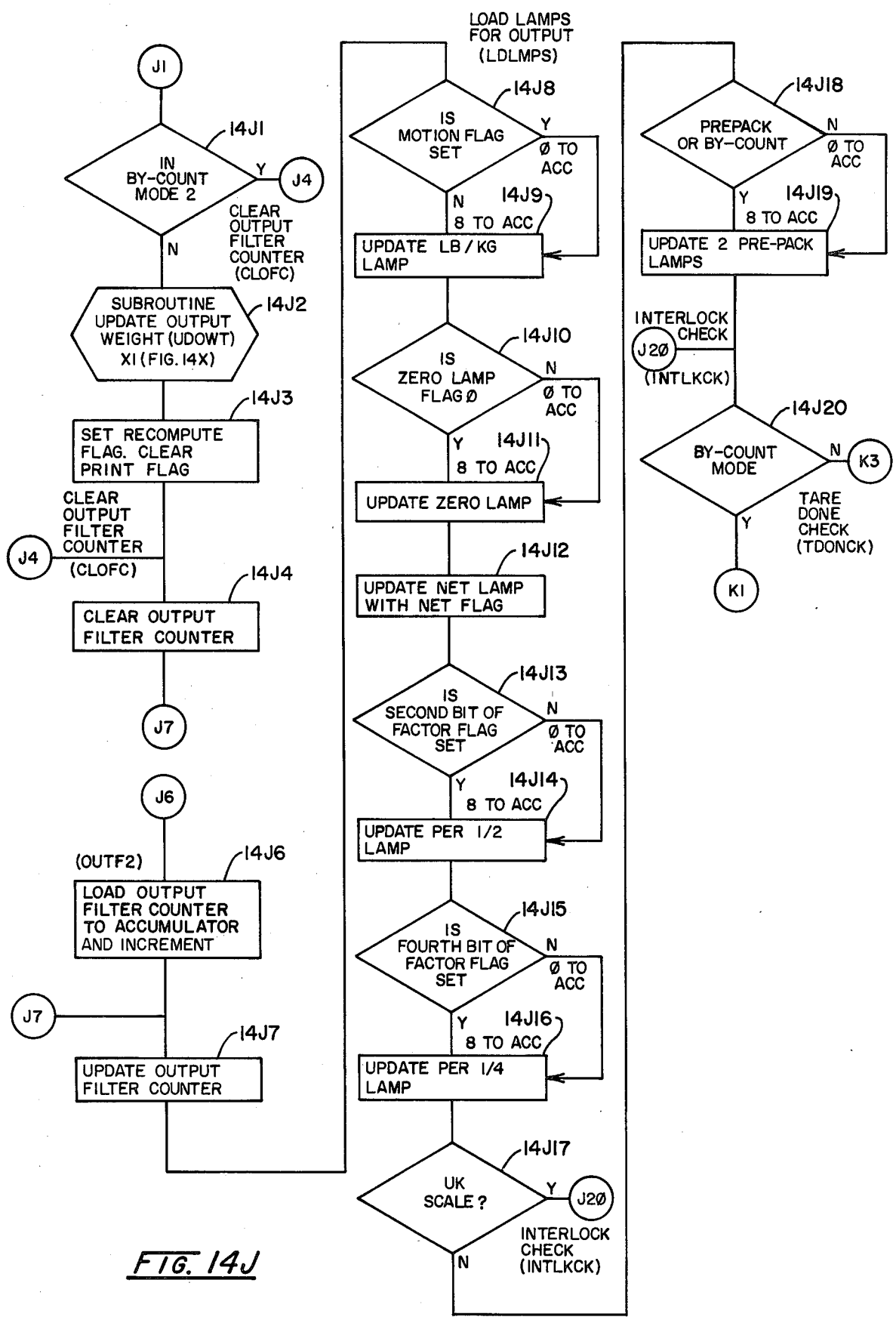
Figure 14K:
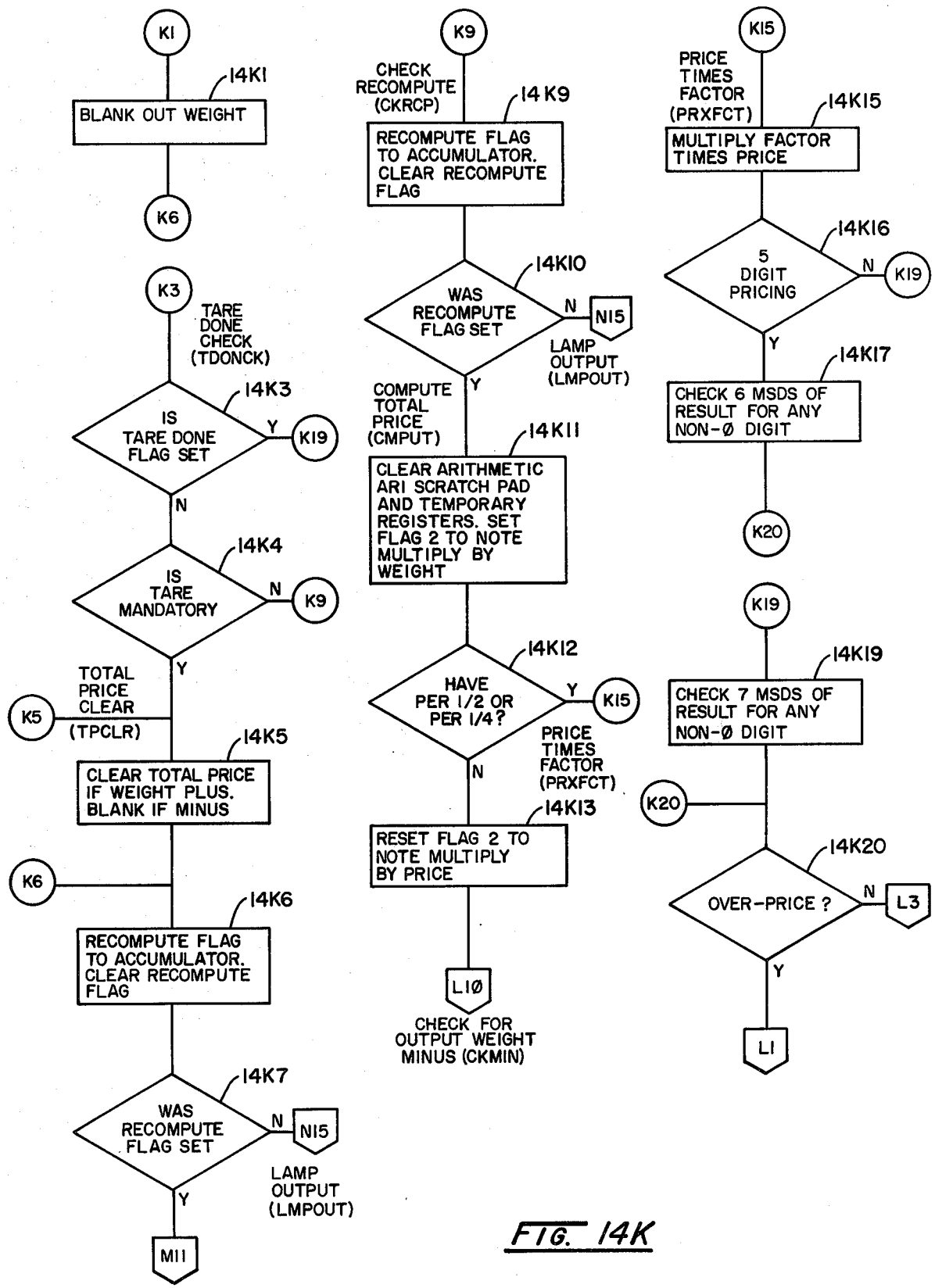
Figure 14L:
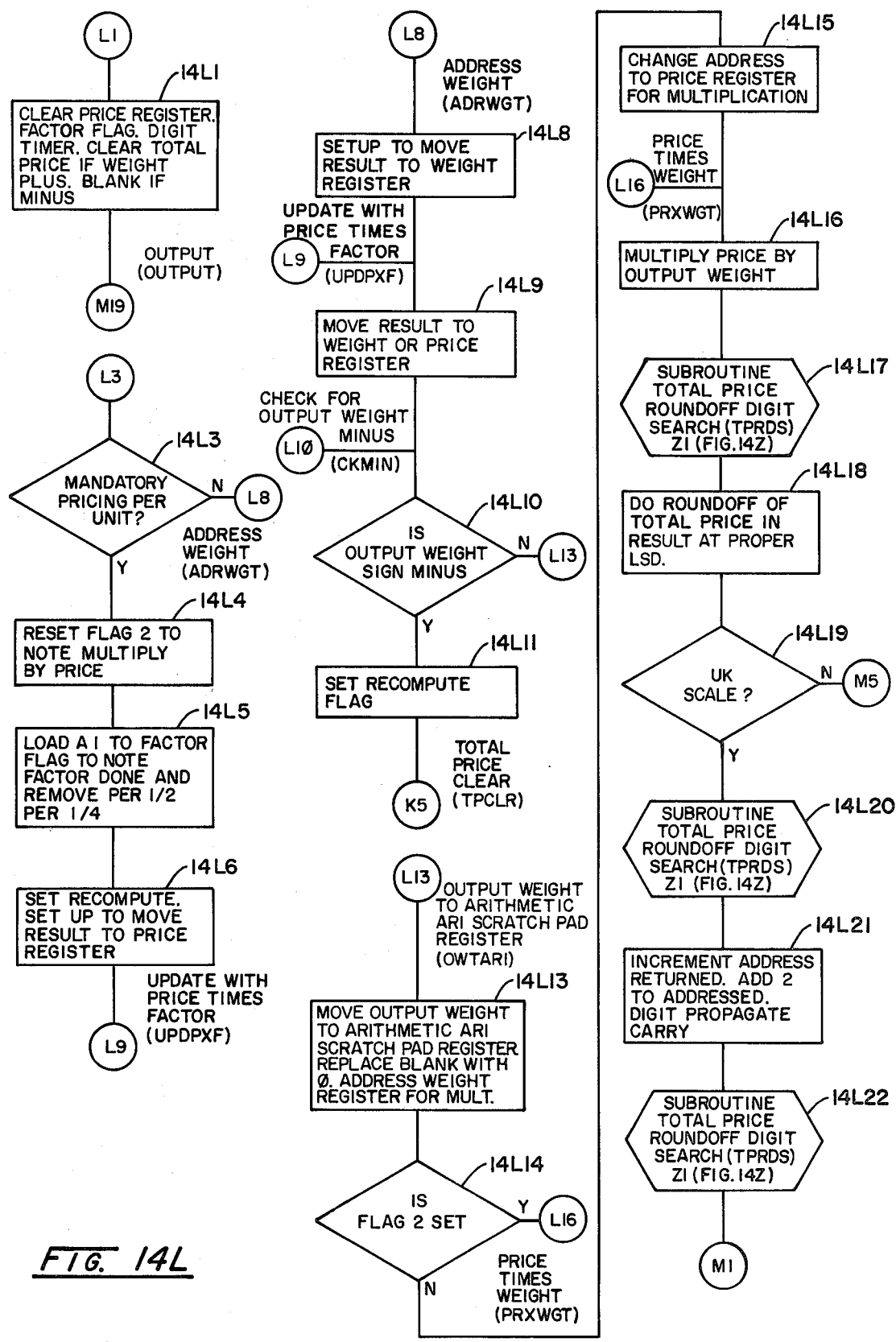
Figure 14M:
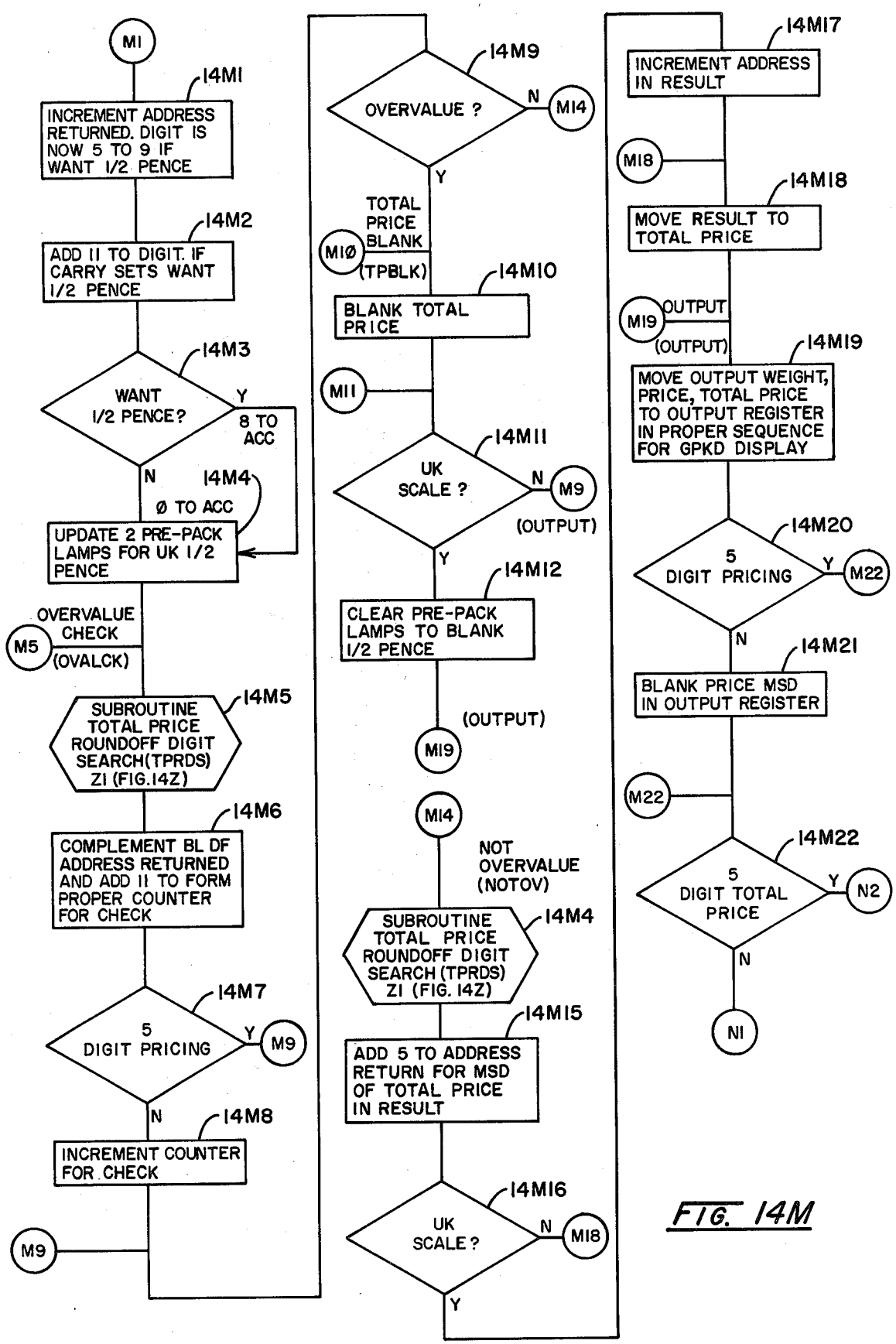
Figure 14N:
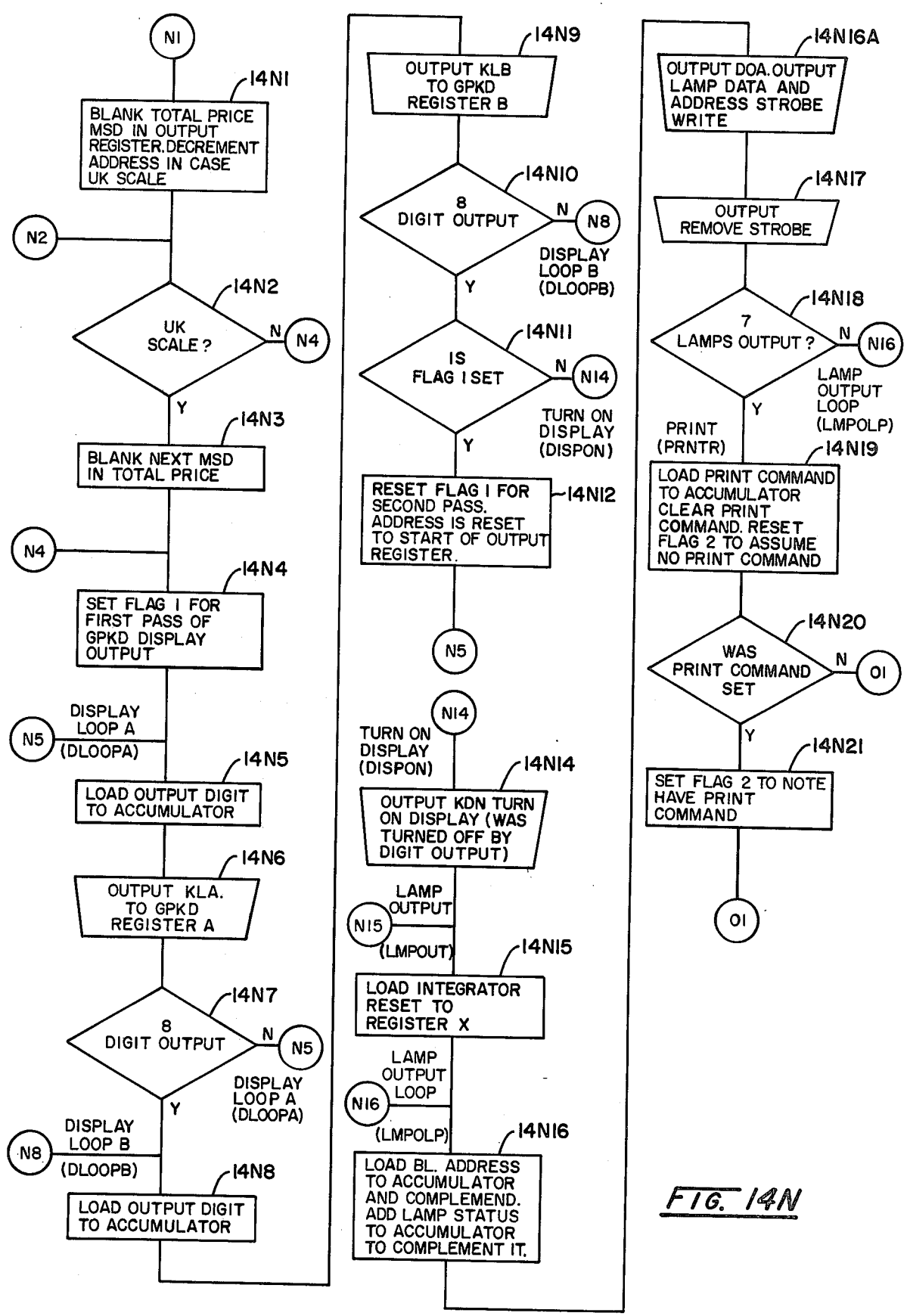
Figure 14O:
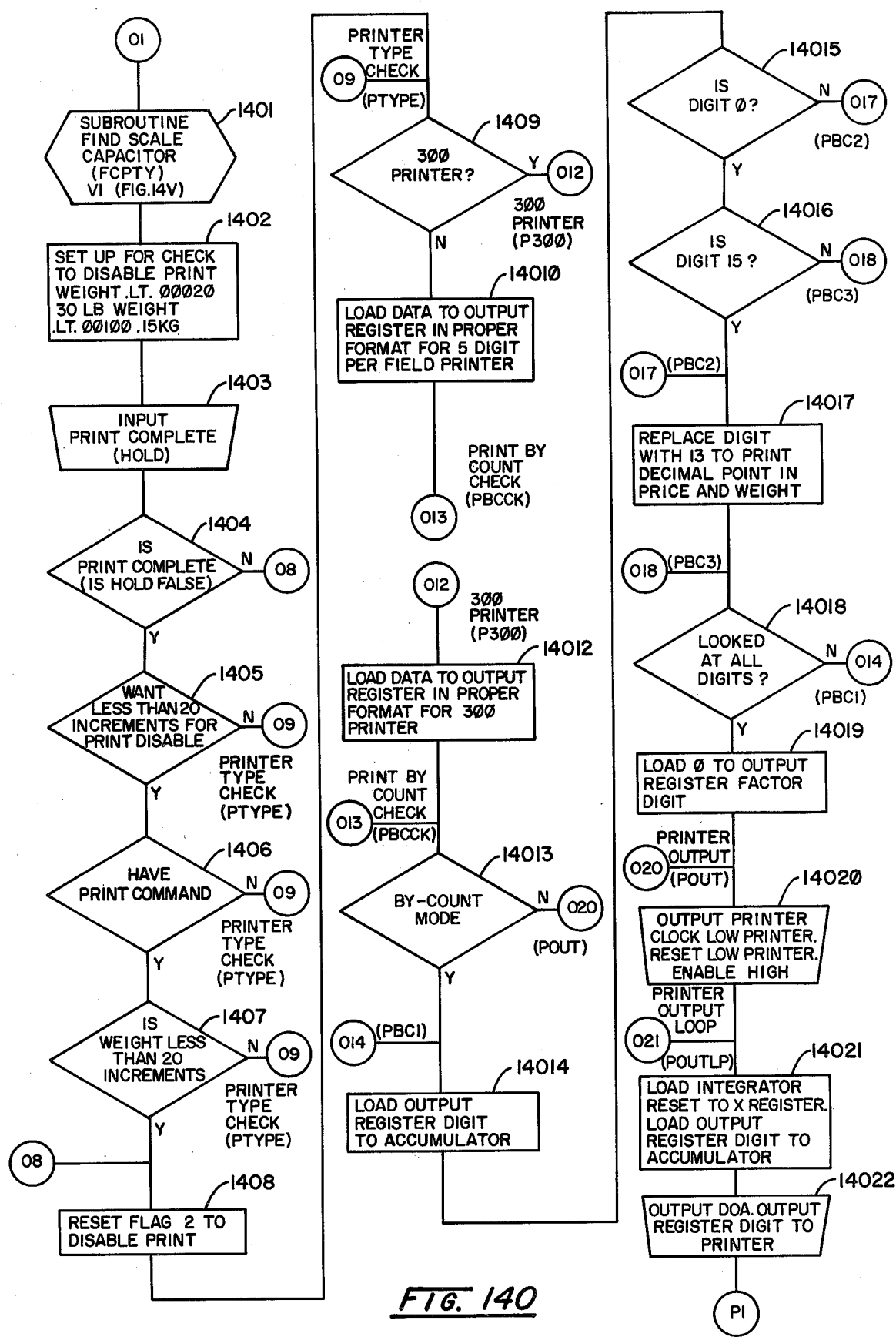
Figure 14P:
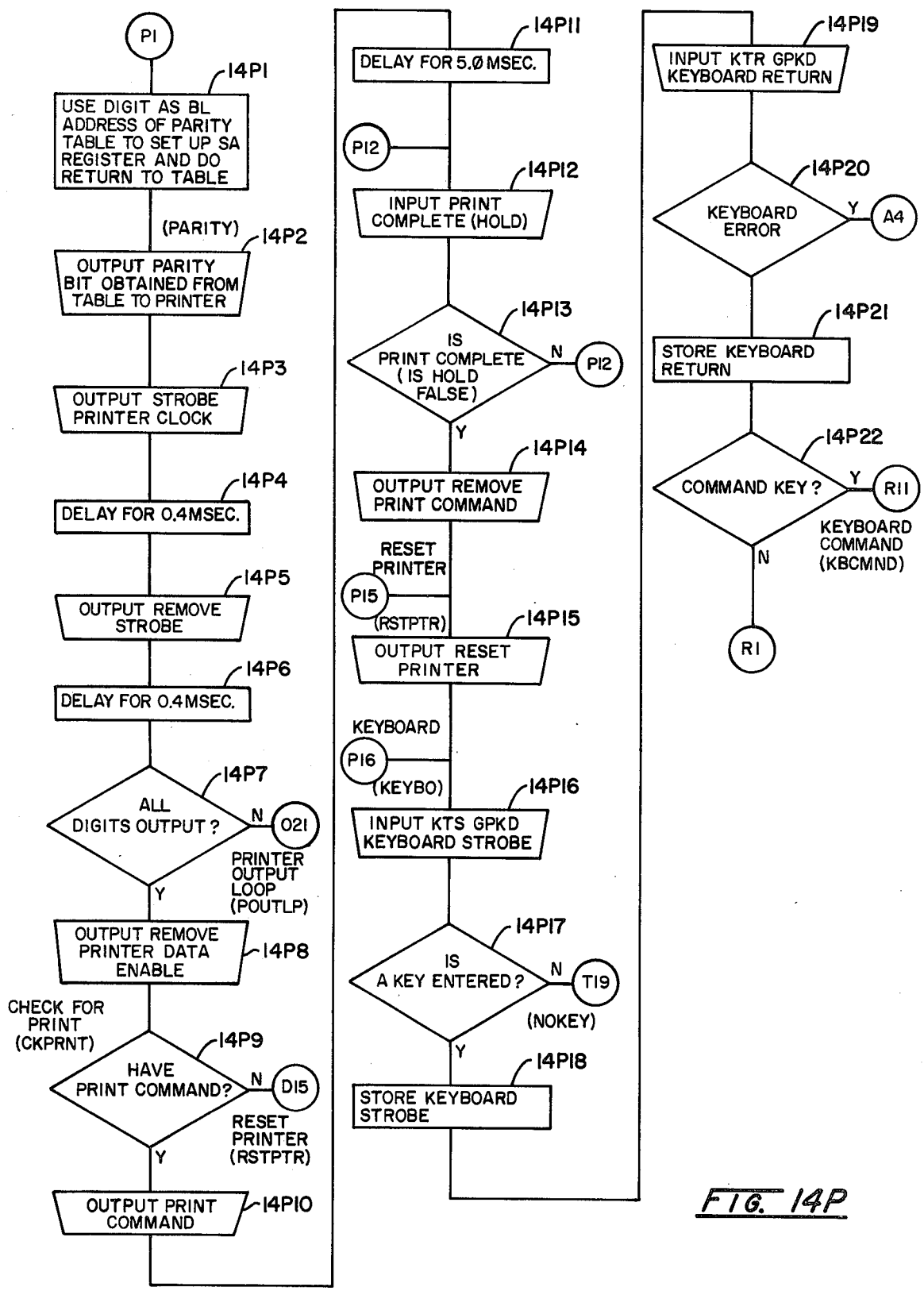
Figure 14R:
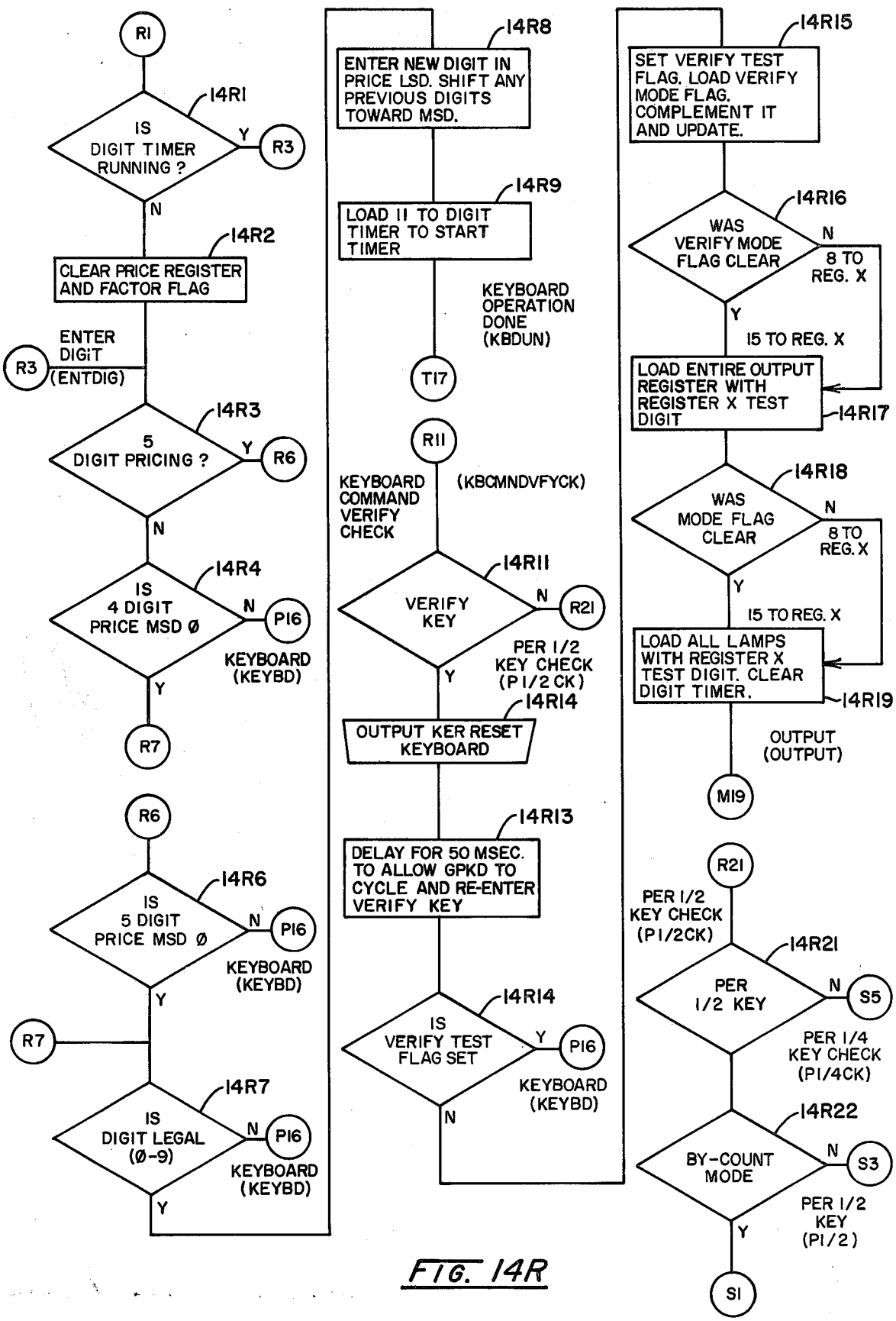
Figure 14S:
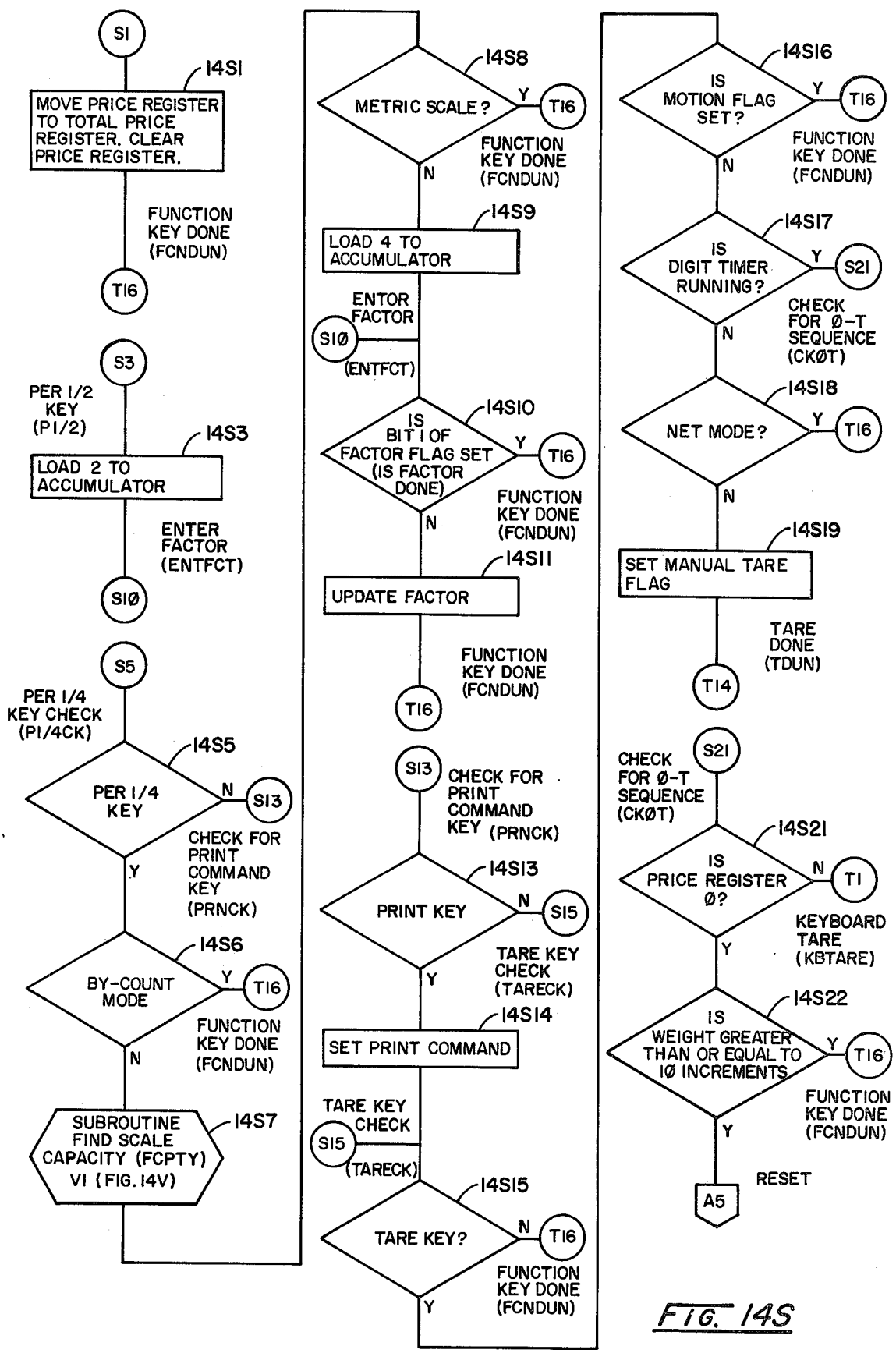
Figure 14T:
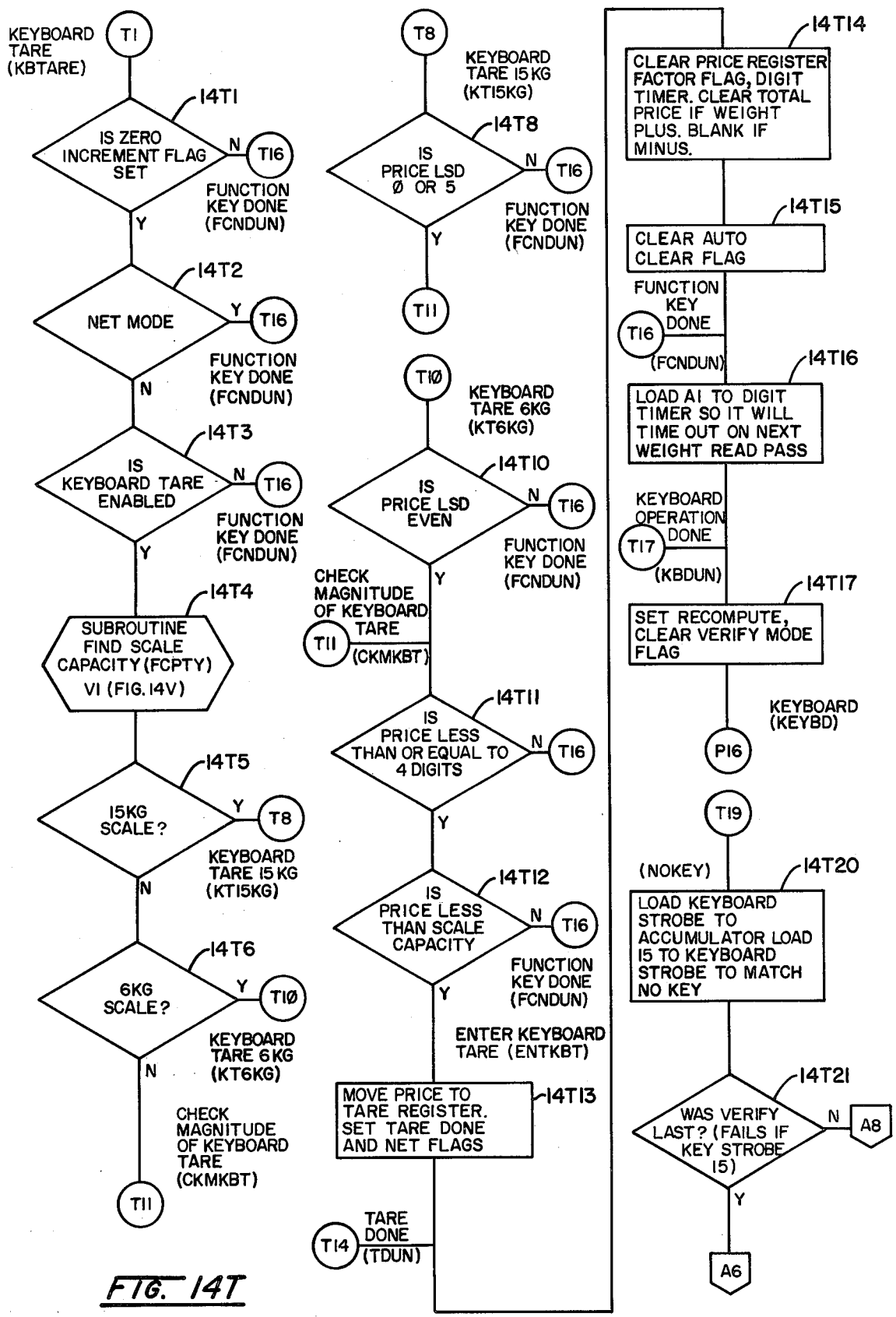

The main program then advances through the remaining sequences shown in FIG. 14M and then transfers to the sequences of FIGS. 14N and 14O and through the various sequences of FIG. 14P through 14P15. These output and printer sequences are analogous to the output sequences such as described in the above identified patents and applications. The main program then advances through the various keyboard sequences or routines beginning at 14P16. If no key is operated the program transfers to T19 of FIG. 14T and then to A8 assuming no verifying operation.

Upon transfer to block 14A8 via transfer A8, the various control and mode switches are scanned and the various registers in the RAM 911 conditioned or set in accordance with the condition of the various control and mode switches. These various operations are designated in blocks 14A8 through 14A11. These operations and the operations relating to the scanning and response to the keyboard digit keys are analogous to the corresponding operations described in the above patents and applications incorporated herein.

In the beginning under the assumed conditions, the digit timer was previously or already zero so control transfers from block 14A11 via transfer A15 to block 14A15.

Beginning with block 14A15, the read weight sequence of operations VI is perfomed in which the analog to digital conversion in accordance with the present invention is accomplished.

At the beginning of the read weight sequence of operations, a find scale capacity subroutine is performed. This subroutine is illustrated on FIG. 14V. It performs the interrogation of RAM registers 043 and 044 to determine what scale capacity is selected and returns to the main program data which is dependent upon which capacity is selected.

Referring to FIG. 14V, at step 14V1, the arithmetic scratch pad register 01A–01F is cleared and flag 1, i.e., flip flop 825 of the CPU 210 is set to make an initial assumption that the 15 kilogram scale is not selected. Similarly, the carry register 812 of the CPU 210 is set for an initial assumption that the 6 kilogram scale is not selected.

Then, in step 14V2, the 30 lb. enable RAM register 043 is examined to determine whether the 30 lb. scale is selected. If it is, operation jumps to step 14V6. However, if it is not, the carry is then reset in step 14V3 to assume that the 6 kilogram scale is selected. Then, in step 14V4 the 6 kilogram enable register RAM 044 is examined to determine whether the 6 kilogram scale is selected. If it is, operation jumps to step V6. However, if it is not, the carry register is set and flag 1 is reset to note that the 15 kilogram scale is selected.

Then, at step 14V6, the flag 1 (FF825) and carry register 812 are used to load into the X register 813 of the CPU 210 a 5 if the 15 kilogram scale was selected, a 3 if the 30 lb. scale is selected and a 6 if the 6 kilogram scale is selected. In step 14V7 there is loaded into the accumulator 810 a 5 if the 15 kilogram scale was selected, a 1 if the 30 lb. scale is selected, and a 2 if the 6 kilogram scale is selected. Then, in step 14V8 the address DD1A of the arithmetic scratch pad register AR1 is loaded in the BL section of the address register 814 and operation returns to the next order in the sequence of operations at which the find scale capacity sequence of operations was called.

Referring now again to FIG. 14A, data returned in this manner is then used in steps 14A16 through 14A22 to set up a timing sequence for providing the time interval during which the analog weight signal is integrated as part of the analog to digital conversion.

In the exemplary embodiment of the present invention three, four bit, digital timers are employed; a "Long Timer" in RAM register 00A, a "Mid Timer" in RAM register 009, and a "Short Timer" in the accumulator and initialized to the values shown in steps 14A17, 14A20, or 14A22. These timers are then processed according to the subsequently described timing subroutines in order to provide the desired integrating time interval $T_1$ illustrated in FIG. 12.

Although a single timer register having sufficient bit capacity could be used to provide the desired time interval, it is advantageous to use the short, mid and long timers described above.

As an example, if the scale has been set or conditioned to operate as 6 kilogram scale, the long timer 00A, is set to a 15 state, the mid-timer 009, is set to its 3 state, and the short timer in the accumulator is set to a 9 state.

After loading this initial timing data into the long, mid and short timers, the CPU 210 at step 14B1 switches the transistor 94 (FIG. 4) of the switching circuit 50 to its conduction state in order to apply the analog weight signal to the integrator circuit 51 and begin the integration.

The delay subroutine at step 14B2 then uses the previously loaded long, mid and short timers to provide the desired time-delay such as $T_1$. This delay subroutine comprising a counting and timing program loop of instructions is illustrated in detail on FIG. 14W.

Referring now to FIG. 14W, upon entry into the delay subroutine at step 14W1, the four bit contents of the midtimer is loaded to register X813 of the CPU. The four bit contents of the short timer is then loaded at step 14W2 into the accumulator and decremented. The timer is checked at step 14W3 to determine whether it had previously been 0. If it was not 0, then at step 14W4 a 105 microsecond delay is obtained by causing the CPU 210 to perform some instructions causing the CPU to count cycles for the purpose of gaining the delay. Thereafter, the sequence of operation loops back again to step 14W2. Operation continues to loop through these 14W2 through 14W4 steps until the short timer is decremented to zero. Thus, it will loop through these steps a number of times equal to the number initially loaded into the short timer.

When a 0 is detected in step 14W3, the operation jumps to step 14W6 in which the mid-timer is loaded into the accumulator and decremented. The contents of the mid-timer is then checked at step 14W7 to determine whether it was a 0. If the mid-timer was not 0, a 1.3 millisecond delay is provided by setting the short timer to a 12 state and looping back to step 14W2. This causes the operations to loop through steps 14W2, 14W3, and 14W4 twelve tmes until the short timer again is decremented to 0.

Thereupon, steps 14W6, 14W7, and 14W8 will again be performed and the entire procedure repeated until the midtimer was found to be 0 at step 14W7. Upon finding the midtimer to be 0 at step 14W7, the operation jumps to step 14W10 which sets up a 14.3 millisecond time delay by loading an 11 state into the mid-timer. The previously set long timer is then loaded into the accumulator at step 14W11 and is decremented. Then, at step 14W12, the timer is checked to determine whether it was previously 0. If the long timer was not previously 0, operation loops back to step 14W8 and then to step 14W2 and repeats the previously described loop until operation arrives again at step 14W12 and finds that the long timer was decremented to zero. This will signify that the entire selected time delay such as $T_1$, during which the analog signal was integrated has expired and operation can return to step 14B3 of FIG. 14B.

Returning to FIG. 14B, at step 14B3, the timing loop counters which are going to be used during the time intervals for integrating the reference DC source are cleared. The discrete outputs of the CPU 210 are disabled and the state of the output 102 of the threshold detector 53 is examined.

If, during the first integrating interval $T_1$ then (See FIG. 12), the output of the integrator 51 becomes opposite in polarity from the initial level $V_0$ along a slope such as $S_D$ to a level such as $V_3$ such output represents a negative raw weight of relatively large magnitude. This might happen if the platter were removed if an operator lifted up on it. It will immediately cause the output of the threshold detector 53 to switch to its low state. If the comparator is found to be in a low state at step 14B5, then this indicates at step 14B6 that a large negative raw weight was detected and therefore all the discrete outputs of the CPU are enabled and operation jumps to step 14E14 at FIG. 14E and then to step 14M10. This results in skipping of many intermediate operations which check, filter, correct, or otherwise process the raw weight and which would not be meaningful with such negative weight data.

However, if a positive raw weight is found in step 14B5 such as would result from the integration along slope $S_1$ to $V_1$, operation proceeds to step 14B8 which stops the integration of the analog signal by switching transistor 94 to a non-conducting state and begins the first reference source integration, such as time interval $T_2$, by switching the transistor 95 of FIG. 4 to its conducting state.

Steps 14B9 through 14B11 form the interrogation and counting cycle or instruction loop for the integration of the comparator or threshold detector during the $T_2$ integration time of the first reference DC source. During each instruction loop, the output of the threshold detector 53 is periodically interrogated and a counter is incremented each time the output of the comparator has not changed sign. This counting for both the first and second reference DC source integrating intervals $T_2$ and $T_3$ is done in three, four-bit counters, one counter for each of three hexadecimal digits.

While each of these three, four-bit counters could be formed in three, four-bit RAM registers, it is more convenient to form them in the save register 817 forming a part of the CPU 210 illustrated in FIG. 9. The twelve bits of the save register 817 comprise three, four-bit counters referred to as counter 1, counter 2, and counter 3. This is convenient because the Rockwell PPS-4/2 CPU has an instruction, with the mnemonic CYS, which cycles the save register 817 and the accumulator. This convenient instruction provides a four-bit right shift of the save register 817 with the four-bits which are shifted off the right end of the save register 817 being transferred to the accumulator and with the contents of the accumulator being transferred into the left end of the save register 817.

As shown in steps 14B9-14B11, the counting begins by setting the carry register 812 of the CPU 210 (FIG. 9) to its 1 state. That carry is added to the contents of counter 1 with the results placed in counter 1. Then any carry generated from counter 1 is added to the contents of counter 2 with the result placed in counter 2. Then any carry produced by counter 2 is added to the contents of counter 3 and the result placed in counter 3.

At step 14B10, the output 102 of the threshold detector is then loaded to the accumulator and examined in step 14B12 to determine if it is yet low, that is whether the $V_o$ level has been crossed. If the comparator is not low, operation then loops back to step 14B9 where it passes again through steps 14B9-14B11. Each pass through this loop requires 65 microseconds using the specific selected CPU instructions. Operation continues to loop through steps 14B9-14B11 until the comparator is found at step 14B11 to have switched to its low state. This indicates that the output of the integrator circuit 51 has crossed its initial voltage level $V_o$.

An additional 65 microsecond delay is then provided at step 14B12 to extend the second integrating time by the interval $T_{2C}$ shown on FIG. 12 and described above. Then, at step 14B13, transistor 95 of FIG. 4 is switched to its non-conducting state to halt the integration of the first reference DC source.

The count contained in the three timing loop counters for the second integrating time interval $T_2$ is then stored in the scratch pad registers 70, 71, and 72 of the RAM memory and the counters (the SA register 817) are cleared for reuse. Then at step 14B15, the third timing interval $T_3$ illustrated in FIG. 12 is begun by switching the transistor 96 of FIG. 3 to its conducting state to apply the second reference DC source to the integrator circuit 51.

Then steps 14B16, 14B17, and 14B18 provide an interrogation and counting cycle or loop of steps 14B9-14B11. While the steps of the $T_3$ counting loop are not identical with the steps of the $T_2$ loops, they require the same overall time of 65 microseconds. During each pass through this $T_3$ cycle, the output 102 of the threshold detector 53 is examined to determine whether it has returned to its high state. So long as it has not, operation continues looping through the $T_3$ interrogating and counting cycle of steps 14B16-14B18. However, whenever in step 14B18 the output 102 has found to have shifted to its high state, then at step 14B19, the transistor 96 (FIG. 4) is turned off to stop the integration of the second reference DC source and the integrator 51 is reset by switching the transistor 97 to its conducting state.

Then, at step 14B20, the contents of counter 1 and counter 2 of the $T_3$ counters is stored in RAM memory register spaces 73 and 74. At step 14B21, the scratch pad memories (i.e., register spaces 01A through 01F) illustrated in FIG. 13 are cleared for subsequent use.

Thus the contents of each four-bit register 70, 71, 72, 73, and 74 now represents a hexadecimal digit of the $T_2$ and $T_3$ count which in turn represent the raw weight on the scale. Next these counts are converted to decimal notation and then finally to raw weight increments. This is begun in step 14B22 by multiplying the contents of register 72 (which has stored in it the most significant hexadecimal of the $T_2$ count) by 256 and moving the result to the weight register 02A through 02F illustrated in FIG. 13. Then, at step 14C1, the weight sign is cleared and the temporary scratch pad register is again cleared. The contents of register 71 (which has stored in it the next most significant hexadecimal of the $T_2$ count) the $T_2$ counter is multiplied in step 14C2 by 16 and the result moved to the arithmetic scratch pad register illustrated in FIG. 13. Then, at step 14C3, the results of these two multiplications are added together with the result being moved to the weight register. Then, at step 14C4 the least significant hexadecimal digit of the $T_2$ count is converted to decimal form and added to the sum in the weight register. At 14C5 the resulting total is placed in the weight register and represents the total count during time interval $T_2$ in decimal digits. The arithmetic scratch pad register is then cleared. While the digits of this decimal number are different from the digits of the hexadecimal number, both numbers represent the same number of counts or cycles obtained during the $T_2$ interval and each count represents 32 raw weight increments.

The decimal conversion of the $T_3$ count then begins at step 14C6 by moving the contents of register 74 (which has stored in it the most significant hexadecimal digit of the $T_3$ count) to the arithmetic register. As stated previously, the reference signal level during time interval $T_3$ is 1/32 the reference signal level which is integrated during time interval $T_2$ and therefore each count during time interval $T_2$ represents 32 times as much as analog weight signal (i.e., 32 raw weight increments) as does each $T_3$ count. In order to eliminate the effect of the additional 65 microsecond delay provided at step 14B12 during time interval $T_2$, (one additional $T_2$ count) 32 counts are subtracted from the $T_3$ count in step 14C6.

Conversion of the $T_3$ count to decimal form then proceeds at step 14C7 by multiplying the result of the subtraction in step 14C6 by 16 and moving the result to the temporary scratch pad register (FIG. 13). The arithmetic register is also cleared and in step 14C8 the low digit of the $T_3$ count is moved from register 74 (FIG. 13) to the arithmetic register and converted to decimal form. The result of the multiplication in step 14C7 which is stored in the temporary scratch pad register and the result of the decimal conversion of step 14C8 which is stored in the arithmetic register are then added together in step 14C8 to represent the total counts (raw weight increments) during time interval $T_3$ reduced by 32 counts to compensate for the 65 microsecond delay as described above.

Because each $T_2$ count represents 32 times as much analog weight signal amplitude as each $T_3$ count, at step 14C9 the total of the $T_2$ counts is multiplied by 32 and the result is moved to the weight register. Then, at step 14C10 the $T_3$ count is subtracted from the $T_2$ count in order to provide the net number of raw weight increments. This final number of raw weight increments, which is proportional to the sum of the weight on the scale platter and the analog offset, is then moved in step 14C11 to the weight register and is referred to as the raw weight.

PROCESS WEIGHT

In the process weight operation VII, the presence or absence of platter motion if first detected and noted, the digital weight data resulting from step 14C11 is then filtered or updated, the appropriate initial analog offset is digitally subtracted and finally the "x10 EXPAND" operations are performed if that mode is selected.

The detection of motion begins at step 14C12 with the subtraction of the filtered weight, which represents a previously detected and processed weight which was stored in the filtered weight register during a previous pass through an operation sequence cycle. It is subtracted from the most recently detected raw weight resulting from step 14C11. The sign of the result of this subtraction is moved to the arithmetic sign register 019 in step 14C13.

In step 14C14, a determination is made whether the result of the above substraction is less than or equal to five raw weight increments. If this result is less than or equal to five raw weight increments, then this is accepted as one detection of a no motion condition and operation goes to step 14C17 wherein a fifteen is loaded into the accumulator and then added to the motion flag to decrement the motion flag. It will be recalled that the motion flag is a three state flag which required two detections of no motion prior to concluding that no platter motion exists. Consequently, at step 14C18 the motion flag is examined to determine whether it had decremented to zero. If the motion flag had already been zero, then no motion existed for the last two passes through the operational sequence cycle and consequently operation proceeds to step 14C22. However, if the flag was not already zero, then operation advances to step 14C19.

If at step 14C14 the result of the subtraction was found to be greater than 5 counts, then a motion condition exists so in step 14C15 a two is loaded into the accumulator for purposes of subsequently setting the motion flag to its two state and operation proceeds to step 14C19.

At step 14C19 the motion flag is updated with either the 2 from step 14C15 or its decremented state from step 14C17. Then, at step 14C20 the output filter counter is set to its three state to indicate that new weight data has been detected. The recompute flag is also set to indicate that new price computations must be made subsequently and operation advances to step 14D5.

However, if at step 14C18 the motion flag was found to have been zero, so that a no motion condition was found to exist, then the initial raw weight filtering operation will occur at step 14C22. The purpose of raw weight filtering is to eliminate the effects of noise and random data shifts. In step 14C22 the least significant digit of the most recently detected raw weight from step 14C11 is written into RAM register 035. The least significant digit of the previously detected weight count is written into RAM register 034. Then, using the most recently detected raw weight and the two previous raw weights, a determination is made at step 14D1 whether the least significant digit of the second previous detected raw weight is equal to the least significant digit of the first previous raw weight. If these are not equal then the filtering operations must be performed beginning in step 14D3. If, however, at step 14D1 these digits are found to be equal, then at step 14D2 a determination is made whether the least significant digit of the first previous raw weight is equal to the least significant digit of the most recently detected raw weight. If these are not equal, then filtering must be performed beginning at step 14D3. However, if the least significant digits are found to be equal in both steps 14D1 and 14D2, filtering may be skipped and operation jumps to step 14D5.

The filtering operation which begins at step 14D3 consists essentially of forming a new filtered weight by adjusting the most recently detected weight toward the previously detected and modified weight which is stored in the filtered weight register (FIG. 13). The most recently detected raw weight is adjusted toward the previously filtered weight by one count more than one half the difference between the previously filtered raw weight and the most recently detected weight. Therefore, in step 14D3 the least significant digit of the difference between the most recently detected weight and the previous filtered weight is divided by 2 and then the integer part of the result added to 1.

If in step 14D3A this difference divided by 2 is found to be 0 (i.e., if the difference was 0 or 1, then the filtered raw weight is written into the weight register (FIG. 13).

However, if the difference is not 0 or 1 then at step 14D4 the most recently detected raw weight is adjusted toward the previously filtered weight by 1 count more than ½ the least significant digit of the above difference. This is then treated as a new filtered raw weight and is first moved to the weight register. Then, in step 14D5 this weight is moved to the filtered weight register to provide an updated filtered raw weight for subsequent use.

It was previously described that potentiometer 76 is adjusted to provide a fixed analog offset under no weight conditions. Therefore, this initial offset must be removed from the detected raw weight data. This is done in steps 14D6 through 14D14. However, because a different analog signal integrating time interval is used for different scale capacities and the load cell output voltage is interpreted differently for different capacities, a different number must be subtracted from the raw weight of each scale capacity.

Therefore, in step 14D6 the find scale capacity subroutine of FIG. 14V is performed which returns the data described above. The returned data is used to set the arithmetic scratch pad register to 003700 if the 6 Kg scale capacity is selected, to 001600 if the 15 kilogram scale capacity is selected, and to 001700 if the 30 pound scale capacity is selected.

After the arithmetic scratch pad register is set to one of these three numbers, which is the analog offset expressed in raw weight increments for the particular scale capacity selected, then in step 14D14 the chosen number of raw weight increments is subtracted from the raw weight and the result is moved to the weight register.

In step 14D15 a check is made to determine whether the "x10 EXPAND" mode has been selected. If it is not, which is the usual situation except when servicing, etc., operation jumps to step 14E3.

However, if the "x10 EXPAND" mode has been selected, a determination is made at step 14D16 whether the raw weight is less than or equal to 2 raw weight increments. If it is, operation proceeds to step 14D17 in which an 8 is loaded into the accumulator for subsequent use in turning on the zero lamp to indicate that the scale is zeroed. If, however, the weight is found to be greater than 2 raw weight increments, then operation proceeds to step 14D19 in which a 0 is loaded into the accumulator for subsequently turning off the zero lamp to indicate that the scale is not zeroed.

After steps 14D17 or 14D19, operation proceeds to step 14D20 in which the 0 or 8 from the accumulator is loaded into the zero lamp register 021 (FIG. 13) for later use in control of the zero lamp. Also flag 2, 825, of the CPU 210 illustrated in FIG. 9 is set to note that the "x10 EXPAND" mode has been selected. This flag is used in step 14D21 which is the subroutine for updating the output weight.

In the Update Output Operation XVII of step 14D21, the five most or five least significant digits of data in the weight register (FIG. 13) are moved to the output weight register (FIG. 13) unless a negative weight is found or the 300 printer enable mode 10 is selected. If either of these two latter conditions exist, operation jumps to the weight blanking sequence of operations beginning at step 14E14.

Figure 14X:
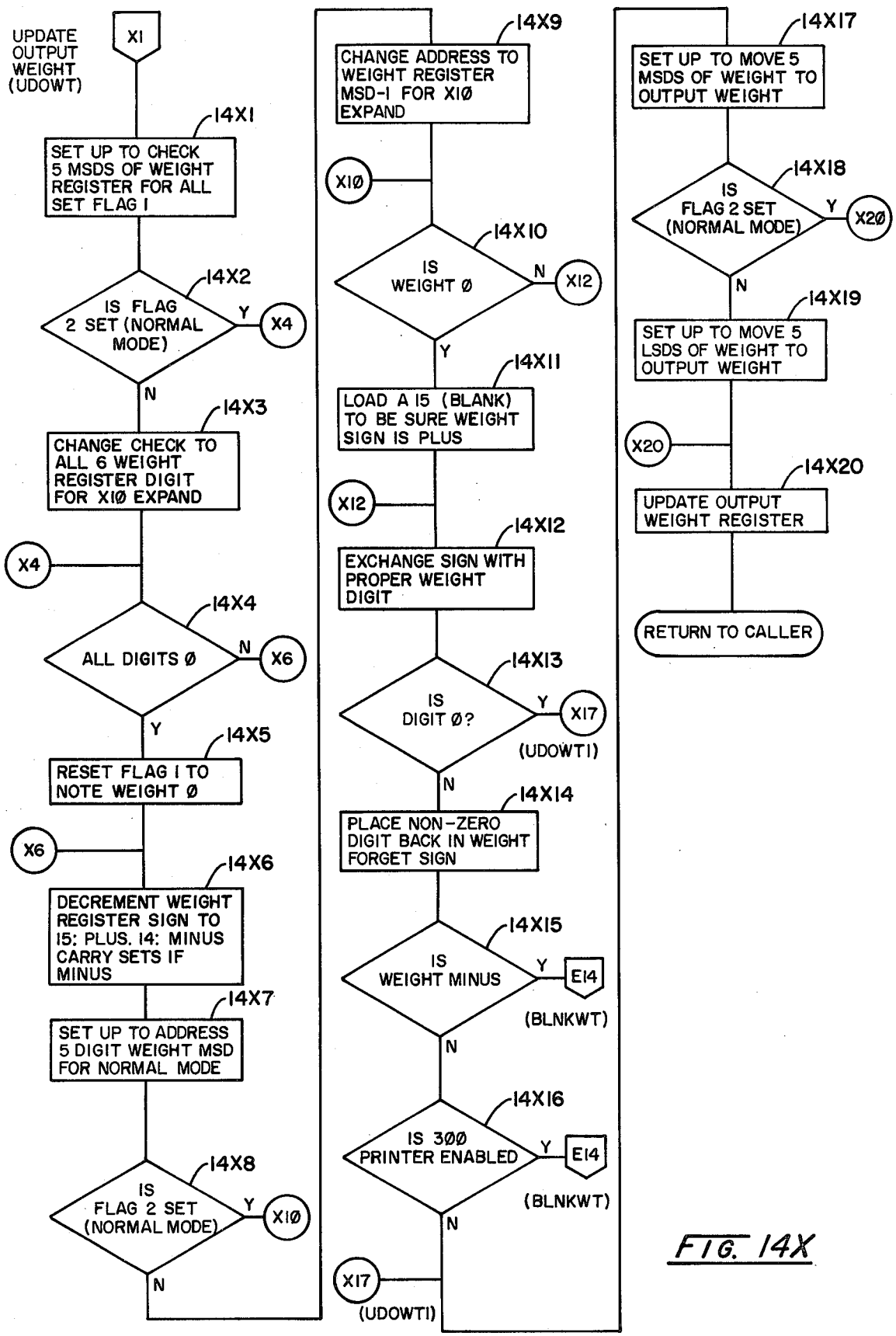

Referring in detail to the Update Output Weight operation in FIG. 14X, at step 14X1, the computer is set up to check the five most significant digits of the weight register for all zeroes and flag 1 of the CPU 210 is set. Then, in step 14X2 flag 2 of the CPU 210 is checked to determine whether it is set to indicate the normal mode of operation or whether it is reset to note the "x10 EXPAND" mode of operation. If flag 2 is found to be reset, then in step 14X3, the previous step 14X1 set up is changed to set up to check all 6 weight register digits as is appropriate for the "x10 EXPAND" mode. Otherwise, if flag 2 is found to be set in step 14X2, operation proceeds directly to step 14X4.

In step 14X4, the digits are checked to determine if they are all zero. If all digits are found to be zero, then in step 14X5 flag 1 of the CPU 210 is reset to note that the weight is zero. If, however, the digits are not all zero, then operation proceeds directly to step 14X6.

Then, in step 14X6, the weight register sign data is decremented to 15 if it is a plus and to 14 if it is a minus. Additionally, the carry is set if it is a minus. In step 14X7, the registers are set up to address the most significant digit of the 5 digit weight for the normal mode of operation. Then in step 14X8 flag 2 is interrogated to determine whether it is set to indicate a normal mode of operation. If it is set, operation jumps directly to step 14X10. However, if flag 2 is not set, then the "x10 EXPAND" mode is selected and the next lower significant digit is addressed for the "x10 EXPAND" mode.

In step 14X10, the weight is interrogated to determine if it is 0. If the weight is not 0 then a 15 is loaded into the appropriate digit position so that the negative sign is not displayed for a zero weight. If, however, a non-zero weight is detected at step 14X10, then operation proceeds to step 14X12.

In step 14X12 the proper sign is placed in the proper position and in step 14X13 the removed weight digit is examined to determine whether it is zero. If it is zero, operation jumps to step 14X17. If it was not zero, the digit is returned to the proper position in step 14X14 and the sign is forgotten. Then in step 14X15, the weight sign is examined. If the weight sign was minus, operation loops back to the blank weight step 14E14. If, however, the sign was not minus, then RAM register 040 is interrogated in step 14X16 to determine whether the Toledo Scale 300 printer is enabled. If the 300 printer is enabled, the operation loops back to the blank weight step 14E14 because the 300 printer cannot accommodate the required number of significant digits. If the 300 printer is found in step 14X16 not to be enabled or if the exchanged digit examined in step 14X13 is found to be zero, then operation advances to step 14X17.

In step 14X17, the registers are set up to move the five most significant digits of weight to the output weight register. Then, in step 14X18 flag 2 is checked to see if it is set so that operation is in the normal mode. If flag 2 is set, operation advances to step 14X20 and the output weight register is updated with the 5 most significant digits of the weight register.

If, however, flag 2 is not set, thereby indicating that the "x10 EXPAND" mode has been selected, then operation advances to step 14X19 which sets up the registers to write the 5 least significant digits of weight into the output weight register at step 14X19. Then, in step 14X20 the output weight register has the selected five significant digits of the weight register written into it. After step 14X20 operation returns to the next step after it was called.

Returning therefore to FIG. 14D, after the output weight register is updated, the price and total price registers are blanked in step 14D22 because they are not used in the "x10 EXPAND" mode. Operation then proceeds to step 14E1 in which the tare register and the auto-zero register are cleared. Operation then jumps to the output operation XX1 at step 14M19 because the intermediate steps are not significant in the "x10 EXPAND" mode.

MANUAL ZERO CAPTURE

In the usual situation, where the "x10 EXPAND" mode is found at step 14D15 to not have been selected, operation advances to the manual zero capture operation VIII at step 14E3.

In the manual zero capture operation VIII, a series of checks are first made to determine whether the scale should be zeroed. If the scale should be zeroed, the raw weight in the weight register is written into the auto zero register (FIG. 13). The data in the auto zero register is then subtracted from the detected weight to provide a corrected raw weight and a check for overcapacity is made.

Considering the manual zero capture check operation VIII in greater detail, the RAM memory is checked at step 14E3 to determine whether the "Z" key was pressed. If the "Z" key was not pressed, then the zeroing operation is skipped and operation jumps to step 14E10 because manual zeroing is not desired where not initiated by depression of the "Z" key.

If, however, the "Z" key is found is step 14E3 to have been depressed, then operation proceeds to step 14E4 to check the net flag to determine whether the system is in the net mode. If the system is already in the net mode then gross zeroing is not appropriate and operation jumps to step 14E10. However, if the system is found not to be in the net mode, then at step 14E5 the motion flag is checked to determine whether motion exists. If motion exists, then the weight data detected during such motion should not be used for zeroing purposes and operation similarly jumps to step 14E10. However, if the motion flag has not been set then at step 14E6 a two is added to the zero key timer and it is checked in step 14E7 to determine whether it is zero. If the zero key timer is found not to have advanced to zero, then the "Z" key has not been depressed sufficiently long to permit zeroing of the weighing scale so that operation jumps to step 14E11.

However, if at step 14E7 the zero key timer has gone to zero, then at step 14E8 a check is made whether the weight count is less than 400 raw weight increments. If the weight count is greater than 400 raw weight increments, a significant weight must exist upon the platter and consequently zeroing would be undesirable and operation jumps to step 14E11. However, if the weight is less than 400 raw weight increments, operation proceeds to step 14E9 in which the detected weight data is moved into the auto zero register and the zero done flag is set to indicate that the scale is zeroed. At step 14E10, the zero key timer is cleared.

When operation proceeds to step 14E11, the data in the auto-zero register is subtracted from data in the weight register. The data in the auto-zero register represents the correction factor used to zero the weighing scale. Consequently, when subtracted from weight data the result represents the accurate, zeroed weight upon the weighing scale platter.

Then, at step 14E12 this zeroed weight is subtracted from 030050, which represent a weight which is 50 raw weight increments beyond the scale capacity to determine whether the scale is reading a weight beyond its maximum capacity.

A check is then made in step 14E13 to determine whether the result of this subtraction is positive. If it is negative, this indicates that the scale is not beyond its capacity and consequently operation proceeds to the gross auto zero correction operation IX at step 14E16.

However, if the result of the subtraction is positive, the scale is overcapacity and operation advances to step 14E14 wherein the output weight is blanked. From step 14E14 operation advances to step 14E14 wherein the output weight is blanked. From step 14E14 operation then jumps to step 14M10 for blanking the total price and continuing the operation.

GROSS AUTO ZERO CORRECTION

Although the weighing scale of the present invention may be manually zeroed as provided in operation VIII the zero will still be subject to some drift or wandering. It is therefore desirable to automatically track these changes in order to maintain an accurate correction factor in the auto zero register.

In the gross auto zero correction operation IX, the corrected weight from step 14E11 is examined to determine whether the scale is within an auto zero correction band of ±4 raw weight increments within which the gross zero will be automatically tracked or corrected. If the raw weight is within the auto zero correction band, the zero increment flag is set. If the total auto zero correction factor will less than 400 raw weight increments and the corrected raw weight is not already exactly zero, then the auto zero correction factor is corrected by one raw weight increment.

Examining the gross auto zero correction operation IX in detail, the raw weight from step 14E11 is examined in step 14E16 to determine whether it is less than or equal to 4 raw weight increments. If the raw weight is found to be less than or equal to 4 raw weight increments then the scale is within the auto zero increment and operation proceeds to step 14E19. In step 14E19, a 15 is loaded into the accumulator in order to subsequently set the zero increment flag to note that the scale is within the auto zero increment.

If in step 14E16, the corrected raw weight from step 14E11 is found to be greater than 4 raw weight increments then in step 14E17, a 0 is loaded into the accumulator from subsequent clearing of the zero increment flag to note that the scale is not within the auto zero increment.

Then, in step 14E20, the number previously loaded into the accumulator is written into the zero increment flag and flag 1 of CPU 210 is set to note the gross weighing mode.

At step 14E21, the corrected raw weight is again examined to determine whether it is either outside the auto zero correction band or equal to zero because in either situation correction of the auto zero register will be skipped. Therefore, if at step 14E21 the raw weight is found to be greater than 4 counts or equal to 0, operation jumps to step 14F1. If, however, the raw weight is within the gross auto zero correction band but is not equal to zero, operation proceeds to step 14E22 which is the "Correct Auto Zero" operation XXVIII beginning at step 14Y1 of FIG. 14Y.

Referring now to FIG. 14Y, at steps 14Y1 and 14Y2, the arithmetic scratch pad register is cleared and a factor of one is written into its least significant digit. The weight sign is loaded to the accumulator and complemented and then is written into the arithmetic scratch pad sign register. Then the auto zero register is addressed.

In step 14Y3, flag 1 is interrogated to determine whether it is set to note the gross mode or reset to note the net mode since the Correct Auto Zero Operation XXVIII is used for gross auto zero correction as well as net zero tracking. Therefore, if flag 1 is found in step 14Y3 to be set, operation jumps to step 14Y5 for the gross auto zero correction while, if the flag 1 is found in step 14Y3 to be reset, then operation advances to step 14Y4 in which the address is changed to the tare register which is corrected in net zero tracking.

In step 14Y5 the 1 which was prevously loaded in the arithmetic scratch pad register is algebraically added to either the auto zero register or the tare register depending upon which is addressed as a result of steps 14Y2, 14Y3 and 14Y4. The result of this correction is written into the RAM result registers 005 through 00F.

Then, in step 14Y6 flag 1 is again interrogated to determine whether the scale is in the gross mode. If it is not in the gross mode, operation returns to the calling operation. However, if the scale is in the gross mode operation proceeds to step 14Y9 in which the corrected result is examined to determine whether it is less than 400 raw weight increments.

If the resulting gross auto zero correction factor is less than 400 raw weight increments, than at step 14Y10 the auto zero register is updated with the corrected auto zero factor from the result register. However, if the result is equal to or greater than 400 raw weight increments then no further auto zero tracking is permitted. This prevents the zero increment from being more than 400 raw weight increments from the factory determined zero. Operation then returns to the step after the calling operation leaving the auto zero register with its previous contents.

MULTIPLY RAW WEIGHT BY PROPER FACTOR

Referring to FIG. 14F, up until this point in the sequence of operations, the weight is represented in raw weight increments regardless of the scale capacity which has been selected with 30,000 raw weight increments representing full scale capacity.

In this operation X, the raw weight is multiplied by the proper integral factor to convert the raw weight digits to digits representing the selected and conventional units of weight.

At step 14F1 with the find scale capacity subroutine operation XXV is performed and will return to the accumulator a 5 if the 15 kilogram scale is selected, 1 if the 30 lb. scale is selected and 2 if the 6 kilogram scale is selected. Thus, in step 14F2 the returned multiplier is written into the arithmetic scratch pad register and in step 14F3 it is multiplied by the raw weight with the result being moved to the weight register. Therefore, after step 14F3, the digits in the weight register represent the decimal digits of the detected weight.

In step 14F4, the most significant digit of the price register is examined to determine whether it is greater than or equal to 8. This interrogation of the most significant digit of the price register is necessary because, if the verify key was depressed elsewhere in the sequence of the operation, that will cause all 8's to be loaded into the price digits. Therefore, if an 8 or 9 is found in the most significant price digit, operation will proceed to step 14F5 to clear the price register, factor flag and digit timer and to clear the total price if the weight is positive and to blank the total price if the weight is negative.

However, if the verify key was not depressed and consequently an 8 or 9 is not found in the most significant price digit, operation jumps from step 14F4 to step 14F6. It might be noted that a result of steps 14F4 and 14F5 is that the operator will not be permitted to input an 8 or 9 to the most significant price digit and get meaningful results. However, this presents no problem because such large prices are not encountered in the usual operation of the weighing scale.

MANUAL TARE

The manual tare operation XI permits the operator to place a tare object on the scale platter and have the tare weight written into memory. In this operation, a series of checks are performed and if conditions are proper, the weight is written into the tare weight register, some flags are conditioned and some registers are then cleared.

At step 14F6, the zero done flag is interrogated to see whether the weighing scale was previously zeroed. If it was not, then the tare operation and the net mode of operation are not permitted so that operation will jump to step 14F22.

However, if the scale was zeroed, the state of the manual tare flag is written into the accumulator and the manual tare flag register is itself cleared in step 14F7. In step 14F8 the manual tare flag is examined to determine whether it is set. If it is not set this indicates that the tare key was not depressed and detected during the read keyboard operation XXIII and therefore operation jumps from step 14F8 to step 14G1, skipping the manual tare operation.

If, however, the manual tare flag is set then in step 14F9 the motion flag is interrogated to determine whether there is motion. If the motion flag is found to be set so that motion exists, then erroneous tare weight data would be on the scale. Therefore, operation jumps from step 14F9 to step 14G1.

However, if no motion is detected, then in step 14F10 the most significant digit of the weight register is examined to see if it contains a zero. If it does not, operation must jump to step 14G1 and the manual tare operation skipped because the most significant weight digit will be used to display a negative sign in the net mode of operation.

If the most significant digit of the weight register is found to be zero, operation proceeds to step F11, in which the zero increment flag is examined to determine whether the scale is within the auto zero correction band. If the scale was within the auto zero correction band, operation proceeds to step 14F13, but if it is not then the weight sign is examined to determine whether it is minus. If the weight sign is not minus, operation continues to step 14F13. However, if the weight sign is found to be minus, operation jumps to step 14G1.

In step 14F13 preparations are made for moving the weight to the tare register. The zero increment flag is then examined in step 14F14 to again determine whether the scale is within the auto zero correction band. If it is not, operation proceeds to step 14F16 at which the weight data in the weight register is moved to the tare register to store it as the tare weight.

If at step 14F14, the scale is found to be within the auto zero correction band, then at step 14F15 the register is cleared so that in step 14F16 all zeroes will be moved into the tare register. Steps 14F14, 14F15, and 14F16 permit the entry of a zero tare weight in order to permit the operator to intentionally override or satisfy the tare mandatory mode if that mode was selected at the factory. It also assures that zeroes will be displayed whenever the weighing scale is within the auto zero correction band even though it is not at absolute zero.

Operation then proceeds to step 14F17 in which the zero increment flag is again examined to determine whether the weighing scale is within the auto zero correction band. If it is not, an 8 is loaded in step 14F18 into the accumulator for subsequent use to set the net flag and thereby indicate that the weighing scale is in the net mode. If, however, the weighing scale is found in step 14F17 to not be in the auto zero correction band, then operation jumps to step 14F20 in which zeroes are loaded into the accumulator for subsequent use to clear the net flag and thereby indicate that the weighing scale is in the gross weighing mode.

Then at step 14F21, the contents of the accumulator from either step 14F18 or 14F19 is written into the net flag, the tare done flag is set to indicate that the tare operation has been completed and the recompute flag is set to indicate that a new price must be computed upon entry into the compute total price operation XX. Then, in step 22 the price register, factor flag and the digit timer are all cleared. The total price is cleared if the weight is plus and is blanked if the weight is minus.

SUBTRACT TARE

Operation then proceeds to step 14G1 at which the tare weight is subtracted from the weight and the resulting net weight is written into the weight register.

NET AUTO ZERO CORRECTION

As explained above, the exemplary embodiment tracks changes in the net zero by modifying the tare register data to correct for such changes. This is done in steps 14G2 through 14G15.

In step 14G2 the weight in the weight register is examined to determine whether it is zero. If the weight is zero then no net auto zero correction is needed and operation jumps to the auto clear operation XIV at step 14F16. If, however, the weight is not zero, then the net flag is interrogated to determine whether it is set. If it is not set indicating that the weighing scale is in the gross weighing mode, then the net auto zero correction is skipped and operation jumps to step 14G16. If, however, the net flag is set, then operation proceeds to the find scale capacity operation at step 14G4.

Because the weight data in the weight register is no longer in raw weight increments but has been converted to weight units appropriate for the selected scale capacity, the band for the net zero correction will be different for the different scale capacities.

Therefore, in steps 14G5 through 14G11, the data returned by step 14G4 will set the arithmetic scratch pad register to 000009 if the 6Kg scale capacity is selected, to 00025 if the 15Kg scale capacity is selected and to 000005 if the 30 pound scale capacity is selected.

Then, at step 14G12 the number written into the arithmetic scratch pad register is subtracted from the weight and flag 1 of the CPU 210 is reset to note the net mode. Then in step 14G13, the result of the above subtraction is checked to determine whether it is positive. If the result is positive, then the weight is above the net zero correction band and operation proceeds to step 14G16 without any correction. If, however, the result of the subtraction of step 14G12 is found in step 14G13 to be negative, then the tare register is corrected in step 14G14 as previously described by the correct auto zero operation XXVIII, with the result of the correction being written into the tare register in step 14G15.

AUTO CLEAR

In the auto clear operation the tare and price registers are to be automatically cleared after an object has been weighed if that mode is selected. They are cleared if the scale rises above ten scale increments, remains for a sufficient length of time above the ten scale increments and then falls below the ten increments.

The auto clear operation XIV begins at step 14G16 with the find scale capacity operation. The multiplier digit which is returned to the accumulator is then written into the third least significant digit of the arithmetic scratch pad register in step 14G17. The number written into the scratch pad register at step 14G17 represents 100 raw weight increments for the selected scale capacity. That number is then subtracted at step 14G18 from the weight and the result is examined at step 14G19. If this result is plus, this indicates that the scale is still weighing a weight above the 100 raw weight increments and that therefore the price and tare registers should not yet be clear. Therefore, operation will jump to step 14H4.

However, if at step 14G19 the result is found to be negative, then the weight is below 10 scale increments and the auto clear flag is cleared at step 14G20. Then in step 14G21, the state of the auto clear flag prior to clearing in step 14G20 is examined to determine whether it was equal to 6. If the auto clear flag was equal to 6, this indicates that the weight previously had been above 100 raw weight increments for a sufficient length of time that the tare and price registers should now be cleared and operation will advance to step 14G22. If, however, the auto clear flag had not advanced to a 6, then the weight was not above 100 raw weight increments for a sufficient length of time and clearing of these registers should not be done. Therefore, operation will jump to step 14H6.

At step 14G22, a determination is made whether a "prepack" or "by count" mode is selected. If a "prepack" or "by count" mode is selected, then auto clear will be skipped because any price and tare data in the price and tare registers will be used in subsequent weighing operations. However, if in step 14G22 neither the "prepack" or "by count" mode is selected, operation advances to step 14H1 in which memory register 053 is examined to determine whether the auto clear mode was selected. If the auto clear mode was not selected, operation jumps to step 14H6 and automatic clearing is skipped. If, however, auto clear is enabled, then operation advances to step 14H2 and the tare register, the price register, the factor flag and the digit timer are cleared. The total price is cleared if the weight is positive and blanked if the weight is negative. After step 14H2, operation advances to step 14H6.

If in step 14G19, the result of the previous subtraction indicated that the weight was still above the 100 raw weight increments, then operation advances to step 14H4 in which the auto clear flag is interrogated.

If the auto clear flag is found to have advanced to its "six" state, this indicates that the weight has been above 100 raw increments sufficiently long to permit automatic clearing whenever the scale weight falls below the 100 raw weight increments. Therefore, nothing is done to the auto clear flag and operation advances to step 14H6. If, however, the auto clear flag has not advanced to its "six" state, then in step 14H5 the auto clear flag is incremented.

ZERO LAMP

In the Zero lamp opertions of steps 14H6 through 14H20, a check is made to determine whether the weight data is within a small range of zero referred to as the zero increment range. If it is found to be within this range on two successive checks it is considered to be in this range and the zero lamp is turned on.

In operation 14H6, the find scale capacity operation XXV is performed, and in operations 14H7 through 14H13, the data returned by step 14H6 is used to set the arithmetic scratch pad register to a 5 if the 6 kilogram scale is selected, a 14 if the 15 kilogram is selected and a 3 if the 30 lb. scale is selected. Then, in step 14H14 the number set in the arithmetic scratch pad register is subtracted from the weight and the result is examined in step H15 to determine whether it is plus. If the result is plus, the weight is above the zero increment range. Therefore, in step 14H16, a 2 is loaded to the accumulator for subsequent use in setting the zero lamp flag so that the zero lamp will be turned off. Operation then jumps to step 14H20.

If in step 14H15 the result of the subtraction of step 14H14 is found to be negative then the scale is within the zero increment range. However, since it must be within the zero increment range on two successive checks before the zero lamp is to be turned on, operation advances to step 14H18 in which the zero lamp flag (which has three states) is written into the accumulator and decremented. Then in step 14H19 the flag is examined to determine if it was zero. If it was not zero, operation advances to step 14H20 in which either the decremented state of the zero lamp flag from step 14H18 or the set state from step 14H16 is written into the zero lamp flag register. If it was zero, then the zero state in the zero lamp flag register continues so that the zero lamp remains on.

ROUND OFF

All the above operations involving weight data have been done with six significant digits of weight data. In the round off operation XVI, the weight data is rounded off to fewer significant digits.

Consequently, at step 14H21 the find scale capacity operation XXV is performed and its results examined to determine which scale is selected. If the 6 kilogram scale is selected operation jumps to step 14I4. If, however, the 6 kilogram scale is not selected operation advances to step 14I1 in which the 6 digit weight in the weight register is rounded off to 5 significant digits and the 6th digit is cleared.

Then, at step 14I2, the data returned at step 14H21 is examined to determine whether the 30 lb. scale has been selected. If it has been selected, no further round off is required and operation jumps to step 14I14 at the beginning of the output filter operation XVII.

However, if the 30 lb. scale is not selected then the 15 kilogram scale must be selected and operation jumps to step 14I7 for rounding off by 5. At step 14I7 the 5th least significant digit of the weight is examined and if it is less than 3, operation jumps to step 14I11 in which a zero is loaded in the accumulator. If, however, the 5th least significant digit is not less than 3, then it is examined at step 14I8 and if it is not less than 8, operation jumps to step 14I11 in which a zero is loaded into the accumulator. However, if it is less than 8, a 5 is loaded into the accumulator at step 14I9 and operation advances to step 14I12.

If the 6 kilogram scale was found in step 14H22 to have been selected then in step 14I4 the least significant digit of the five digit weight is examined. If it is odd, the carry register of the CPU 210 is set and operation jumps to step 14I13. If, however, in step 14I4 the least significant digit of the 5 digit weight is found to be even, then operation jumps directly to step 14I13.

In step 14I12 whatever is loaded into the accumulator in step 14I9 or 14I11 is written into the 5th least significant weight digit register. Then at step 14I13 the carry register is added to the 4th least significant digit of the weight register with the result being written into the weight register.

OUTPUT FILTER

In the output filter operation XVII, the most recently detected weight is compared to the weight currently being displayed to determine if it is different enough from the displayed weight to justify an update of the displayed weight. If a sufficient difference occurs 3 times in succession, such an update will be made.

Therefore, in step 14I14 the output weight is moved from the output weight register to the arithmetic scratch pad register along with its sign. This output weight is then subtracted from the weight in the weight register in step 14I15. Then in step 14I16, the motion flag is examined. If the motion flag is set, operation jumps to step 14I22. If the motion flag is not set then at step 14I17 the find scale capacity operation XXV is performed. Then, at step 14I19, a determination is made whether the result of the subtraction in step 14I15 is less than or equal to the number returned by step 14I17 which represents 10 raw weight increments for the selected scale capacity.

If the result of the subtraction is not less than or equal to the returned digit, then operation jumps to step 14I22. However, if the result is less than or equal to the returned digit then in step 14I20 the result is examined to see if it is zero. If it is found to be zero, then there is no difference between the recently detected weight and the output weight and updating is unnecessary and consequently operation jumps to step 14J4. However, if the result is not zero, the filter counter is examined to determine if it is less than 3. If it is not less than 3, then it has not timed out and a difference has not been observed a sufficient number of times to require updating of the output weight. Therefore, if the output filter counter is less than 3, operation jumps to step 14J6 where the output filter counter is loaded into the accumulator and incremented. If, however, the output filter counter is found to not be less than 3, operation advances to step 14I22.

In steps 14I22 flag 2 of the CPU 210 is set to note that the 5 most significant digits of weight data will be subsequently used. Operation then advances to step 14J1. At step 14J1, the memory is checked to determine whether the "by count" mode is selected. If it is, no updating of the output weight display data is appropriate and therefore operation jumps to step 14J4. If, however, it is not in the "by count" mode, then operation advances to step 14J2 which is the update output weight subroutine operation XXVII illustrated in FIG. 14X and described above. After the output weight is updated, then in step 14J3 the recompute flag is set and the print flag is cleared. In step 14J4 the output filter counter is cleared and operation jumps to step 14J7.

In step 14J7, the output filter counter is updated with either the incremented filter counter from step 14J6 or the cleared filter counter from step 14J4.

LOAD LAMPS FOR OUTPUT

In this operation the various lamp status flag registers are checked and their status used to update the lamp status registers 020 through 026 for use in controlling the front and back indicator lamp displays.

In step 14J8, the motion flag is examined. If the motion flag is set then motion exists and a zero is loaded into the accumulator and used in step 14J9 to update the LB/KG lamp register so that the LB/KG lamp subsequently will be turned off during the motion condition. If, however, the motion flag is not set, then an 8 will be loaded to the accumulator for subsequent use in step 14J9 for updating the LB/KG lamp register so that the LB/KG lamp subsequently will be turned on.

In step 14J10, the zero lamp flag is examined. If the zero lamp flag is found to be 0, then an 8 is loaded to the accumulator for use in step 14J11 to update the zero lamp register to subsequently turn on the zero lamp indicating that the weighing scale is zeroed. If, however, the zero lamp is not zero, then a zero is loaded into the accumulator for use in step 14J11 to update the zero lamp register and subsequently turn off the zero lamp.

In step 14J12, the net lamp register is updated with the state of the net flag.

In step 14J13, the second bit of the factor flag is examined. If it is set, then an 8 is loaded into the accumulator for use in step 14J14 to update the per ½ lamp register. However, if it is not set, then a 0 is loaded into the accumulator for use in step 14J14 to update the per ½ lamp register so that the per ½ lamp will be turned off.

In step 14J14, the 4th bit of the factor flag is examined. If it is set, an 8 is loaded into the accumulator for use in step 14J15 in updating the per ¼ lamp register so that the per ¼ lamp will be turned on. However, if the 4th bit of the factor flag is not set, then a 0 is loaded into the accumulator for use in step 14J15 in updating the ¼ lamp register so that the per ¼ lamp will be off.

In step 14J16, RAM register 045 is interrogated to determine whether the UK scale has been selected. If it has been selected, then operation jumps to step 14J20. If the UK scale has not been selected, then a determination is made in step 14J17 whether the "prepack" or "by count" mode has been selected. If the "prepack" or "by count" mode has been selected, an 8 is loaded into the accumulator for use in step 14J18 in updating the prepack lamp registers. If, however, the "prepack" or "by count" mode is not selected, a 0 is loaded into the accumulator for use in updating the prepack lamp registers in step 14J18 so that the legend will not be backlighted.

INTERLOCK CHECK

In the interlock check operation, various conditions are checked to determine whether operation should proceed to the computation of a total price in operation or should skip that operation and jump to the next.

In step 14J20, the "by count" mode is checked. If the "by count" mode has been selected, then operation advances to step 14K1 in which the output weight is blanked as is appropriate for the "by count" mode and then operation jumps to step 14K6 skipping the check to determine whether tare has been done. If it has not been selected, operation proceeds to step 14K3 to determine whether tare has been done.

At step 14K3, a determination is made whether tare has been done. If tare has been done, operation jumps to step 14K9 to determine whether the recompute flag is set. However, if tare has not been done, then in step 14K4 a determination is made whether tare is mandatory. If tare is not mandatory, then operation advances to step 14K9. However, if tare was not done and tare is mandatory, then a price should not yet be computed so operation advances to step 14K5 which clears any total price if the weight is positive and blanks total price if the weight is negative.

Operation then continues to step 14K6 in which the contents of the recompute flag register is written into the accumulator and the recompute flag register is cleared. Then in step 14K7 the condition of the recompute flag as written into the accumulator is checked. If the recompute flag was set, operation skips to step 14M11 and if the recompute flag was not set then operation skips further to step 14N15.

However, if the tare was done or was not mandatory, then in step 14K9, the recompute flag is similarly written into the accumulator and the recompute flag register is cleared. In step 14K10, the condition of the recompute flag as written into the accumulator is examined. If the recompute flag is set so that a new computation of a total price is called for, operation advances to the compute total price operation beginning FIG. 14K. However, if the recompute flag was not set, then the currently exhibited price, weight and total price data do not need modification. Therefore, both the compute total price operation XX and that portion of the output operation XXI which outputs new weight, price and total price data may be skipped. Operation therefore jumps to step 14N15.

COMPUTE TOTAL PRICE

In the Compute Total Price Operation XX, the presence of a factor is checked and if one has been input, the price is multiplied by the factor. This product is checked for overprice and if not overpriced a check is made whether pricing per unit is mandatory. Then if the weight is positive it is mutiplied by the price and the resulting total value is rounded off, checked for overvalue and if not overvalue is stored in the total price register (FIG. 13).

The computation of the total price begins to step 14K11 with the clearing of the arithmetic and temporary scratch pad registers and the setting of flag 2 to assume that the weight is to be multiplied by a factor. Then, in step 14K12 a determination is made whether the price is to be multiplied by a factor of 2 or 4. If the weight is not to be multiplied by a factor, operation proceeds to step 14K13 in which flag 2 is reset to note that the detected weight is to be multiplied directly by price without first requiring that the price be multiplied by a factor. Operation then jumps to step 14L10. However, if the price must first be multiplied by 4 or 2, operation proceeds to step 14K15 in which the price is multiplied by the appropriate factor.

The result of this multiplication will be 11 digits long. If 5 digit pricing is used, then the 6 most significant digits of the result must all be zeroes and if 4 digit pricing is used, then the 7 most significant digits of the price must be zeroes.

Therefore, in step 14K16, a determination is made whether 5 digit pricing has been selected. If it has, the 6 most significant digits of the result are checked in step 14K17 for any non-zero digit. However, if 5 digit pricing is not selected, then in step 14K19 the 7 most significant digits of the result are checked for any non-zero digit.

Since the presence of a non-zero digit in the check of steps 14K17 or 14K19 will indicate that the price constraints have been exceeded, in step 14K20 the results of these checks are examined to determine whether the multiplication has produced an overprice. If the result is overprice, operation advances to step 14L1 in which the price register, factor flag and digit timer are cleared. The total price is cleared if the weight is positive and blanked if the weight is negative. Thereafter, operation jumps to step 14M19.

However, if there is not an overprice, operation advances from step 14K20 to step 14L3. In this step, a determination is made whether the mandatory pricing per unit mode is selected. If it is not, operation advances to step 14L8 in which the address registers are set up to move the result of the price times factor multiplication to the weight register. Therefore, with the mandatory pricing per unit not selected, the result of the price times factor multiplication will, in step 14L9, be moved into the weight register.

However, if price by unit is found in step L3 to have been selected, then in step 14L4 flag 2 of the CPU 210 is set to note that the price will be multiplied by the weight to determine the total price. Then, in step 14L5, a 1 is written into the factor flag register 013 to note that factoring is done and the 2 or 4 previously stored therein is removed. Operation now advances to step 14L6 in which the recompute flag is set and the register address is modified to set up to move the result of the price times factor multiplication into the price register.

Operation then advances to step 14L9 from either step 14L6 or step 14L8. The result of the price times factor multiplication is moved to either the weight register or the price register depending upon whether step 14L6 or 14L8 preceeded step 14L9.

In step 14L10, the output weight sign is examined. If it is found to be negative, then an error occurred in the computation and operation advances to step 14L11 which sets the recompute flag and loops the operation back to step 14K5. However, if the output weight sign is positive, then operation advances to step 14L13 in which the contents of the output weight register is moved to the arithmetic scratch pad register, the blank bit therein is replaced with a zero and the weight register is addressed.

Then, in step 14L14 flag 2 is examined. If it was set, operation jumps to step 14L16. If flag 2 is not set, operation proceeds to step 14L15 in which the register address is changed to the address of the price register.

In step 14L16, the data in the register which is addressed in either step 14L13 or 14L15 is multiplied by the data in the output weight register to give a total price.

This total price must now be rounded off to the proper number of digits. In order to determine which digit to round off, step 14L17 is performed which is a subroutine operation for returning the address of the proper digit to be rounded off. This subroutine is described in detail in connection with FIG. 14Z.

Referring to the Total Price Roundoff Digit Search Operation of FIG. 14Z, in step 14Z1, the digit address of the digit which is rounded off under non-UK conditions is first addressed in the result register. Then, in step 14Z2 the 30 lb. enable register is examined and if the 30 lb. scale capacity has been selected, the address of step 14Z1 is decremented shifting the address to the round off position for the 30 lb. scale.

However, if the 30 lb. scale capacity is not selected, operation jumps directly to step 14Z4 in which the UK enable register is examined. If the UK scale has been selected, the address is again decremented in step 14Z5 to the position which is appropriate for rounding off for use in the UK. If UK is not selected the address is correct.

This therefore provides, as stated in step 14Z6, the proper round off address. This address is then loaded into the accumulator and operation returns to the step in the main sequence of operations in which the total price round off digit search operation was initiated.

Returning to FIG. 14L, the total price is then rounded off using the address returned from step 14L17 and a determination is made in step 14L19 whether the UK mode is selected. If the UK mode is not selected, operation jumps to step 14M5, no further round off being necessary. However, if the UK mode is selected then a further round off must be performed. Therefore, operation again advances to the total price round off digit search subroutine operation XXIX at step 14L20.

The address returned in step 14L20 is then incremented to the next most significant digit in step 14L21 and a 2 is added to that digit with the carry being propagated. Then at step 14L22 the total price round off digit search subroutine operation is performed and at step 14M1 the returned address is incremented.

If the currently addressed digit is in the range 5 to 9 inclusive, this indicates that the ½ legend should be illuminated. Therefore, in step 14M2 an 11 may be added to that digit. If a carry is produced, then the digit was in the stated range and therefore half-pence is desired. Consequently, in step 14M3 the carry may be inspected to determine if half-pence is desired. If it is, an 8 is loaded to the accumulator for being written into the prepack or half-pence registers 025 and 026. However, if half-pence is not desired, a zero is loaded into the accumulator for writing into the same registers in step 14M4.

Operation then proceeds to an over valve check. At step 14M5 the total price round off digit search subroutine operation XXIX is again repeated. The lower 4 digits of the returned address are complemented and added to 11 in order to form an address counter for performing the over value check. Then, in step 14M7, a determination is made whether 5 digit pricing is selected. If it is not, then in step 14M8 the check counter formed in step 14M6 is incremented so that the over value check will be done for 4 digit pricing. However, if 5 digit pricing is selected, operation jumps directly to step 14M9.

At step 14M9 the addressed digit and the more significant digits of the total price are examined to determine whether they are 0. If all are 0, then in step 14M9 the total price is found not to be over value and operation jumps to step 14M14. However, if a non-zero digit is found, the total price is over value and in step 14M10 the total price is blanked.

In step 14M11, a determination is made whether the UK scale is selected. If it is not, operation jumps directly to step 14M19. However, if the UK scale is selected, then in step 14M12 the prepack lamp registers are cleared.

If, in step 14M9, an over value did not exist, operation advances to step 14M14 to prepare and move the computed total price to the total price register. To do this the total price round off digit search subroutine operation XXIX is preformed at step 14M14 and then at steps 14M15 a 5 is added to the returned address so that the most significant digit of the total price may be addressed. Then, at step 14M16 a determination is made whether the UK scale mode is selected. If it is, in step 14M17 the address is incremented so that in step 14M18 the appropriate number of total price digits are moved from the result register to the total price register.

OUTPUT

In the Output Operation XXI, the proper digits are output to the GPKD 410 and displayed and the contents of the lamp status flags are output to the lamp latches for display.

In step 14M19, the output weight, price and total price are moved to RAM registers 070 through 07F in the proper sequence for output to the GPKD. Then, in step 14M20 a determination is made whether 5 digit pricing is selected. If 5 digit pricing is selected, operation advances directly to step 14M22 while if 5 digit pricing is not selected, then 4 digit pricing will be provided and in step 14M21 the most significant digit of the price register is blanked.

Similarly, in step 14M22, a determination is made whether 5 digit total price is selected. If it is, operation jumps directly to step 14N2 while if the 5 digit total price is not selected, then operation goes to step 14N1 in which the most significant digit of the total price is blanked.

Then, in step 14N2 a determination is again made whether the UK mode is selected. If it is, the next most significant digit in the total price is also blanked while if it is not operation jumps directly to step 14N4.

Steps 14N4 through 14N12 operate to output the digits in RAM register 070 through 07f to the GPKD for display. Then, in step 14N14, the CPU sends the KDN instructions to the GPKD to turn on the display and display the digits which were output to the GPKD.

Finally, in steps 14N15 through 14N18, the 7 lamp states are output to the latch, decoder and driver circuitry 56.

PRINT

In the print operation determinations are made whether a print command was entered, whether a print should be disabled because the weight is below the minimum established for printing and what type of print is desired. The data is then output to the printer and a print is performed if the print command was entered. The printer is then reset. Looking now at the print operation XXII in more detail, in step 14N19, the contents of the print command register is written into the accumulator and the print command register is cleared. Flag 2 of the CPU 210 is then reset. Then, in step 14N20 the contents of the accumulator is examined to determine whether the print command was set. If the print command was not set, then operation jumps to step 1401. However, if the print command was set, flag 2 of the CPU 210 is set in step 14N21 to note that a print command exists. Then, in step 1401 the find scale capacity subroutine operation XXV is performed and its returned data is used in step 1402 to make a determination whether the weight is less than 20 raw weight increments. Then, in step 1403, the print complete signal from the printer is input to the CPU 210 and examined in step 1404 to determine whether a character is being printed.

If the printing is not complete, operation jumps to step 1408 in which flag 2 is reset in order to disable an initiation of another print operation while a print operation is being currently carried out. However, if printing is complete, a determination is made in step 1405 whether the print inhibit mode has been selected. If it has not, operation jumps to step 1409. However, if the print disable mode has been selected, a determination is made whether a print command exists. If a print command does not exist, operation jumps to step 1409. However, if a print command does exist, a determination is made whether the weight is less than 20 raw weight increments. If the weight is not less than 20 raw weight increments, operation jumps to step 1409. However, if the weight is less than 20 increments flag 2 is reset in order to disable a print. Then, in step 1409 a determination is made whether the Toledo Scale 300 printer mode has been selected. If it has not, the output data is written into RAM registers 070 through 07F in the proper format for a 5 digit printer. However, if the 300 printer is found in step 1409 to have been selected, operation advances to step 14012 in which the data is loaded into the same registers in proper format for the 300 printer.

After the data is loaded in the proper format, then in step 14013 a determination is made whether the "by count" mode is selected. If the "by count" mode is not selected, operation jumps to step 14013 to begin the output of the data to the printer.

However, if the "by count" mode is selected, it is desirable to replace all the digits in which a 0 appears with a decimal point so that merely a series of dots are printed. To do this, a loop formed by steps 14014 through 14018 looks at each digit and if the digit is a 0 it is replaced with a 13 so that it will cause a decimal point to be printed. After all digits are examined, then in step 14019 a 0 is loaded to the output registers factor digit and the printer output is begun.

To do this, step 14020 switches the printer clock and printer reset lines illustrated in FIG. 6 to a low state and the printer enable line to its high state.

Then, an output loop is formed in steps 14021 through 14P7 in which each digit to be output and its appropriate parity bit is output in sequence. In step 14021 the integrator reset signal is written into the X register of the CPU to maintain the analog to digital integrator circuit in its reset condition. Then, in step 14021 the first digit from the output RAM registers 14070 through 1407F is loaded into the accumulator and in step 14022 the output instruction, with mnemonic DOA, is output to the GPKD and the digit is thereby sent to the printer.

In step 14P1, the output digit is used to address the parity table and select the correct parity bit so that in step 14P2 the parity bit is output to the printer. Then at step 14P3 the printer clock line is strobed and held in the strobe state for 0.4 milliseconds in step 14P4. The strobe is removed in step 14P5. Then, after another 0.4 millisecond delay in step 14P6 a determination is made in step 14P7 whether all of the digits have been output. If they have not, operation loops back to state 021 to again pass through steps 14021 through 14P7 until all digits have finally been output in this manner to the printer.

After all digits have been output, the printer enable line of FIG. 6 is switched to its low state in step 14P8 to disable the printer and operation proceeds to step P9. At step 14P9 a determination is made whether a print command exists. If it does not, operation jumps to step 14P15 in which the printer is reset through the print reset line illustrated in FIG. 6.

However, if a print command is found to exist at step 14P9, the print command is output as step 14P10 on the print command line illustrated in FIG. 6. After a delay of 5 milliseconds in step 14P11, the print complete line is input to the CPU in step 14P12 and examined in step 14P13 to determine whether the print is complete. If the print is incomplete, operation loops back to step 14P12 and continues looping through steps 14P12 and 14P13 until the print is found in step 14P13 to be complete. In step 14P14, the print command is removed from the print command line and in step 14P15 the printer is reset through its print reset line.

KEYBOARD

In the keyboard operation XXIII, a determination is made whether a key is entered and if so the entered key is identified and stored in memory if conditions are appropriate. For some of the operations called for by key depressions, the operation also is performed.

Referring to the diagram of the GPKD in FIG. 11, each time a key is depressed, the code representing that key is stored in the key buffer registers 1032. Then, whenever the CPU outputs the proper instruction to the GPKD, the key codes are input to the CPU.

The key codes comprise two parts as described in the Rockwell literature. The first is a four bit word entitled the strobe. The second is a four bit word entitled the return.

Returning to FIG. 14P, in step 14P16 the CPU 210 outputs the mneumonic KTS instruction which causes the GPKD to transfer the strobe code to the CPU. Then, in step 14P17, the transferred strobe can be examined to determine whether a key was entered. If a key was not entered, operation jumps to step 14T19 at the end of the keyboard operation. In steps 14T19 and 14T20, a determination is made whether the verify key was the last key to have been depressed. If the verify key was not the last key, operation loops back to step 14A8. However, if the verify key was the last key to have been depressed, operation proceeds to step 14P18 in which the keyboard strobe word is entered into register 047. Then, in step 14P19 a mneumonic KTR instruction is output from the CPU to the GPKD to cause the GPKD to return its keyboard return data to the CPU.

As explained in the Rockwell literature, if the number of depressed keys exceeds the storage capacity of the GPKD, then the most significant bit of the keyboard return word will be switched from a 0 to a 1. Consequently, in step 14P20, the keyboard return 4 bit word can be examined to determine if such a keyboard error is present because all depressed keys were not stored in the GPKD. If such a keyboard error is found, operation loops back to step 14A4 in which the CPU 210 outputs a KER instruction to the GPKD 410 which causes it to be reset. If not keyboard error is present then the keyboard return word is written into RAM memory 046.

Then in step 14P22, the keyboard strobe and return data are examined. If a command key is found, operation jumps to step 14R11. However, if a command key is not found, the key must have been a digit key and therefore operation proceeds to step 14R1.

In step 14R1 the digit timer is examined. If the digit timer is still running, this means that the key was depressed within the required time for accepting the depression of a digit key. Therefore, operation may jump to step 14R3 in which the digit is written into RAM memory. However, if the digit timer is not running, then the entered digit must be the first in a new series of digits so the price register and the factor register are cleared in step 14R2. Then, in step 14R3, a determination is made whether 5 digit pricing is selected. If 5 digit pricing is selected, operation jumps to step 14R6. If 5 digit pricing is not selected, then 4 digit pricing must have been selected. Therefore, in step 14R4, a determination is made whether the most significant digit of the 4 digit price is a zero. If the most significant digit is found in step 14R4 to be a non-zero digit, then all the allowable digits have been entered and the digit just input from the GPKD should be ignored. Therefore, operation loops back to the beginning of the keyboard operation XXIII at step 14P16. However, if the most significant digit of the 4 digit price is zero then operation jumps to step 14R7. Similarly, if 5 digit pricing was found to have been selected at step 14R3, then in step 14R6 the most significant digit of the 5 digit price is examined to determine whether it is zero. If this most significant digit is not zero, then the most recently entered digit must be ignored and therefore operation loops back to step 14P16.

If, however, operation advances to step 14R7, the most recently entered digit is examined to determine whether it is 0 to 9 inclusive. If it is not, one of these allowed digits, it must be ignored and therefore operation loops back to step 14P16. However, if it is an allowed digit, the new digit is entered into the least significant digit of the price register in step 14R8 and any other digits already entered in the price register are shifted one position toward the most significant digit. Then, in step 14R9 the digit timer is set to its 11 state to set up a new time delay for acceptance of another digit. Operation then jumps to step 14T17.

If in step 14P22 a command key rather than a digit key was found to have been depressed, then in step 14R11 the stored key data is examined. If the verify key was not depressed operation jumps to step 14R21 to determine whether it was the per half key which was depressed.

If, however, the verify key was depressed, then a KER instruction is output from the CPU in step 14R12 in order to reset the GPKD. Then, after a 50 millisecond time delay in step 14R12, the verify test flag is examined. If the verify test flag is set, then this detection of the verify key should be ignored and operation loops back to step 14P16. However, if the verify flag was not set, then in step 14R15 it is set and the contents of the verify mode flag is complemented. Then, in steps 14R16 the verify mode flag is examined to determine whether it was clear.

If the verify mode flag was clear then a 15 is written into the X register of the CPU 210 and the contents of X register is unloaded into each 4 bit register at RAM addresses 070 through 07F. This is done so that upon the first depression of the verify key all digits of the displays will be blanked. However, if the verify mode flag was found not clear in step 14R16, an 8 is loaded into register X so that in step 14R17 all 8's will be loaded into the contents of RAm registers 070 through 07F. These 8's will then subsequently cause all segments of the display registers to be illuminated.

In step 14R19, all the lamps are loaded with the register X test digit and the digit timer is cleared. Then operation loops back to step 14M19 so that the loaded digits can be output for the verify test.

If, however, the verify key was found in step 14R11 not to have been depressed, then in step 14R21 determination is made whether the per ½ key is depressed. If it is not, operation jumps to step 14S5. However, if the per ½ key is depressed, then in step 14R22 a determination is made whether the "by count" mode has been selected. If it has not been selected, operation jumps to step 14S3 in which a 2 is loaded into the accumulator and operation jumps to step 14S10.

If the "by count" mode was found selected in step 14R22, then in step 14S1 the contents of the price register is moved to the total price register and the price register is cleared. Thereafter operation jumps to step 14T16.

If operation jumped to step 14S5 because the per ½ key was found in step 14R21 not to have been depressed, a determination is made whether the per ¼ key was depressed. If it was not, operation jumps to step 14S13. However, if the per ¼ key was depressed, then in step 14S6 a determination is made whether the "by count" mode was selected. If it was, operation jumps to step 14T16. However, if the "by count" mode was not selected, then in step 14S7 the find scale capacity operation XXV is performed.

In step 14S8 the returned data is examined to determine whether a metric scale capacity has been selected. If it has, operation jumps to step 14T16. However, if a metric scale has not been selected, a 4 is loaded into the accumulator in step 14S9.

In step 14S10 the first bit of the factor flag is examined to determine whether it is a 1 indicating that the factor multiplication has already been done. If factoring is found to have been done, operation jumps to step 14T16. However, if factoring has not been done, the factor register is updated with the 4 loaded in the accumulator in step 14S9 and the setting of the first bit of the factor flag.

In step 14S13, a determination is made whether the print key was depressed. If the print key was depressed, then in step 14S14 the print command RAM register 027 is set and operation continues to step 14S15. However, if the print key was not selected, operation jumps directly to step 14S15 in which a determination is made whether the tare key was depressed. If the tare key was not depressed, there are no more keys to check and therefore operation jumps to step 14T16. However, if the tare key was depressed, then in step 14S16 a determination is made whether the motion flag is set.

If the motion flag is found to be set, indicating that platter motion exists, then a manual tare weight would be erroneous and consequently should not be accepted. Therefore, operation will jump to step 14T16. However, if the motion flag is not set, the digit timer is checked to determine if it was still running. If the digit timer is still running this indicates that the tare key was depressed in sufficient time that it may be accepted as a keyboard tare. Therefore, operation jumps to step 14S21 in which the price register is examined to determine whether its digits are all zeroes. If a non-zero digit is found in the price register then a keyboard tare must be intended and operation jumps to step 14T1. However, if the price register contains all zeroes, a determination is made in step 14S22 whether the weight is greater than or equal to 10 increments. If the weight is greater than or equal to 10 scale increments, operation jumps to step 14T16. However, if it is not greater than 10 increments a tare entry is erroneous and operation loops back to step 14A5.

Referring back to step 14S17, if the digit timer was not still running, an examination is made at step 14S18 of the net flag to determine if the weighing scale is in the net mode. If it is already in the net mode, the tare key depression should be ignored and operation jumps to step 14T16. However, if it is not in the net mode then the manual tare flag is set at step 14S19 and operation jumps to step 14T14.

Step 14T1 is entered from step 14S21 because it appears that a keyboard tare was intended. The zero increment flag is examined in step 14T1 to determine whether the scale is within the auto zero increment. If it is not, operation jumps to step 14T16. However, if it is an examination is made to determine whether the weighing scale is in the net mode at step 14T2. If it is already in the net mode no further tare weight should be entered and operation jumps to step 14T16. However, if it is not in the net mode, a determination is made in step 14T2 whether a keyboard tare is permitted.

If a keyboard tare is not permitted then operation jumps to step 14T16. However, if keyboard tare is permitted then operation advances to step 14T4 in which the find scale capacity operation XXV is performed. The returned data is then used to check the keyboard tare weight which is entered, initially in the price register, to determine if it is in a format acceptable as a tare weight. Therefore, if a 15 kilogram scale is selected, then in step 14T8 the least significant digit of the price must be a 0 or a 5. If it is not a 0 or a 5, the digits are merely left in the price register and operation jumps to step 14T16. If, however, the least significant digit is a 0 or a 5 and therefore is acceptable operation advances to step 14T11.

If the 30 lb. scale is selected then operation advances directly from step 14T6 to step 14T11 in which the price register is examined to determine whether there are 4 or fewer digits. If there are more than 4 digits then there are too many and the data in the price register cannot be accepted as tare weight data and therefore operation jumps to step 14T16. However, if there are 4 or fewer digits, then in step 14T12, the data in the price register is examined to determine whether it is less than the scale weight capacity. If it is not, it cannot be accepted as a tare weight and therefore operation jumps to step 14T16. However, if it is less than the scale capacity, operation advances to step 14T13 in which the data in the price register is moved to the tare register and the tare done and net flags are set. Operation then advances to step 14T14 in which the price register, factor flag and digit timer are cleared. Additionally, in step 14T14 the total price is selected if the weight is plus and blanked if weight is minus. Then, in step 14T15 the auto clear flag is cleared.

In step 14T16, a 1 is loaded into the digit timer, in step 14T17 the recompute flag is set and the verify mode flag is cleared. Operation then loops back to step 14P16 to check for another key.

APPENDIX

| | LABEL | OPERATION |
|---|---|---|
| 224 | ADD | Add |
| 510 | ADDC | Add Carry to Field |
| 373 | ADDC> | Link to ADDC |
| 1378 | ADRWGT | Address Weight |
| 302 | ARICL | ARI Clear |
| 338 | BLANK | Blank |
| 490 | BLKWT> | Blank Out Weight |
| 1005 | BLNKWT | Blank Out Weight |
| 1104 | CKACL> | Link to CKACLR |
| 1130 | CKACLR | Check Auto Clear |
| 1008 | CKGAZC | Check Gross Auto Zero Correction |
| 1157 | CKINC | Check Incrementing Auto Clear Flag |
| 1383 | CKMIN | Check for Our Weight Minus |
| 1929 | CKMKBT | Check Magnitude of Keyboard Tare |
| 1096 | CKNAZC | Check Net Auto Zero Correction |
| 1701 | CKPRNT | Check for Print |
| 1329 | CKRCP | Check Recompute |
| 620 | CKRST | Check for Scale Reset |
| 330 | CKWSGN | Check for Weight Sign |
| 1889 | CKOT | Check for 0-T Sequence |
| 304 | CLEAR | Clear Subroutine |
| 1262 | CLROFC | Clear Out Filter Counter |
| 349 | CLRPF | Clear Print Flag |
| 324 | CLRPR | Clear Price Subroutine |
| 293 | CLRT | Clear Tare Subroutine |
| 162 | CMDIG | Compare Test Digit with Memory |
| 1335 | CMPUT | Compute Total Price |
| 1040 | CRCTAZ | Correct Auto Zero |
| 374 | CRTAZ> | Link to CRCTAZ |
| 984 | CZTIM | Clear Zero Key Timer |
| 529 | DELAY | Delay Subroutine |
| 376 | DELAY> | Link to DELAY |
| 533 | DELY1 | Label in DELAY |
| 540 | DELY2 | Label in DELAY |
| 546 | DELY3 | Label in DELAY |
| 1526 | DISPON | Turn on Display |
| 493 | DL.4MS | 0.4 MS DELAY |
| 1511 | DLOOPA | Display Loop Label |
| 1518 | DLOOPB | Display Loop Label |
| 377 | DLY.4> | Link to DL.4MS |
| 1767 | ENTDIG | Enter Digit |
| 1963 | ENTFCT | Enter Factor |
| 1940 | ENTKBT | Enter Keyboard Tare |
| 1953 | FCNDUN | Function Key Done |
| 405 | FCPTY | Find Scale Capacity Subroutine |
| 371 | FCPTY> | Link to FCPTY |
| 419 | FCPTY1 | Label in FCPTY |
| 424 | FCPTY2 | Label in FCPTY |
| 431 | FCPTY3 | Label in FCPTY |
| 1852 | FDUN> | Link to FCNDUN |
| 1900 | FDUN>> | Link to FCNDUN |
| 887 | FLTWGT | Filter Raw Weight |
| 899 | FLTWT1 | Label in FLTWGT |
| 869 | INIFLT | Initial Filter |
| 1309 | ITLKCK | Interlock Check |
| 18 | KAF | Turn Off A |
| 1788 | KBCMND | Keyboard Command |
| 1956 | KBDUN | Keyboard Operation Done |
| 1748 | KBD1 | Label in KEYBD |
| 568 | KBERR | Keyboard Error |
| 19 | KBF | Turn Off B |
| 1902 | KBTARE | Keyboard Tare |
| 1758 | KCMND> | Link to KBCMND |
| 20 | KDN | Turn on Display |
| 21 | KER | Keyboard Error |
| 1757 | KERR> | Link to KBERR |
| 1723 | KEYBD | Keyboard Routine |
| 1810 | KEYBD> | Link to KEYBD |
| 22 | KLA | Load Display Register A |
| 23 | KLB | Load Display Register B |
| 24 | KTR | Transfer Keyboard Return |

APPENDIX-continued

| | LABEL | OPERATION |
|---|---|---|
| 25 | KTS | Transfer Keyboard Strobe |
| 1920 | KT15KG | Keyboard Tare 15 KG |
| 1925 | KT6KG | Keyboard Tare 6 KG |
| 1268 | LDLMPS | LD Lamps for Output |
| 933 | LDPPUK | LD Pre-pack or UK Total Price ½ Lamps |
| 1334 | LMOUT> | Link to LMP Out |
| 1591 | LMPLP> | Link to LMPOLP |
| 1530 | LMPOLP | Lamp Output Loop |
| 1527 | LMPOUT | Lamp Output Routine |
| 891 | LSD/2 | Raw Weight LSD Divided by 2 |
| 266 | MADDL | Multiply Add Loop |
| 151 | MAGCK | Magnitude Check Routine |
| 155 | MAGLP | Label in MAGCK |
| 438 | MAXAZ | Test for Maximum Auto Zero Subroutine |
| 253 | MDIG | Multiplier Digit |
| 1024 | MCFTR | Multiply Raw Weight by Proper Factor |
| 311 | MODECK | Check for By-Count Mode Subroutine |
| 96 | MOVPR | Link to MOVPRX |
| 447 | MOVPRX | Move Price Subroutine |
| 75 | MOVX | Move Register to Register Subroutine |
| 378 | MOVX> | Link to MOVX |
| 107 | MOV5 | Move 5 Digits Subroutine |
| 105 | MOV5X | Specialized Move 5 Digits Subroutine |
| 243 | MULT | Multiply Subroutine |
| 276 | NDIG | Next Digit of Multiplier |
| 83 | NOKEY | No Key Depression |
| 1756 | NOKEY> | Link to NOKEY |
| 1448 | NOTOV | Not Overvalue |
| 1219 | OUTFLT | Output Filter Routine |
| 1254 | OUTF1 | Label in OUTFLT |
| 1265 | OUTF2 | Label in OUTFLT |
| 174 | OUTPT> | Link to OUTPUT |
| 1462 | OUTPUT | Output Routine |
| 1425 | OVALCK | Overvalue Check |
| 1390 | OW>ARI | Output Weight to the ARI Register |
| 1681 | PARITY | Parity Formulation Return |
| 1968 | PBCCK | Price By-Count Check |
| 1978 | PBC1 | Label in PBCCK |
| 1984 | PBC2 | Label in PBCCK |
| 1986 | PBC3 | Label in PBCCK |
| 1658 | POUT | Printer Output |
| 1992 | POUT> | Link to POUT |
| 1668 | POUTLP | Printer Output Loop |
| 1865 | PRNCK | Check for Print Command Key |
| 1551 | PRNTR | Printer Routine |
| 847 | PROCWT | Process Weight |
| 1346 | PRXFCT | Price Times Factor |
| 1404 | PRXWGT | Price Times Weight |
| 1578 | PTYPE | Printer Type Check |
| 1863 | P½ | Per ½ Key |
| 1841 | P½CK | Per ½ Key Check |

APPENDIX-continued

| | LABEL | OPERATION |
|---|---|---|
| 1853 | P¼CK | Per ¼ Key Check |
| 1618 | P300 | 300 Printer Routine |
| 1592 | P300> | Link to P300 |
| 586 | RDSWA | Label in RDSWS |
| 577 | RDSWS | Read Switches Routine |
| 92 | RDSWS> | Link to RDSWS |
| 642 | RDWGT | Read Weight |
| 686 | RDWGT1 | Label in RDWGT |
| 569 | RESET | Scale Reset |
| 1203 | RNDBY2 | Round Weight by 2's |
| 1209 | RNDBY5 | Round Weight by 5's |
| 372 | RNDOF> | Link to RNDOFF |
| 505 | RNDOFF | Round Off Subroutine |
| 1215 | RNDWT1 | Label in Weight Roundoff |
| 1218 | RNDWT2 | Label in Weight Roundoff |
| 590 | RSLOOP | Read Switch Loop |
| 1704 | RSTPR> | Link to RSTPTR |
| 1720 | RSTPTR | Reset Printer |
| 235 | SDUN | Subtract Subroutine Done |
| 26 | SES | PPS4 Select Enable Status |
| 379 | SETRC> | Link to SETRCP |
| 608 | SETRCP | Set Recompute Subroutine |
| 27 | SOS | PPS4 Select Output Status |
| 1092 | STARE | Subtract Tare |
| 987 | SUBAZ | Subtract Auto-Zero |
| 195 | SUBL | Subtract Loop |
| 209 | SUBM | Subtract Result Minus (Borrow) |
| 216 | SUBML | Subtract Result Minus Loop |
| 183 | SUBT | Subtract Subroutine |
| 1870 | TARECK | Tare Key Check |
| 1949 | TDUN | Tare Done |
| 1315 | TDUNCK | Tare Done Check |
| 1440 | TPBLK | Total Price Blank |
| 1332 | TPCLR | Total Price Clear |
| 358 | TPRDS | Total Price Round Off Digit Research |
| 748 | T2CNVT | T2 Count Convert |
| 690 | T2LOOP | T2 Counting Loop |
| 804 | T3CNVT | T3 Count Convert |
| 719 | T3LOOP | T3 Counting Loop |
| 911 | UDFWT | Update Filtered Weight |
| 458 | UDOWT | Update Output Weight Subroutine |
| 375 | UDOWT> | Link to UDOWT |
| 483 | UDOWT1 | Label in UDOWT |
| 1381 | UDTPXF | Update with Price Times Factor |
| 1192 | UDZLF | Update Zero Lamp Flag |
| 1796 | VFYCK | Verify Key Check |
| 957 | X10CLR | Times 10 Routine Clear |
| 945 | X10EXP | Times 10 Expand |
| 961 | ZCAPT | Zero Capture Check |
| 1163 | ZLAMP | Zero Lamp Routine |
| 1814 | ¼CK> | Link to P¼CK |

```
ADDR  CODE    ARG  STVJ         S1MI

1    ** 8203 DCS CALCULATOR OPTION SWITCH ASSIGNMENTS **
                       2    *     NAME DEFINES ON CONDITION
                       3    *     SP1-1: .LT.20 INCREMENT PRINT INHIBIT
                       4    *         -2: NOT USED
                       5    *         -3: 5 DIGIT TOTAL PRICE ENABLE
                       6    *         -4: KEYBOARD TARE ENABLE
                       7    *         -5: 10 INCREMENT AUTO CLR ENABLE
                       8    *         -6: 5 DIGIT UNIT PRICE ENABLE
                       9    *         -7: NOT USED
                      10    *     SP2-1: TARE MANDATORY ENABLE
                      11    *         -2: 6 KG CAPACITY ENABLE
                      12    *         -3: 300 PRINTER ENABLE
                      13    *         -4: MANDATORY PRICE/UNIT ENABLE
                      14    *         -5: UNITED KINGDOM ENABLE
                      15    *         -6: 30 LB CAPACITY ENABLE
                      16    *         -7: TIMES 10 EXPAND ENABLE
                      17    *****                                          *****
            00FB      18    KAF       EQX    FB
            00F7      19    KBF       EQX    F7
            00F3      20    KDN       EQX    F3
            00F6      21    KER       EQX    F6
            00FE      22    KLA       EQX    FE
```

```
                    00FD    23  KLB    EQX    FD
                    00FC    24  KTR    EQX    FC
                    00FA    25  KTS    EQX    FA
                    0040    26  SES    EQX    40
                    0041    27  SJS    EQX    41
                            28                ORG    0C0
00C0  FF   0000     29  >00    PTR    #00    MOTION FLAG
00C1  FE   0001     30  >01    PTR    #01    Z GRAD FLAG
00C2  FD   0002     31  >02    PTR    #02    TARE DONE FLAG
00C3  FB   0004     32  >04    PTR    #04    DIGIT TIMER
00C4  F6   0009     33  >09    PTR    #09    RESULT PTR FOR MOVX
00C5  ED   0012     34  >12    PTR    #12    NET FLAG
00C6  EC   0013     35  >13    PTR    #13    PER 1/2 FLAG
00C7  E5   001A     36  >1A    PTR    #1A    ARI LSD
00C8  DE   0021     37  >21    PTR    #21    ZERO LAMP, WGT-ARI
00C9  D6   0029     38  >29    PTR    #29    WGT SIGN
00CA  CC   0033     39  >33    PTR    #33    AUTO CLR FLAG
00CB  B7   0048     40  >48    PTR    #48    PREPAK,Z KEY,AZ INH,X10
00CC  A8   0057     41  >57    PTR    #57    RECOMPUTE FLAG
00CD  96   0069     42  >69    PTR    #69    PRICE MSD
00CE  91   006E     43  >6E    PTR    #6E    OUT WGT SIGN
00CF  85   007A     44  >7A    PTR    #7A    TEMP LSD
                    45
                    46                ORG    0D0
00D0  FC   01FC     47  >MOVX   PTR   MOVX>
00D1  02   0102     48  >MOV5X  PTR   MOV5X
00D2  04   0104     49  >MOV5   PTR   MOV5
00D3  40   0140     50  >SUBT   PTR   SUBT
00D4  79   0179     51  >MULT   PTR   MULT
00D5  26   0126     52  >MAGCK  PTR   MAGCK
00D6  B3   01B3     53  >ARICL  PTR   ARICL
00D7  B5   01B5     54  >CLEAR  PTR   CLEAR
00D8  A9   01A9     55  >CLRT   PTR   CLRT
00D9  C0   01C0     56  >CLRPR  PTR   CLRPR
00DA  CE   01CE     57  >BLANK  PTR   BLANK
00DB  DE   01DE     58  >TPRDS  PTR   TPRDS
00DC  EE   01EE     59  >FCPTY  PTR   FCPTY>
00DD  F0   01F0     60  >RNDOF  PTR   RNDOF>
00DE  F2   01F2     61  >ADDC   PTR   ADDC>
00DF  F6   01F6     62  >UDUWT  PTR   UDUWT>
00E0  F8   01F8     63  >DELAY  PTR   DELAY>
00E1  4C   014C     64  >SUBL   PTR   SUBL
00E2  FA   01FA     65  >DLY,4  PTR   DLY,4>
00E3  00   0100     66  >MOVPR  PTR   MOVPR
00E4  BA   01BA     67  >MODE   PTR   MODECK
00E5  FE   01FE     68  >SETRC  PTR   SETRC>
00E6  F4   01F4     69  >CRTAZ  PTR   CRTAZ>
00E7  3D   013D     70  >OUTP>  PTR   OUTPT>
                    71  * MOVX SUBROUTINE - MOVES DIGS FROM ADDR UP TO END
                    72  *       TO CALL:    BM=SOURCE BM
                    73  *                   BL=SOURCE AND DEST BL (LSD)
                    74  *                   A=DESTINATION BM
00E8  1B            75  MOVX    LXA         DEST BM>X
00E9  37   0        76          LD          LD DATA WRD
00EA  18            77          XBMX        DEST BM>BM,SOURCE BM>X
00EB  3F   0        78          EX          WRITE DATA WRD
00EC  18            79          XBMX        SOURCE BM>BM,DEST BM>X
00ED  17            80          INCB        INC BL, SKIP IF 0
00EE  A9   00E9     81          T    MOVX+1  BL NOT 0
00EF  05            82          RTN         RETURN
00F0  70   000F     83  NOKEY   LDI  15
00F1  2F   0        84          EXD         KEY STB>A,15>KEY STB
00F2  1E            85          SKZ         SKIP IF STROBE 0
00F3  BA   00FA     86          T    RDSWS>
00F4  78   0004     87          LDI  4      4>A
00F5  0C            88          EOR         EX-OR WITH KEY RTN
00F6  1E            89          SKZ         SKIP IF VERIFY LAST
00F7  BA   00FA     90          T    RDSWS>
00F8  5017 0017     91          TL   RDSWS-2 CLR PRICE IF VERIFY LAST
00FA  5019 0019     92  RDSWS>  TL   RDSWS
                    93
                    94                ORG    100
                    95  * MOVPR SUBROUTINE - MOVES UNIT PRICE TO REG 7A-7E
0100  5239 0239     96  MOVPR   TL   MOVPRX
```

```
 97  * MOV5 SUBROUTINE - MOVES 5 DIGS INDEPENDENT OF ADDR
 98  *      TO CALL:       BM=SOURCE BM
 99  *                     BL=SOURCE BL (MSD)
100  *                     X=DESTINATION BM
101  *                     A=DESTINATION BL (MSD)
102  *      ON RETURN 6TH DIG IS IN A AND B OK FOR "EX"
103  ****   MAY BE CALLED FROM MAIN PROGRAM ONLY    ****
104  * MOV5X DIFFERS ONLY IN DEFAULT DEST BL=15
0102  1B              105  MOV5X   LXA                A>X,DEST BM IN A
0103  70    000F      106          LDI      15        DEST BL=15
0104  26              107  MOV5    RF1                RESET FLG 1
0105  06              108          XS                 EXCH SA AND SB
0106  6F              109          CYS                SA*DEST BL/?/?,A*?
0107  37    0         110          LD                 LD DATA WRD N
0108  1F              111          DECB               DEC BL
0109  8A    010A      112          T        *+1
010A  6F              113          CYS                SA*DATN/DEST BL/?,A*?
010B  37    0         114          LD                 LD DATA WRD N-1
010C  1F              115          DECB               DEC BL
010D  8E    010E      116          T        *+1
010E  6F              117          CYS                SA*DATN-1*DATN*DEST BL,A*?
010F  37    0         118          LD                 LD DATA WRD N-2
0110  1F              119          DECB               DEC BL
0111  92    0112      120          T        *+1
0112  6F              121          CYS
                     122  *        SA*DATN-2/DATN-1/DATN,A*DEST BL
0113  19              123          XABL               DEST BL>BL,SOURCE BL>A
0114  1B              124          XBMX               DEST BM>BM,SOURCE BM>X
0115  6F              125          CYS
                     126  *        SA*SRCE BL/DATN-2/DATN-1,A*DATN
0116  2F    0         127          EXD                WRITE DATA WRD N,DEC BL
0117  98    0118      128          T        *+1
0118  6F              129          CYS                SA*?/SRCE BL/DATN-2,A*DATN-1
0119  2F    0         130          EXD                WRITE DATA WRD N-1,DEC BL
011A  9B    011B      131          T        *+1
011B  6F              132          CYS                SA*?/?/SRCE BL,A*DATN-2
011C  16              133          SKF1               SKIP ON FLG 1, PASS 2
011D  A0    0120      134          T        *+3       PASS 1
011E  06              135          XS                 RESTORE SA FOR RETURN
011F  05              136          RTN                RETURN
0120  2F    0         137          EXD                WRITE DATA WRD N-2,DEC BL
0121  6F              138          CYS                SA*?/?/?,A*SRCE BL
0122  19              139          XABL               SOURCE BL>BL,DEST BL>A
0123  1B              140          XBMX               SOURCE BM>BM,DEST BM>X
0124  22              141          SF1                SET FLG 1,PASS 2
0125  86    0106      142          T        MOV5+2
                     143  * MAGCK SUBROUTINE - CHECKS FIELD FOR .LE. TEST DIG
                     144  *      TO CALL:       BM=FIELD BM
                     145  *                     BL=COUNTER DOWN TO TEST POINT
                     146  *                     A=TEST DIGIT
                     147  *      ON RETURN:
                     148  *      IF ALL 0S FOUND:C=0,A=15,NO SKIP
                     149  *      IF MEM.LE.TEST: C=0,A=DIFFERENCE,NO SKIP
                     150  *      IF MEM.GT.TEST: C=1,SKIPS NEXT INSTR ON RTN
0126  1B              151  MAGCK   LXA                TEST DIG>X
0127  70    000F      152          LDI      15        FIELD BL
0128  19              153          XABL               COUNTER>A,15>BL
0129  24              154          RC
012A  60    000F      155  MAGLP   ADI      15        DEC COUNTER,SKIP ON C
012B  05              156          RTN                NO C,C=0,A=15,RETURN
012C  3F    0         157          EX                 MEM DIG>A,CNTR>MEM
012D  1E              158          SKZ                SKIP IF DIG 0
012E  B1    0131      159          T        CMDIG     NOT 0,COMPARE DIGS
012F  2F    0         160          EXD                CNTR>A,MEM DIG>MEM,DEC BL
0130  AA    012A      161          T        MAGLP     LOOP
0131  3F    0         162  CMDIG   EX                 CNTR>A,MEM DIG>MEM
0132  60    000F      163          ADI      15        DEC CNTR,SKIP ON C
0133  B6    0136      164          T        *+3       CNTR 0,DO COMPARISON
0134  20              165          SC                 SET C FOR RTN
0135  07              166          RTNSK              TOO EARLY,C=1,A=?
0136  12              167          LAX                TEST DIG>A
0137  0E              168          CJMP               COM TEST DIG
0138  0B              169          AD                 ADD MEM DIG
0139  0E              170          CJMP               CJM RES TO FORM POS DIFF
013A  15              171          SKC                SKIP ON C,MEM DIG.GT.TEST
```

```
013B    05              172            RTN              RETURN,MEM DIG,LE,TEST DIG
013C    07              173            RTNSK            RETURN,MEM DIG,GT,TEST DIG
013D    55AE   05AE     174   OUTPT>   TL      OUTPUT   OUTPUT ROUTINE LINK
                        175
                        176            ORG     140
                        177   * SUBT SUBROUTINE - SUBTRACTS 2 FIELDS WITH SIGNS
                        178   *    IN BL ADDR 9, DATA IN BL ADDR 10-15(A-F)
                        179   *      TO CALL:        BM=MINUEND BM
                        180   *                      BL=SUBTRAHEND BM
                        181   *    ON RETURN RESULT SIGN IS IN A, B ADDRESSES
                        182   *      RESULT SIGN, RESULT IN RAM 09 THRU 0F
0140    76     0009     183   SUBT     LDI     9        MINUEND SIGN ADDR>A
0141    19              184            XABL             MND SGN ADDR>BL,SBTRND BM>A
0142    1B              185            LXA              SBTRND BM>X
0143    37     0        186            LD               LD MND SGN
0144    13              187            SAG              ADDR RESULT
0145    3F     0        188            EX               WRITE TO RESULT SGN
0146    37     0        189            LD               LD MND SGN
0147    18              190            XBMX             SBTRND BM>BM,MND BM>X
0148    0C              191            EOR              EX-OR SIGNS
0149    17              192            INCB             INC BL
014A    1E              193            SKZ              SKIP IF SIGNS SAME
014B    AA     016A     194            T       ADD      SIGNS DIFFERENT
014C    20              195   SUBL     SC               SET C TO START
014D    37     0        196            LD               LD SBTRND DIG
014E    0E              197            COMP             COM IT
014F    18              198            XBMX             MND BM>BM,SBTRND BM>X
0150    08              199            ADCSK            ADD MND DIG+C,SKIP ON C
0151    65              200            DC               NO C,DECIMAL CORRECT
0152    13              201            SAG              ADDR RESULT
0153    3F     0        202            EX               WRITE TO RESULT
0154    18              203            XBMX             SBTRND BM>BM,MND BM>X
0155    17              204            INCB             INC BL,SKIP IF 0
0156    8D     014D     205            T       SUBL+1   NOT 0,LOOP
0157    15              206            SKC              SKIP IF NO BORROW
0158    9A     015A     207            T       SUBM     BORROW
0159    B5     0175     208            T       SDUN     DONE
015A    00F6   0009     209   SUBM     LBL     #09      ADDR RESULT SIGN
015C    37     0        210            LD               LD RESULT SIGN
015D    0E              211            COMP             COM IT
015E    3F     0        212            EX               UPDATE IT
015F    17              213            INCB             INC BL
0160    20              214            SC               10S COM LSD
0161    7F     0000     215            LDI     0        0>A
0162    3F     0        216   SUBML    EX               RESULT DIG>A,0>RESULT
0163    0E              217            COMP             COM DIG
0164    08              218            ADCSK            ADD DIG COM+0+C,SKIP ON C
0165    65              219            DC               NO C,DECIMAL CORRECT
0166    3F     0        220            EX               RESULT DIG>RESULT,0>A
0167    17              221            INCB             INC BL,SKIP IF 0
0168    A2     0162     222            T       SUBML    NOT 0,LOOP
0169    B5     0175     223            T       SDUN     DONE
016A    24              224   ADD      RC               RESET C TO START
016B    37     0        225            LD               LD ADDEND DIG
016C    69     0006     226            ADI     6        EXCESS 6
016D    18              227            XBMX             MND BM>BM,ADND BM>X
016E    08              228            ADCSK            ADD MND+C,SKIP ON C
016F    65              229            DC               NO C,DECIMAL CORRECT
0170    13              230            SAG              ADDR RESULT
0171    3F     0        231            EX               WRITE TO RESULT
0172    18              232            XBMX             ADND BM>BM,MND BM>X
0173    17              233            INCB             INC BL,SKIP IF 0
0174    AB     016B     234            T       ADD+1    NOT 0,LOOP
0175    00F6   0009     235   SDUN     LBL     #09      ADDR RESULT SGN
0177    37     0        236            LD               LD RESULT SGN
0178    05              237            RTN              RETURN
                        238   * MULT SUBROUTINE - MULTIPLIES MULTIPLICAND BY ARI
                        239   *    WITH BL ADDR OF 10-15(A-F)
                        240   *      TO CALL:        BM=MULTIPLICAND BM
                        241   *                      BL=5
                        242   *    ON RETURN B ADDRESSES RESULT LSD (05)
0179    7F     0000     243   MULT     LDI     0        0>A
017A    13              244            SAG              ADDR RESULT
017B    3F     0        245            EX               CLR RESULT
017C    17              246            INCB             INC BL,SKIP IF 0
```

```
017D   B9    0179   247              T       MULT    NOT 0,LOOP
017E   5180  0180   248              TL      #180
                    249
                    250              ORG     180
0180   75    000A   251              LDI     10      ARI BL
0181   1B           252              LXA             INIT X WITH ARI BL=10
0182   7E    0001   253      MDIG    LDI     1       ARI BM
0183   1A           254              XAX             ARI BL>A,ARI BM>X
0184   1B           255              XBMX            ARI BM>BM,MPCND BM>X
0185   19           256              XABL            ARI BL>BL
0186   37    0      257              LD              LD MULTIPLIER DIG
0187   60    000F   258              ADI     15      DEC BY 1,SKIP ON C
0188   99    0199   259              T       NDIG    DIG WAS 0,ADV TO NXT MPR DIG
0189   3F    0      260              EX              UPDATE MULTIPLIER DIG
018A   1B           261              XBMX            MPCND BM>BM
018B   75    000A   262              LDI     10      MPCND BL
018C   19           263              XABL            ARI BL>A,MPCND BL>BL
018D   1B           264              LXA             ARI BL>X
018E   24           265              RC              RESET C TO START ADD LOOP
018F   37    0      266      MADDL   LD              LD MPCND DIG
0190   69    0006   267              ADI     6       EXCESS 6
0191   13           268              SAG             ADDR RESULT
0192   08           269              ADCSK           ADD PARTIAL RES+C,SKIP ON C
0193   65           270              DC              NO C,DECIMAL CORRECT
0194   13           271              SAG             ADDR RESULT
0195   3F    0      272              EX              UPDATE PARTIAL RESULT
0196   17           273              INCB            INC MPCND BL,SKIP IF 0
0197   8F    018F   274              T       MADDL   NOT 0,LOOP
0198   82    0182   275              T       MDIG    BL 0,GET MULTIPLIER DIG
0199   17           276      NDIG    INCB            INC ARI BL,SKIP IF 0
019A   9E    019E   277              T       *+4     NOT 0 SHIFT RESULT
019B   00F5  000A   278              LBL     #0A     ADDR RESULT 6 DIG MSD
019D   05           279              RTN             RETURN
019E   7F    000F   280              LDI     15      RESULT MSD
019F   19           281              XABL            ARI BL>A,RES MSD>BL
01A0   1B           282              XBMX            MPCND BM>BM
01A1   1B           283              LXA             ARI BL>X
01A2   7F    0000   284              LDI     0       0>A TO CLEAR RESULT MSD
01A3   13           285              SAG             ADDR RESULT
01A4   3F    0      286              EX              DIG N>RES,DIG N-1>A
01A5   1F           287              DECB            DEC BL
01A6   44    0004   288              SKBI    4       SKIP IF BL=4
01A7   A3    01A3   289              T       *-4     BL NOT 4,LOOP
01A8   82    0182   290              T       MDIG    SHIFT DONE,GET NEXT MPR DIG
                    291      * CLRT SUBROUTINE - CLEARS TARE REG,TARE DONE FLAG,
                    292      *  NET FLAG,MANUAL TARE FLAG
01A9   00FC  0003   293      CLRT    LBL     #03
01AB   7F    0000   294              LDI     0
01AC   2E    1      295              EXD     1       CLR MANUAL TARE FLAG
01AD   7F    0000   296              LDI     0
01AE   3E    1      297              EX      1       CLR NET FLAG
01AF   7F    0000   298              LDI     0
01B0   3F    0      299              EX              CLR TARE DONE FLAG
01B1   00A6  0059   300              LBL     #59     ADDR TARE
                    301      * ARICL SUBROUTINE - CLEARS ARI REG FROM 19 THRU 1F
01B3   00E6  0019   302      ARICL   LBL     #19     ADDR ARI
                    303      * CLEAR SUBROUTINE - CLEARS REG FROM ADDR UP TO END
01B5   7F    0000   304      CLEAR   LDI     0
01B6   3F    0      305              EX              0>MEM DIG
01B7   17           306              INCB            INC BL,SKIP IF 0
01B8   B5    01B5   307              T       CLEAR   NOT 0,LOOP
01B9   05           308              RTN             RETURN
                    309      * MODECK SUBROUTINE - CHECKS FOR BY COUNT
                    310      *  MODE IN KEYBD PER 1/2 AND 1/4 KEY SECTION
01BA   CB    00CB   311      MODECK  LB      >4B
01BB   70    0002   312              LDI     2       2>A
01BC   00           313              AND             .AND.WITH BY COUNT
01BD   1E           314              SKZ             SKIP IF BY COUNT
01BE   05           315              RTN             NORMAL OR PRE-PAK
01BF   07           316              RTNSK           BY COUNT
                    317
                    318              ORG     1C0
                    319      * CLRPR SUBROUTINE - CLEARS PRICE REG,PER 1/2,1/4,
                    320      *  FCTR DONE FLAGS,DIGIT TIMER, CLEARS TOTAL PRICE
                    321      *   IF OUT WGT PLUS,BLANKS TOTAL PRICE IF MINUS.
```

|  |  |  |  |  |  |  |  |
|---|---|---|---|---|---|---|---|
|  |  |  | 322 | * | CLEARS VERIFY TEST IN PROCESS FLAG |  |  |
|  |  |  | 323 | **** | ALSO CLEARS ARI REG | **** |  |
| 01C0 | C3 | 00C3 | 324 | CLRPR | LB | >04 |  |
| 01C1 | 7F | 0000 | 325 |  | LDI | 0 |  |
| 01C2 | 2E | 1 | 326 |  | EXD | 1 | CLR DIGIT TIMER |
| 01C3 | D7 | 00D7 | 327 |  | TM | >CLEAR | CLR FCTR,VFY FLAGS,ARI |
| 01C4 | CD | | 328 |  | LB | >69 |  |
| 01C5 | 01CD | 01CD | 329 |  | TML | BLANK-1 | CLR PRICE |
| 01C7 | CE | 00CE | 330 | CKWSGN | LB | >6E |  |
| 01C8 | 71 | 000E | 331 |  | LDI | 14 | 14>A |
| 01C9 | 0C | | 332 |  | EOR |  | EX-OR WITH OUT WGT SIGN |
| 01CA | 009B | 0064 | 333 |  | LBL | #64 | ADDR TOTAL PRICE MSD |
| 01CC | 1E | | 334 |  | SKZ |  | SKIP IF OUT WGT SIGN MINUS |
| 01CD | 7F | 0000 | 335 |  | LDI | 0 | PLUS,LD 0 TO CLR TOTAL PRICE |
|  |  |  | 336 | * BLANK SUBROUTINE - BLANKS REG FROM ADDR DOWN TO |  |  |  |
|  |  |  | 337 | * BOTTOM OR DOWN TO BL ADDR OF 5 |  |  |  |
| 01CE | 70 | 000F | 338 | BLANK | LDI | 15 |  |
| 01CF | 1B | | 339 |  | LXA |  | 0 OR 15>X |
| 01D0 | 2F | 0 | 340 |  | EXD |  | 15>MEM DIG,DEC BL,SKIP IF 15 |
| 01D1 | 93 | 01D3 | 341 |  | T | *+2 | NOT 15 |
| 01D2 | 99 | 01D9 | 342 |  | T | CLRPF |  |
| 01D3 | 12 | | 343 |  | LAX |  | 0 OR 15>A |
| 01D4 | 49 | 0009 | 344 |  | SKBI | 9 | SKIP IF BL=9 |
| 01D5 | 97 | 01D7 | 345 |  | T | *+2 |  |
| 01D6 | 99 | 01D9 | 346 |  | T | CLRPF |  |
| 01D7 | 44 | 0004 | 347 |  | SKBI | 4 | SKIP IF BL=4 |
| 01D8 | 90 | 01D0 | 348 |  | T | BLANK+2 | NOT 4,LOOP |
| 01D9 | 0008 | 0027 | 349 | CLRPF | LBL | #27 |  |
| 01DB | 7F | 0000 | 350 |  | LDI | 0 |  |
| 01DC | 3F | 0 | 351 |  | EX |  | CLR PRINT COMMAND |
| 01DD | 05 | | 352 |  | RTN |  | RETURN |
|  |  |  | 353 | * TPRDS SUBROUTINE - SETS B ADDR TO CORRECT DIGIT |  |  |  |
|  |  |  | 354 | * FOR TOTAL PRICE INITIAL ROUND OFF IN RESULT |  |  |  |
|  |  |  | 355 | * TPRDS - TOTAL PRICE ROUND OFF DIGIT SEARCH |  |  |  |
|  |  |  | 356 | * ON RETURN: ROUND OFF DIGIT BL IS IN A |  |  |  |
|  |  |  | 357 | * B ADDR IS LOADED FOR RNDOFF |  |  |  |
| 01DE | 008A | 0045 | 358 | TPRDS | LBL | #45 |  |
| 01E0 | 37 | 0 | 359 |  | LD |  | UK SCALE ENB>A |
| 01E1 | 1B | | 360 |  | LXA |  | A>X |
| 01E2 | 008C | 0043 | 361 |  | LBL | #43 |  |
| 01E4 | 37 | 0 | 362 |  | LD |  | LD 30LB SCALE ENB |
| 01E5 | 00F8 | 0007 | 363 |  | LBL | #07 | ADDR NON-UK METRIC ROUND OFF |
| 01E7 | 1E | | 364 |  | SKZ |  | SKIP IF NOT 30LB SCALE |
| 01E8 | 1F | | 365 |  | DECB |  | ADDR NON-UK LB ROUND OFF |
| 01E9 | 12 | | 366 |  | LAX |  | RE-LD UK SCALE ENB |
| 01EA | 1E | | 367 |  | SKZ |  | SKIP IF NOT UK SCALE |
| 01EB | 1F | | 368 |  | DECB |  | ADDR UK METRIC OR LB RND OFF |
| 01EC | 11 | | 369 |  | LABL |  | FINAL BL>A |
| 01ED | 05 | | 370 |  | RTN |  | RETURN |
| 01EE | 5211 | 0211 | 371 | FCPTY> | TL | FCPTY | FCPTY SUBROUTINE LINK |
| 01F0 | 5274 | 0274 | 372 | RNDOF> | TL | RNDOFF | RNDOFF SUBROUTINE LINK |
| 01F2 | 5278 | 0278 | 373 | ADDC> | TL | ADDC | ADDC SUBROUTINE LINK |
| 01F4 | 53EF | 03EF | 374 | CRTAZ> | TL | CRCTAZ | CRCTAZ SUBROUTINE LINK |
| 01F6 | 5240 | 0240 | 375 | UDOWT> | TL | UDOWT | UDOWT SUBROUTINE LINK |
| 01F8 | 5280 | 0280 | 376 | DELAY> | TL | DELAY | DELAY SUBROUTINE LINK |
| 01FA | 5267 | 0267 | 377 | DLY.4> | TL | DL.4MS | DL.4MS SUBROUTINE LINK |
| 01FC | 50E8 | 00E8 | 378 | MOVX> | TL | MOVX | MOVX SUBROUTINE LINK |
| 01FE | 503C | 003C | 379 | SETRC> | TL | SETRCP | SETRCP SUBROUTINE LINK |
|  |  |  | 380 |  |  |  |  |
|  |  |  | 381 |  | ORG | 200 |  |
| 0200 | 77 | 0008 | 382 |  | LDI | 8 | DIG 0 PARITY |
| 0201 | 7F | 0000 | 383 |  | LDI | 0 | DIG 1 |
| 0202 | 7F | 0000 | 384 |  | LDI | 0 | DIG 2 |
| 0203 | 77 | 0008 | 385 |  | LDI | 8 | DIG 3 |
| 0204 | 7F | 0000 | 386 |  | LDI | 0 | DIG 4 |
| 0205 | 77 | 0008 | 387 |  | LDI | 8 | DIG 5 |
| 0206 | 77 | 0008 | 388 |  | LDI | 8 | DIG 6 |
| 0207 | 7F | 0000 | 389 |  | LDI | 0 | DIG 7 |
| 0208 | 7F | 0000 | 390 |  | LDI | 0 | DIG 8 |
| 0209 | 77 | 0008 | 391 |  | LDI | 8 | DIG 9 |
| 020A | 77 | 0008 | 392 |  | LDI | 8 | DIG 10 |
| 020B | 7F | 0000 | 393 |  | LDI | 0 | DIG 11 |
| 020C | 77 | 0008 | 394 |  | LDI | 8 | DIG 12 |
| 020D | 7F | 0000 | 395 |  | LDI | 0 | DIG 13 |
| 020E | 7F | 0000 | 396 |  | LDI | 0 | DIG 14 |

```
020F  56A1  06A1  397         TL    PARITY
                  398  * FCPTY SUBROUTINE - SETS FLG1,C,A,X ACCORDING
                  399  *  TO SCALE CAPACITY. THE ARI REG IS CLEARED.
                  400  *      FLG1  - RESET IF 15KG SCALE
                  401  *      C     - RESET IF  6KG SCALE
                  402  *      A     - 10 GRADUATION DIGIT
                  403  *      X     - CAPACITY DIGIT
                  404  *      B     - ADDRESSES ARI LSD(1A)
0211  D6    000D  405  FCPTY  TM    >ARICL
0212  22          406         SF1         ASSUME NOT 15KG
0213  20          407         SC          ASSUME NOT 6KG
0214  00BC  0043  408         LBL   #43
0216  37    0     409         LD          LD 30LB SCALE ENB
0217  1E          410         SKZ         SKIP IF NOT 30LB SCALE
0218  A0    0220  411         T     FCPTY1 30LB SCALE
0219  24          412         RC          NOT 30LB,ASSUME 6KG
021A  17          413         INCB
021B  37    0     414         LD          LD 6KG SCALE ENB
021C  1E          415         SKZ         SKIP IF NOT 6KG SCALE
021D  A0    0220  416         T     FCPTY1 6KG SCALE
021E  20          417         SC          NOT 6KG
021F  26          418         RF1         15KG
0220  15          419  FCPTY1 SKC         SKIP IF NOT 6KG
0221  A5    0225  420         T     FCPTY2 6KG
0222  16          421         SKF1        SKIP IF NOT 15KG
0223  7A    0005  422         LDI   5     15KG
0224  7C    0003  423         LDI   3     30LB
0225  79    0006  424  FCPTY2 LDI   6     6KG
0226  1B          425         LXA         CAPACITY DIGIT>X
0227  15          426         SKC         SKIP IF NOT 6KG
0228  AC    022C  427         T     FCPTY3 6KG
0229  16          428         SKF1        SKIP NOT 15KG
022A  7A    0005  429         LDI   5     15KG
022B  7E    0001  430         LDI   1     30LB
022C  7D    0002  431  FCPTY3 LDI   2     6KG
022D  00E5  001A  432         LBL   #1A
022F  05          433         RTN         RETURN
                  434  * MAXAZ SUBROUTINE - CHECKS THAT WGT OR AUTO ZERO
                  435  *  CORRECTION RESULT IS LESS THAN 000400 CNTS. ON
                  436  *    ENTRY B IS SET TO 24(WGT) OR 04(RESULT). IF
                  437  *    AUTO ZERO IS UPDATED A RETURN AND SKIP OCCURS.
0230  7C    0003  438  MAXAZ  LDI   3
0231  D5    0005  439         TM    >MAGCK CK FOR,LE.3XX,WGT OR RES FLD
0232  84    0234  440         T     *+2   .LE.3XX RTN
0233  05          441         RTN         .GT.3XX RTN,OVER,RETURN
0234  76    0009  442         LDI   9
0235  19          443         XABL        ADDR WGT OR RESULT SIGN
0236  7B    0004  444         LDI   4
0237  D0    0000  445         TM    >MOVX MOVE WGT OR RES TO AUTO ZERO
0238  07          446         RTNSK       UPDATE DONE,RETURN AND SKIP
0239  CD    00CD  447  MOVPRX LB    >69
023A  78    0007  448         LDI   7
023B  1B          449         LXA
023C  71    000E  450         LDI   14
023D  5104  0104  451         TL    MOV5
                  452
                  453         ORG   240
                  454  * UDOWT SUBROUTINE - MOVES WGT 5 MSDS AND WGT SIGN
                  455  *  TO OUT WGT. BLANKS OUT WGT IF SIGN MINUS AND
                  456  *  HAVE NON-0 DIGIT IN MSD. ENSURES THAT SIGN PLUS
                  457  *  IF OUT WGT IS 0.
0240  00DA  0025  458  UDOWT  LBL   #25
0242  14          459         SKF2        SKIP NOT X10 EXP
0243  17          460         INCB
0244  7F    0000  461         LDI   0
0245  22          462         SF1
0246  D5    0005  463         TM    >MAGCK CK FOR ALL 0S IN FINAL WGT
0247  26          464         RF1         ALL 0S RETURN,RESET FLG1
0248  C9    00C9  465         LB    >29
0249  70    000F  466         LDI   15    15>A TO DEC WGT SIGN
024A  0B          467         AD          WGT SIGN>15:PLUS,14:MINUS
024B  00D0  002F  468         LBL   #2F
024D  14          469         SKF2        SKIP NOT X10 EXP
024E  1F          470         DECB
```

```
024F   16              471          SKF1            SKIP IF OUT WGT NOT 0
0250   70      000F    472          LDI     15      BE SURE SIGN PLUS IF 0
0251   3F      0       473          EX              OUT WGT SIGN>MSD WGT,MSD>A
0252   1E              474          SKZ             SKIP IF WGT MSD 0
0253   95      0255    475          T       *+2     NOT 0
0254   9C      025C    476          T       JDOWT1  MSD 0
0255   3F      0       477          EX              NOT 0,MSD>MEM
0256   00BF    0040    478          LBL     #40
0258   37      0       479          LD              LD 300 PRINTER ENB
0259   15              480          SKC             SKIP IF WGT MINUS
025A   1E              481          SKZ             NOT MINUS,SKIP NOT 300 PRNTR
025B   A5      0265    482          T       BLKWT>  MI,OR,300 PNTR,AND,MSD NOT 0
025C   00D0    002F    483  JDOWT1  LBL     #2F
025E   14              484          SKF2            SKIP NOT X10 EXPAND
025F   1F              485          DECB
0260   79      0006    486          LDI     6
0261   1B              487          LXA
0262   71      000E    488          LDI     14
0263   5104    0104    489          TL      MOV5    MOVE WGT 5 MSDS TO OUT WGT
0265   53C9    03C9    490  BLKWT>  TL      BLNKWT  BLANK OUT WGT
                       491  * DL.4MS SUBROUTINE - SETS UP AND PERFORMS .4MS DLY
                       492  *  AND RETURNS WITH B SET TO ADDR 0D
0267   1C41    0041    493  DL.4MS  IDL     SOS     STROBE OR REMOVE CLOCK
0269   C4      00C4    494          LB      >09
026A   7F      0000    495          LDI     0
026B   3F      0       496          EX
026C   17              497          INCB
026D   7F      0000    498          LDI     0
026E   3F      0       499          EX
026F   7C      0003    500          LDI     3
0270   E0      00E0    501          TM      >DELAY  .4 MS DELAY
0271   00F2    000D    502          LBL     #0D
0273   05              503          RTN
                       504  * RNDOFF SUBROUTINE - DOES 5 ROUND OFF,PROPAGATES C
0274   74      000B    505  RNDOFF  LDI     11      11>A
0275   0B              506          AD              ADD RND OFF DIG,C>1 IF,GE,5
0276   7F      0000    507          LDI     0
0277   BB      027B    508          T       ADDC+3  REPLACE LSD WITH 0
                       509  * ADDC SUBROUTINE - ADDS C TO FIELD,PROPAGATES C
0278   79      0006    510  ADDC    LDI     6       EXCESS 6
0279   08              511          ADCSK           ADD MEM DIG+C,SKIP ON C
027A   65              512          DC              DECIMAL CORRECT
027B   3F      0       513          EX              UPDATE MEM DIG
027C   17              514          INCB            INC BL,SKIP IF 0
027D   B8      0278    515          T       ADDC    NOT 0,LOOP
027E   05              516          RTN             RETURN
                       517
                       518          ORG     280
                       519
                       520  * DELAY SUBROUTINE - ALLOWS TIME DELAYS FROM 190
                       521  *  MIC-SEC TO 255.76 MILLI-SEC, INCREMENT .105 MS
                       522  *       TO CALL:        LONG TIMER IN ADDR 0A
                       523  *                       MID TIMER IN ADDR 09
                       524  *                       SHORT TIMER IN A
                       525  *       DELAY VALUES:   LONG TIMER 15.64  MS/COUNT
                       526  *                       MID TIMER   1.3   MS/COUNT
                       527  *                       SHORT TIMER 0.105 MS/COUNT
                       528  *                       DEAD TIME   0.085 MS
0280   00F6    0009    529  DELAY   LBL     #09
0282   3F      0       530          EX              MID TIMER>A,SHORT TIMER>MEM
0283   1B              531          LXA             SAVE MID TIMER IN X
0284   3F      0       532          EX              SHORT TIMER>A,MID TIMER>MEM
0285   60      000F    533  DELY1   ADI     15      DEC SHORT TIM,SKIP WAS NOT 0
0286   8E      028E    534          T       DELY2   WAS 0
0287   00F3    000C    535          LBL     #0C     LD B WITH 4 COUNTER
0289   528B    028B    536          TL      *+2     10 MIC-SEC
028B   17              537          INCB            5 MIC-SEC,INC BL,SKIP IF 0
028C   89      0289    538          T       *-3     5 MIC-SEC,X4 FOR 80 MIC-SEC
028D   85      0285    539          T       DELY1   SHORT DELY=TIMERX105 MIC-SEC
028E   12              540  DELY2   LAX             LD MID COUNTER
028F   60      000F    541          ADI     15      DEC,SKIP WAS NOT 0
0290   94      0294    542          T       DELY3   WAS 0
0291   1B              543          LXA             DECREMENTED TIMER>X
0292   73      000C    544          LDI     12      SET UP SHORT DELAY=1.26 MS
0293   85      0285    545          T       DELY1   MID DELAY=TIMERX1.3 MS
```

```
0294   74    000B   546   DELY3   LDI    11
0295   1B           547           LXA           SET UP MID DELAY=14.3 MS
0296   00F5  000A   548           LBL    #0A
0298   37    0      549           LD            LD LONG TIMER
0299   60    000F   550           ADI    15     DEC,SKIP WAS NOT 0
029A   05           551           RTN           WAS 0,DONE,85 MIC-SEC ADDED
029B   3F    0      552           EX            UPDATE LONG TIMER
029C   92    0292   553           T      DELY3-2 SET UP SHORT DELAY
                    554
                    555   *MAIN PROGRAM POWER-UP START*
                    556           ORG    0
0000   81    0001   557           T      *+1    POWER UP ENTRY
0001   00CE  0031   558           LBL    #31
0003   7F    0000   559           LDI    0
0004   2C    3      560           EXD    3      BE SURE Z DONE FLAG CLR
0005   77    0008   561           LDI    8
0006   1C41  0041   562           IOL    SOS    DISCRETE I/O>LOW
0008   17           563           INCB
0009   85    0005   564           T      *-4    LOOP TO INIT ALL 15 I/O
000A   77    0008   565           LDI    8
000B   1C40  0040   566           IOL    SES    ENABLE ALL DISCRETE OUTPUTS
000D   5392  0392   567           TL     X10CLR
000F   1CF6  00F6   568   KBERR   IOL    KER    RESET KEYBOARD
0011   C5    00C5   569   RESET   LB     >12
0012   D7    00D7   570           TM     >CLEAR CLR NET,FCTR,VFY TEST FLGS
0013   CA    00CA   571           L3     >33
0014   7F    0000   572           LDI    0
0015   3F    0      573           EX            CLR AUTO CLR FLAG
0016   D8    00D8   574           TM     >CLRT  CLR TARE
0017   E5    00E5   575           TM     >SETRC  SET RECOMPUTE
0018   D9    0009   576           TM     >CLRPR CLR PRICE,TOTAL PRICE
0019   00F0  006F   577   RDSWS   LBL    #6F
001B   7F    0000   578           LDI    0
001C   3F    0      579           EX            BE SURE RAM REG 6F CLR
001D   C8    00CB   580           LB     >48
001E   27           581           DIA           RD X10,Z KEY,BY CNT,PRE-PAK
001F   3F    0      582           EX
0020   00F9  0006   583           LBL    #06
0022   22           584           SF1           SET FLG1 FOR 1ST SWITCH BANK
0023   7B    0004   585           LDI    4      WANT RAM REG 4 FOR 1ST BANK
0024   1B           586   RDSWA   LXA           RAM REG>X
0025   7F    0000   587           LDI    0
0026   1C41  0041   588           IOL    SOS    ENB BANK,SET I/O 6:1ST,7:2ND
0028   C0    00C0   589           LB     >00
0029   77    0008   590   RSLOOP  LDI    8
002A   1C41  0041   591           IOL    SOS    RD SWITCH,0>A:ON,8>A:OFF
002C   1B           592           XBMX          RAM REG>BM,0>X
002D   1E           593           SKZ           SKIP IF SW ON
002E   7F    0000   594           LDI    0      SW OFF
002F   77    0008   595           LDI    8      SW ON
0030   3F    0      596           EX            8>MEM:ON,0>MEM:OFF
0031   17           597           INCB          INC BL
0032   1B           598           XBMX          0>BM,RAM REG>X
0033   46    0006   599           SKBI   6      SKIP IF BL=6
0034   A9    0029   600           T      RSLOOP LOOP
0035   16           601           SKF1          SKIP ON FLG1,1ST BANK READ
0036   17           602           INCB          2ND BANK READ,WANT I/O 7
0037   77    0008   603           LDI    8
0038   1C41  0041   604           IOL    SOS    DIS BANK,CLR I/O 6:1ST,7:2ND
003A   5040  0040   605           TL     #040
                    606   * SETRCP SUBROUTINE - SETS RECOMPUTE FLAG
                    607   *  ON RETURN PRINT FLAG IS ADDRESSED
003C   CC    00CC   608   SETRCP  LB     >57
003D   70    000F   609           LDI    15
003E   38    7      610           EX     7      SET RECOMPUTE FLAG
003F   05           611           RTN
                    612
                    613           ORG    040
0040   16           614           SKF1          SKIP IF 1ST BANK READ
0041   87    0047   615           T      CKRST  2ND BANK READ,DONE
0042   17           616           INCB          START 2ND BANK,WANT I/O 7
0043   26           617           RF1           CLR FLG1 FOR 2ND SWITCH BANK
0044   7A    0005   618           LDI    5      WANT RAM REG 5 FOR 2ND BANK
0045   5024  0024   619           TL     RDSWA  LOOP
0047   C3    00C3   620   CKRST   LB     >04
```

| | | | | | | |
|---|---|---|---|---|---|---|
| 0048 | 37 | 0 | 621 | | LD | | LD DIG TIMER |
| 0049 | 60 | 000F | 622 | | ADI | 15 | DEC IT,SKIP ON C |
| 004A | 9D | 005D | 623 | | T | RDWGT | NO C,TIMER WAS 0,SKIP CHECK |
| 004B | 3F | 0 | 624 | | EX | | UPDATE DIGIT TIMER |
| 004C | 00BD | 0042 | 625 | | LBL | #42 | |
| 004E | 77 | 0008 | 626 | | LDI | 8 | 8>A TO SELECTIVELY COM 8 BIT |
| 004F | 0C | | 627 | | EOR | | EX-OR WITH TARE MAND ENB |
| 0050 | C2 | 00C2 | 628 | | LB | >02 | |
| 0051 | 0F | | 629 | | OR | | ,OR,WITH T DONE,A=0:NOT DONE |
| 0052 | 17 | | 630 | | INCB | | |
| 0053 | 0F | | 631 | | OR | | NO RESET IF MAN T FLAG SET |
| 0054 | 17 | | 632 | | INCB | | |
| 0055 | 0F | | 633 | | OR | | ,OR,WITH DIG TIM,A=0:JUST 0 |
| 0056 | 1E | | 634 | | SKZ | | SKIP IF ALL TRUE TO RESET |
| | | | 635 | * SKIP IF (TARE MANDATORY),AND,(NO TARE DONE),AND, | | | |
| | | | 636 | *        (NO MANUAL TARE FLAG),AND,(TIMER JUST 0) | | | |
| 0057 | 9D | 005D | 637 | | T | RDWGT | A,NE,0,NO RESET |
| 0058 | E4 | 00E4 | 638 | | TM | >MODE | CK FOR BY COUNT MODE |
| 0059 | 98 | 005B | 639 | | T | *+2 | NOT BY COUNT,RESET OK |
| 005A | 9D | 005D | 640 | | T | RDWGT | BY COUNT,SKIP RESET |
| 005B | 5011 | 0011 | 641 | | TL | RESET | A,EQ,0,RESET SCALE |
| 005D | DC | 00DC | 642 | RDWGT | TM | >FCPTY | DETERMINE SCALE CAPACITY |
| 005E | C4 | 00C4 | 643 | | LB | >09 | |
| 005F | 15 | | 644 | | SKC | | SKIP NOT 6KG |
| 0060 | A4 | 0064 | 645 | | T | *+4 | 6KG |
| 0061 | 16 | | 646 | | SKF1 | | SKIP NOT 15KG |
| 0062 | 7E | 0001 | 647 | | LDI | 1 | 15KG |
| 0063 | 77 | 0008 | 648 | | LDI | 8 | 30LB |
| 0064 | 7C | 0003 | 649 | | LDI | 3 | 6KG |
| 0065 | 3F | 0 | 650 | | EX | | ENTER T1 DELAY MID TIMER |
| 0066 | 17 | | 651 | | INCB | | |
| 0067 | 15 | | 652 | | SKC | | SKIP NOT 6KG |
| 0068 | 70 | 000F | 653 | | LDI | 15 | 6KG |
| 0069 | 79 | 0006 | 654 | | LDI | 6 | 15KG OR 30LB |
| 006A | 3F | 0 | 655 | | EX | | ENTER T1 DELAY LONG TIMER |
| 006B | 77 | 0008 | 656 | | LDI | 8 | |
| 006C | 1B | | 657 | | LXA | | T1 CONTROL BIT>X |
| 006D | 7F | 0000 | 658 | | LDI | 0 | |
| 006E | 1D | | 659 | | DOA | | START T1 INTEGRATION |
| 006F | 15 | | 660 | | SKC | | SKIP NOT 6KG |
| 0070 | 84 | 0074 | 661 | | T | *+4 | 6KG |
| 0071 | 16 | | 662 | | SKF1 | | SKIP NOT 15KG |
| 0072 | 78 | 0004 | 663 | | LDI | 4 | 15KG,TOTAL DELAY  95,765 MS |
| 0073 | 74 | 000B | 664 | | LDI | 11 | 30LB,TOTAL DELAY 105,600 MS |
| 0074 | 76 | 0009 | 665 | | LDI | 9 | 6KG,TOTAL DELAY 239,635 MS |
| 0075 | E0 | 00E0 | 666 | | TM | >DELAY | PERFORM T1 DELAY |
| 0076 | 7F | 0000 | 667 | | LDI | 0 | |
| 0077 | 6F | | 668 | | CYS | | |
| 0078 | 7F | 0000 | 669 | | LDI | 0 | |
| 0079 | 6F | | 670 | | CYS | | |
| 007A | 7F | 0000 | 671 | | LDI | 0 | |
| 007B | 6F | | 672 | | CYS | | |
| 007C | 00F7 | 0008 | 673 | | LBL | #08 | |
| 007E | 5080 | 0080 | 674 | | TL | #080 | |
| | | | 675 | | | | |
| | | | 676 | | ORG | 080 | |
| 0080 | 7F | 0000 | 677 | | LDI | 0 | |
| 0081 | 3F | 0 | 678 | | EX | | FORM DUMMY MEM 0 FOR ADDS |
| 0082 | 7F | 0000 | 679 | | LDI | 0 | |
| 0083 | 1C40 | 0040 | 680 | | IOL | SES | DISABLE DISCRETE OUTPUTS |
| 0085 | 67 | 0008 | 681 | | ADI | 8 | SKIP IF WGT TOO MINUS |
| 0086 | 8C | 008C | 682 | | T | RDWGT1 | NO COIN,NOT TOO MINUS |
| 0087 | 77 | 0008 | 683 | | LDI | 8 | |
| 0088 | 1C40 | 0040 | 684 | | IOL | SES | ENABLE DISCRETE OUTPUTS |
| 008A | 53C9 | 03C9 | 685 | | TL | BLNKWT | TOO MINUS |
| 008C | 7B | 0004 | 686 | RDWGT1 | LDI | 4 | |
| 008D | 1B | | 687 | | LXA | | T2 CONTROL BIT>X |
| 008E | 7F | 0000 | 688 | | LDI | 0 | |
| 008F | 1D | | 689 | | DOA | | STOP T1,START T2 INTEGRATION |
| 0090 | 20 | | 690 | T2LOOP | SC | | START 65 MIC-SEC T2 LOOP |
| 0091 | 6F | | 691 | | CYS | | LD LOW DIGIT COUNTER |
| 0092 | 0A | | 692 | | ADC | | CNTR+0+C>A,C |
| 0093 | 6F | | 693 | | CYS | | STORE LOW,LD MID DIG COUNTER |
| 0094 | 0A | | 694 | | ADC | | CNTR+0+C>A,C |
| 0095 | 6F | | 695 | | CYS | | STORE MID,LD HI DIG COUNTER |

| Addr | Code | Oper | Line | Label | Mnem | Operand | Comment |
|---|---|---|---|---|---|---|---|
| 0096 | 0A | | 696 | | ADC | | CNTR+0+C>A,C |
| 0097 | 6F | | 697 | | CYS | | STORE HIGH DIGIT COUNTER,0>A |
| 0098 | 1C41 | 0041 | 698 | | IJL | SOS | INPUT A/D CMPRTR,8>A IF LOW |
| 009A | 1E | | 699 | | SKZ | | SKIP IF COMPARATOR HIGH |
| 009B | 9D | 009D | 700 | | T | *+2 | COIN,COMPARATOR LOW |
| 009C | 90 | 0090 | 701 | | T | T2LOOP | NO COIN,CONTINUE COUNTING |
| 009D | 0083 | 007C | 702 | | LBL | #7C | |
| 009F | 17 | | 703 | | INCB | | INC BL,SKIP IF 0,WANT EXTRA |
| 00A0 | 9F | 009F | 704 | | T | *-1 | 65 MIC-SEC DELAY TO DOA INST |
| 00A1 | 7F | 0000 | 705 | | LDI | 0 | |
| 00A2 | 1B | | 706 | | LXA | | T2 OFF>X |
| 00A3 | 1D | | 707 | | DOA | | STOP T2 INTEGRATION |
| 00A4 | 7F | 0000 | 708 | | LDI | 0 | |
| 00A5 | 6F | | 709 | | CYS | | T2 DIGIT CNTRS>A,0>CNTRS |
| 00A6 | 3F | 0 | 710 | | EX | | LOW>ADDR 70,MID>71,HIGH >72 |
| 00A7 | 17 | | 711 | | INCB | | INC BL |
| 00A8 | 43 | 0003 | 712 | | SKBI | 3 | SKIP IF BL=3 |
| 00A9 | A4 | 00A4 | 713 | | T | *-5 | LOOP |
| 00AA | 00F7 | 000B | 714 | | LBL | #0B | |
| 00AC | 70 | 0002 | 715 | | LDI | 2 | |
| 00AD | 1B | | 716 | | LXA | | T3 CONTROL BIT>X |
| 00AE | 7F | 0000 | 717 | | LDI | 0 | |
| 00AF | 1D | | 718 | | DOA | | START T3 INTEGRATION |
| 00B0 | 77 | 0008 | 719 | T3LOOP | LDI | 8 | START 65 MIC-SEC T3 LOOP |
| 00B1 | 20 | | 720 | | SC | | |
| 00B2 | 6F | | 721 | | CYS | | LD LOW DIGIT COUNTER |
| 00B3 | 0A | | 722 | | ADC | | CNTR+0+C>A,C |
| 00B4 | 6F | | 723 | | CYS | | STORE LOW,LD MID DIG COUNTER |
| 00B5 | 0A | | 724 | | ADC | | CNTR+0+C>A,C |
| 00B6 | 6F | | 725 | | CYS | | STORE MID,LD HI DIG COUNTER |
| 00B7 | 0A | | 726 | | ADC | | CNTR+0+C>A,C (ALWAYS 0) |
| 00B8 | 6F | | 727 | | CYS | | STORE HIGH DIGIT COUNTER,0>A |
| 00B9 | 1C41 | 0041 | 728 | | IJL | SOS | INPUT A/D CMPRTR,8>A IF LOW |
| 00BB | 1E | | 729 | | SKZ | | SKIP IF COMPARATOR HIGH |
| 00BC | B0 | 00B0 | 730 | | T | T3LOOP | NO COIN,CONTINUE COUNTING |
| 00BD | 7E | 0001 | 731 | | LDI | 1 | |
| 00BE | 529D | 029D | 732 | | TL | #29D | |
| | | | 733 | | | | |
| | | | 734 | | ORG | 29D | |
| 029D | 1B | | 735 | | LXA | | A/D RESET CONTROL BIT>X |
| 029E | 70 | 000F | 736 | | LDI | 15 | |
| 029F | 1D | | 737 | | DOA | | RESET A/D INTEGRATOR |
| 02A0 | 1C40 | 0040 | 738 | | IJL | SES | ENABLE DISCRETE OUTPUTS |
| 02A2 | 008C | 0073 | 739 | | LBL | #73 | |
| 02A4 | 6F | | 740 | | CYS | | LD LOW DIGIT T3 COUNTER |
| 02A5 | 3F | 0 | 741 | | EX | | LOW DIG CNTR>ADDR 73 |
| 02A6 | 17 | | 742 | | INCB | | |
| 02A7 | 6F | | 743 | | CYS | | LD MID DIGIT T3 COUNTER |
| 02A8 | 3F | 0 | 744 | | EX | | MID DIG CNTR>ADDR 74 |
| 02A9 | 0086 | 0079 | 745 | | LBL | #79 | |
| 02AB | 07 | 00D7 | 746 | | TM | >CLEAR | CLR TEMP |
| 02AC | 06 | 0006 | 747 | | TM | >ARICL | CLR ARI |
| 02AD | 008D | 0072 | 748 | T2CNVT | LBL | #72 | |
| 02AF | 37 | 0 | 749 | | LD | | LD HIGH DIGIT T2 COUNTER |
| 02B0 | C7 | 00C7 | 750 | | LB | >1A | |
| 02B1 | 3F | 0 | 751 | | EX | | HI DIG T2 CNTR>ARI FOR MULT |
| 02B2 | 0083 | 007C | 752 | | LBL | #7C | LD TEMP WITH 256 |
| 02B4 | 70 | 0002 | 753 | | LDI | 2 | |
| 02B5 | 2F | 0 | 754 | | EXD | | |
| 02B6 | 7A | 0005 | 755 | | LDI | 5 | |
| 02B7 | 2F | 0 | 756 | | EXD | | |
| 02B8 | 79 | 0006 | 757 | | LDI | 6 | |
| 02B9 | 3F | 0 | 758 | | EX | | |
| 02BA | 008A | 0075 | 759 | | LBL | #75 | |
| 02BC | D4 | 00D4 | 760 | | TM | >MULT | MULT HI DIG T2 CNTR BY 256 |
| 02BD | 70 | 0002 | 761 | | LDI | 2 | |
| 02BE | 52C0 | 02C0 | 762 | | TL | #2C0 | |
| | | | 763 | | | | |
| | | | 764 | | ORG | 2C0 | |
| 02C0 | D1 | 00D1 | 765 | | TM | >MOV5X | MOVE RESULT TO WGT |
| 02C1 | 2F | 0 | 766 | | EXD | | MOVE RES 6TH DIG(LSD) TO WGT |
| 02C2 | 7F | 0000 | 767 | | LDI | 0 | |
| 02C3 | 3F | 0 | 768 | | EX | | CLR WGT SIGN |
| 02C4 | CF | 00CF | 769 | | LB | >7A | |
| 02C5 | D7 | 00D7 | 770 | | TM | >CLEAR | CLR TEMP |

| | | | | | | | |
|---|---|---|---|---|---|---|---|
| 02C6 | 008E | 0071 | 771 | | LBL | #71 | |
| 02C8 | 37 | 0 | 772 | | LD | | LD MID DIGIT T2 COUNTER |
| 02C9 | C7 | 00C7 | 773 | | LB | >1A | |
| 02CA | 39 | 6 | 774 | | EX | 6 | MID DIG T2 CNTR>ARI FOR MULT |
| 02CB | 79 | 0006 | 775 | | LDI | 6 | LD TEMP WITH 16 |
| 02CC | 3F | 0 | 776 | | EX | | |
| 02CD | 17 | | 777 | | INCB | | |
| 02CE | 7E | 0001 | 778 | | LDI | 1 | |
| 02CF | 3F | 0 | 779 | | EX | | |
| 02D0 | 008A | 0075 | 780 | | LBL | #75 | |
| 02D2 | D4 | 00D4 | 781 | | TM | >MULT | MULT MID DIG T2 CNTR BY 16 |
| 02D3 | 7E | 0001 | 782 | | LDI | 1 | |
| 02D4 | D1 | 00D1 | 783 | | TM | >MOVSX | MOVE RESULT TO ARI |
| 02D5 | 2F | 0 | 784 | | EXD | | MOVE 6TH DIG(LSD) TO ARI |
| 02D6 | 70 | 000F | 785 | | LDI | 15 | |
| 02D7 | 3F | 0 | 786 | | EX | | MAKE MINUS SO SUBT WILL ADD |
| 02D8 | C8 | 00C8 | 787 | | LB | >21 | |
| 02D9 | D3 | 00D3 | 788 | | TM | >SUBT | 16XMID CNTR + 256XHIGH CNTR |
| 02DA | 7D | 0002 | 789 | | LDI | 2 | |
| 02DB | D0 | 00D0 | 790 | | TM | >MOVX | MOVE RESULT TO WGT |
| 02DC | C7 | 00C7 | 791 | | LB | >1A | |
| 02DD | D7 | 00D7 | 792 | | TM | >CLEAR | CLR ARI EXCEPT SIGN |
| 02DE | 008F | 0070 | 793 | | LBL | #70 | |
| 02E0 | 37 | 0 | 794 | | LD | | LD LOW DIGIT T2 COUNTER |
| 02E1 | C7 | 00C7 | 795 | | LB | >1A | |
| 02E2 | 3F | 0 | 796 | | EX | | LOW DIGIT CNTR>ARI |
| 02E3 | 24 | | 797 | | RC | | |
| 02E4 | DE | 00DE | 798 | | TM | >ADDC | TRANSFORM HEX TO DECIMAL |
| 02E5 | C8 | 00C8 | 799 | | LB | >21 | |
| 02E6 | D3 | 00D3 | 800 | | TM | >SUBT | LOW + 16XMID + 256XHIGH |
| 02E7 | 7D | 0002 | 801 | | LDI | 2 | |
| 02E8 | D0 | 00D0 | 802 | | TM | >MOVX | MOVE RESULT TO WGT |
| 02E9 | D6 | 00D6 | 803 | | TM | >ARICL | CLR ARI |
| 02EA | 008B | 0074 | 804 | T3CNVT | LBL | #74 | |
| 02EC | 37 | 0 | 805 | | LD | | LD MID DIGIT T3 COUNTER |
| 02ED | C7 | 00C7 | 806 | | LB | >1A | |
| 02EE | 61 | 000E | 807 | | ADI | 14 | |
| 02EF | B0 | C2F0 | 808 | | T | *+1 | |
| 02F0 | 3F | 0 | 809 | | EX | | MID DIG T3 CNTR>ARI |
| 02F1 | 008A | 0075 | 810 | | LBL | #75 | |
| 02F3 | D4 | 00D4 | 811 | | TM | >MULT | MULT MID DIG T3 CNTR BY 16 |
| 02F4 | 78 | 0007 | 812 | | LDI | 7 | |
| 02F5 | D1 | 00D1 | 813 | | TM | >MOVSX | SAVE RESULT IN TEMP |
| 02F6 | 3F | 0 | 814 | | EX | | MOVE 6TH DIG(LSD) TO TEMP |
| 02F7 | D6 | 00D6 | 815 | | TM | >ARICL | CLR ARI |
| 02F8 | 008C | 0073 | 816 | | LBL | #73 | |
| 02FA | 37 | 0 | 817 | | LD | | LD LOW DIGIT T3 COUNTER |
| 02FB | C7 | 00C7 | 818 | | LB | >1A | |
| 02FC | 3F | 0 | 819 | | EX | | LOW DIG T3 CNTR>ARI |
| 02FD | 24 | | 820 | | RC | | |
| 02FE | 5300 | 0300 | 821 | | TL | #300 | |
| | | | 822 | | | | |
| | | | 823 | | ORG | 300 | |
| 0300 | DE | 00DE | 824 | | TM | >ADDC | TRANSFORM HEX TO DECIMAL |
| 0301 | 0086 | 0079 | 825 | | LBL | #79 | ADDR TEMP SIGN |
| 0303 | 70 | 000F | 826 | | LDI | 15 | |
| 0304 | 29 | 6 | 827 | | EXD | 6 | MAKE MINUS SO SUBT WILL ADD |
| 0305 | 1F | | 828 | | DECB | | |
| 0306 | D3 | 00D3 | 829 | | TM | >SUBT | 16XMID T3 CNTR + LOW T3 CNTR |
| 0307 | 78 | 0007 | 830 | | LDI | 7 | |
| 0308 | D0 | 00D0 | 831 | | TM | >MOVX | SAVE IN TEMP |
| 0309 | C7 | 00C7 | 832 | | LB | >1A | LD ARI WITH 32 |
| 030A | 7D | 0002 | 833 | | LDI | 2 | |
| 030B | 3F | 0 | 834 | | EX | | |
| 030C | 17 | | 835 | | INCB | | |
| 030D | 7C | 0003 | 836 | | LDI | 3 | |
| 030E | 3F | 0 | 837 | | EX | | |
| 030F | 00DA | 0025 | 838 | | LBL | #25 | |
| 0311 | D4 | 00D4 | 839 | | TM | >MULT | MULT T2 COUNTS IN WGT BY 32 |
| 0312 | 7D | 0002 | 840 | | LDI | 2 | |
| 0313 | D1 | 00D1 | 841 | | TM | >MOVSX | MOVE RESULT TO WGT |
| 0314 | 3F | 0 | 842 | | EX | | MOVE 6TH DIG(LSD) TO WGT |
| 0315 | 00D8 | 0027 | 843 | | LBL | #27 | |
| 0317 | D3 | 00D3 | 844 | | TM | >SUBT | 12 CNTS(WGT) - T3 CNTS(TEMP) |
| 0318 | 7D | 0002 | 845 | | LDI | 2 | |

| | | | | | | | |
|---|---|---|---|---|---|---|---|
| 0319 | D0 | 00D0 | 846 | | TM | >MOVX | MOVE FINAL RAW COUNTS TO WGT |
| 031A | D6 | 00D6 | 847 | PROCWT | TM | >ARICL | CLR ARI |
| 031B | 00DC | 0023 | 848 | | LBL | #23 | |
| 031D | D3 | 00D3 | 849 | | TM | >SUBT | SUB FILTERED WGT FROM WGT |
| 031E | 00E6 | 0019 | 850 | | LBL | #19 | |
| 0320 | 3F | 0 | 851 | | EX | | RESULT SIGN>ARI SIGN |
| 0321 | 00F9 | 0006 | 852 | | LBL | #06 | |
| 0323 | 7A | 0005 | 853 | | LDI | 5 | |
| 0324 | D5 | 00D5 | 854 | | TM | >MAGCK | CK FOR RESULT,LE,5 |
| 0325 | 70 | 000F | 855 | | LDI | 15 | ,LE,5 RTN,15>A:DEC MOTN FLG |
| 0326 | 7D | 0002 | 856 | | LDI | 2 | ,GT,5 RTN,2>A:SET MOTN FLG |
| 0327 | C0 | 00C0 | 857 | | LB | >00 | |
| 0328 | 15 | | 858 | | SKC | | SKIP,GT,5, MOTION |
| 0329 | AB | 032B | 859 | | T | *+2 | NO MOTION |
| 032A | AD | 032D | 860 | | T | *+3 | MOTION |
| 032B | 09 | | 861 | | ADSK | | DEC MOTN FLG,SKIP ON C |
| 032C | 85 | 0335 | 862 | | T | INIFLT | FLG WAS 0,EXEC INITIAL FLTR |
| 032D | 3F | 0 | 863 | | EX | | UPDATE OR SET MOTN FLG |
| 032E | 00EF | 0010 | 864 | | LBL | #10 | |
| 0330 | 7C | 0003 | 865 | | LDI | 3 | |
| 0331 | 3F | 0 | 866 | | EX | | 3>OUT FLTR CNTR:UPDT OUT WGT |
| 0332 | E5 | 00E5 | 867 | | TM | >SETRC | SET RECOMPUTE |
| 0333 | 5362 | 0362 | 868 | | TL | UDFWT | SKIP INITIAL FILTER |
| 0335 | 00D5 | 002A | 869 | INIFLT | LBL | #2A | |
| 0337 | 37 | 0 | 870 | | LD | | LD WGT LSD |
| 0338 | 00CA | 0035 | 871 | | LBL | #35 | |
| 033A | 1B | | 872 | | LXA | | WGT LSD>X |
| 033B | 2F | 0 | 873 | | EXD | | WGT LSD>1 PREV LSD,1 PREV>A |
| 033C | 3F | 0 | 874 | | EX | | 1 PREV>2 PREV LSD,2 PREV>A |
| 033D | 0C | | 875 | | EOR | | EX-OR 2 PREV WITH 1 PREV LSD |
| 033E | 5540 | 0340 | 876 | | TL | #340 | |
| | | | 877 | | | | |
| | | | 878 | | ORG | 340 | |
| 0340 | 1E | | 879 | | SKZ | | SKIP IF EQUAL |
| 0341 | 88 | 0348 | 880 | | T | FLTWGT | NOT EQ,FILTER WGT |
| 0342 | 37 | 0 | 881 | | LD | | LD 1 PREV LSD |
| 0343 | 17 | | 882 | | INCB | | |
| 0344 | 0C | | 883 | | EOR | | EX-OR 1 PREV WITH CURRENT |
| 0345 | 1E | | 884 | | SKZ | | SKIP IF EQUAL |
| 0346 | 88 | 0348 | 885 | | T | FLTWGT | NOT EQ,FILTER WGT |
| 0347 | A2 | 0362 | 886 | | T | UDFWT | ALL EQ,MOVE WGT TO FLTRD WGT |
| 0348 | 7F | 0000 | 887 | FLTWGT | LDI | 0 | |
| 0349 | 1B | | 888 | | LXA | | 0>X |
| 034A | 00F5 | 000A | 889 | | LBL | #0A | |
| 034C | 36 | 1 | 890 | | LD | 1 | LD WGT-FLTRD WGT LSD |
| 034D | 3F | 0 | 891 | LSD/2 | EX | | ARI LSD=2>ARI LSD |
| 034E | 71 | 000E | 892 | | LDI | 14 | |
| 034F | 09 | | 893 | | ADSK | | SUB 2 FROM ARI LSD,SKIP ON C |
| 0350 | 95 | 0355 | 894 | | T | FLTWT1 | ARI LSD WAS 0 OR 1,DONE |
| 0351 | 1A | | 895 | | XAX | | PARTIAL LSD/2>A,LSD-2>X |
| 0352 | 6E | 0001 | 896 | | ADI | 1 | INC PARTIAL LSD/2 |
| 0353 | 1A | | 897 | | XAX | | LSD-2>A,PARTIAL LSD/2>X |
| 0354 | 8D | 034D | 898 | | T | LSD/2 | REPEAT UNTIL LSD/2 FORMED |
| 0355 | 12 | | 899 | FLTWT1 | LAX | | LD LSD/2 |
| 0356 | 1E | | 900 | | SKZ | | SKIP IF 0 |
| 0357 | 9C | 035C | 901 | | T | *+5 | |
| 0358 | 00C5 | 003A | 902 | | LBL | #3A | |
| 035A | 7D | 0002 | 903 | | LDI | 2 | |
| 035B | A5 | 0365 | 904 | | T | UDFWT+3 | |
| 035C | 6E | 0001 | 905 | | ADI | 1 | FORM LSD/2+1 |
| 035D | 3F | 0 | 906 | | EX | | LSD/2+1>ARI LSD |
| 035E | C8 | 00C8 | 907 | | LB | >21 | |
| 035F | D3 | 00D3 | 908 | | TM | >SUBT | MODIFY WGT BY LSD/2+1 |
| 0360 | 7D | 0002 | 909 | | LDI | 2 | |
| 0361 | D0 | 00D0 | 910 | | TM | >MOVX | UPDATE WGT |
| 0362 | 00D6 | 0029 | 911 | UDFWT | LBL | #29 | |
| 0364 | 7C | 0003 | 912 | | LDI | 3 | |
| 0365 | D0 | 00D0 | 913 | | TM | >MOVX | MOVE WGT TO FILTERED WGT |
| 0366 | DC | 00DC | 914 | | TM | >FCPTY | DETERMINE CAPACITY |
| 0367 | 00E3 | 001C | 915 | | LBL | #1C | FORM DIGITAL INITIAL IN ARI |
| 0369 | 16 | | 916 | | SKF1 | | SKIP NOT 15KG |
| 036A | 79 | 0006 | 917 | | LDI | 6 | 15KG |
| 036B | 7B | 0007 | 918 | | LDI | 7 | 30LB OR 6KG |
| 036C | 3F | 0 | 919 | | EX | | 6 OR 7>ARI LSD+2 |
| 036D | 17 | | 920 | | INCB | | |

```
036E   15              921         SKC                   SKIP NOT 6KG
036F   7C   0003       922         LDI     3             6KG,ARI=3700
0370   7E   0001       923         LDI     1             15KG:ARI=1500,30LB:ARI=1600
0371   3F   0          924         EX                    1 OR 3>ARI LSD+3
0372   C8   00C8       925         LB      >21
0373   D3   00D3       926         TM      >SUBT         SUB DIG INIT FROM WGT
0374   7D   0002       927         LDI     2
0375   D0   00D0       928         TM      >MOVX         UPDATE WGT
0376   CB   00CB       929         LB      >48
0377   5380 0380       930         TL      #380
                       931    * LDPPUK SUBROUTINE - LOADS ENTRY ACCUMULATOR
                       932    *  TO 2 PRE-PAK, UK 1/2 TOTAL PRICE REGISTERS
0379   00DA 0025       933    LDPPUK LBL   #25
037B   3F   0          934         EX                    A>1ST REGISTER
037C   37   0          935         LD                    RE-LD A
037D   17              936         INCB
037E   3F   0          937         EX                    A>2ND REGISTER
037F   05              938         RTN
                       939
                       940         ORG     380
0380   77   0008       941         LDI     8
0381   0D              942         AND                   CK FOR X10 EXPD MODE
0382   67   0008       943         ADI     8             SKIP IF X10 EXPAND
0383   97   0397       944         T       ZCAPT
0384   0009 0026       945    X10EXP LBL   #26
0386   7D   0002       946         LDI     2
0387   D5   0005       947         TM      >MAGCK        CK FOR WGT.LE.2 CNTS
0388   77   0008       948         LDI     8             .LE.2 RTN, Z LAMP ON
0389   7F   0000       949         LDI     0             .GT.2 RTN, Z LAMP OFF
038A   C8   00C8       950         LB      >21
038B   3F   0          951         EX                    UPDATE Z LAMP
038C   25              952         RF2                   NOTE X10 EXP
038D   DF   00DF       953         TM      >UDOWT
038E   DA   00DA       954         TM      >BLANK        BLANK PRICE
038F   009B 0064       955         LBL     #64
0391   DA   00DA       956         TM      >BLANK        BLANK TOTAL PRICE
0392   D8   0008       957    X10CLR TM    >CLRT         CLR TARE
0393   00B6 0049       958         LBL     #49
0395   D7   00D7       959         TM      >CLEAR        CLR AUTO ZERO
0396   E7   00E7       960         TM      >OUTP>        GO TO OUTPUT
0397   7B   0004       961    ZCAPT LDI    4
0398   0D              962         AND                   CK FOR Z KEY
0399   1E              963         SKZ                   SKIP IF TRUE
039A   B1   03B1       964         T       CZTIM         FALSE,CLR Z KEY TIMER
039B   C5   00C5       965         LB      >12
039C   37   0          966         LD                    LD NET FLAG
039D   1E              967         SKZ                   SKIP NOT NET
039E   B1   03B1       968         T       CZTIM         NET,NO Z KEY ALLOWED
039F   C0   00C0       969         LB      >00
03A0   34   3          970         LD      3             LD MOTION FLAG
03A1   1E              971         SKZ                   SKIP IF NO MOTION
03A2   B1   03B1       972         T       CZTIM         MOTION
03A3   7D   0002       973         LDI     2
03A4   0B              974         AD                    INC Z KEY TIMER
03A5   3F   0          975         EX                    UPDATE
03A6   15              976         SKC                   SKIP IF TIMER DONE
03A7   B5   03B5       977         T       SUBAZ         STILL COUNTING
03A8   00DB 0024       978         LBL     #24           TIMER DONE
03AA   0230 0230       979         TML     MAXAZ         CK FOR WGT.LT.400 CNTS
03AC   B5   03B5       980         T       SUBAZ         .GE.400 CNT RTN
03AD   00CE 0031       981         LBL     #31           .LT.400 CNT RTN
03AF   70   000F       982         LDI     15
03B0   3F   0          983         EX                    SET Z DONE FLAG
03B1   00CF 0030       984    CZTIM LBL    #30
03B3   7F   0000       985         LDI     0
03B4   3F   0          986         EX                    CLR Z KEY TIMER
03B5   00DB 0024       987    SUBAZ LBL    #24
03B7   D3   00D3       988         TM      >SUBT         SUB AUTO-ZERO FROM WGT
03B8   7D   0002       989         LDI     2
03B9   D0   00D0       990         TM      >MOVX         UPDATE WGT
03BA   06              991         TM      >ARICL
03BB   00E4 001B       992         LBL     #1B           SET ARI=30050
03BD   7A   0005       993         LDI     5
03BE   53C0 03C0       994         TL      #3C0
                       995
```

```
03C0   3F    0       996            ORG     3C0
03C1   00E1  001E    997            EX
03C2   7C    0003    998            LBL     #1E
03C3   7C    0003    999            LDI     3
03C4   3F    0      1000            EX
03C5   C8    00C8   1001            LB      >21
03C6   D3    0003   1002            TM      >SUBT   CK FOR OVERCAP
03C7   1E           1003            SKZ             SKIP IF OVERCAP
03C8   8D    03CD   1004            T       CKGAZC  NOT OVERCAP
03C9   CE    00CE   1005   BLNKWT   LB      >6E
03CA   DA    00DA   1006            TM      >BLANK  BLANK OUT WGT
03CB   559A  059A   1007            TL      TPBLK   BLANK TOTAL PRICE
03CD   00D9  0026   1008   CKGAZC   LBL     #26     CK GROSS AUTO-ZERO CRCN
03CF   7B    0004   1009            LDI     4
03D0   D5    00D5   1010            TM      >MAGCK  CK FOR WGT.LE.4 CNTS
03D1   0E           1011            COMP            .LE.4 RTN,A>0 IF WGT 0
03D2   C1    00C1   1012            LB      >01     .GT.4 RTN,ADDR Z GRAD FLAG
03D3   3F    0      1013            EX              SAVE A IN Z GRAD FLAG,FLAG>A
03D4   15           1014            SKC             SKIP IF WGT.GT.4 CNTS
03D5   70    000F   1015            LDI     15      15>A TO SET Z GRAD FLAG
03D6   7F    0000   1016            LDI     0       0>A TO CLR Z GRAD FLAG
03D7   3F    0      1017            EX              UPDT Z GRAD FLAG,MAGCK RTN>A
03D8   60    000F   1018            ADI     15      SKIP IF WGT NOT 0
03D9   9E    03DE   1019            T       MFCTR   WGT 0,SKIP CORRECTION
03DA   22           1020            SF1             NOTE GROSS CORRECTION
03DB   15           1021            SKC             SKIP IF WGT.GT.4 CNTS
03DC   E6    00E6   1022            TM      >CRTAZ  .LE.4 CNTS,DO GROSS A-Z CRCN
03DD   9E    03DE   1023            T       *+1
03DE   DC    00DC   1024   MFCTR    TM      >FCPTY  A=1:30LB,2:6KG,5:15KG
03DF   3F    0      1025            EX              WRITE MULTIPLE TO ARI LSD
03E0   00DA  0025   1026            LBL     #25
03E2   D4    0004   1027            TM      >MULT   MULT WGT BY MULTIPLE
03E3   7D    0002   1028            LDI     2
03E4   D1    0001   1029            TM      >MOV5X  UPDATE WGT 5 MSDS
03E5   2B    4      1030            EXD     4       UPDATE WGT 6TH DIG(LSD)
03E6   77    0008   1031            LDI     8       8>A
03E7   0D           1032            AND             .AND.WITH PRICE MSD
03E8   1E           1033            SKZ             SKIP IF PRICE MSD.LT.8
03E9   D9    0009   1034            TM      >CLRPR  .GE.8,INVALID PRICE
03EA   00CE  0031   1035            LBL     #31
03EC   37    0      1036            LD              LD Z DONE FLAG
03ED   5400  0400   1037            TL      #400
                    1038   * CRCTAZ SUBROUTINE - CORRECTS AUTO ZERO REGISTER
                    1039   * BY ONE COUNT TO BRING WGT TOWARD 0
03EF   D6    0006   1040   CRCTAZ   TM      >ARICL  CLR ARI
03F0   C7    00C7   1041            LB      >1A
03F1   7E    0001   1042            LDI     1       1>A
03F2   2C    3      1043            EXD     3       CORRECTION OF 1>ARI LSD
03F3   34    3      1044            LD      3       LD WGT SIGN
03F4   0E           1045            COMP            COM FOR AUTO ZERO CORRECTION
03F5   3F    0      1046            EX              .COM.WGT SIGN>ARI SIGN
03F6   00BE  0041   1047            LBL     #41
03F8   16           1048            SKF1            SKIP IF GROSS CORRECTION
03F9   36    1      1049            LD      1       NET,ADDR TARE REG
03FA   D3    0003   1050            TM      >SUBT   CORRECT AUTO-ZERO BY 1
03FB   16           1051            SKF1            SKIP IF GROSS CORRECTION
03FC   05           1052            RTN             NET,RETURN
03FD   C3    00C3   1053            LB      >04
03FE   5230  0230   1054            TL      MAXAZ   CK FOR.LT.400 CNTS
                    1055
                    1056            ORG     400
0400   6E    0001   1057            ADI     1       SKIP IF Z DONE SINCE PWR UP
0401   A4    0424   1058            T       STARE-1 NO Z DONE
0402   00FC  0003   1059            LBL     #03
0404   3F    0      1060            EX              MAN TARE FLAG>A,0>MAN T FLAG
0405   67    0008   1061            ADI     8       SKIP IF FLAG SET
0406   A5    0425   1062            T       STARE   FLAG CLR
0407   C0    00C0   1063            LB      >00
0408   37    0      1064            LD              LD MOTION FLAG
0409   00D0  002F   1065            LBL     #2F
040B   0F           1066            OR              .OR.WITH WGT MSD
040C   1E           1067            SKZ             SKIP IF MSD 0.AND.NO MOTION
040D   A5    0425   1068            T       STARE   MSD NOT 0.OR.MOTION
040E   C1    00C1   1069            LB      >01
040F   7E    0001   1070            LDI     1
```

```
0410  0B            1071         AD              A>0,C>1 IF IN ZERO GRAD
0411  C9   00C9     1072         LB    >29
0412  0D            1073         AND             .AND.WGT SIGN WITH 0 OR 1
0413  1E            1074         SKZ             SKIP WGT PLUS,OR,ZERO GRAD
0414  A5   0425     1075         T     STARE     WGT MINUS,AND,NOT ZERO GRAD
0415  17            1076         INCB            ADDR WGT
0416  15            1077         SKC             SKIP IF IN ZERO GRAD
0417  9A   041A     1078         T     *+3       NOT ZERO GRAD
0418  D6   00D6     1079         TM    >ARICL    CLR ARI TO GET 0 FIELD
0419  C7   00C7     1080         LB    >1A       CHANGE ADDR TO ARI
041A  7A   0005     1081         LDI   5
041B  D0   00D0     1082         TM    >MOVX     MOVE WGT OR 0S TO TARE
041C  C5   00C5     1083         LB    >12
041D  15            1084         SKC             SKIP SETTING NET IF Z GRAD
041E  77   0008     1085         LDI   8         SET NET
041F  7F   0000     1086         LDI   0         CLR NET
0420  3E   1        1087         EX    1         UPDATE NET FLAG
0421  70   000F     1088         LDI   15
0422  3F   0        1089         EX              SET TARE DONE FLAG
0423  E5   00E5     1090         TM    >SETRC    SET RECOMPUTE
0424  D9   00D9     1091         TM    >CLRPR    CLR PRICE,TOTAL PRICE
0425  00DA 0025     1092  STARE  LBL   #25
0427  D3   00D3     1093         TM    >SUBT     SUBT TARE FROM WGT
0428  70   0002     1094         LDI   2
0429  D0   00D0     1095         TM    >MOVX     UPDATE WGT
042A  00D9 0026     1096  CKNAZC LBL   #26
042C  7F   0000     1097         LDI   0
042D  D5   00D5     1098         TM    >MAGCK    CK FOR WGT 0
042E  B5   0453     1099         T     CKACL>    WGT 0 RTN,SKIP CRRCTN
042F  C5   00C5     1100         LB    >12
0430  37   0        1101         LD              LD NET FLAG
0431  1E            1102         SKZ             SKIP NOT NET
0432  B5   0455     1103         T     *+3       NET,CK A-Z CORRECTION
0433  544E 044E     1104  CKACL> TL    CKACLR    NOT NET,SKIP A-Z CRRCTN
0435  DC   00DC     1105         TM    >FCPTY    CK NET AUTO ZERO CRRCTN
0436  15            1106         SKC             SKIP NOT 6KG
0437  76   0009     1107         LDI   9
0438  7A   0005     1108         LDI   5
0439  3F   0        1109         EX              ARI LSD=9:6KG,5:15KG,0LB
043A  17            1110         INCB
043B  16            1111         SKF1            SKIP NOT 15KG
043C  70   0002     1112         LDI   2
043D  5440 0440     1113         TL    #440
                    1114
                    1115         ORG   440
0440  3F   0        1116         EX              ARI=25:15KG,0>A
0441  C4   00C4     1117         LB    >09
0442  3F   0        1118         EX              CLR RESULT SIGN
0443  C7   00C7     1119         LB    >1A
0444  70   0002     1120         LDI   2
0445  1B            1121         LXA
0446  E1   00E1     1122         TM    >SUBL     CK FOR WGT.LE.4 CNTS,A>0,GT,
0447  26            1123         RF1             NOTE NET CORRECTION
0448  6E   0001     1124         ADI   1         SKIP IF WGT.LE.4 CNTS
0449  8E   044E     1125         T     CKACLR    .GT.4 CNTS,SKIP CRRCTN
044A  E6   00E6     1126         TM    >CRTAZ    .LE.4,DO NET A-Z CRRCTN
044B  C4   00C4     1127         LB    >09
044C  7A   0005     1128         LDI   5
044D  D0   00D0     1129         TM    >MOVX     MOVE RESULT TO TARE
044E  DC   00DC     1130  CKACLR TM    >FCPTY    A=1:30LB,2:6KG,5:15KG
044F  00E3 001C     1131         LBL   #1C
0451  3F   0        1132         EX              A>ARI LSD+2
0452  C8   00C8     1133         LB    >21
0453  D3   00D3     1134         TM    >SUBT     CK FOR 10 INC AUTO CLR WGT
0454  1B            1135         LXA             RESULT SIGN >X,0 IF.GE.10 G
0455  CA   00CA     1136         LB    >33
0456  75   000A     1137         LDI   10        10>A
0457  0B            1138         AD              ADD AUTO CLR FLG,C>1 IF 6
0458  12            1139         LAX             RE-LD RESULT SIGN
0459  6E   0001     1140         ADI   1         SKIP IF WGT.LT.AUTO CLR WGT
045A  AB   046B     1141         T     CKINC     .GE.AUTO CLR WGT
045B  3F   0        1142         EX              CLR AUTO CLR FLAG
045C  15            1143         SKC             SKIP IF AUTO CLR FLAG.EQ.6
045D  B1   0471     1144         T     ZLAMP     .LT.6
045E  CB   00CB     1145         LB    >48
```

| | | | | | | |
|---|---|---|---|---|---|---|
| 045F | 7C | 0003 | 1146 | | LDI | 3 | CK FOR PRE-PAK OR BY CNT |
| 0460 | 0D | | 1147 | | AND | | |
| 0461 | 62 | 0000 | 1148 | | ADI | 13 | SKIP NOT PRE-PAK OR BY CNT |
| 0462 | B1 | 0471 | 1149 | | T | ZLAMP | PRE-PAK;BY CNT,SKIP AUTO CLR |
| 0463 | 00AC | 0053 | 1150 | | LBL | #53 | |
| 0465 | 37 | 0 | 1151 | | LD | | LD AUTO CLR PR AND TARE ENB |
| 0466 | 67 | 0008 | 1152 | | ADI | 8 | SKIP IF ENABLED |
| 0467 | B1 | 0471 | 1153 | | T | ZLAMP | NOT ENABLED |
| 0468 | D8 | 00D8 | 1154 | | TM | >CLRT | CLR TARE |
| 0469 | D9 | 00D9 | 1155 | | TM | >CLRPR | CLR PRICE,TOTAL PRICE |
| 046A | B1 | 0471 | 1156 | | T | ZLAMP | |
| 046B | 15 | | 1157 | CKINC | SKC | | SKIP IF AUTO CLR FLAG.EQ.6 |
| 046C | AE | 046E | 1158 | | T | *+2 | .LT.6 |
| 046D | B1 | 0471 | 1159 | | T | ZLAMP | .EQ.6,SKIP INCREMENTING |
| 046E | 7E | 0001 | 1160 | | LDI | 1 | |
| 046F | 0B | | 1161 | | AD | | INC AUTO CLR FLAG |
| 0470 | 3F | 0 | 1162 | | EX | | UPDATE AUTO CLR FLAG |
| 0471 | DC | 00DC | 1163 | ZLAMP | TM | >FCPTY | A=1:30LB,2:6KG,5:15KG |
| 0472 | 3F | 0 | 1164 | | EX | | A>ARI LSD |
| 0473 | 37 | 0 | 1165 | | LD | | RE-LD A |
| 0474 | 16 | | 1166 | | SKF1 | | SKIP ON FLG1,6KG,OR 30LB |
| 0475 | 71 | 000E | 1167 | | LDI | 14 | 15KG,LD 14 INSTEAD |
| 0476 | 6E | 0001 | 1168 | | ADI | 1 | INC |
| 0477 | 0B | | 1169 | | AD | | FORM 2A+1 OR 4 (15KG) |
| 0478 | 3F | 0 | 1170 | | EX | | 3,5 OR 4>ARI LSD;1,2,OR 5>A |
| 0479 | 63 | 000C | 1171 | | ADI | 12 | ADD 12,SKIP ON C,A>1 IF 15KG |
| 047A | BD | 047D | 1172 | | T | *+3 | NOT 15KG |
| 047B | 17 | | 1173 | | INCB | | |
| 047C | 3F | 0 | 1174 | | EX | | 15KG,1>ARI LSD+1 |
| 047D | C4 | 00C4 | 1175 | | LB | >09 | |
| 047E | 5480 | 0480 | 1176 | | TL | #480 | |
| | | | 1177 | | | | |
| | | | 1178 | | ORG | 480 | |
| 0480 | 7F | 0000 | 1179 | | LDI | 0 | |
| 0481 | 3F | 0 | 1180 | | EX | | 0>RESULT SIGN |
| 0482 | C7 | 00C7 | 1181 | | LB | >1A | |
| 0483 | 70 | 0002 | 1182 | | LDI | 2 | |
| 0484 | 1B | | 1183 | | LXA | | |
| 0485 | E1 | 00E1 | 1184 | | TM | >SUBL | CK FOR WGT.LE.2 CNTS,A>0.GT. |
| 0486 | 00EE | 0011 | 1185 | | LBL | #11 | ADDR ZERO LAMP FLAG |
| 0488 | 1E | | 1186 | | SKZ | | SKIP IF RES PLUS,Z LAMP OFF |
| 0489 | 8C | 048C | 1187 | | T | *+3 | RE NEG, DEC ZERO LAMP FLAG |
| 048A | 7D | 0002 | 1188 | | LDI | 2 | |
| 048B | 8E | 048E | 1189 | | T | UDZLF | TURN OFF ZERO LAMP |
| 048C | 09 | | 1190 | | ADSK | | DEC Z LMP FLG,SKIP WAS NOT 0 |
| 048D | 8F | 048F | 1191 | | T | *+2 | WAS 0,SKIP UPDATE |
| 048E | 3F | 0 | 1192 | UDZLF | EX | | UPDATE ZERO LAMP FLAG |
| 048F | DC | 00DC | 1193 | | TM | >FCPTY | C=0:6KG;C=1:30LB,15KG |
| 0490 | 36 | 1 | 1194 | | LD | 1 | 0>A |
| 0491 | 3D | 2 | 1195 | | EX | 2 | CLR SUBT RESULT LSD |
| 0492 | 15 | | 1196 | | SKC | | SKIP IF 30LB OR 15KG |
| 0493 | 9A | 049A | 1197 | | T | RNDBY2 | 6KG |
| 0494 | DD | 00DD | 1198 | | TM | >RNDOF | ROUND OFF 6 DIG WGT LSD |
| 0495 | 00D4 | 002B | 1199 | | LBL | #2B | |
| 0497 | 16 | | 1200 | | SKF1 | | SKIP IF 30LB SCALE |
| 0498 | A0 | 04A0 | 1201 | | T | RNDBY5 | 15KG |
| 0499 | AA | 04AA | 1202 | | T | OUTFLT | 30LB |
| 049A | 17 | | 1203 | RNDBY2 | INCB | | |
| 049B | 7E | 0001 | 1204 | | LDI | 1 | 6KG |
| 049C | 0D | | 1205 | | AND | | A>0 IF 5 DIG LSD EVEN |
| 049D | 1E | | 1206 | | SKZ | | SKIP IF EVEN,C=0 FROM RNDOFF |
| 049E | 20 | | 1207 | | SC | | ODD,SET C |
| 049F | A9 | 04A9 | 1208 | | T | RNDWT2 | |
| 04A0 | 72 | 000D | 1209 | RNDBY5 | LDI | 13 | 13>A |
| 04A1 | 09 | | 1210 | | ADSK | | ADD 5 DIG LSD, SKIP ON C |
| 04A2 | A6 | 04A6 | 1211 | | T | RNDWT1 | 5 DIG LSD.LT.3 |
| 04A3 | 77 | 0008 | 1212 | | LDI | 8 | 5 DIG LSD.GE.3,8>A |
| 04A4 | 09 | | 1213 | | ADSK | | ADD 5 DIG LSD,SKIP ON C |
| 04A5 | 7A | 0005 | 1214 | | LDI | 5 | 5 DIG LSD.GE.3 AND .LT.8,5>A |
| 04A6 | 7F | 0000 | 1215 | RNDWT1 | LDI | 0 | 5 DIG LSD.LT.3 OR .GE.8,0>A |
| 04A7 | 3F | 0 | 1216 | | EX | | UPDATE 5 DIG LSD WITH 0 OR 5 |
| 04A8 | 17 | | 1217 | | INCB | | |
| 04A9 | DE | 00DE | 1218 | RNDWT2 | TM | >ADDC | INC WGT FIELD IF C SET |
| 04AA | CE | 00CE | 1219 | OUTFLT | LB | >6E | |
| 04AB | 7E | 0001 | 1220 | | LDI | 1 | |

| | | | | | | | |
|---|---|---|---|---|---|---|---|
| 04AC | 01 | 0001 | 1221 | | TM | >MOV5X | MOVE OUT WGT TO ARI |
| 04AD | 00E0 | 001F | 1222 | | LBL | #1F | |
| 04AF | 71 | 000E | 1223 | | LDI | 14 | 14>A |
| 04B0 | 0C | | 1224 | | EOR | | EX-OR WITH OUT WGT MSD |
| 04B1 | 6D | 0002 | 1225 | | ADI | 2 | SKIP IF WAS 1,A>1 |
| 04B2 | 7F | 0000 | 1226 | | LDI | 0 | WAS MINUS OR BLANK |
| 04B3 | 3F | 0 | 1227 | | EX | | UPDATE OUT WGT MSD |
| 04B4 | 00F5 | 000A | 1228 | | LBL | #0A | |
| 04B6 | 7F | 0000 | 1229 | | LDI | 0 | |
| 04B7 | 3E | 1 | 1230 | | EX | 1 | CLR SUBT RESULT LSD |
| 04B8 | 17 | | 1231 | | INCB | | |
| 04B9 | 7D | 0002 | 1232 | | LDI | 2 | |
| 04BA | 1B | | 1233 | | LXA | | |
| 04BB | E1 | 00E1 | 1234 | | TM | >SUBL | SUB OUT WGT FROM 5 MSDS WGT |
| 04BC | C0 | 00C0 | 1235 | | LB | >00 | |
| 04BD | 37 | 0 | 1236 | | LD | | LD MOTN FLAG |
| 04BE | 54C0 | 04C0 | 1237 | | TL | #4C0 | |
| | | | 1238 | | | | |
| | | | 1239 | | ORG | 4C0 | |
| 04C0 | 1E | | 1240 | | SKZ | | SKIP IF NO MOTION |
| 04C1 | 90 | 04D0 | 1241 | | T | OUTF1 | MOTION |
| 04C2 | DC | 00DC | 1242 | | TM | >FCPTY | A=1:30LB,2:6KG,5:15KG |
| 04C3 | 00FA | 0005 | 1243 | | LBL | #05 | |
| 04C5 | D5 | 00D5 | 1244 | | TM | >MAGCK | CK FOR RESULT,LE,A |
| 04C6 | 88 | 04C8 | 1245 | | T | *+2 | .LE. |
| 04C7 | 90 | 04D0 | 1246 | | T | OUTF1 | .GT. |
| 04C8 | 00EF | 0010 | 1247 | | LBL | #10 | |
| 04CA | 6E | 0001 | 1248 | | ADI | 1 | A>0,C>1 IF ALL 0S IN RESULT |
| 04CB | 8D | 04CD | 1249 | | T | *+2 | RESULT NOT 0 |
| 04CC | 9E | 04DE | 1250 | | T | OUTF2+2 | RESULT 0,CLR OUT FLTR CNTR |
| 04CD | 72 | 000D | 1251 | | LDI | 13 | 13>A |
| 04CE | 09 | | 1252 | | ADSK | | ADD OUT FLTR CNTR,SKIP ON C |
| 04CF | 9C | 04DC | 1253 | | T | OUTF2 | OUT FLTR CNTR,LT.3 |
| 04D0 | 21 | | 1254 | OUTF1 | SF2 | | NOTE WANT 5 MSDS |
| 04D1 | E4 | 00E4 | 1255 | | TM | >MODE | CK FOR BY COUNT MODE |
| 04D2 | 94 | 04D4 | 1256 | | T | *+2 | NOT BY COUNT |
| 04D3 | 98 | 04D8 | 1257 | | T | CLROFC | BY COUNT,IGNORE OUT FLT CNTR |
| 04D4 | DF | 00DF | 1258 | | TM | >UDOWT | OUT FLTR CNTR 3,UPDT OUT WGT |
| 04D5 | E5 | 00E5 | 1259 | | TM | >SETRC | SET RECOMPUTE |
| 04D6 | 7F | 0000 | 1260 | | LDI | 0 | |
| 04D7 | 3F | 0 | 1261 | | EX | | CLR PRINT FLAG |
| 04D8 | 00EF | 0010 | 1262 | CLROFC | LBL | #10 | |
| 04DA | 7F | 0000 | 1263 | | LDI | 0 | 0>A TO CLR OUT FLTR CNTR |
| 04DB | 9E | 04DE | 1264 | | T | OUTF2+2 | |
| 04DC | 7E | 0001 | 1265 | OUTF2 | LDI | 1 | |
| 04DD | 08 | | 1266 | | AD | | INC OUT FLTR CNTR |
| 04DE | 3E | 1 | 1267 | | EX | 1 | UPDATE OUT FLTR CNTR |
| 04DF | 35 | 2 | 1268 | LDLMPS | LD | 2 | LD MOTION FLAG |
| 04E0 | 1E | | 1269 | | SKZ | | SKIP NO MOTION |
| 04E1 | 7F | 0000 | 1270 | | LDI | 0 | MOTION |
| 04E2 | 77 | 0008 | 1271 | | LDI | 8 | NO MOTION |
| 04E3 | 3C | 3 | 1272 | | EX | 3 | UPDATE LB/KG LAMP |
| 04E4 | 17 | | 1273 | | INCB | | |
| 04E5 | 34 | 3 | 1274 | | LD | 3 | LD Z LAMP FLAG |
| 04E6 | 1E | | 1275 | | SKZ | | SKIP IF 0,LAMP ON |
| 04E7 | 7F | 0000 | 1276 | | LDI | 0 | FLAG NOT 0 |
| 04E8 | 77 | 0008 | 1277 | | LDI | 8 | FLAG 0 |
| 04E9 | 3C | 3 | 1278 | | EX | 3 | UPDATE ZERO LAMP |
| 04EA | 17 | | 1279 | | INCB | | |
| 04EB | 34 | 3 | 1280 | | LD | 3 | LD NET FLAG |
| 04EC | 3C | 3 | 1281 | | EX | 3 | UPDATE NET LAMP |
| 04ED | 17 | | 1282 | | INCB | | |
| 04EE | 7D | 0002 | 1283 | | LDI | 2 | |
| 04EF | 0D | | 1284 | | AND | | CK FOR PER 1/2 |
| 04F0 | 1E | | 1285 | | SKZ | | SKIP NO PER 1/2 |
| 04F1 | 77 | 0008 | 1286 | | LDI | 8 | PER 1/2 |
| 04F2 | 00DC | 0023 | 1287 | | LBL | #23 | |
| 04F4 | 3C | 3 | 1288 | | EX | 3 | UPDATE PER 1/2 LAMP |
| 04F5 | 7B | 0004 | 1289 | | LDI | 4 | |
| 04F6 | 0D | | 1290 | | AND | | CK FOR PER 1/4 |
| 04F7 | 1E | | 1291 | | SKZ | | SKIP NO PER 1/4 |
| 04F8 | 77 | 0008 | 1292 | | LDI | 8 | PER 1/4 |
| 04F9 | 00DB | 0024 | 1293 | | LBL | #24 | |
| 04FB | 39 | 6 | 1294 | | EX | 6 | UPDATE PER 1/4 LAMP |
| 04FC | 17 | | 1295 | | INCB | | |

```
04FD   37     0      1296            LD              LD UK ENB
04FE   5500   0500   1297            TL     #500
                     1298
                     1299            ORG    500
0500   1E            1300            SKZ             SKIP NOT UK SCALE
0501   8A     050A   1301            T      ITLKCK   SKIP PRE-PAK LAMPS
0502   CB     00CB   1302            LB     >4B
0503   7C     0003   1303            LDI    3
0504   0D            1304            AND             CK FOR PRE-PAK OR BY CNT
0505   62     000D   1305            ADI    13       SKIP NOT PRE-PAK OR BY CNT
0506   77     0008   1306            LDI    8        PRE-PAK OR BY CNT
0507   7F     0000   1307            LDI    0        NOT PRE-PAK OR BY CNT
0508   0379   0379   1308            TML    LDPPUK   UPDATE 2 PRE-PAK LAMPS
050A   E4     00E4   1309    ITLKCK  TM     >MODE    CK FOR BY COUNT MODE
050B   90     0510   1310            T      TDUNCK   NOT BY COUNT
050C   CE     00CE   1311            LB     >6E
050D   DA     00DA   1312            TM     >BLANK   BLANK OUT WGT
050E   3F     0      1313            EX              RESTORE PRINT FLAG
050F   99     0519   1314            T      TPCLR+2
0510   C2     00C2   1315    TDUNCK  LB     >02
0511   33     4      1316            LD     4        LD TARE DONE FLAG
0512   1E            1317            SKZ             SKIP IF TARE NOT DONE
0513   A0     0520   1318            T      CKRCP
0514   37     0      1319            LD              LD TARE MANDATORY ENB
0515   67     0008   1320            ADI    8        SKIP IF MANDATORY
0516   A0     0520   1321            T      CKRCP    NOT MANDATORY
0517   01C7   01C7   1322    TPCLR   TML    CKWSGN   WGT +:0S,WGT -:15S>TOT PRICE
0519   CC     00CC   1323            LB     >57
051A   7F     0000   1324            LDI    0
051B   3F     0      1325            EX              RECOMP>A,0>RECOMP
051C   60     000F   1326            ADI    15       SKIP IF RECOMPUTE SET
051D   A5     0525   1327            T      LMOUT>   GO TO OUT LMPS AND KEYBD
051E   559D   059D   1328            TL     TPBLK+3  CLR TP 1/2 IF UK,OUTPUT
0520   CC     00CC   1329    CKRCP   LB     >57
0521   7F     0000   1330            LDI    0
0522   3F     0      1331            EX              RECOMPUTE>A,0>RECOMPUTE
0523   1E            1332            SKZ             SKIP IF RECOMPUTE CLR
0524   A7     0527   1333            T      CMPUT    DO RECOMPUTE
0525   55F4   05F4   1334    LMOUT>  TL     LMPOUT   SKIP DISPLAY OUTPUT
0527   D6     0006   1335    CMPUT   TM     >ARICL
0528   CF     00CF   1336            LB     >7A
0529   D7     0007   1337            TM     >CLEAR   CLR RAM REG 7
052A   21            1338            SF2             SET FLG2:TOT PR MULT BY WGT
052B   C6     00C6   1339            LB     >13
052C   79     0006   1340            LDI    6        6>A
052D   0D            1341            AND             .AND.WITH FACTOR FLAG
052E   1E            1342            SKZ             SKIP NO PER 1/2 OR PER 1/4
052F   83     0533   1343            T      PRXFCT   HAVE PER 1/2 OR PER 1/4
0530   25            1344            RF2             RESET FLG2:TOT PR MULT BY PR
0531   555B   055B   1345            TL     CKMIN
0533   C7     00C7   1346    PRXFCT  LB     >1A
0534   3F     0      1347            EX              FACTOR>ARI LSD
0535   C9     00C9   1348            LB     >29
0536   D7     0007   1349            TM     >CLEAR   CLR WGT
0537   E3     00E3   1350            TM     >MOVPR
0538   008A   0075   1351            LBL    #75
053A   D4     00D4   1352            TM     >MULT    MULTIPLY FACTOR TIMES PRICE
053B   00AE   0051   1353            LBL    #51
053D   37     0      1354            LD              LD 5 DIG PRICE ENB
053E   5540   0540   1355            TL     #540
                     1356
                     1357            ORG    540
0540   00F8   0007   1358            LBL    #07
0542   1E            1359            SKZ             SKIP IF 4 DIG PRICING
0543   1F            1360            DECB            5 DIG,DEC COUNTER
0544   7F     0000   1361            LDI    0
0545   D5     00D5   1362            TM     >MAGCK   CK FOR OVERPRICE
0546   89     0549   1363            T      *+3      LEGAL PRICE RTN
0547   D9     00D9   1364            TM     >CLRPR   CLR PRICE,TOTAL PRICE
0548   E7     00E7   1365            TM     >OUTP>   GO TO OUTPUT
0549   00BE   0041   1366            LBL    #41
054B   37     0      1367            LD              LD MANDATORY PRICE/UNIT ENB
054C   66     0009   1368            ADI    9        A>1 AND SKIP IF ENABLED
054D   96     0556   1369            T      ADRWGT   NOT ENABLED
054E   25            1370            RF2             RESET FLG2:TOT PR MULT BY PR
```

```
054F  C6   00C6  1371            LB    >13
0550  3F   0     1372            EX          1>FACTOR FLAG;FACTOR DONE
0551  E5   00E5  1373            TM    >SETRC SET RECOMPUTE
0552  79   0006  1374            LDI   6      DEST BM IS PRICE
0553  1B         1375            LXA
0554  76   0009  1376            LDI   9
0555  99   0559  1377            T     UDTPXF
0556  70   0002  1378  ADRWGT    LDI   2      DEST BM IS WGT
0557  1B         1379            LXA
0558  71   000E  1380            LDI   14
0559  C4   00C4  1381  UDTPXF    LB    >09
055A  D2   00D2  1382            TM    >MOV5  MOVE RESULT TO PRICE OR WGT
055B  CE   00CE  1383  CKMIN     LB    >6E
055C  71   000E  1384            LDI   14     14>A
055D  0C         1385            EOR          EX-OR WITH OUT WGT SIGN
055E  1E         1386            SKZ          SKIP IF MINUS
055F  A5   0563  1387            T     OW>ARI OUT WGT PLUS
0560  E5   00E5  1388            TM    >SETRC SET RECOMPUTE
0561  5517 0517  1389            TL    TPCLR  OUT WGT MINUS
0563  E3   00E3  1390  OW>ARI    TM    >MOVPR
0564  CE   00CE  1391            LB    >6E
0565  7E   0001  1392            LDI   1
0566  1B         1393            LXA
0567  71   000E  1394            LDI   14
0568  D2   0002  1395            TM    >MOV5  MOVE OUT WGT TO ARI
0569  00E1 001E  1396            LBL   #1E
056B  37   0     1397            LD           LD OUT WGT MSD
056C  6E   0001  1398            ADI   1      INC,A>0 AND SKIP IF MSD BLNK
056D  AF   056F  1399            T     *+2    NO BLANK IN OUT WGT MSD
056E  3F   0     1400            EX           REPLACE BLANK WITH 0
056F  00DA 0025  1401            LBL   #25
0571  14         1402            SKF2         SKIP IF TOT PR MULT BY WGT
0572  32   5     1403            LD    5      CHANGE BM FOR MULT BY PRICE
0573  D4   0004  1404  PRXWGT    TM    >MULT  MULTIPLY PRICE TIMES OUT WGT
0574  DB   00DB  1405            TM    >TPRDS PROPER ROUND OFF ADDR>A,BL
0575  DD   00DD  1406            TM    >RNDOF DO ROUND OFF OF TOT PR LSD
0576  12         1407            LAX          LD UK ENB SAVED IN TPRDS
0577  1E         1408            SKZ          SKIP NOT UK SCALE
0578  88   057B  1409            T     *+3    UK SCALE
0579  558A 058A  1410            TL    OVALCK NOT UK SCALE
057B  DB   00DB  1411            TM    >TPRDS PROPER ROUND OFF ADDR>A,BL
057C  17         1412            INCB         INC BL TO NEXT DIGIT
057D  77   0008  1413            LDI   8      2 IN EXCESS 6 CODE>A
057E  5580 0580  1414            TL    #580
                   1415
                   1416            ORG   580
0580  0279 0279  1417            TML   ADDC+1 ADD A TO TOTAL PRICE FIELD
0582  DB   00DB  1418            TM    >TPRDS ADDR SAME DIGIT
0583  17         1419            INCB         HAVE 5 TO 9 IN DIG FOR 1/2
0584  74   000B  1420            LDI   11     11>A
0585  09         1421            ADSK         ADD DIG TO A,IF C>1 WANT 1/2
0586  7F   0000  1422            LDI   0      0>A,PRINT,DSPLY BLANK
0587  77   0008  1423            LDI   8      8>A,PRINT,DSPLY 1/2
0588  0379 0379  1424            TML   LDPPUK UK 1/2>PRE-PAK
058A  DB   00DB  1425  OVALCK    TM    >TPRDS PROPER ROUND OFF ADDR>A,BL
058B  1B         1426            LXA          RNDOFF BL>X
058C  00AF 0050  1427            LBL   #50
058E  32   5     1428            LD    5      LD 5 DIG TP ENB
058F  1A         1429            XAX          RNDOFF BL>A,ENB>X
0590  0E         1430            COMP         COM RNDOFF BL
0591  64   000B  1431            ADI   11     ADD TO 11 TO FORM MAGCK CNTR
0592  93   0593  1432            T     *+1
0593  19         1433            XABL         CNTR>BL
0594  12         1434            LAX          RE-LD 5 DIG TP ENB
0595  67   0008  1435            ADI   8      SKIP IF 5 DIG TP
0596  17         1436            INCB         4 DIG TP,INC COUNTER
0597  7F   0000  1437            LDI   0
0598  D5   00D5  1438            TM    >MAGCK CK FOR OVERVALUE
0599  A5   05A5  1439            T     NOTOV  ALL 0 RTN
059A  009B 0064  1440  TPBLK     LBL   #64
059C  DA   00DA  1441            TM    >BLANK BLANK TOTAL PRICE
059D  00BA 0045  1442            LBL   #45
059F  37   0     1443            LD           LD UK SCALE ENABLE
05A0  67   0008  1444            ADI   8      A>0 AND SKIP IF UK
05A1  AE   05AE  1445            T     OUTPUT NOT UK SCALE
```

```
05A2  0379  0379  1446          TML    LDPPUK   BLANK UK 1/2
05A4  AE    05AE  1447          T      OUTPUT
05A5  DB    00DB  1448   NOTUV  TM     >TPRDS   PROPER ROUND OFF ADDR>A,BL
05A6  6A    0005  1449          ADI    5        ADD 5 TO GET MSD
05A7  19          1450          XABL            ADDR TOTAL PRICE MSD IN RES
05A8  79    0006  1451          LDI    6
05A9  1A          1452          XAX             UK ENB>A,DEST BM>X
05AA  1E          1453          SKZ             SKIP NOT UK SCALE
05AB  17          1454          INCB            INC SOURCE BL
05AC  78    0004  1455          LDI    4
05AD  D2    00D2  1456          TM     >MOV5    MOVE RESULT TO TOTAL PRICE
                  1457   * THE FOLLOWING SEQUENCE OF MOV5 CALLS SET DISPLAY
                  1458   * OUT REG AS FOLLOWS FOR OUTPUT TO GPKD:
                  1459   *  70              75    ADDRESS   7A           7F
                  1460   * V0-V1-P2-P3-P4-W0-W1-15-V2-V3-V4-P0-P1-W2-W3-W4
                  1461   *   P=PRICE,W=WEIGHT,V=TOTAL PRICE (VALUE)
05AE  0091  006E  1462   OUTPUT LBL    #6E
05B0  78    0007  1463          LDI    7
05B1  D1    00D1  1464          TM     >MOV5X
05B2  0099  0066  1465          LBL    #66
05B4  78    0007  1466          LDI    7
05B5  1B          1467          LXA
05B6  73    000C  1468          LDI    12
05B7  D2    00D2  1469          TM     >MOV5
05B8  70    000F  1470          LDI    15
05B9  3F    0     1471          EX
05BA  0094  006B  1472          LBL    #6B
05BC  78    0007  1473          LDI    7
05BD  1B          1474          LXA
05BE  55C0  05C0  1475          TL     #5C0
                  1476
                  1477          ORG    5C0
05C0  79    0006  1478          LDI    6
05C1  D2    00D2  1479          TM     >MOV5
05C2  1B          1480          XBMX
05C3  36    1     1481          LD     1
05C4  2E    1     1482          EXD    1
05C5  36    1     1483          LD     1
05C6  3D    2     1484          EX     2
05C7  17          1485          INCB
05C8  37    0     1486          LD              LD 5 DIG UNIT PRICE ENB
05C9  0088  0074  1487          LBL    #74
05CB  1E          1488          SKZ             SKIP IF 4 DIG PRICING
05CC  8F    05CF  1489          T      *+3
05CD  70    000F  1490          LDI    15
05CE  3F    0     1491          EX              BLANK PRICE MSD (P4)
05CF  00BA  0045  1492          LBL    #45
05D1  37    0     1493          LD              LD UK ENB
05D2  1B          1494          LXA             SAVE IN X
05D3  00AF  0050  1495          LBL    #50
05D5  37    0     1496          LD              LD 5 DIGIT TOTAL PRICE ENB
05D6  CF    00CF  1497          LB     >7A
05D7  1E          1498          SKZ             SKIP IF 4 DIGIT TOTAL PRICE
05D8  9B    05DB  1499          T      *+3      5 DIGIT,NO MSD BLANK
05D9  70    000F  1500          LDI    15
05DA  2F    0     1501          EXD             BLANK TOTAL PRICE MSD (V4)
05DB  12          1502          LAX             RE-LD UK ENABLE
05DC  67    0008  1503          ADI    8        SKIP IF UK SCALE
05DD  A0    05E0  1504          T      *+3      NOT UK SCALE
05DE  70    000F  1505          LDI    15
05DF  3F    0     1506          EX              UK,BLANK NEXT MSD TOT PR
05E0  008F  0070  1507          LBL    #70
05E2  22          1508          SF1             SET FLG1 FOR 1ST PASS
                  1509   * GPKD REG A IS SET AS FOLLOWS FROM LSD:
                  1510   * V0-V1-P2-P3-P4-W0-W1-15-V0-V1-P2-P3-P4-W0-W1-15
05E3  37    0     1511   DLOOPA LD              LD OUT DIGIT
05E4  1CFE  00FE  1512          IOL    KLA      DIG>GPKD REG A
05E6  17          1513          INCB
05E7  48    0008  1514          SKBI   8
05E8  A3    05E3  1515          T      DLOOPA   LOOP 8 TIMES
                  1516   * GPKD REG B IS SET AS FOLLOWS FROM LSD:
                  1517   * V2-V3-V4-P0-P1-W2-W3-W4-V2-V3-V4-P0-P1-W2-W3-W4
05E9  37    0     1518   DLOOPB LD              LD OUT DIGIT
05EA  1CFD  00FD  1519          IOL    KLB      DIG>GPKD REG B
05EC  17          1520          INCB
```

| | | | | | | | |
|---|---|---|---|---|---|---|---|
| 05ED | A9 | 05E9 | 1521 | | T | DLOOPB | LOOP TO END |
| 05EE | 16 | | 1522 | | SKF1 | | SKIP IF 1ST PASS |
| 05EF | 82 | 05F2 | 1523 | | T | DISPON | 2ND PASS,DONE |
| 05F0 | 26 | | 1524 | | RF1 | | RESET FLG1 FOR 2ND PASS |
| 05F1 | A3 | 05E3 | 1525 | | T | DLOOPA | |
| 05F2 | 1CF3 | 00F3 | 1526 | DISPON | IJL | KDN | TURN ON DISPLAY |
| 05F4 | 00DF | 0020 | 1527 | LMPOUT | LBL | #20 | |
| 05F6 | 7E | 0001 | 1528 | | LDI | 1 | |
| 05F7 | 1B | | 1529 | | LXA | | 1>X, INTEGRATOR RESET |
| 05F8 | 11 | | 1530 | LMPOLP | LABL | | LAMP ADDR>A |
| 05F9 | 0E | | 1531 | | COMP | | ,COM,ADDR |
| 05FA | 0B | | 1532 | | AD | | ADD LAMP STAT,,COM,LAMP |
| 05FB | 1D | | 1533 | | DOA | | OUTPUT LAMP DATA AND ADDR |
| 05FC | 11 | | 1534 | | LABL | | |
| 05FD | 1B | | 1535 | | LXA | | SAVE ADDR IN X |
| 05FE | 5600 | 0600 | 1536 | | TL | #600 | |
| | | | 1537 | | | | |
| | | | 1538 | | ORG | 600 | |
| 0600 | C4 | 00C4 | 1539 | | LB | >09 | |
| 0601 | 7F | 0000 | 1540 | | LDI | 0 | |
| 0602 | 1C41 | 0041 | 1541 | | IOL | SOS | STROBE WRITE |
| 0604 | 77 | 0008 | 1542 | | LDI | 8 | |
| 0605 | 1C41 | 0041 | 1543 | | IOL | SOS | REMOVE STROBE |
| 0607 | C8 | 00C8 | 1544 | | LB | >21 | |
| 0608 | 7E | 0001 | 1545 | | LDI | 1 | |
| 0609 | 1A | | 1546 | | XAX | | ADDR>A,INTEGRATOR RESET>X |
| 060A | 19 | | 1547 | | XABL | | ADDR>BL |
| 060B | 17 | | 1548 | | INCB | | |
| 060C | 47 | 0007 | 1549 | | SKBI | 7 | |
| 060D | BC | 063C | 1550 | | T | LMPLP> | LOOP FOR 7 LAMPS |
| 060E | 7F | 0000 | 1551 | PRNTR | LDI | 0 | |
| 060F | 3F | 0 | 1552 | | EX | | PRINT CMND>A,0>PRINT CMND |
| 0610 | 25 | | 1553 | | RF2 | | ASSUME NO PRINT COMMAND |
| 0611 | 1E | | 1554 | | SKZ | | SKIP IF NO PRINT COMMAND |
| 0612 | 21 | | 1555 | | SF2 | | NOTE TO OUTPUT PRINT CMND |
| 0613 | DC | 00DC | 1556 | | TM | >FCPTY | |
| 0614 | 16 | | 1557 | | SKF1 | | SKIP NOT 15KG |
| 0615 | 99 | 0619 | 1558 | | T | *+4 | 15KG |
| 0616 | 15 | | 1559 | | SKC | | SKIP NOT 6KG |
| 0617 | 7C | 0003 | 1560 | | LDI | 3 | 6KG, DISABLE,LT.00040 |
| 0618 | 7E | 0001 | 1561 | | LDI | 1 | 30LB,DISABLE,LT.00020 |
| 0619 | 76 | 0009 | 1562 | | LDI | 9 | 15KG,DISABLE,LT.00100 |
| 061A | 1B | | 1563 | | LXA | | TEST DIGIT>X |
| 061B | 36 | 1 | 1564 | | LD | 1 | DUMMY INST TO ADDR 0A |
| 061C | 77 | 0008 | 1565 | | LDI | 8 | |
| 061D | 1C41 | 0041 | 1566 | | IOL | SOS | INPUT PRINT COMPLETE |
| 061F | 1E | | 1567 | | SKZ | | SKIP IF PRINT COMPLETE |
| 0620 | AC | 062C | 1568 | | T | PTYPE-1 | DISABLE PRINT |
| 0621 | 00AB | 0054 | 1569 | | LBL | #54 | |
| 0623 | 37 | 0 | 1570 | | LD | | LD LT 20 INC PRINT DISABLE |
| 0624 | 1E | | 1571 | | SKZ | | SKIP IF NO PRINT DISABLE |
| 0625 | 14 | | 1572 | | SKF2 | | SKIP IF HAVE PRINT COMMAND |
| 0626 | AD | 062D | 1573 | | T | PTYPE | NO DISABLE,OR,NO PRINT CMND |
| 0627 | 0092 | 006D | 1574 | | LBL | #6D | PRINT DISABLE,AND,PRINT CMND |
| 0629 | 7C | 0003 | 1575 | | LDI | 3 | |
| 062A | 0129 | 0129 | 1576 | | TML | MAGLP-1 | CK FOR PRINT DISABLE WGT |
| 062C | 25 | | 1577 | | RF2 | | ,LE,TEST DIG RTN,NO PRINT |
| 062D | 00BF | 0040 | 1578 | PTYPE | LBL | #40 | |
| 062F | 37 | 0 | 1579 | | LD | | LD 300 PRINTER ENABLE |
| 0630 | CE | 00CE | 1580 | | LB | >6E | |
| 0631 | 1E | | 1581 | | SKZ | | SKIP NOT 300 PRINTER |
| 0632 | BE | 063E | 1582 | | T | P300> | 300 PRINTER |
| 0633 | 78 | 0007 | 1583 | | LDI | 7 | 301 OR SMART PRINTER |
| 0634 | D1 | 00D1 | 1584 | | TM | >MOVSX | ENTER OUT WGT TO PRINT REG |
| 0635 | 18 | | 1585 | | XBMX | | |
| 0636 | C6 | 00C6 | 1586 | | LB | >13 | |
| 0637 | 71 | 000E | 1587 | | LDI | 14 | |
| 0638 | 0D | | 1588 | | AND | | REMOVE FCTR DONE FROM FACTOR |
| 0639 | CF | 00CF | 1589 | | LB | >7A | |
| 063A | 5640 | 0640 | 1590 | | TL | #640 | |
| 063C | 55F8 | 05F8 | 1591 | LMPLP> | TL | LMPOLP | |
| 063E | 565A | 065A | 1592 | P300> | TL | P300 | |
| | | | 1593 | | | | |
| | | | 1594 | | ORG | 640 | |
| 0640 | 3F | 0 | 1595 | | EX | | ENTER FACTOR |

```
0641  00BA  0045  1596        LBL   #45
0643  35    2     1597        LD    2       LD UK ENB
0644  1F          1598        DECB
0645  1E          1599        SKZ           SKIP NOT UK SCALE
0646  1F          1600        DECB          DEC TOT PR SOURCE POINTER
0647  76    0009  1601        LDI   9
0648  D2    00D2  1602        TM    >MOV5   ENTER TOTAL PRICE
0649  18          1603        XBMX
064A  00BA  0045  1604        LBL   #45
064C  31    6     1605        LD    6       LD UK ENB
064D  67    0008  1606        ADI   8       SKIP IF UK SCALE
064E  93    0653  1607        T     *+5     NOT UK
064F  32    5     1608        LD    5       LD UK 1/2 FROM PRE-PAK
0650  1E          1609        SKZ           SKIP IF 1/2 LAMP OFF
0651  75    000A  1610        LDI   10      PRINT 1/2
0652  3F    0     1611        EX            UPDATE TOT PR LSD (V0)
0653  CD    00CD  1612        LB    >69
0654  7B    0004  1613        LDI   4
0655  D2    00D2  1614        TM    >MOV5   ENTER UNIT PRICE
0656  7F    0000  1615        LDI   0
0657  3F    0     1616        EX            0>PRINT REG WGT MSD
0658  57E6  07E6  1617        TL    PBCCK   CK FOR BY COUNT MODE
065A  1F          1618  P300  DECB          300 PRINTER
065B  78    0007  1619        LDI   7
065C  1B          1620        LXA
065D  73    000C  1621        LDI   12
065E  D2    00D2  1622        TM    >MOV5   ENTER OUT WGT TO PRINT REG
065F  18          1623        XBMX
0660  C6    00C6  1624        LB    >13
0661  71    000E  1625        LDI   14
0662  0D          1626        AND           REMOVE FCTR DONE FROM FACTOR
0663  0087  0078  1627        LBL   #78
0665  3F    0     1628        EX            ENTER FACTOR
0666  009B  0064  1629        LBL   #64
0668  35    2     1630        LD    2       LD TOTAL PRICE 5 DIG MSD
0669  1E          1631        SKZ           SKIP IF 0
066A  25          1632        RF2           NOT 0,DISABLE PRINT
066B  17          1633        INCB
066C  37    0     1634        LD            LD UK SCALE ENB
066D  009C  0063  1635        LBL   #63
066F  1E          1636        SKZ           SKIP NOT UK SCALE
0670  1F          1637        DECB          DEC TOT PR SOURCE POINTER
0671  78    0007  1638        LDI   7
0672  D2    00D2  1639        TM    >MOV5   ENTER TOTAL PRICE
0673  18          1640        XBMX
0674  00BA  0045  1641        LBL   #45
0676  31    6     1642        LD    6       LD UK ENB
0677  67    0008  1643        ADI   8       SKIP IF UK SCALE
0678  BE    067E  1644        T     *+6     NOT UK
0679  32    5     1645        LD    5       LD UK 1/2 FROM PRE-PAK
067A  1F          1646        DECB
067B  1E          1647        SKZ           SKIP IF 1/2 LAMP OFF
067C  75    000A  1648        LDI   10      PRINT 1/2
067D  3F    0     1649        EX            UPDATE TOT PR LSD (V0)
067E  5680  0680  1650        TL    #680
                  1651
                  1652        ORG   680
0680  0097  0068  1653        LBL   #68
0682  7C    0003  1654        LDI   3
0683  D2    00D2  1655        TM    >MOV5   ENTER UNIT PRICE
0684  7A    0005  1656        LDI   5       11 CNTR>A,300 PRINTER
0685  5/E7  07E7  1657        TL    PBCCK+1 CK FOR BY COUNT MODE
0687  00F2  000D  1658  POUT  LBL   #0D
0689  7F    0000  1659        LDI   0
068A  1C41  0041  1660        IJL   SUS     OUTPUT>HIGH
068C  17          1661        INCB
068D  89    0689  1662        T     POUT+2  LOOP,PRNTR CLK,RST LD,ENB HI
068E  00BF  0040  1663        LBL   #40
0690  34    3     1664        LD    3       LD 300 PRINTER ENB
0691  1E          1665        SKZ           SKIP NOT 300 PRINTER
0692  73    000C  1666        LDI   12      300 PRINTER
0693  70    000F  1667        LDI   15      301 OR SMART PRINTER
0694  19          1668  POUTLP XABL         A>BL
0695  7E    0001  1669        LDI   1
0696  1B          1670        LXA           1>X,INTEGRATOR RESET
```

| | | | | | | | |
|---|---|---|---|---|---|---|---|
| 0697 | 37 | 0 | 1671 | | LD | | LD DIGIT |
| 0698 | 1D | | 1672 | | DOA | | OUTPUT |
| 0699 | 0E | | 1673 | | COMP | | SET UP PARITY |
| 069A | 6F | | 1674 | | CYS | | |
| 069B | 70 | 000F | 1675 | | LDI | 15 | |
| 069C | 6F | | 1676 | | CYS | | |
| 069D | 72 | 000D | 1677 | | LDI | 13 | |
| 069E | 6F | | 1678 | | CYS | | |
| 069F | 77 | 0008 | 1679 | | LDI | 8 | 8>A FOR 15 PARITY |
| 06A0 | 05 | | 1680 | | RTN | | |
| 06A1 | 1B | | 1681 | PARITY | LXA | | PARITY>X |
| 06A2 | 11 | | 1682 | | LABL | | BL>A |
| 06A3 | 1A | | 1683 | | XAX | | PARITY>A,BL>X |
| 06A4 | 00F3 | 000C | 1684 | | LBL | #0C | |
| 06A6 | 1C41 | 0041 | 1685 | | IOL | SOS | OUTPUT PARITY |
| 06A8 | 17 | | 1686 | | INCB | | |
| 06A9 | 12 | | 1687 | | LAX | | DIGIT BL>A |
| 06AA | 3F | 0 | 1688 | | EX | | DIGIT BL>RAM ADDR 00 |
| 06AB | 77 | 0008 | 1689 | | LDI | 8 | |
| 06AC | E2 | 00E2 | 1690 | | TM | >DLY,4 | STROBE CLOCK,.4 MS DELAY |
| 06AD | 7F | 0000 | 1691 | | LDI | 0 | |
| 06AE | E2 | 00E2 | 1692 | | TM | >DLY,4 | REMOVE CLOCK,.4 MS DELAY |
| 06AF | 30 | 7 | 1693 | | LD | 7 | DIGIT BL>A |
| 06B0 | 60 | 000F | 1694 | | ADI | 15 | DEC BL,SKIP NOT 15 |
| 06B1 | B3 | 06B3 | 1695 | | T | *+2 | DONE |
| 06B2 | 94 | 0694 | 1696 | | T | POUTLP | LOOP |
| 06B3 | 00F1 | 000E | 1697 | | LBL | #0E | |
| 06B5 | 77 | 0008 | 1698 | | LDI | 8 | |
| 06B6 | 1C41 | 0041 | 1699 | | IOL | SOS | REMOVE PRINTER DATA ENB |
| 06B8 | 00F4 | 0008 | 1700 | | LBL | #08 | |
| 06BA | 14 | | 1701 | CKPRNT | SKF2 | | SKIP IF HAVE PRINT COMMAND |
| 06BB | BE | 06BE | 1702 | | T | RSTPR> | NO PRINT |
| 06BC | 56C0 | 06C0 | 1703 | | TL | #6C0 | |
| 06BE | 56D0 | 06D0 | 1704 | RSTPR> | TL | RSTPTR | |
| | | | 1705 | | | | |
| | | | 1706 | | ORG | 6C0 | |
| 06C0 | 7F | 0000 | 1707 | | LDI | 0 | PRINT |
| 06C1 | 1C41 | 0041 | 1708 | | IOL | SOS | OUTPUT PRINT COMMAND |
| 06C3 | C4 | 00C4 | 1709 | | LB | >09 | |
| 06C4 | 7B | 0004 | 1710 | | LDI | 4 | |
| 06C5 | 3F | 0 | 1711 | | EX | | MID TIMER=4 |
| 06C6 | E0 | 00E0 | 1712 | | TM | >DELAY | 5.0 MS DELAY |
| 06C7 | 77 | 0008 | 1713 | | LDI | 8 | |
| 06C8 | 1C41 | 0041 | 1714 | | IOL | SOS | INPUT PRINT COMPLETE |
| 06CA | 1E | | 1715 | | SKZ | | SKIP IF PRINT COMPLETE |
| 06CB | 87 | 06C7 | 1716 | | T | *-4 | HOLD HERE UNTIL COMPLETE |
| 06CC | 17 | | 1717 | | INCB | | |
| 06CD | 77 | 0008 | 1718 | | LDI | 8 | |
| 06CE | 1C41 | 0041 | 1719 | | IOL | SOS | REMOVE PRINT COMMAND |
| 06D0 | 00F0 | 000F | 1720 | RSTPTR | LBL | #0F | |
| 06D2 | 77 | 0008 | 1721 | | LDI | 8 | |
| 06D3 | 1C41 | 0041 | 1722 | | IOL | SOS | RESET PRINTER |
| 06D5 | 1CFA | 00FA | 1723 | KEYBD | IOL | KTS | RD KEYBOARD STROBE |
| 06D7 | 0E | | 1724 | | COMP | | |
| 06D8 | 00B8 | 0047 | 1725 | | LBL | #47 | |
| 06DA | 67 | 0008 | 1726 | | ADI | 8 | ADD 8,SKIP IF KEY ENTERED |
| 06DB | BA | 06FA | 1727 | | T | NOKEY> | NO KEY ENTERED |
| 06DC | 2F | 0 | 1728 | | EXD | | STORE KEYBOARD STROBE |
| 06DD | 1CFC | 00FC | 1729 | | IOL | KTR | RD KEYBOARD RETURN |
| 06DF | 0E | | 1730 | | COMP | | |
| 06E0 | 67 | 0008 | 1731 | | ADI | 8 | ADD 8,SKIP IF ERROR |
| 06E1 | 67 | 0008 | 1732 | | ADI | 8 | RESTORE,WILL SKIP |
| 06E2 | BC | 06FC | 1733 | | T | KERR> | KEYBOARD ERROR |
| 06E3 | 3F | 0 | 1734 | | EX | | STORE KEYBOARD RETURN |
| 06E4 | 7B | 0004 | 1735 | | LDI | 4 | 4>A |
| 06E5 | 0D | | 1736 | | AND | | ,AND,WITH RETURN,A>0 IF DIG |
| 06E6 | 1E | | 1737 | | SKZ | | SKIP IF DIGIT KEY |
| 06E7 | BE | 06FE | 1738 | | T | KCMND> | COMMAND KEY |
| 06E8 | 7D | 0002 | 1739 | | LDI | 2 | 2>A |
| 06E9 | 0D | | 1740 | | AND | | ,AND,WITH RETURN,A>2:8,9 |
| 06EA | 1E | | 1741 | | SKZ | | SKIP NOT 8 OR 9 KEY |
| 06EB | B1 | 06F1 | 1742 | | T | KBD1 | 8 OR 9 KEY |
| 06EC | 7E | 0001 | 1743 | | LDI | 1 | 1>A |
| 06ED | 0D | | 1744 | | AND | | ,AND,WITH RETURN,A>1:4,5,6,7 |
| 06EE | 1E | | 1745 | | SKZ | | SKIP NOT 4,5,6,7 KEY |

| | | | | | | | |
|---|---|---|---|---|---|---|---|
| 06EF | 7B | 0004 | 1746 | | LDI | 4 | 4,5,6,7 KEY |
| 06F0 | 7F | 0000 | 1747 | | LDI | 0 | 0,1,2,3 KEY |
| 06F1 | 77 | 0008 | 1748 | KBD1 | LDI | 8 | 8,9 KEY |
| 06F2 | 17 | | 1749 | | INCB | | |
| 06F3 | 0B | | 1750 | | AD | | ADD STROBE,HAVE DIGIT IN A |
| 06F4 | C4 | 00C4 | 1751 | | LB | >09 | |
| 06F5 | 3F | 0 | 1752 | | EX | | NEW DIGIT>RAM ADDR 09 |
| 06F6 | C3 | 00C3 | 1753 | | LB | >04 | |
| 06F7 | 37 | 0 | 1754 | | LD | | LD DIGIT TIMER |
| 06F8 | 5700 | 0700 | 1755 | | TL | #700 | |
| 06FA | 50F0 | 00F0 | 1756 | NOKEY> | TL | NOKEY | |
| 06FC | 500F | 000F | 1757 | KERR> | TL | KBERR | |
| 06FE | 5720 | 0720 | 1758 | KCMND> | TL | KBCMND | |
| | | | 1759 | | | | |
| | | | 1760 | | ORG | 700 | |
| 0700 | 1E | | 1761 | | SKZ | | SKIP IF TIMER NOT RUNNING |
| 0701 | 87 | 0707 | 1762 | | T | ENTDIG | TIMER RUNNING |
| 0702 | CD | 00CD | 1763 | | LB | >6D | |
| 0703 | 01CD | 01CD | 1764 | | TML | BLANK-1 | CLR PRICE ONLY |
| 0705 | C6 | 00C6 | 1765 | | LB | >13 | |
| 0706 | D7 | 00D7 | 1766 | | TM | >CLEAR | CLR FACTOR,ARI |
| 0707 | 00AE | 0051 | 1767 | ENTDIG | LBL | #51 | |
| 0709 | 37 | 0 | 1768 | | LD | | LD 5 DIGIT PRICE ENB |
| 070A | 0097 | 0068 | 1769 | | LBL | #68 | |
| 070C | 1E | | 1770 | | SKZ | | SKIP IF 4 DIGIT PRICING |
| 070D | 17 | | 1771 | | INCB | | 5 DIG PRICING |
| 070E | 37 | 0 | 1772 | | LD | | LD MSD PRICE DIGIT |
| 070F | 1E | | 1773 | | SKZ | | SKIP IF 0 |
| 0710 | B8 | 0738 | 1774 | | T | KEYBD> | NOT 0,REFUSE NEW DIGIT |
| 0711 | C4 | 00C4 | 1775 | | LB | >09 | |
| 0712 | 79 | 0006 | 1776 | | LDI | 6 | 6>A |
| 0713 | 09 | | 1777 | | ADSK | | ADD NEW DIGIT |
| 0714 | 96 | 0716 | 1778 | | T | *+2 | =VALID (0-9) |
| 0715 | B8 | 0738 | 1779 | | T | KEYBD> | INVALID (10-15) |
| 0716 | 37 | 0 | 1780 | | LD | | RE-LD NEW DIGIT |
| 0717 | 009A | 0065 | 1781 | | LBL | #65 | |
| 0719 | 3F | 0 | 1782 | | EX | | LESS SIG DIG>MEM,MORE SIG>A |
| 071A | 17 | | 1783 | | INCB | | |
| 071B | 4A | 000A | 1784 | | SKBI | 10 | SKIP AT END OF PRICE REG |
| 071C | 99 | 0719 | 1785 | | T | *-3 | LOOP TO END OF PRICE REG |
| 071D | 75 | 000A | 1786 | | LDI | 10 | |
| 071E | 57D6 | 07D6 | 1787 | | TL | KBDON-2 | START DIGIT TIMER |
| 0720 | 7E | 0001 | 1788 | KBCMND | LDI | 1 | 1>A |
| 0721 | 0D | | 1789 | | AND | | ,AND,WITH RETURN |
| 0722 | 1E | | 1790 | | SKZ | | SKIP IF 0 |
| 0723 | 7B | 0004 | 1791 | | LDI | 4 | |
| 0724 | 7F | 0000 | 1792 | | LDI | 0 | |
| 0725 | 17 | | 1793 | | INCB | | |
| 0726 | 0B | | 1794 | | AD | | ADD STROBE |
| 0727 | 0E | | 1795 | | COMP | | V>15,1/2>14,1/4>13,P>12,T>11 |
| 0728 | 6E | 0001 | 1796 | VFYCK | ADI | 1 | SKIP IF VERIFY |
| 0729 | BE | 073E | 1797 | | T | 1/2CK> | |
| 072A | 1CF6 | 00F6 | 1798 | | IOL | KER | RESET KEYBOARD |
| 072C | C4 | 00C4 | 1799 | | LB | >09 | |
| 072D | 7D | 0002 | 1800 | | LDI | 2 | |
| 072E | 3F | 0 | 1801 | | EX | | |
| 072F | 17 | | 1802 | | INCB | | |
| 0730 | 7C | 0003 | 1803 | | LDI | 3 | |
| 0731 | 3F | 0 | 1804 | | EX | | |
| 0732 | E0 | 00E0 | 1805 | | TM | >DELAY | DELAY 50MS FOR GPKD CYCLE |
| 0733 | 00E7 | 0018 | 1806 | | LBL | #18 | |
| 0735 | 37 | 0 | 1807 | | LD | | LD VERIFY TEST FLAG |
| 0736 | 67 | 0008 | 1808 | | ADI | 8 | SKIP IF VERIFY IN PROCESS |
| 0737 | BA | 073A | 1809 | | T | *+3 | 1ST PASS OF VERIFY |
| 0738 | 56D5 | 06D5 | 1810 | KEYBD> | TL | KEYBD | TIGHT LOOP DURING V HOLD |
| 073A | 3B | 4 | 1811 | | EX | 4 | SET VERIFY TEST FLAG |
| 073B | 37 | 0 | 1812 | | LD | | LD VERIFY MODE FLAG |
| 073C | 5740 | 0740 | 1813 | | TL | #740 | |
| 073E | 575A | 0754 | 1814 | 1/2CK> | TL | P1/2CK | |
| | | | 1815 | | | | |
| | | | 1816 | | ORG | 740 | |
| 0740 | 0E | | 1817 | | COMP | | COM IT |
| 0741 | 3F | 0 | 1818 | | EX | | UPDATE FLAG |
| 0742 | 37 | 0 | 1819 | | LD | | RE-LD |
| 0743 | 1E | | 1820 | | SKZ | | SKIP IF WAS SET |

```
0744   70    000F   1821            LDI      15          WAS CLR,TEST BLANKS
0745   77    0008   1822            LDI      8           WAS SET,TEST BS
0746   1B           1823            LXA                  TEST>X
0747   0091  006E   1824            LBL      #6E
0749   12           1825            LAX                  TEST>A
074A   2F    0      1826            EXD                  LD DISPLAY REG WITH TEST
074B   89    0749   1827            T        *-2         LOOP TO BOTTOM
074C   00D9  0026   1828            LBL      #26
074E   12           1829            LAX                  TEST>A
074F   0E           1830            COMP                 15>0,8>7
0750   1E           1831            SKZ                  SKIP IF BLANKS
0751   0E           1832            COMP                 RESTORE 8
0752   1B           1833            LXA                  LAMP TEST>X
0753   12           1834            LAX                  TEST>A
0754   2F    0      1835            EXD                  LD LAMP WITH TEST
0755   93    0753   1836            T        *-2         LOOP TO LAMP REG END
0756   C3    00C3   1837            LB       >04
0757   7F    0000   1838            LDI      0
0758   3F    0      1839            EX                   CLR DIGIT TIMER
0759   E7    00E7   1840            TM       >OUTP>      GO TO OUTPUT
075A   6E    0001   1841   P1/2CK   ADI      1           SKIP IF PER 1/2
075B   A8    0768   1842            T        P1/4CK
075C   E4    00E4   1843            TM       >MODE       CK FOR BY COUNT
075D   B2    0772   1844            T        P1/2        NORMAL PER 1/2
075E   CD    00CD   1845            LB       >69         BY COUNT MODE
075F   79    0006   1846            LDI      6
0760   1B           1847            LXA
0761   7B    0004   1848            LDI      4
0762   D2    00D2   1849            TM       >MOVS       MOVE PRICE TO TOTAL PRICE
0763   CD    00CD   1850            LB       >69
0764   01CD  01CD   1851            TML      BLANK-1     CLR PRICE ONLY
0766   5705  0705   1852   FDUN>    TL       FCNDUN
0768   6E    0001   1853   P1/4CK   ADI      1           SKIP IF PER 1/4
0769   B5    0775   1854            T        PRNCK
076A   E4    00E4   1855            TM       >MODE       CK FOR PRE-PAK,BY COUNT
076B   AD    076D   1856            T        *+2         NORMAL OR PRE-PAK
076C   A6    0766   1857            T        FDUN>       BY COUNT MODE
076D   DC    00DC   1858            TM       >FCPTY      A=1:30LB,2:6KG,5:15KG
076E   61    000E   1859            ADI      14          SKIP IF 6KG OR 15KG
076F   B1    0771   1860            T        *+2         30LB,PER 1/4 LEGAL
0770   A6    0766   1861            T        FDUN>       METRIC,PER 1/4 ILLEGAL
0771   7B    0004   1862            LDI      4
0772   7D    0002   1863   P1/2     LDI      2
0773   57E0  07E0   1864            TL       ENTFCT      GO ENTER FACTOR
0775   6E    0001   1865   PRNCK    ADI      1           SKIP IF PRINT KEY
0776   BA    077A   1866            T        TARECK
0777   31    6      1867            LD       6           DUMMY TO ADDR 27
0778   77    0008   1868            LDI      8
0779   3F    0      1869            EX                   SET PRINT FLAG
077A   6E    0001   1870   TARECK   ADI      1           SKIP IF TARE KEY
077B   A6    0766   1871            T        FDUN>
077C   5780  0780   1872            TL       #780
                    1873
                    1874            ORG      780
0780   C0    00C0   1875            LB       >00
0781   37    0      1876            LD                   LD MOTION FLAG
0782   1E           1877            SKZ                  SKIP NO MOTION
0783   9B    079B   1878            T        FDUN>>      NO T ALLOWED IN MOTN
0784   C3    00C3   1879            LB       >04
0785   37    0      1880            LD                   LD DIGIT TIMER
0786   1E           1881            SKZ                  SKIP NOT RUNNING
0787   8F    078F   1882            T        CKOT        RUNNING,CK FOR 0-T SEQ
0788   C5    00C5   1883            LB       >12
0789   36    1      1884            LD       1           LD NET FLAG
078A   1E           1885            SKZ                  SKIP NOT NET
078B   9B    079B   1886            T        FDUN>>      NO T ALLOWED IN NET
078C   17           1887            INCB
078D   57CF  07CF   1888            TL       TDUN-2      SET MANUAL TARE FLAG
078F   CD    00CD   1889   CKOT     LB       >69
0790   7F    0000   1890            LDI      0
0791   1B           1891            LXA
0792   7A    0005   1892            LDI      5
0793   0129  0129   1893            TML      MAGLP-1     CK FOR PRICE OF 0
0795   6E    0001   1894            ADI      1           ALL 0 RTN
```

```
0796   9F          079F   1895           T      KBTARE   PRICE NOT 0,KEYBOARD TARE
0797   CA   00CA   1896           LB     >33
0798   37      0   1897           LD              LD AUTO CLR FLAG
0799   60   000F   1898           ADI    15       ADD 15,SKIP IF,GE,10 INC NET
079A   9D   079D   1899           T      *+3      .LT. 10 INC NET,0=T LEGAL
079B   57D5  07D5  1900  FDUN>>   TL     FCNDUN
079D   5011  0011  1901           TL     RESET    LEGAL 0=T,RESET
079F   C1   00C1   1902  KBTARE   LB     >01
07A0   37      0   1903           LD              LD ZERO GRAD FLAG
07A1   67   0008   1904           ADI    8        ADD 8,SKIP IF IN ZERO GRAD
07A2   9B   079B   1905           T      FDUN>>   NO KB TARE ALLOWED OFF 0
07A3   C5   00C5   1906           LB     >12
07A4   37      0   1907           LD              LD NET FLAG
07A5   1E          1908           SKZ             SKIP NOT NET
07A6   9B   079B   1909           T      FDUN>>   NO T ALLOWED IN NET
07A7   DC   00DC   1910           TM     >FCPTY
07A8   00AA 0055   1911           LBL    #55
07AA   34      3   1912           LD     3        LD KEYBOARD TARE ENB
07AB   67   0008   1913           ADI    8        ADD 8,SKIP IF ENABLED
07AC   9B   079B   1914           T      FDUN>>   NOT ENABLED
07AD   16          1915           SKF1            SKIP NOT 15KG
07AE   B2   07B2   1916           T      KT15KG   15KG
07AF   15          1917           SKC             SKIP NOT 6KG
07B0   B7   07B7   1918           T      KT6KG    6KG
07B1   BB   07BB   1919           T      CKMKBT   30LB,CK MAGNITUDE
07B2   37      0   1920  KT15KG   LD              LD PRICE LSD
07B3   1E          1921           SKZ             OK IF 0
07B4   64   000B   1922           ADI    11
07B5   B6   07B6   1923           T      *+1
07B6   B9   07B9   1924           T      KT6KG+2  OK IF 0 OR 5
07B7   7E   0001   1925  KT6KG    LDI    1
07B8   00          1926           AND             CK FOR EVEN DIGIT
07B9   1E          1927           SKZ             OK:EVEN(6KG)=0,5(15KG)
07BA   9B   079B   1928           T      FDUN>>
07BB   7D   000A   1929  CKMKBT   LDI    10
07BC   57C0 07C0   1930           TL     #7C0
                   1931
                   1932           ORG    7C0
07C0   16          1933           SKF1            SKIP NOT 15KG
07C1   1B          1934           LXA             X=3:30LB,6:6KG,10:15KG
07C2   CD   00CD   1935           LB     >69
07C3   7D   0002   1936           LDI    2
07C4   0129 0129   1937           TML    MAGLP-1  CK KBT MAGNITUDE,LE,OX---
07C6   60   000F   1938           ADI    15       ,LE,RTN,DEC DIFF,SKIP NOT 0
07C7   95   07D5   1939           T      FCNDUN   ,GT,RTN,IGNORE,GT,OR DIFF 0
07C8   D8   00D8   1940  ENTKBT   TM     >CLRT    CLR TARE
07C9   CD   00CD   1941           LB     >69
07CA   7A   0005   1942           LDI    5
07CB   D1   00D1   1943           TM     >MOV5X   ENTER KEYBOARD TARE
07CC   C2   00C2   1944           LB     >02
07CD   70   000F   1945           LDI    15
07CE   3E      1   1946           EX     1        SET TARE DONE
07CF   77   0008   1947           LDI    8
07D0   3F      0   1948           EX              SET NET FLAG
07D1   D9   00D9   1949  TDUN     TM     >CLRPR   CLR PRICE
07D2   CA   00CA   1950           LB     >33
07D3   7F   0000   1951           LDI    0
07D4   3F      0   1952           EX              CLR AUTO CLR FLAG
07D5   7E   0001   1953  FCNDUN   LDI    1        SET DIG TIMER TO TIME OUT
07D6   C3   00C3   1954           LB     >04      ON NEXT WGT READ PASS
07D7   3F      0   1955           EX              BY LOADING IT WITH 1
07D8   CC   00CC   1956  KBDUN    LB     >57
07D9   70   000F   1957           LDI    15
07DA   3F      0   1958           EX              SET RECOMPUTE
07DB   17          1959           INCB
07DC   7F   0000   1960           LDI    0
07DD   3F      0   1961           EX              CLR VERIFY MODE FLAG
07DE   56D5 06D5   1962           TL     KEYBD
07E0   00EC 0013   1963  ENTFCT   LBL    #13
07E2   3F      0   1964           EX              FACTOR>FACTOR FLAG,FLAG>A
07E3   1E          1965           SKZ             SKIP NOT DONE BEFORE
07E4   3F      0   1966           EX              REPLACE FACTOR DONE
07E5   95   07D5   1967           T      FCNDUN
07E6   79   0006   1968  PBCCK    LDI    6        10 CNTR (501 OR SMART PRNTR)
07E7   1B          1969           LXA             CNTR>X
```

| | | | | | | | |
|---|---|---|---|---|---|---|---|
| 07E8 | E4 | 00E4 | 1970 | | TM | >MODE | CK FOR BY COUNT MODE |
| 07E9 | BE | 07FE | 1971 | | T | POUT> | NOT BY COUNT |
| 07EA | CF | 00CF | 1972 | | LB | >7A | |
| 07EB | 12 | | 1973 | | LAX | | CNTR>A |
| 07EC | 19 | | 1974 | | XABL | | CNTR>BL |
| 07ED | 1F | | 1975 | | DECB | | |
| 07EE | 1F | | 1976 | | DECB | | START ADDR=CNTR-2 |
| 07EF | 12 | | 1977 | | LAX | | CNTR>A |
| 07F0 | 1B | | 1978 | PBC1 | LXA | | UPDATED CNTR>X |
| 07F1 | 37 | 0 | 1979 | | LD | | LD PRINT REG DIGIT |
| 07F2 | 60 | 000F | 1980 | | ADI | 15 | SKIP DIGIT NOT 0 |
| 07F3 | B6 | 07F6 | 1981 | | T | PBC2 | DIGIT 0,ENTER 13 |
| 07F4 | 60 | 0002 | 1982 | | ADI | 2 | SKIP IF DIGIT 15 |
| 07F5 | B8 | 07F8 | 1983 | | T | PBC3 | NOT 0 OR 15,IGNORE |
| 07F6 | 72 | 000D | 1984 | PBC2 | LDI | 13 | |
| 07F7 | 3F | 0 | 1985 | | EX | | 13>PRINT REG DIGIT |
| 07F8 | 1F | | 1986 | PBC3 | DECB | | |
| 07F9 | BA | 07FA | 1987 | | T | *+1 | |
| 07FA | 12 | | 1988 | | LAX | | CNTR>A |
| 07FB | 6E | 0001 | 1989 | | ADI | 1 | INC CNTR TOWARD 0 |
| 07FC | B0 | 07F0 | 1990 | | T | PBC1 | NOT 0,LOOP |
| 07FD | 3F | 0 | 1991 | | EX | | MAKE SURE FACTOR 0 |
| 07FE | 5687 | 0687 | 1992 | POUT> | TL | POUT | |
| | | | 1993 | | END | | |

0 ERRORS DETECTED

| DEF | SYMBOL | REFERENCES | | | | | | | |
|---|---|---|---|---|---|---|---|---|---|
| 61 | >ADDC | 798 | 824 | 1218 | | | | | |
| 53 | >ARICL | 405 | 747 | 803 | 815 | 847 | 991 | 1040 | 1079 | 1335 |
| 57 | >BLANK | 954 | 956 | 1006 | 1312 | 1441 | | | |
| 54 | >CLEAR | 327 | 570 | 746 | 770 | 792 | 959 | 1337 | 1349 | 1766 |
| 56 | >CLRPR | 576 | 1034 | 1091 | 1155 | 1364 | 1949 | | |
| 55 | >CLRT | 574 | 957 | 1154 | 1940 | | | | |
| 69 | >CRTAZ | 1022 | 1126 | | | | | | |
| 63 | >DELAY | 501 | 666 | 1712 | 1805 | | | | |
| 65 | >DLY,4 | 1690 | 1692 | | | | | | |
| 59 | >FCPTY | 642 | 914 | 1024 | 1105 | 1130 | 1163 | 1193 | 1242 | 1556 | 1858 |
| | | 1910 | | | | | | | |
| 52 | >MAGCK | 439 | 463 | 854 | 947 | 1010 | 1098 | 1244 | 1362 | 1438 |
| 67 | >MODE | 638 | 1255 | 1309 | 1843 | 1855 | 1970 | | |
| 66 | >MOVPR | 1350 | 1390 | | | | | | |
| 47 | >MOVX | 445 | 790 | 802 | 831 | 846 | 910 | 913 | 928 | 990 | 1082 |
| | | 1095 | 1129 | | | | | | |
| 49 | >MOVS | 1382 | 1395 | 1456 | 1469 | 1479 | 1602 | 1614 | 1622 | 1639 | 1655 |
| | | 1849 | | | | | | | |
| 48 | >MOV5X | 765 | 785 | 813 | 841 | 1029 | 1221 | 1464 | 1584 | 1943 |
| 51 | >MULT | 760 | 781 | 811 | 839 | 1027 | 1352 | 1404 | | |
| 70 | >OUTP> | 960 | 1565 | 1840 | | | | | |
| 60 | >RNDOF | 1198 | 1406 | | | | | | |
| 68 | >SETRC | 575 | 867 | 1090 | 1259 | 1373 | 1388 | | |
| 64 | >SUBL | 1122 | 1184 | 1234 | | | | | |
| 50 | >SUBT | 788 | 800 | 829 | 844 | 849 | 908 | 926 | 988 | 1002 | 1050 |
| | | 1093 | 1134 | | | | | | |
| 58 | >TPRDS | 1405 | 1411 | 1418 | 1425 | 1448 | | | |
| 62 | >UDOWT | 953 | 1258 | | | | | | |
| 29 | >00 | 589 | 857 | 969 | 1063 | 1235 | 1875 | | |
| 30 | >01 | 1012 | 1069 | 1902 | | | | | |
| 31 | >02 | 628 | 1315 | 1944 | | | | | |
| 32 | >04 | 324 | 620 | 1053 | 1753 | 1837 | 1879 | 1954 | |
| 33 | >09 | 494 | 643 | 1117 | 1127 | 1175 | 1381 | 1539 | 1709 | 1751 | 1775 |
| | | 1799 | | | | | | | |
| 36 | >1A | 750 | 773 | 791 | 795 | 806 | 818 | 832 | 1041 | 1080 | 1119 |
| | | 1181 | 1346 | | | | | | |
| 34 | >12 | 569 | 965 | 1085 | 1100 | 1883 | 1906 | | |
| 35 | >13 | 1339 | 1571 | 1586 | 1624 | 1765 | | | |
| 37 | >21 | 787 | 799 | 907 | 925 | 950 | 1001 | 1133 | 1544 | |
| 38 | >29 | 465 | 1072 | 1548 | | | | | |
| 39 | >33 | 571 | 1136 | 1896 | 1950 | | | | |
| 40 | >48 | 311 | 580 | 929 | 1145 | 1302 | | | |
| 41 | >57 | 608 | 1323 | 1329 | 1956 | | | | |
| 43 | >6E | 330 | 1005 | 1219 | 1311 | 1385 | 1391 | 1580 | |

| | | | | | | | | | |
|---|---|---|---|---|---|---|---|---|---|
| 42 | >69 | 528 | 447 | 1612 | 1763 | 1845 | 1850 | 1889 | 1935 | 1941 |
| 44 | >7A | 769 | 1336 | 1497 | 1589 | 1972 | | | |
| 224 | ADD | 194 | 234 | | | | | | |
| 510 | ADDC | 373 | 508 | 515 | 1417 | | | | |
| 373 | ADDC> | 61 | | | | | | | |
| 1378 | ADRWGT | 1369 | | | | | | | |
| 302 | ARICL | 53 | | | | | | | |
| 338 | BLANK | 57 | 329 | 348 | 1764 | 1851 | | | |
| 490 | BLKWT> | 482 | | | | | | | |
| 1005 | BLNKWT | 490 | 685 | | | | | | |
| 1104 | C<ACL> | 1099 | | | | | | | |
| 1130 | C<ACLR | 1104 | 1125 | | | | | | |
| 1008 | C<GAZC | 1004 | | | | | | | |
| 1157 | C<INC | 1141 | | | | | | | |
| 1383 | C<MIN | 1345 | | | | | | | |
| 1929 | C<MKBT | 1919 | | | | | | | |
| 1096 | C<NAZC | | | | | | | | |
| 1701 | C<PRNT | | | | | | | | |
| 1329 | C<RCP | 1318 | 1321 | | | | | | |
| 620 | C<RST | 615 | | | | | | | |
| 330 | C<WSGN | 1322 | | | | | | | |
| 1889 | C<0T | 1882 | | | | | | | |
| 304 | CLEAR | 54 | 307 | | | | | | |
| 1262 | CLRJFC | 1257 | | | | | | | |
| 349 | CLRPF | 342 | 346 | | | | | | |
| 324 | CLRPR | 56 | | | | | | | |
| 293 | CLRT | 55 | | | | | | | |
| 162 | CMDIG | 159 | | | | | | | |
| 1335 | CMPUT | 1333 | | | | | | | |
| 1040 | CRCTAZ | 374 | | | | | | | |
| 374 | CRTAZ> | 69 | | | | | | | |
| 984 | CZTIM | 964 | 968 | 972 | | | | | |
| 529 | DELAY | 376 | | | | | | | |
| 376 | DELAY> | 63 | | | | | | | |
| 533 | DELY1 | 539 | 545 | | | | | | |
| 540 | DELY2 | 534 | | | | | | | |
| 546 | DELY3 | 542 | 553 | | | | | | |
| 1526 | DISPON | 1523 | | | | | | | |
| 493 | DL.4MS | 377 | | | | | | | |
| 1511 | DLOOPA | 1515 | 1525 | | | | | | |
| 1518 | DLOOPB | 1521 | | | | | | | |
| 377 | DLY.4> | 65 | | | | | | | |
| 1767 | ENTDIG | 1762 | | | | | | | |
| 1963 | ENTFCT | 1864 | | | | | | | |
| 1940 | ENTKBT | | | | | | | | |
| 1953 | FCNDUN | 1852 | 1900 | 1939 | 1967 | | | | |
| 405 | FCPTY | 371 | | | | | | | |
| 371 | FCPTY> | 59 | | | | | | | |
| 419 | FCPTY1 | 411 | 416 | | | | | | |
| 424 | FCPTY2 | 420 | | | | | | | |
| 431 | FCPTY3 | 427 | | | | | | | |
| 1852 | FDUN> | 1857 | 1861 | 1871 | | | | | |
| 1900 | FDUN>> | 1878 | 1886 | 1905 | 1909 | 1914 | 1928 | | |
| 887 | FLTWGT | 880 | 885 | | | | | | |
| 899 | FLTWT1 | 894 | | | | | | | |
| 869 | INIFLT | 862 | | | | | | | |
| 1309 | ITLKCK | 1301 | | | | | | | |
| 18 | KAF | | | | | | | | |
| 1788 | KBCMND | 1758 | | | | | | | |
| 1956 | KBDUN | 1787 | | | | | | | |
| 1748 | KBD1 | 1742 | | | | | | | |
| 568 | KBERR | 1757 | | | | | | | |
| 19 | KBF | | | | | | | | |
| 1902 | KBTARE | 1895 | | | | | | | |
| 1758 | KCMND> | 1738 | | | | | | | |
| 20 | KDN | 1526 | | | | | | | |
| 21 | KER | 568 | 1798 | | | | | | |
| 1757 | KERR> | 1733 | | | | | | | |
| 1723 | KEYBD | 1810 | 1962 | | | | | | |
| 1810 | KEYBD> | 1774 | 1779 | | | | | | |
| 22 | KLA | 1512 | | | | | | | |
| 23 | KLB | 1519 | | | | | | | |
| 24 | KTR | 1729 | | | | | | | |
| 25 | KTS | 1723 | | | | | | | |
| 1920 | KT1SKG | 1916 | | | | | | | |

| | | | | | | | | | | |
|---|---|---|---|---|---|---|---|---|---|---|
| 1925 | KT6KG | 1918 | 1924 | | | | | | | |
| 1268 | LDLMPS | | | | | | | | | |
| 933 | LDPPUK | 1308 | 1424 | 1446 | | | | | | |
| 1334 | LMOUT> | 1327 | | | | | | | | |
| 1591 | LMPLP> | 1550 | | | | | | | | |
| 1530 | LMPULP | 1591 | | | | | | | | |
| 1527 | LMPOUT | 1534 | | | | | | | | |
| 891 | LSD/2 | 898 | | | | | | | | |
| 266 | MADDL | 274 | | | | | | | | |
| 151 | MAGCK | 52 | | | | | | | | |
| 155 | MAGLP | 161 | 1576 | 1893 | 1937 | | | | | |
| 438 | MAXAZ | 979 | 1054 | | | | | | | |
| 253 | MDIG | 275 | 290 | | | | | | | |
| 1024 | MFCTR | 1019 | | | | | | | | |
| 311 | MJDECK | 67 | | | | | | | | |
| 96 | MJVPR | 66 | | | | | | | | |
| 447 | MJVPRX | 96 | | | | | | | | |
| 75 | MJVX | 81 | 378 | | | | | | | |
| 378 | MJVX> | 47 | | | | | | | | |
| 107 | MJV5 | 49 | 142 | 451 | 489 | | | | | |
| 105 | MJV5X | 48 | | | | | | | | |
| 243 | MJLT | 51 | 247 | | | | | | | |
| 276 | NDIG | 259 | | | | | | | | |
| 83 | NOKEY | 1756 | | | | | | | | |
| 1756 | NOKEY> | 1727 | | | | | | | | |
| 1448 | NOTOV | 1439 | | | | | | | | |
| 1219 | OUTFLT | 1202 | | | | | | | | |
| 1254 | OUTF1 | 1241 | 1246 | | | | | | | |
| 1265 | OUTF2 | 1250 | 1253 | 1264 | | | | | | |
| 174 | OUTPT> | 70 | | | | | | | | |
| 1462 | OUTPUT | 174 | 1445 | 1447 | | | | | | |
| 1425 | OVALCK | 1410 | | | | | | | | |
| 1390 | OW>ARI | 1387 | | | | | | | | |
| 1681 | PARITY | 397 | | | | | | | | |
| 1968 | PBCCK | 1617 | 1657 | | | | | | | |
| 1978 | PBC1 | 1990 | | | | | | | | |
| 1984 | PBC2 | 1981 | | | | | | | | |
| 1986 | PBC3 | 1983 | | | | | | | | |
| 1658 | POUT | 1662 | 1992 | | | | | | | |
| 1992 | POUT> | 1971 | | | | | | | | |
| 1668 | POUTLP | 1696 | | | | | | | | |
| 1865 | PRNCK | 1854 | | | | | | | | |
| 1551 | PRNTR | | | | | | | | | |
| 847 | PROCWT | | | | | | | | | |
| 1346 | PRXFCT | 1343 | | | | | | | | |
| 1404 | PRXWGT | | | | | | | | | |
| 1578 | PTYPE | 1568 | 1573 | | | | | | | |
| 1863 | P1/2 | 1844 | | | | | | | | |
| 1841 | P1/2CK | 1814 | | | | | | | | |
| 1853 | P1/4CK | 1842 | | | | | | | | |
| 1618 | P300 | 1592 | | | | | | | | |
| 1592 | P300> | 1582 | | | | | | | | |
| 586 | RDSWA | 619 | | | | | | | | |
| 577 | RDSWS | 91 | 92 | | | | | | | |
| 92 | RDSWS> | 86 | 90 | | | | | | | |
| 642 | RDWGT | 625 | 637 | 640 | | | | | | |
| 686 | RDWGT1 | 682 | | | | | | | | |
| 569 | RESET | 641 | 1901 | | | | | | | |
| 1203 | RNDBY2 | 1197 | | | | | | | | |
| 1209 | RNDBY5 | 1201 | | | | | | | | |
| 372 | RNDOF> | 60 | | | | | | | | |
| 505 | RNDOFF | 572 | | | | | | | | |
| 1215 | RNDWT1 | 1211 | | | | | | | | |
| 1218 | RNDWT2 | 1208 | | | | | | | | |
| 590 | RSLOOP | 600 | | | | | | | | |
| 1704 | RSTPR> | 1702 | | | | | | | | |
| 1720 | RSTPTR | 1704 | | | | | | | | |
| 235 | SDUN | 208 | 225 | | | | | | | |
| 26 | SES | 566 | 680 | 684 | 738 | | | | | |
| 379 | SETRC> | 68 | | | | | | | | |
| 608 | SETRCP | 579 | | | | | | | | |
| 21 | SJS | 495 | 562 | 588 | 591 | 604 | 698 | 728 | 1541 | 1543 | 1566 |
| | | 1660 | 1685 | 1699 | 1708 | 1714 | 1719 | 1722 | | | |
| 1092 | STARE | 1058 | 1062 | 1068 | 1075 | | | | | |
| 987 | SUBAZ | 977 | 980 | | | | | | | |

| | | | | | | |
|---|---|---|---|---|---|---|
| 195 | SJBL | 64 | 205 | | | |
| 209 | SJBM | 207 | | | | |
| 216 | SJBML | 222 | | | | |
| 183 | SJBT | 50 | | | | |
| 1870 | TARECK | 1866 | | | | |
| 1949 | TDUN | 1888 | | | | |
| 1315 | TDUNCK | 1310 | | | | |
| 1440 | TPBLK | 1007 | 1328 | | | |
| 1322 | TPCLR | 1314 | 1389 | | | |
| 358 | TPRDS | 58 | | | | |
| 748 | T2CNVT | | | | | |
| 690 | T2LJOP | 701 | | | | |
| 804 | T3CNVT | | | | | |
| 719 | T3LJOP | 130 | | | | |
| 911 | UDF*T | 868 | 886 | 904 | | |
| 458 | UDO*T | 375 | | | | |
| 375 | UDO*T> | 62 | | | | |
| 483 | UDO*T1 | 476 | | | | |
| 1381 | UDTPXF | 1377 | | | | |
| 1192 | UDZLF | 1189 | | | | |
| 1796 | VFYCK | | | | | |
| 957 | X10CLR | 567 | | | | |
| 945 | X10EXP | | | | | |
| 961 | ZCAPT | 944 | | | | |
| 1163 | ZLAMP | 1144 | 1149 | 1153 | 1156 | 1159 |
| 1814 | 1/2CK> | 1797 | | | | |

What is claimed is:

1. In a digital scale an analog to digital converter means comprising in combination an integrator means having an input and an output, means for applying an analog input signal to the integrator input to drive the integrator output from a datum level to a level dependent upon the magnitude of the analog input signal, switch means for applying a reference signal to the integrator input, program controlled means interconnected with the integrator output and with the switch means, the program controlled means having a counting and timing program loop of instructions of fixed duration for counting the excursions around the loop during the time required for the reference signal to drive the integrator output back to a predetermined level near the datum level.

2. In a digital scale an analog to digital converter means in accordance with claim 1 wherein the program controlled means includes program means to continue the operation of the integrator means in response to the reference signal for an additional time interval after the integrator output is driven across the datum level.

3. In a digital scale an analog to digital converter means in accordance with claim 1 where in the means for applying an analog input signal to the integrator input includes counting means for counting predetermined intervals of time and the program controlled means includes program loops to control the counting means to control the time the analog input signal is applied to the input of the integrator.

4. In a digital scale an analog to digital converter means in accordance with claim 3 wherein the program controlled means includes storage means to store data for different scale capacities to condition the counting means to count different amounts for different scale capacities whereby the input analog signal is applied to the input of the integrator for different times for different scale capacities.

5. In a digital scale an analog to digital converter means comprising in combination an integrator having an input and an output, switch means for applying an analog input signal to the integrator input to drive the integrator output from a datum level to a level dependent upon the magnitude of the analog input signal, program controlled means interconnected with the integrator output and with the switch means, the program controlled means having a counting and timing program loop of instructions to control the time of operation of the switch means.

6. In a digital scale an analog to digital converter means in accordance with claim 5 wherein the program controlled means includes counting means controlled by the counting and timing program loop, storage means to store data for different scale capacities, and means controlled by the stored data for different scale capacities to set the counting means to count to different numbers for the different scale capacities.

7. In a digital scale an analog to digital converter means in accordance with claim 5 wherein the program controlled means includes counting means controlled by the counting program loop to count excursions around the loop, storage means to store data for different scale capacities, and means to condition the counting means to cause the integrator output to reach substantially the same level at full load for the different scale capacities.

8. In a digital scale a triple slope analog to digital converter means comprising in combination integrating means having an input and an output, means for applying an analog signal representing a weight on the scale to the input of the integrating means to drive the output of the integrating means from a datum level to a level controlled by the magnitude of the input analog signal, first switch means to apply a first reference signal to the input of the integrating means to drive the output of the integrating means toward the datum level at a first predetermined rate, second switch means to apply a second reference signal to the input of the integrating means to drive the output of the integrating means toward the datum level at a second predetermined rate, program controlled means interconnected with the first and second switch means and the output of the integrating means, the program controlled means including counting means for counting predetermined time intervals during the application of the first reference signal to the input of the integrating means during which intervals the output of the integrating means changes by an amount representing a plurality of weight increments, the program controlled means also including counting means to count the predetermined time intervals during the application of the second reference signal to the input of the integrating means during which intervals the output of the integrator changes by an amount representing a different number of weight increments and arithmetic means for combining the counted number of intervals to obtain a digital representation of total weight increments.

9. In a digital scale, a triple slope analog to digital converter means comprising in combination, integrating means having an input and an output, first switch means for applying an analog signal to the input of the integrating means, second switch means for applying a first reference signal to the input of the integrating means, third switch means for applying a second reference signal to the input of the integrating means, program controlled means interconnected with the integrating output and with the first, second, and third switch means, the program controlled means including timing means to control the time of application of the input signals to the input of the integrating means for deriving a digital representation of the magnitude of the input analog signal.

10. In a digital scale in accordance with claim 9 wherein the program controlled means includes storage means for storing data for different scale capacities, means responsive to the stored data for the respective scale capacities to control the time of application of the input analog signal to the input of the integration means to produce substantially the same digital representation of a full load for each of the respective scale capacities, and arithmetic means to convert the digital representation of the magnitude of the input signal to respective weight indications for the respective scale capacities.

11. In a digital scale a triple slope analog to digital converter means in accordance with claim 9 wherein the output of the integrating means is driven from a datum level to a level representing the weight on the scale in response to the application of the analog input signal and is driven back to the datum level in response to the application of the first reference signal, and wherein the first reference signal is applied to the input of the integrating means for a further predetermined interval of time.

12. In a digital scale a triple slope analog to digital converter in accordance with claim 11 wherein the output of the integrating means is driven back to the datum level in response to the application of the second reference signal to the input of the integrating means.

13. In a digital scale a triple slope analog to digital converter means in accordance with claim 11 wherein the program controlled means includes means for preventing change in the output of the integrating means during the further interval of time from affecting the output digital representation of the weight on the scale.

14. In a digital scale in accordance with claim 9 comprising in combination means for correcting each digital representation of the magnitude of the analog input including means for comparing each digital representation with a previously corrected digital representation, means responsive to the difference being within a predetermined range to augment a fraction of the difference toward the last representation and means for combining the result with the last digital representation to obtain the corrected digital representation.

15. An analog to digital converter comprising, in combination, integrator means having an input and an output, first switch means for applying an analog signal to the input of the integrator means to drive the output of the integrator means from a datum level to a level representing the amplitude of the analog signal, second switch means for applying a reference signal to the integrator means to drive the output of the integrator means back to a level near the datum level, a computer interconnected with the output of the integrator means and with the first and second switch means, a program delay loop for controlling the computer, and counting means for counting excursions around the program delay loop to control one of the switch means.

16. An analog to digital converter comprising, in combination, integrating means having an input and an output, means for applying an analog signal to the input of the integrating means to drive the output of the integrating means from a datum level to a level representing the amplitude of the analog signal, first switch means for applying a first reference signal to the input of the integrating means to drive the output of the integrating means toward the datum level at a first predetermined rate, second switch means for applying a second reference signal to the input of the integrating means to drive the output of the integrating means toward the datum level at a second predetermined rate, program controlled means interconnected with the output of the integrating means and interconnected with the first switch means and with the second switch means for actuating the first switch means until the output of the integrator is driven back to a level near the datum level and for thereafter actuating the second switch means to drive the output of the integrator back to substantially the datum level, the program controlled means including a program loop for controlling the program controlled means for a predetermined interval of time, counting means for counting excursions around the program loop during the actuation of the first switch means and during the actuation of the second switch means, and combining means for deriving a digital representation of the amplitude of the input analog signal from the numbers of excursions around the program loop.

17. An analog to digital converter in accordance with claim 16 comprising, in combination, means for maintaining the first switch means actuated for an additional time interval after the output of the integrator crosses the datum level.

* * * * *